United States Patent
Choi et al.

(10) Patent No.: US 12,152,042 B2
(45) Date of Patent: Nov. 26, 2024

(54) ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Jongwon Choi, Yongin-si (KR); Yongsuk Cho, Hwaseong-si (KR); Seungyeon Kwak, Suwon-si (KR); Sangdong Kim, Seongnam-si (KR); Soyeon Kim, Seoul (KR); Sukekazu Aratani, Hwaseong-si (KR); Sunghun Lee, Hwaseong-si (KR); Jiyoun Lee, Anyang-si (KR); Dmitry Kravchuk, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 716 days.

(21) Appl. No.: 17/319,489

(22) Filed: May 13, 2021

(65) Prior Publication Data
US 2021/0355148 A1  Nov. 18, 2021

(30) Foreign Application Priority Data

May 14, 2020 (KR) .................. 10-2020-0057820
May 12, 2021 (KR) .................. 10-2021-0061455

(51) Int. Cl.
*H01L 51/50* (2006.01)
*C07F 15/00* (2006.01)
(Continued)

(52) U.S. Cl.
CPC ....... C07F 15/0033 (2013.01); *H10K 85/342* (2023.02); *H10K 50/15* (2023.02);
(Continued)

(58) Field of Classification Search
None
See application file for complete search history.

(56) References Cited

U.S. PATENT DOCUMENTS 6,465,115 B2  10/2002  Shi et al.
6,596,415 B2  7/2003  Shi et al.
(Continued)

FOREIGN PATENT DOCUMENTS

CN  104193783  *  5/2019  ............. H01L 51/50
EP  3301088 A1  4/2018
(Continued)

OTHER PUBLICATIONS

The partial EP Search Report dated Sep. 7, 2021 of EP App. No. 201173643.4.
(Continued)

*Primary Examiner* — Gregory D Clark
(74) *Attorney, Agent, or Firm* — CANTOR COLBURN LLP

(57) ABSTRACT

An organometallic compound represented by Formula 1:

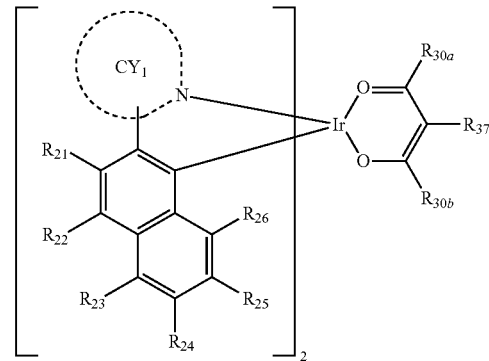

Formula 1 wherein, in Formula 1, $R_{37}$ is hydrogen, deuterium, a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic
(Continued)

group, or a substituted or unsubstituted monovalent non-aromatic condensed heteropolycyclic group; and ring $CY_1$, $R_{21}$ to $R_{26}$, $R_{30a}$, and $R_{30b}$, are as described herein.

19 Claims, 1 Drawing Sheet

(51) Int. Cl.
*H10K 85/30* (2023.01)
*H10K 50/15* (2023.01)
*H10K 50/16* (2023.01)
*H10K 50/17* (2023.01)
*H10K 50/18* (2023.01)

(52) U.S. Cl.
CPC ........... H10K 50/16 (2023.02); H10K 50/171 (2023.02); H10K 50/18 (2023.02)

(56) References Cited

U.S. PATENT DOCUMENTS

| | | |
|---|---|---|
| 9,554,442 B2 | 1/2017 | Kamatani et al. |
| 2001/0019782 A1 | 9/2001 | Igarashi et al. |
| 2009/0236974 A1* | 9/2009 | Tamaru et al. ........... H01J 1/62 |
| 2010/0219407 A1 | 9/2010 | Kamatani et al. |
| 2010/0289406 A1 | 11/2010 | Ma et al. |
| 2015/0333279 A1 | 11/2015 | Kamatani et al. |
| 2018/0097179 A1 | 4/2018 | Boudreault et al. |
| 2018/0097187 A1 | 4/2018 | Boudreault et al. |
| 2018/0130956 A1 | 5/2018 | Boudreault et al. |
| 2018/0240988 A1 | 8/2018 | Boudreault et al. |
| 2019/0062357 A1* | 2/2019 | Yoo ....................... H10K 85/348 |
| 2019/0237683 A1 | 8/2019 | Boudreault et al. |
| 2019/0248818 A1 | 8/2019 | Boudreault |
| 2019/0280213 A1 | 9/2019 | Adamovich |
| 2019/0326527 A1 | 10/2019 | Choi et al. |
| 2019/0348618 A1 | 11/2019 | Kamatani et al. |
| 2020/0099000 A1 | 3/2020 | Zhang et al. |
| 2020/0259106 A1 | 8/2020 | Kamatani et al. |
| 2021/0047354 A1* | 2/2021 | Shih ....................... C07F 15/004 |
| 2023/0320210 A1 | 10/2023 | Adamovich et al. |

FOREIGN PATENT DOCUMENTS

| | | |
|---|---|---|
| EP | 3398953 A1 | 11/2018 |
| EP | 3644384 A1 | 4/2020 |
| EP | 3778614 A1 | 2/2021 |
| EP | 3842444 A1 | 6/2021 |
| JP | 2000003782 A | 1/2000 |
| KR | 1020110111968 A | 10/2011 |
| KR | 20180122946 A | 11/2018 |
| KR | 20190107602 A | 9/2019 |
| KR | 1020190123228 A | 10/2019 |
| KR | 20200034636 A | 3/2020 |
| WO | 2019109886 A1 | 6/2019 |
| WO | 2019221445 A1 | 11/2019 |
| WO | 2019221446 A1 | 11/2019 |

OTHER PUBLICATIONS

Extended European Search Report dated Jan. 14, 2022 of EP Patent Application No. 21173643.4.
M. A. Baldo et al., "Highly efficient phosphorescent emission fromorganic electroluminescent devices," letters to nature, Sep. 10, 1998, pp. 151-154, vol. 395.
M. A. Baldo et al., "Very high-efficiency green organic light-emitting devices based on electrophosphorescence," Applied Physics Letters, Jun. 29, 1999, pp. 4-6, vol. 75, No. 1.
Qin Wang et al., "Effects of charged self-assembled quantum dots on two-dimensional quantum transport," Applied Physics Letters, Mar. 27, 2000, pp. 1704-1706, vol. 76, No. 13.
Raymond C. Kwong et al., "High operational stability of electrophosphorescent devices," Appl. Phys. Lett., Apr. 30, 2002, pp. 162-164, vol. 81, No. 1.
Sergey Lamansky et al., "Highly Phosphorescent Bis-Cyclometalated Iridium Complexes: Synthesis, Photophysical Characterization, and Use in Organic Light Emitting Diodes," J. Am. Chem. Soc., 2001, pp. 4304-4312, vol. 123.
Sergey Lamansky et al., "Synthesis and Characterization of Phosphorescent Cyclometalated Iridium Complexes," Inorganic Chemistry, 2001, pp. 1704-1711, vol. 40.
Office Action issued dated Aug. 3, 2023 of KR Patent Application No. 10-2021-0061455.
Office Action mailed Feb. 27, 2024 for Korean Patent Application No. KR 10-2021-0061455.

* cited by examiner

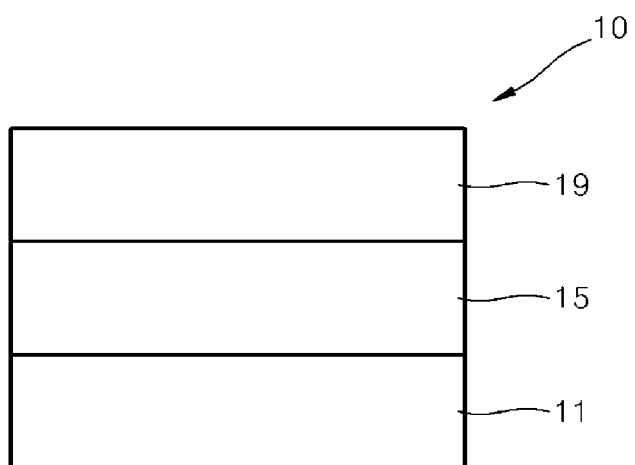

ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

CROSS-REFERENCE TO RELATED APPLICATION

This application claims priority to and the benefit of Korean Patent Application Nos. 10-2020-0057820, filed on May 14, 2020, and Korean Patent Application No. 10-2021-0061455, filed on May 12, 2021, in the Korean Intellectual Property Office, and all the benefits accruing therefrom under 35 U.S.C. § 119, the content of which are incorporated herein in their entireties by reference.

BACKGROUND

1. Field

One or more embodiments described herein relate to an organometallic compound, an organic light-emitting device including the same, and an electronic apparatus including the organic light-emitting device.

2. Description of Related Art

Organic light-emitting devices (OLEDs) are self-emission devices that have improved characteristics compared to conventional devices, including having wider viewing angles, faster response times, excellent brightness, driving voltage, and response speed. In addition, OLEDS can produce full-color images with these enhanced properties.

In an example, an organic light-emitting device includes an anode, a cathode, and an organic layer located between the anode and the cathode, wherein the organic layer includes an emission layer. A hole transport region may be located between the anode and the emission layer, and an electron transport region may be located between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state to thereby generate light, for example, visible light.

SUMMARY

One or more embodiments described herein relate to an organometallic compound, an organic light-emitting device including the same, and an electronic apparatus including the organic light-emitting device.

Additional aspects will be set forth in part in the description which follows and, in part, will be apparent from the description, or may be learned by practice of the presented embodiments of the disclosure.

According to an aspect, one or more embodiments provide an organometallic compound represented by Formula 1:

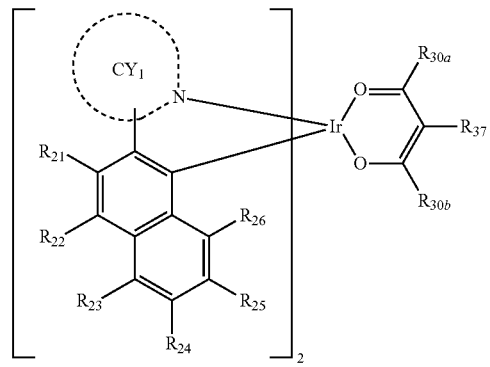

Formula 1 wherein, in Formula 1, ring $CY_1$ is a group represented by one of Formulae CY1-1 to CY1-9,

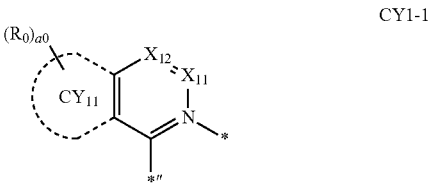

CY1-1

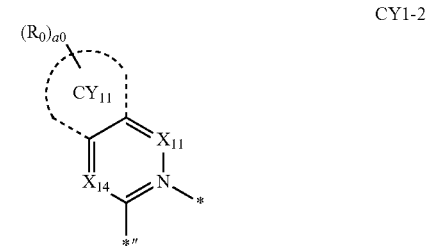

CY1-2

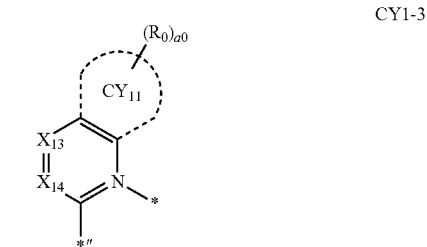

CY1-3

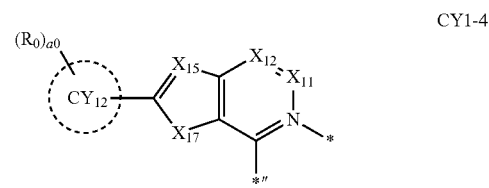

CY1-4

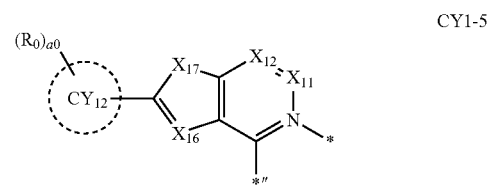

CY1-5

-continued

CY1-6
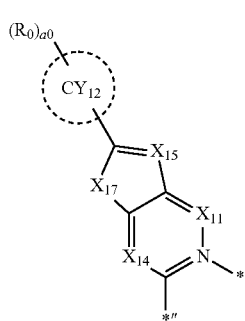

CY1-7
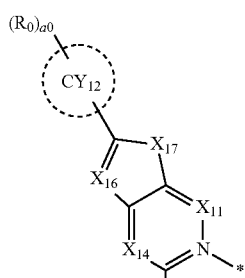

CY1-8
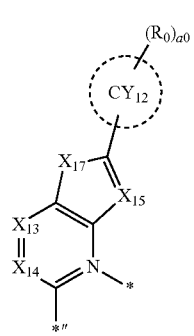

CY1-9
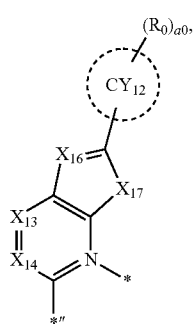

wherein,

\* in Formula CY1-1 to CY1-9 is a binding site to Ir in Formula 1, and \*" is a binding site to a neighboring carbon atom, ring $CY_{11}$ in Formula CY1-1 to CY1-3 is a polycyclic group wherein two or more cyclic groups are condensed with each other, the cyclic group and ring $CY_{12}$ in Formulae CY1-4 to CY1-9 are each independently a $C_5$-$C_{30}$ carbocyclic group or a $C_1$-$C_{30}$ heterocyclic group, in Formulae CY1-1 to CY1-9, $X_{11}$ is $C(R_{11})$ or N, $X_{12}$ is $C(R_{12})$ or N, $X_{13}$ is $C(R_{13})$ or N, $X_{14}$ is $C(R_{14})$ or N, $X_{15}$ is $C(R_{15})$ or N, $X_{16}$ is $C(R_{16})$ or N, and $X_{17}$ is O, S, $N(R_{17})$, $C(R_{18})(R_{19})$, or $Si(R_{18})(R_{19})$, $R_{30a}$ is a group represented by \*—$C(R_{31})(R_{32})(R_{33})$, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, $R_0$, $R_{11}$ to $R_{19}$, $R_{21}$ to $R_{26}$, $R_{31}$ to $R_{33}$, and $R_{30b}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, provided that each of $R_{31}$ to $R_{33}$ is not hydrogen, $R_{37}$ is hydrogen, deuterium, a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, a0 is an integer from 0 to 20, two or more of a plurality of $R_0$ are optionally linked to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of $R_1$ to $R_{19}$ are optionally linked to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of $R_{11}$ to $R_{19}$ and $R_0$ are optionally linked to form a $C_5$-$C_{30}$ carbocyclic group that is unsubstituted or substituted with at least one $R_{10a}$, or a $C_1$-$C_{60}$ heterocyclic group that is unsubstituted or substituted with at least one $R_{10a}$, two or more of $R_{21}$ to $R_{26}$ are optionally linked to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of $R_{30a}$, $R_{30b}$, and $R_{37}$ are optionally linked to form a $C_5$-$C_{30}$ carbocyclic group that is unsubstituted or substituted with at least one $R_{10a}$, or a $C_1$-$C_{60}$ heterocyclic group that is unsubstituted or substituted with at least one $R_{10a}$, $R_{10a}$ is as described in connection with $R_0$, and substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), —Ge(Q$_{13}$)(Q$_{14}$)(Q$_{15}$), —B(Q$_{16}$)(Q$_{17}$), —P(=O)(Q$_{18}$)(Q$_{19}$), —P(Q$_{18}$)(Q$_{19}$), or a combination thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), —Ge(Q$_{23}$)(Q$_{24}$)(Q$_{25}$), —B(Q$_{26}$)(Q$_{27}$), —P(=O)(Q$_{28}$)(Q$_{29}$), —P(Q$_{28}$)(Q$_{29}$), or a combination thereof, —N(Q$_{31}$)(Q$_{32}$), —Si(Q$_{33}$)(Q$_{34}$)(Q$_{35}$), —Ge(Q$_{33}$)(Q$_{34}$)(Q$_{35}$), —B(Q$_{36}$)(Q$_{37}$), —P(=O)(Q$_{38}$)(Q$_{39}$), or —P(Q$_{38}$)(Q$_{39}$), or a combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{60}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_1$-$C_{60}$ heteroaryl group; a $C_1$-$C_{60}$ heteroaryl group which is unsubstituted or substituted with deuterium, a $C_1$-$C_{60}$ alkyl group, a $C_6$-$C_{60}$ aryl group, or a combination thereof; a $C_1$-$C_{60}$ heteroaryloxy group; a $C_1$-$C_{60}$ heteroarylthio group; a monovalent non-aromatic condensed polycyclic group; or a monovalent non-aromatic condensed heteropolycyclic group.

According to another aspect, one or more embodiments provide an organic light-emitting device including a first electrode, a second electrode, and an organic layer located between the first electrode and the second electrode, wherein the organic layer includes an emission layer, and wherein the organic layer further includes at least one organometallic compound represented by Formula 1.

The organometallic compound may be included in an emission layer of the organic layer, and the organometallic compound included in the emission layer may act as a dopant.

According to another aspect, one or more embodiments provide an electronic apparatus including the organic light-emitting device.

BRIEF DESCRIPTION OF THE DRAWING

The above and other aspects, features, and advantages of certain embodiments of the disclosure will be more apparent from the following description taken in conjunction with the accompanying drawing, in which FIGURE which shows a schematic cross-sectional view of an organic light-emitting device according to one or more embodiments.

DETAILED DESCRIPTION

Reference will now be made in detail to exemplary embodiments, examples of which are illustrated in the accompanying drawing, wherein like reference numerals refer to like elements throughout. In this regard, the present exemplary embodiments may have different forms and should not be construed as being limited to the descriptions set forth herein. Accordingly, the exemplary embodiments are described below, by referring to the FIGURE, to explain one or more aspects. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing one or more exemplary embodiments only and is not intended to be limiting. As used herein, the singular forms "a," "an," and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

According to an aspect, one or more embodiments of the present disclosure describe an organometallic compound represented by Formula 1:

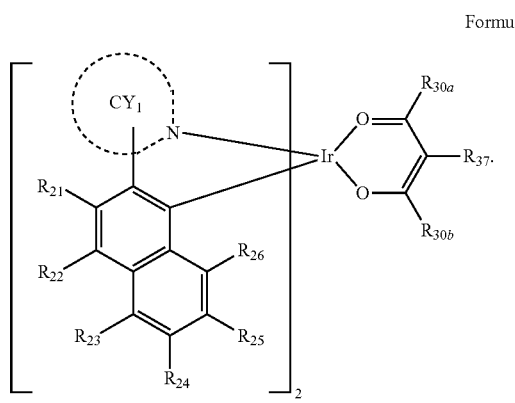

Formula 1

Ring $CY_1$ in Formula 1 is a group represented by one of Formulae CY1-1 to CY1-9:

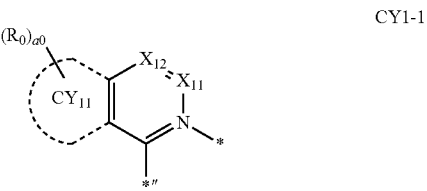

CY1-1

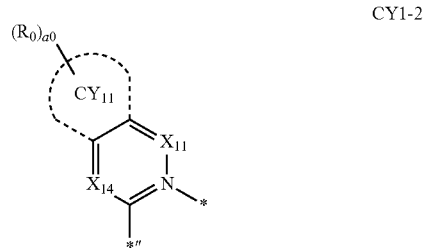

CY1-2

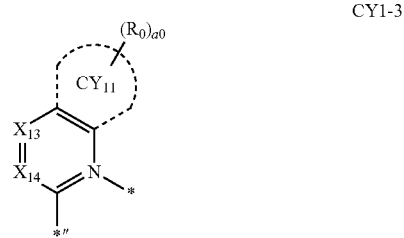

CY1-3

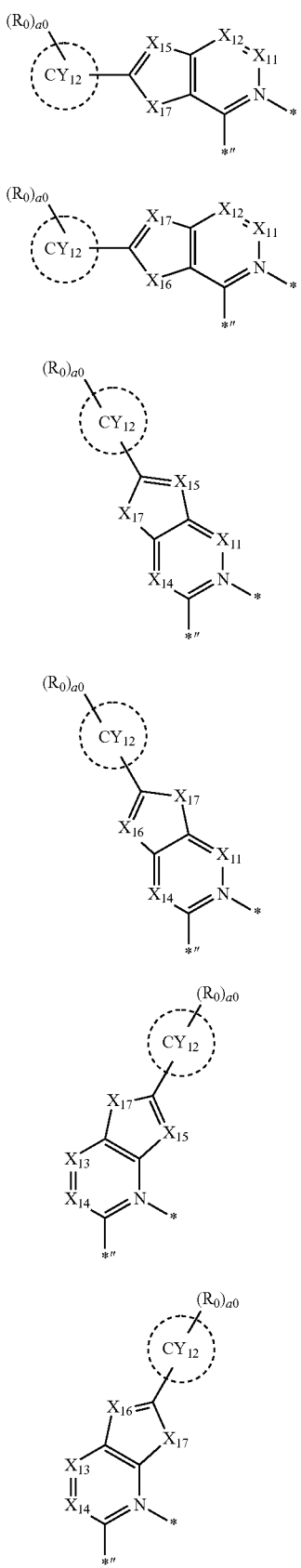

* in Formulae CY1-1 to CY1-9 is a binding site to Ir in Formula 1, and *″ is a binding site to a neighboring carbon atom.

Ring $CY_{11}$ in Formulae CY1-1 to CY1-3 is a polycyclic group wherein two or more cyclic groups are condensed with each other, and the cyclic group and ring $CY_{12}$ in Formulae CY1-4 to CY1-9 are each independently a $C_5$-$C_{30}$ carbocyclic group or a $C_1$-$C_{30}$ heterocyclic group.

In one or more embodiments, ring $CY_{11}$ in Formulae CY1-1 to CY1-3 may be a) a condensed cyclic group wherein two or more first rings are condensed with each other, b) a condensed cyclic group wherein two or more second rings are condensed with each other, or c) a condensed cyclic group wherein at least one first ring is condensed with at least one second ring.

In one or more embodiments, ring $CY_{12}$ in Formulae CY1-4 to CY1-9 is i) a first ring, ii) a second ring, iii) a condensed cyclic group wherein two or more first rings are condensed with each other, iv) a condensed cyclic group wherein two or more second rings are condensed with each other, or v) a condensed cyclic group wherein at least one first ring is condensed with at least one second ring, wherein the first ring may be a cyclopentane group, a cyclopentene group, a furan group, a thiophene group, a pyrrole group, a silole group, a germole group, a borole group, a selenophene group, a phosphole group, an oxazole group, an oxadiazole group, an oxatriazole group, a thiazole group, a thiadiazole group, a thiatriazole group, a pyrazole group, an imidazole group, a triazole group, a tetrazole group, an azasilole group, an azagermole group, an azaborole group, an azaselenophene group, or an azaphosphole group, and wherein the second ring may be an adamantane group, a norbornane group (or, bicyclo[2.2.1]heptane group), a norbornene group, a bicyclo[1.1.1]pentane group, a bicyclo [2.1.1]hexane group, a bicyclo[2.2.2]octane group, a cyclohexane group, a cyclohexene group, a benzene group, a pyridine group, a pyrimidine group, a pyrazine group, a pyridazine group, or a triazine group.

In one or more embodiments, ring $CY_{11}$ in Formulae CY1-1 to CY1-3 may be a naphthalene group, an anthracene group, a phenanthrene group, a triphenylene group, a pyrene group, a chrysene group, a 1,2,3,4-tetrahydronaphthalene group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a fluorene group, a dibenzosilole group, a dibenzoborole group, a dibenzophosphole group, a dibenzoselenophene group, a dibenzogermole group, a dibenzothiophene 5-oxide group, 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a quinoline group, an isoquinoline group, a quinoxaline group, a quinazoline group, a phenanthroline group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In one or more embodiments, ring $CY_{11}$ in Formulae CY1-1 to CY1-3 may be a naphthalene group, an anthracene group, a phenanthrene group, a triphenylene group, a pyrene group, a chrysene group, a 1,2,3,4-tetrahydronaphthalene group, a quinoline group, an isoquinoline group, a quinoxaline group, a quinazoline group, a phenanthroline group, a 5,6,7,8-tetrahydroisoquinoline group, or a 5,6,7,8-tetrahydroquinoline group.

In one or more embodiments, ring $CY_{11}$ in Formulae CY1-1 to CY1-3 may be a naphthalene group or a phenanthrene group.

In one or more embodiments, ring $CY_{12}$ in Formulae CY1-4 to CY1-9 may be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a thiophene group, a furan group, a pyrrole group, a cyclopentadiene group, a silole group, a borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a fluorene group, a dibenzosilole group, a dibenzoborole group, a dibenzophosphole group, a dibenzoselenophene group, a dibenzogermole group, a dibenzothiophene-5-oxide group, a 9H-fluorene-9-one group, a dibenzothiophene-5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene-5-oxide group, an aza-9H-fluorene-9-one group, an azadibenzothiophene-5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

In one or more embodiments, ring $CY_{12}$ in Formulae CY1-4 to CY1-9 may be a benzene (phenyl) group, a naphthalene group, an anthracene group, a phenanthrene group, a triphenylene group, a pyrene group, a chrysene group, a 1,2,3,4-tetrahydronaphthalene group, a thiophene group, a dibenzothiophene group, a dibenzofuran group, a carbazole group, a fluorene group, a dibenzosilole group, a dibenzoborole group, a dibenzophosphole group, a dibenzoselenophene group, a dibenzogermole group, a dibenzothiophene-5-oxide group, a 9H-fluorene-9-one group, a dibenzothiophene-5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene-5-oxide group, an aza-9H-fluorene-9-one group, an azadibenzothiophene-5,5-dioxide group, a pyridine group, a pyrimidine group, a pyrazine group, a pyridazine group, a triazine group, a quinoline group, an isoquinoline group, a quinoxaline group, a quinazoline group, or a phenanthroline group.

In one or more embodiments, ring $CY_{12}$ in Formulae CY1-4 to CY1-9 may be a benzene group, a thiophene group, or a pyridine group.

In one or more embodiments, ring $CY_1$ in Formula 1 may be a benzoquinoline group, a benzoisoquinoline group, a naphthoquinoline group, a naphthoisoquinoline group, a pyridofuran group, or a pyridothiophene group.

In Formulae CY1-1 to CY1-9 of Formula 1, $X_{11}$ is $C(R_{11})$ or N, $X_{12}$ is $C(R_{12})$ or N, $X_{13}$ is $C(R_{13})$ or N, $X_{14}$ is $C(R_{14})$ or N, $X_{15}$ is $C(R_{15})$ or N, $X_{15}$ is $C(R_{15})$ or N, and $X_{17}$ is O, S, $N(R_{17})$, $C(R_{18})(R_{19})$ or $Si(R_{18})(R_{19})$.

In one or more embodiments, in Formulae CY1-1 to CY1-9, $X_{11}$ may be $C(R_{11})$, $X_{12}$ may be $C(R_{12})$, $X_{13}$ may be $C(R_{13})$, $X_{14}$ may be $C(R_{14})$, $X_{15}$ may be $C(R_{15})$, $X_{16}$ may be $C(R_{16})$. In one or more embodiments, $X_{17}$ may be O or S.

$R_{30a}$ in Formula 1 is a group represented by *—$C(R_{31})(R_{32})(R_{33})$, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group. $R_{31}$ to $R_{33}$ are the same as described in the present specification.

In one or more embodiments, $R_{30a}$ in Formula 1 may be a group represented by *—$C(R_{31})(R_{32})(R_{33})$.

In one or more embodiments, $R_{30a}$ in Formula 1 may be a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_2$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl) bicyclo[1.1.1]pentyl group, a ($C_1$-$C_{20}$ alkyl)bicyclo[2.1.1] hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or a combination thereof, $R_0$, $R_{11}$ to $R_{19}$, $R_{21}$ to $R_{26}$, $R_{31}$ to $R_{33}$, and $R_{30b}$ in the respective formulae above are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$), provided that each of $R_{31}$ to $R_{33}$ is not hydrogen. $Q_1$ to $Q_9$ are as described herein.

In one or more embodiments, each of $R_{31}$ to $R_{33}$ may not be hydrogen and deuterium.

In one or more embodiments, $R_0$, $R_{11}$ to $R_{19}$, $R_{21}$ to $R_{26}$, $R_{31}$ to $R_{33}$, and $R_{30b}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, $C_1$-$C_{20}$ alkyl group, a $C_2$-$C_{20}$ alkenyl group, a $C_1$-$C_{20}$ alkoxy group, or a $C_1$-$C_{20}$ alkylthio group;

a $C_1$-$C_{20}$ alkyl group, a $C_2$-$C_{20}$ alkenyl group, a $C_1$-$C_{20}$ alkoxy group, or a $C_1$-$C_{20}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl) cycloheptenyl group, a ($C_1$-$C_{20}$ alkyl)bicyclo[1.1.1] pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or combination thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1] hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or azadibenzothiophenyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_2$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or a combination thereof; or —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$), and
wherein each of $R_{31}$ to $R_{33}$ is not hydrogen,
wherein $Q_1$ to $Q_9$ may each independently be:
deuterium, —F, —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, —CD$_2$CDH$_2$, —CF$_3$, —CF$_2$H, —CFH$_2$, —CH$_2$CF$_3$, —CH$_2$CF$_2$H, —CH$_2$CFH$_2$, —CHFCH$_3$, —CHFCF$_2$H, —CHFCFH$_2$, —CHFCF$_3$, —CF$_2$CF$_3$, —CF$_2$CF$_2$H, or —CF$_2$CFH$_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, $C_1$-$C_{10}$ alkyl group, a phenyl group, or a combination thereof.

In one embodiment, $R_0$, $R_{11}$ to $R_{19}$, $R_{21}$ to $R_{26}$, $R_{31}$ to $R_{33}$, and $R_{30b}$ may each independently be:

hydrogen, deuterium, —F, or a cyano group;

a $C_1$-$C_{20}$ alkyl group unsubstituted or substituted with deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or any combination thereof;

a $C_3$-$C_{10}$ cycloalkyl group, a $C_1$-$C_{10}$ heterocycloalkyl group, a phenyl group, a biphenyl group, a naphthyl group, a pyridinyl group, a fluorenyl group, a carbazolyl group, a dibenzofuranyl group, or a bibenzothiophenyl group, unsubstituted or substituted with deuterium, —F, a cyano group, a $C_1$-$C_{20}$ alkyl group, a deuterated $C_1$-$C_{20}$ alkyl group, a $C_1$-$C_{20}$ fluorinated alkyl group, a $C_1$-$C_{20}$ alkoxy group, a deuterated $C_1$-$C_{20}$ alkoxy group, a $C_1$-$C_{20}$ fluorinated alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or any combination thereof; or —Si($Q_3$)($Q_4$)($Q_5$), or —Ge($Q_3$)($Q_4$)($Q_5$);
wherein each of $R_{31}$ to $R_{33}$ is not hydrogen.

$R_{37}$ in Formula 1 is hydrogen, deuterium, a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

In one or more embodiments, at least one group $R_0$ in the number of a0, at least one of $R_{11}$ to $R_{14}$, at least one of $R_{21}$ to $R_{26}$, $R_{30a}$, $R_{30b}$, $R_{37}$, or a combination thereof, may each independently be:
  deuterium, —F, or a cyano group;
  a $C_1$-$C_{20}$ alkyl group unsubstituted or substituted with deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or a combination thereof;
  a $C_3$-$C_{10}$ cycloalkyl group, a $C_1$-$C_{10}$ heterocycloalkyl group, a phenyl group, a biphenyl group, a naphthyl group, a pyridinyl group, a fluorenyl group, a carbazolyl group, a dibenzofuranyl group, or a bibenzothiophenyl group, unsubstituted or substituted with deuterium, —F, a cyano group, a $C_1$-$C_{20}$ alkyl group, a deuterated $C_1$-$C_{20}$ alkyl group, a $C_1$-$C_{20}$ fluorinated alkyl group, a $C_1$-$C_{20}$ alkoxy group, a deuterated $C_1$-$C_{20}$ alkoxy group, a $C_1$-$C_{20}$ fluorinated alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or a combination thereof, or —Si($Q_3$)($Q_4$)($Q_5$), or —Ge($Q_3$)($Q_4$)($Q_5$).

In one or more embodiments, $R_{30a}$ may each independently be —$CD_3$, —$CD_2H$, —$CDH_2$, —$CF_3$, —$CF_2H$, —$CFH_2$, $C_2$-$C_{10}$ alkenyl group, a $C_1$-$C_{10}$ alkoxy group, a $C_1$-$C_{10}$ alkylthio group, a group represented by one of Formulae 9-1 to 9-39, a group represented by one of Formulae 9-1 to 9-39 wherein at least one hydrogen is substituted with deuterium, a group represented by one of Formulae 9-1 to 9-39 wherein at least one hydrogen is substituted with —F, a group represented by one of Formulae 9-201 to 9-237, a group represented by one of Formulae 9-201 to 9-237 wherein at least one hydrogen is substituted with deuterium, a group represented by one of Formulae 9-201 to 9-237 wherein at least one hydrogen is substituted with —F, a group represented by one of Formulae 10-1 to 10-129, a group represented by one of Formulae 10-1 to 10-129 wherein at least one hydrogen is substituted with deuterium, a group represented by one of Formulae 10-1 to 10-129 wherein at least one hydrogen is substituted with —F, a group represented by one of Formulae 10-201 to 10-350, a group represented by one of Formulae 10-201 to 10-350 wherein at least one hydrogen is substituted with deuterium, or a group represented by one of Formulae 10-201 to 10-350 wherein at least one hydrogen is substituted with —F.

In one or more embodiments, $R_0$, $R_{11}$ to $R_{19}$, $R_{21}$ to $R_{26}$, $R_{31}$ to $R_{33}$, and $R_{30b}$ may each independently be hydrogen, deuterium, —F, —$CH_3$, —$CD_3$, —$CD_2H$, —$CDH_2$, —$CF_3$, —$CF_2H$, —$CFH_2$, $C_2$-$C_{10}$ alkenyl group, a $C_1$-$C_{10}$ alkoxy group, a $C_1$-$C_{10}$ alkylthio group, a group represented by one of Formulae 9-1 to 9-39, a group represented by one of Formulae 9-1 to 9-39 wherein at least one hydrogen is substituted with deuterium, a group represented by one of Formulae 9-1 to 9-39 wherein at least one hydrogen is substituted with —F, a group represented by one of Formulae 9-201 to 9-237, a group represented by one of Formulae 9-201 to 9-237 wherein at least one hydrogen is substituted with deuterium, a group represented by one of Formulae 9-201 to 9-237 wherein at least one hydrogen is substituted with —F, a group represented by one of Formulae 10-1 to 10-129, a group represented by one of Formulae 10-1 to 10-129 wherein at least one hydrogen is substituted with deuterium, a group represented by one of Formulae 10-1 to 10-129 wherein at least one hydrogen is substituted with —F, a group represented by one of Formulae 10-201 to 10-350, a group represented by one of Formulae 10-201 to 10-350 wherein at least one hydrogen is substituted with deuterium, a group represented by one of Formulae 10-201 to 10-350 wherein at least one hydrogen is substituted with —F, —Si($Q_3$)($Q_4$)($Q_5$), or —Ge($Q_3$)($Q_4$)($Q_5$), wherein $Q_3$ to $Q_5$ are as described herein.

In one or more embodiments, $R_{37}$ may be hydrogen, deuterium, —$CH_3$, —$CD_3$, —$CD_2H$, —$CDH_2$, —$CF_3$, —$CF_2H$, —$CFH_2$, a group represented by one of Formulae 9-1 to 9-39, a group represented by one of Formulae 9-1 to 9-39 wherein at least one hydrogen is substituted with deuterium, a group represented by one of Formulae 9-1 to 9-39 wherein at least one hydrogen is substituted with —F, a group represented by one of Formulae 9-201 to 9-237, a group represented by one of Formulae 9-201 to 9-237 wherein at least one hydrogen is substituted with deuterium, a group represented by one of Formulae 9-201 to 9-237 wherein at least one hydrogen is substituted with —F, a group represented by one of Formulae 10-1 to 10-129, a group represented by one of Formulae 10-1 to 10-129 wherein at least one hydrogen is substituted with deuterium, a group represented by one of Formulae 10-1 to 10-129 wherein at least one hydrogen is substituted with —F, a group represented by one of Formulae 10-201 to 10-350, a group represented by one of Formulae 10-201 to 10-350 wherein at least one hydrogen is substituted with deuterium, or a group represented by one of Formulae 10-201 to 10-350 wherein at least one hydrogen is substituted with —F.

In one or more embodiments, the group represented by

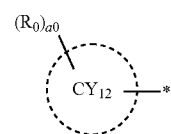

in Formulae CY1-4 to CY1-9 may be a group represented by one of Formulae 10-1 to 10-129, a group represented by one of Formulae 10-1 to 10-129 wherein at least one hydrogen is substituted with deuterium, a group represented by one of Formulae 10-1 to 10-129 wherein at least one hydrogen is substituted with —F, a group represented by one of Formulae 10-201 to 10-350, a group represented by one of Formulae 10-201 to 10-350 wherein at least one hydrogen is substituted with deuterium, or a group represented by one of Formulae 10-201 to 10-350 wherein at least one hydrogen is substituted with —F.

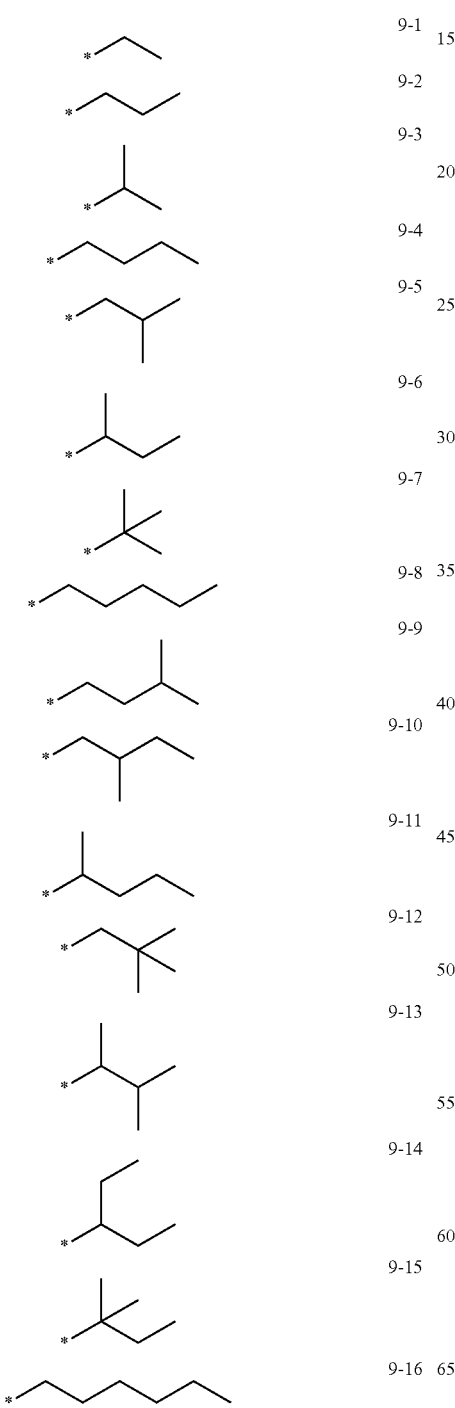
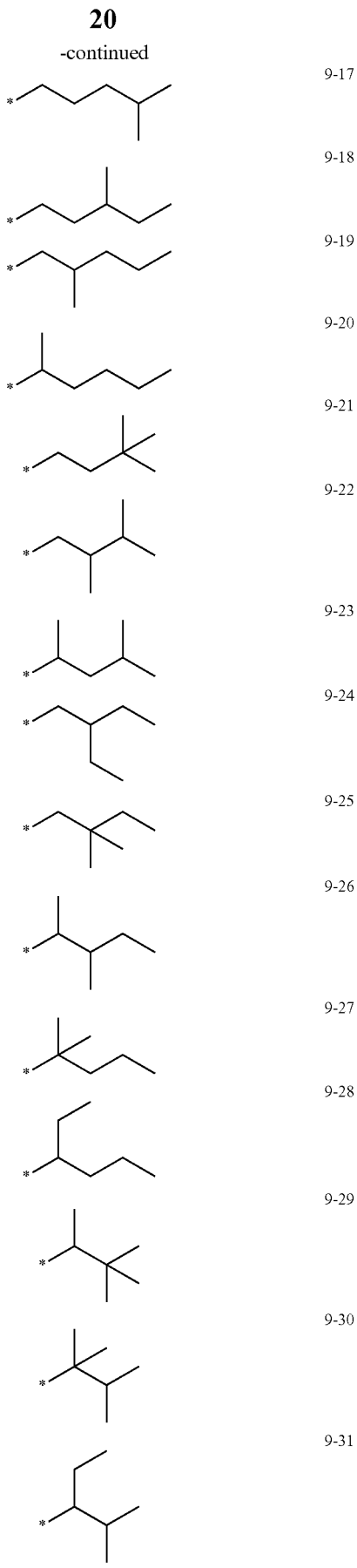

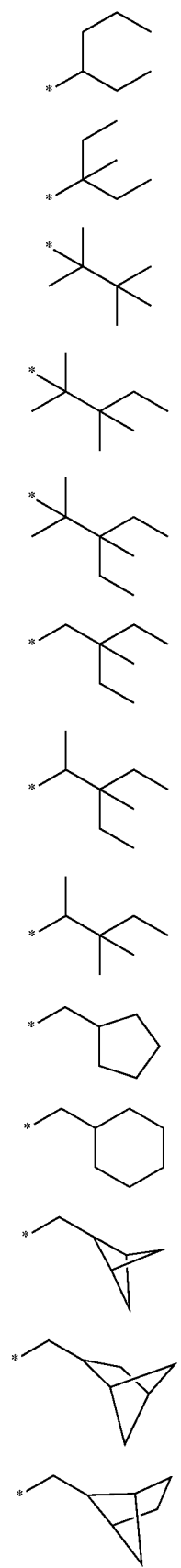
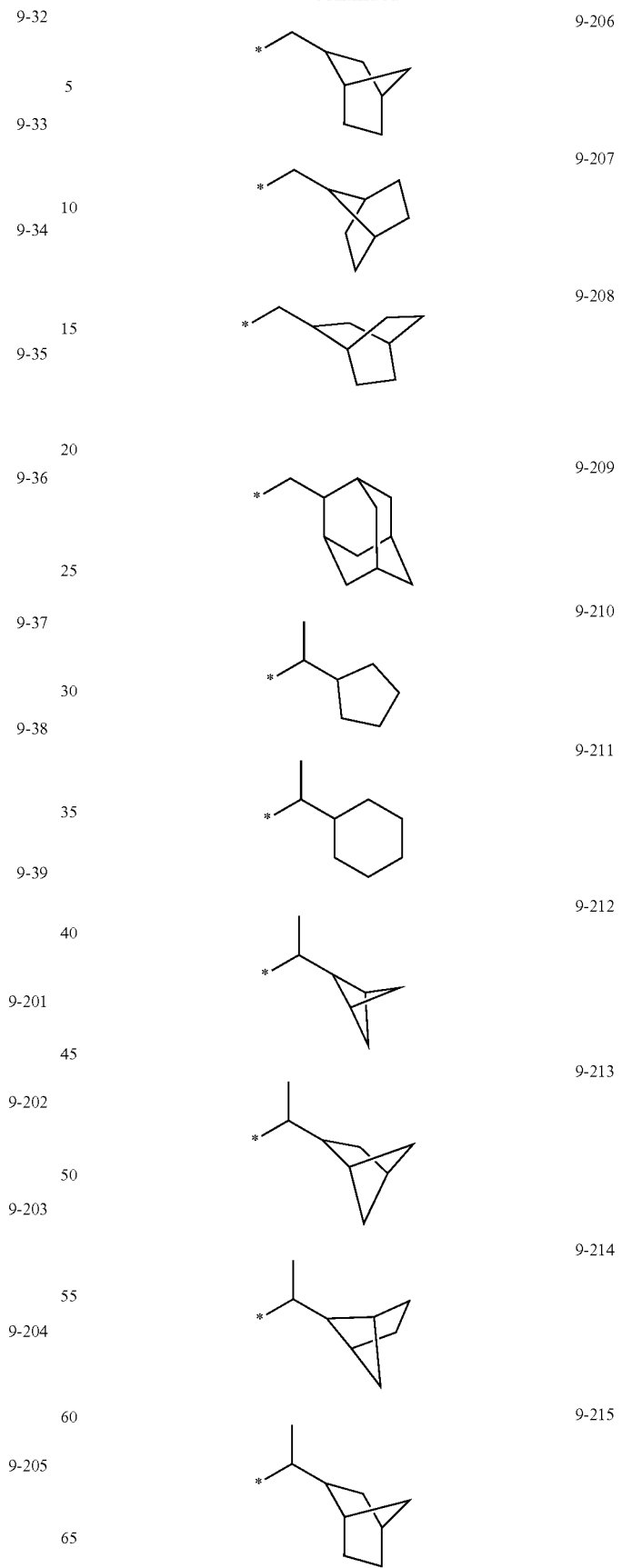

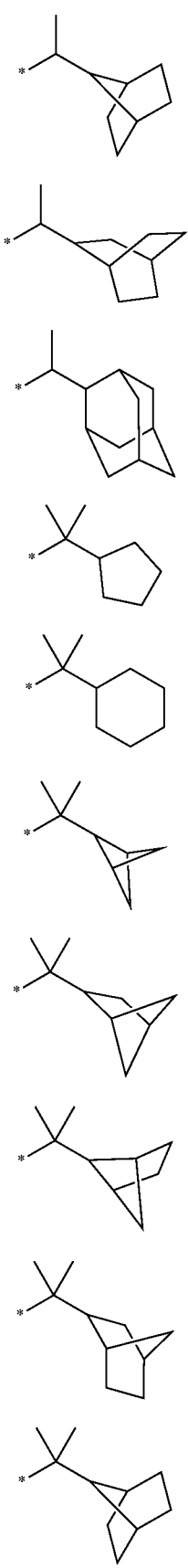
9-216
9-217
9-218
9-219
9-220
9-221
9-222
9-223
9-224
9-225
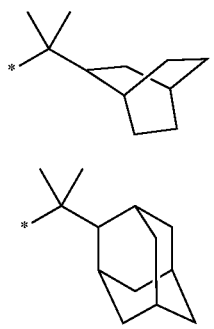
9-226
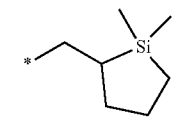
9-227
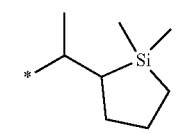
9-228
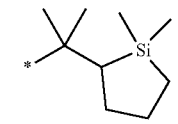
9-229
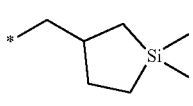
9-230
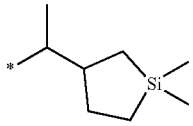
9-231
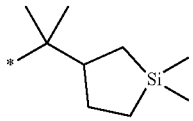
9-323
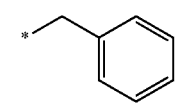
9-233
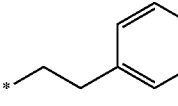
9-234
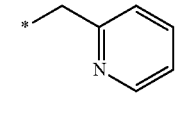
9-235
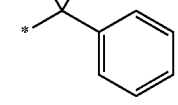
9-236
9-237

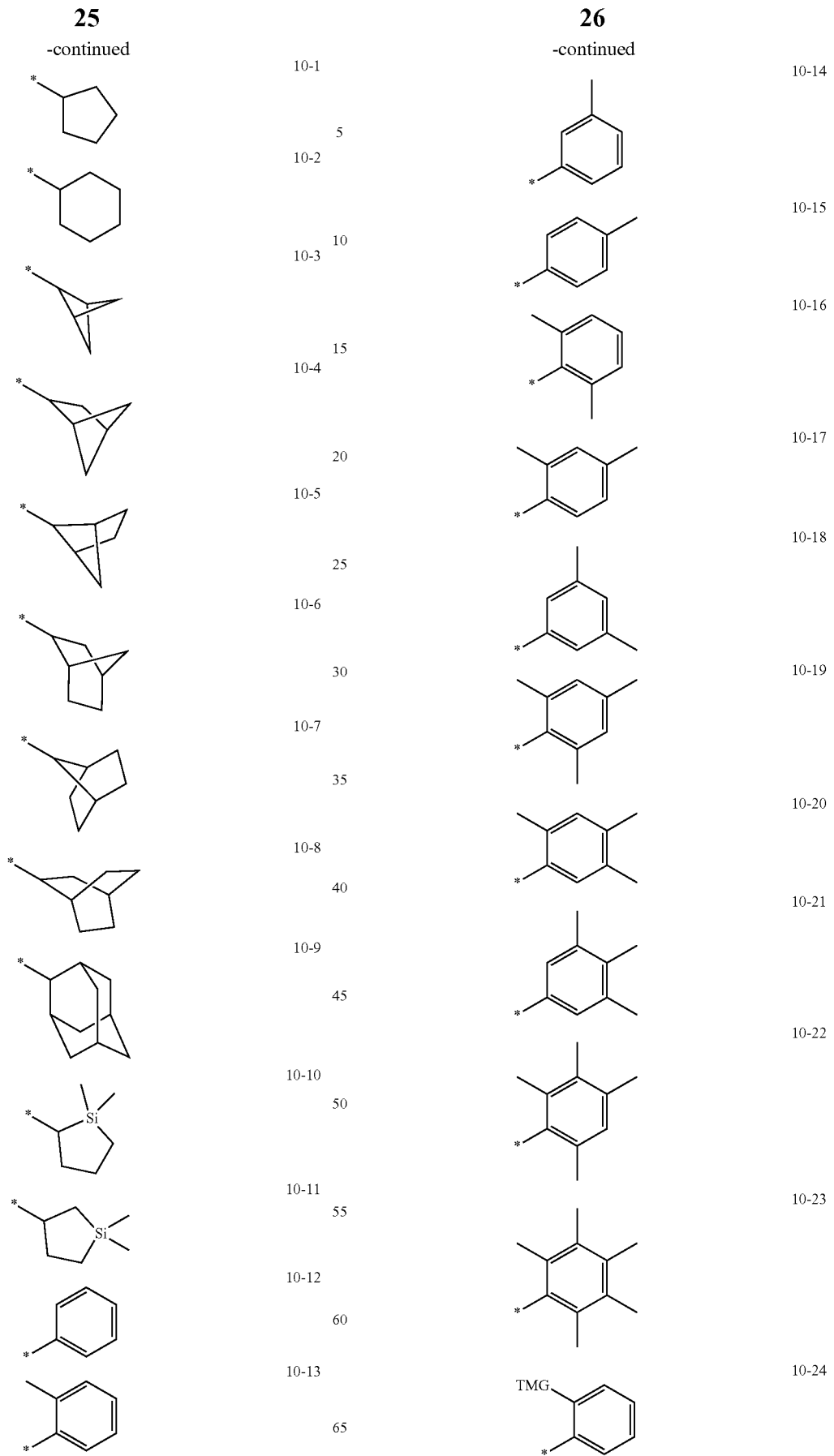

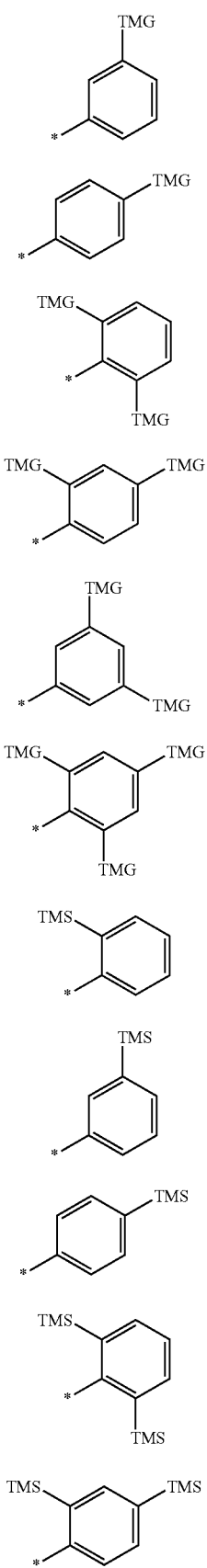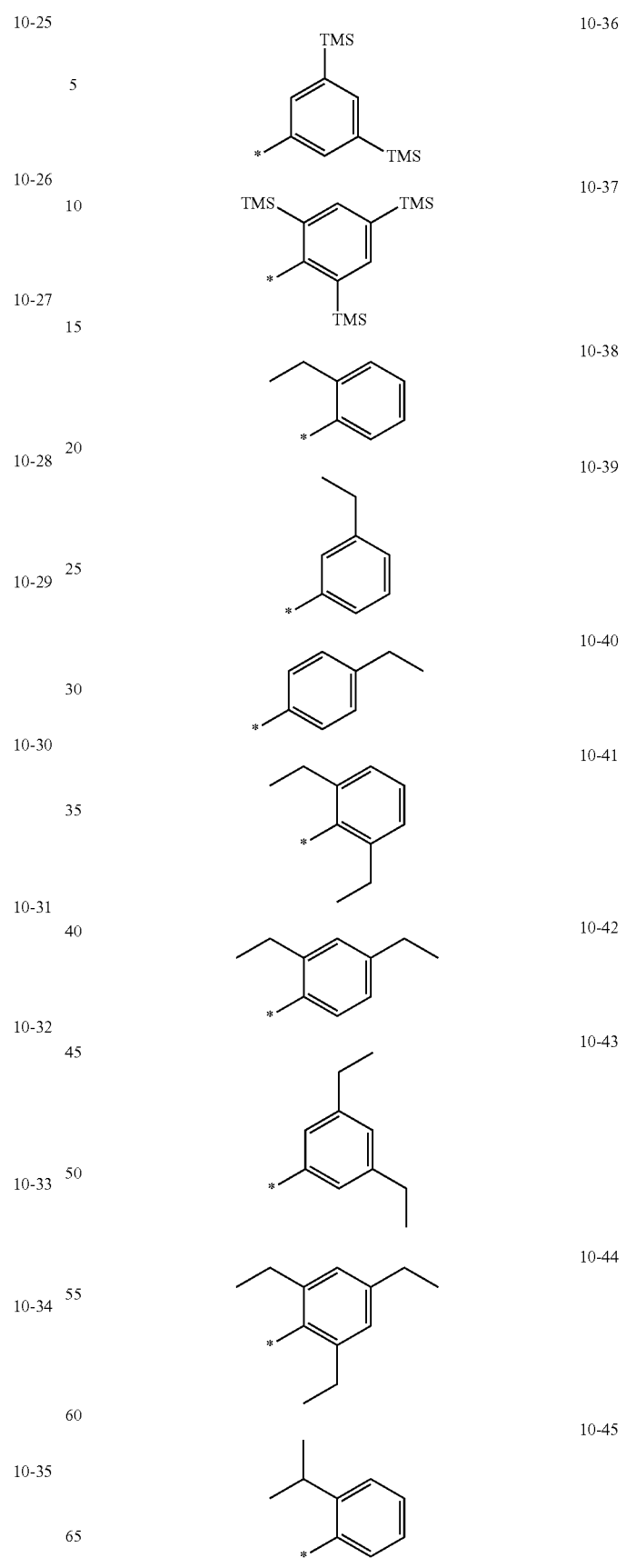

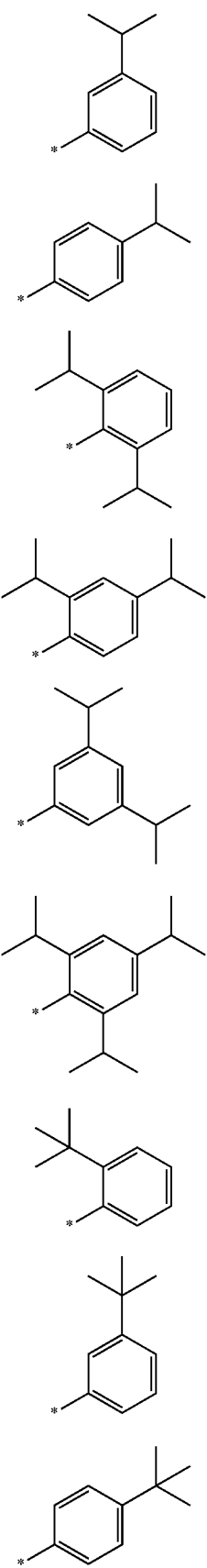
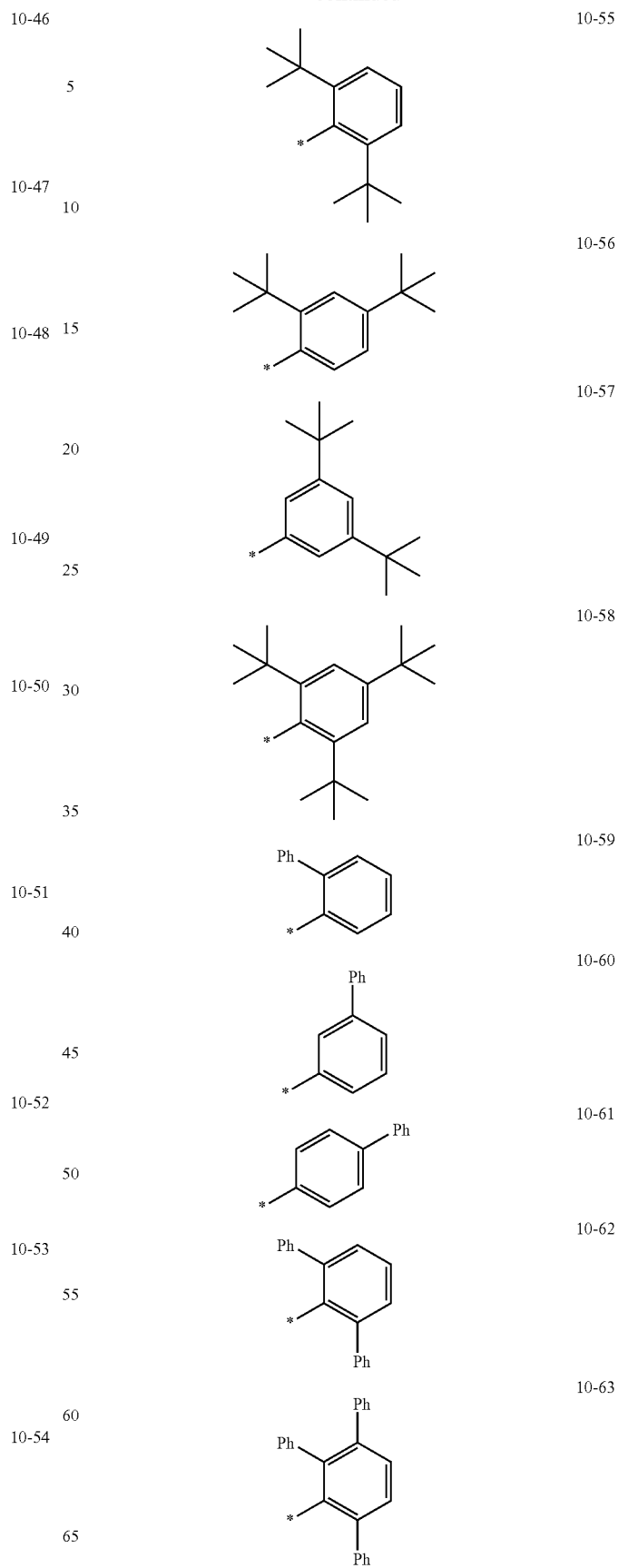

| | |
|---|---|
| 10-64 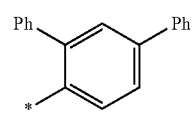 | 10-73 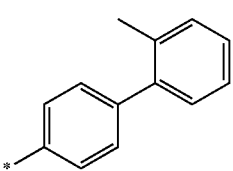 |
| 10-65 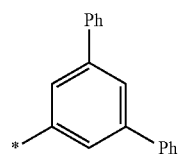 | 10-74 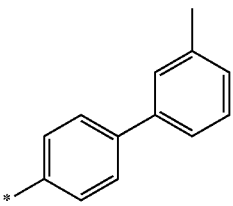 |
| 10-66 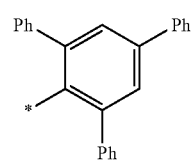 | 10-75 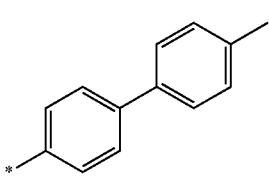 |
| 10-67 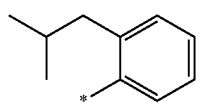 | 10-76 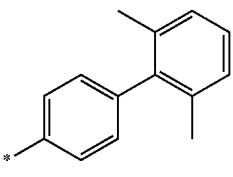 |
| 10-68 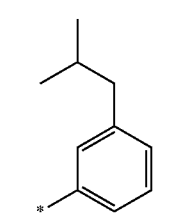 | 10-77 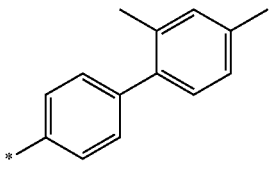 |
| 10-69 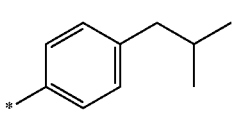 | 10-78 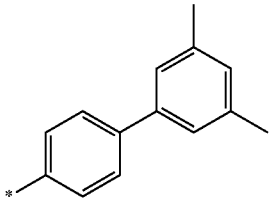 |
| 10-70 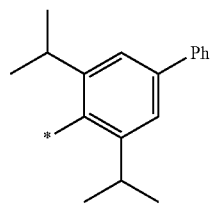 | 10-79 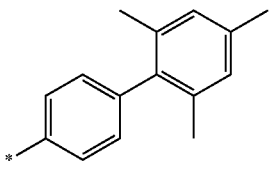 |
| 10-71 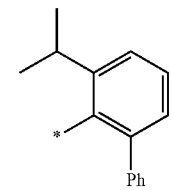 | 10-80 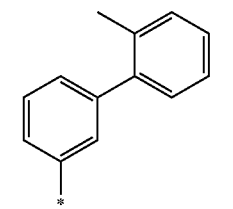 |
| 10-72 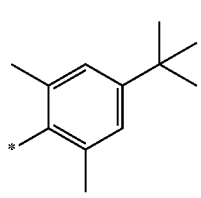 | |

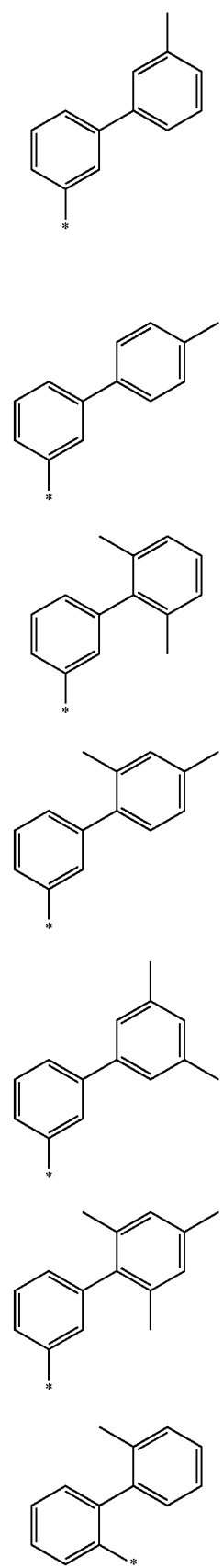
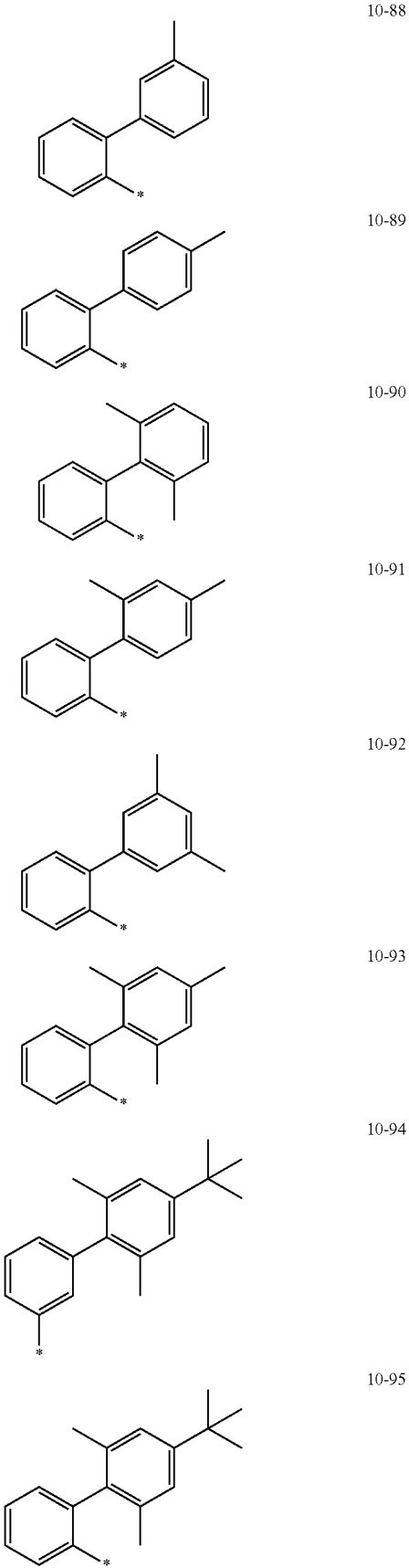

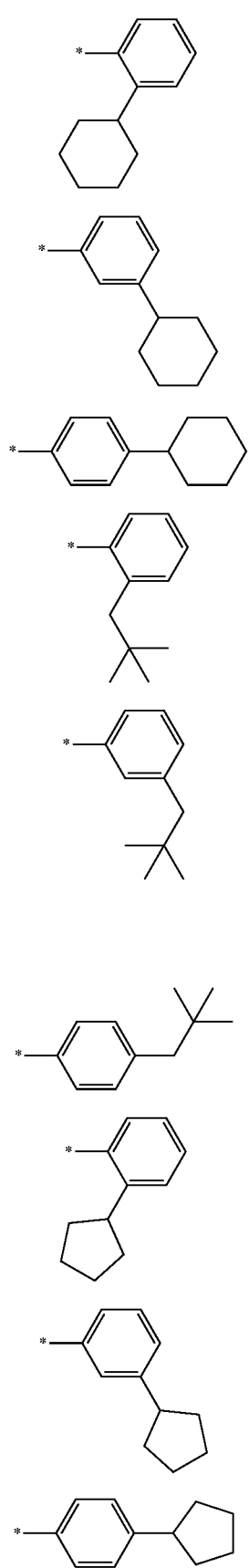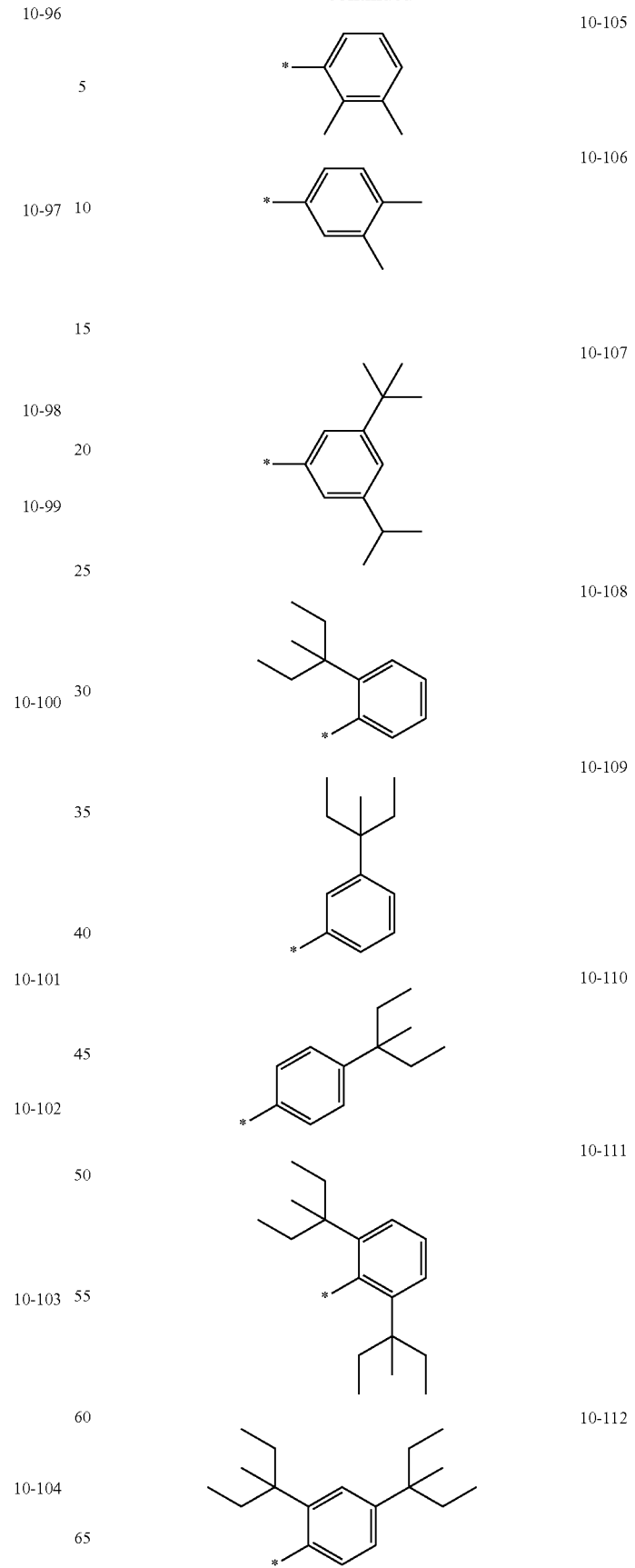

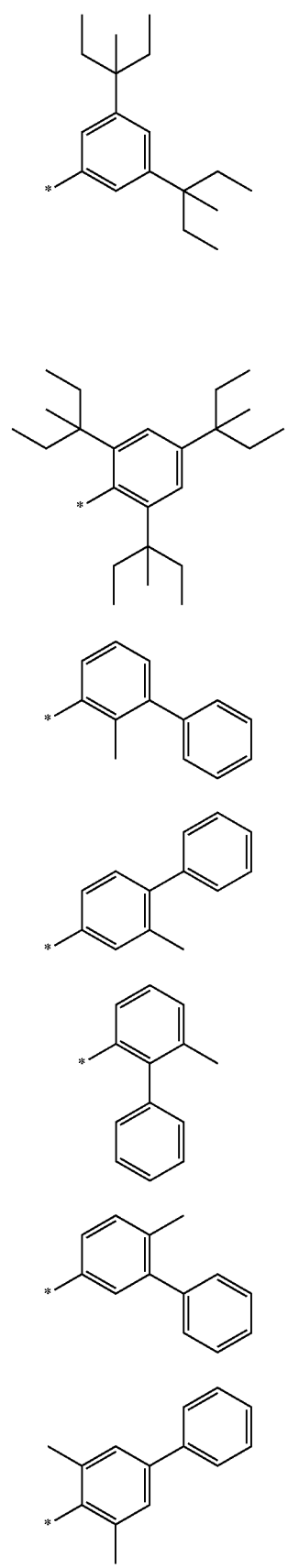
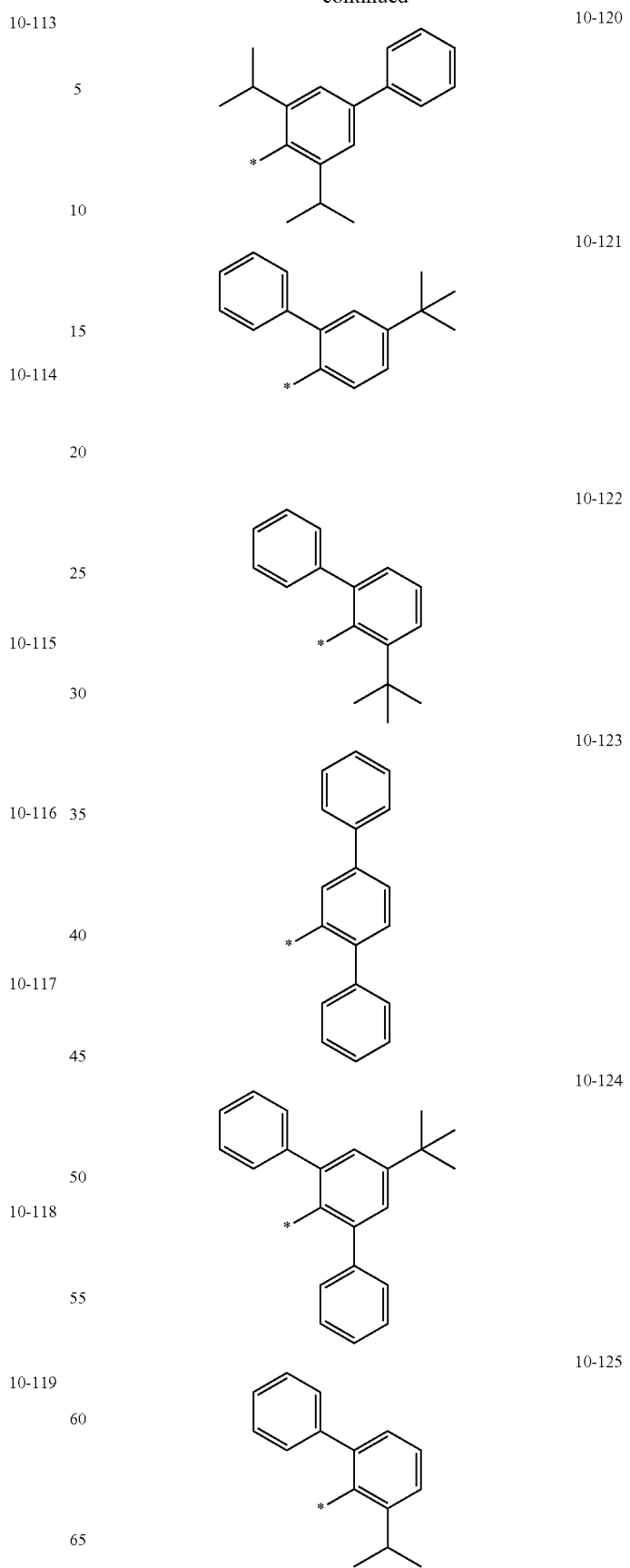

-continued
10-126
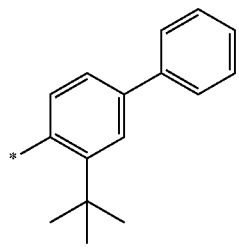
10-127
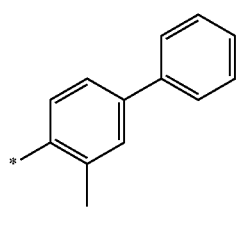
10-128
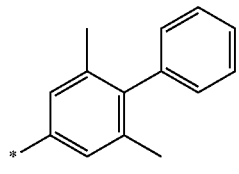
10-129
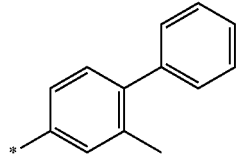
10-201
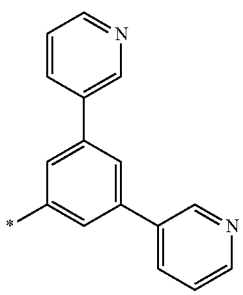
10-202
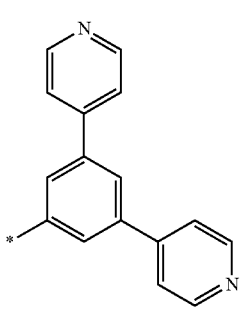
-continued
10-203
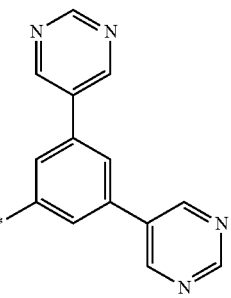
10-204
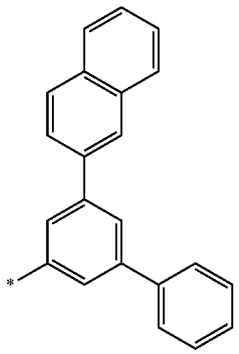
10-205
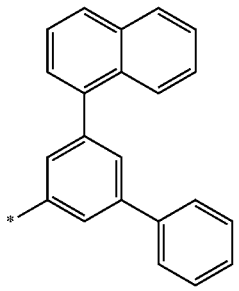
10-206
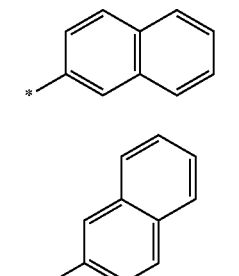
10-207
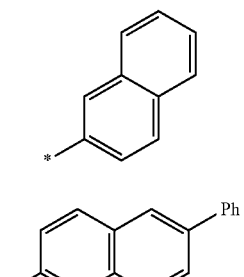
10-208
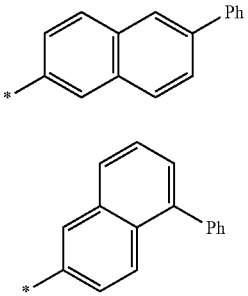
10-209

-continued
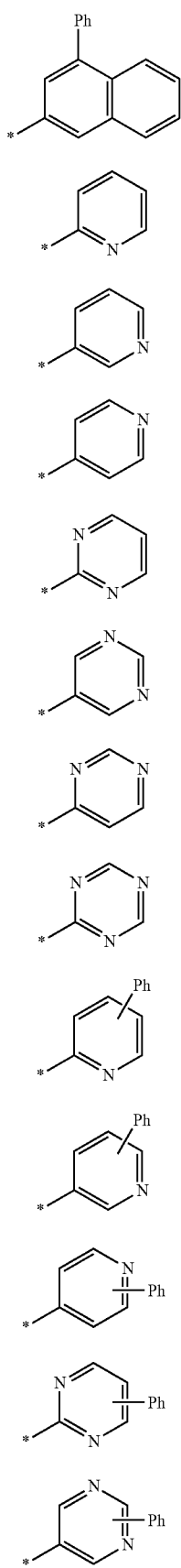
10-210
10-211
10-212
10-213
10-214
10-215
10-216
10-217
10-218
10-219
10-220
10-221
10-222
-continued
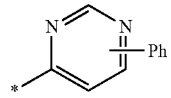 10-223
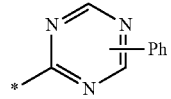 10-224
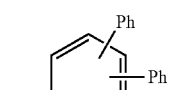 10-225
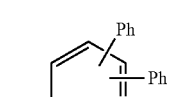 10-226
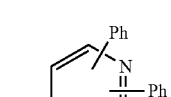 10-227
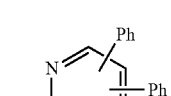 10-228
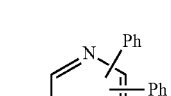 10-229
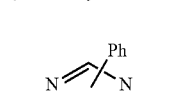 10-230
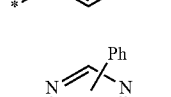 10-231
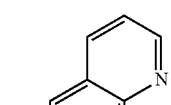 10-232
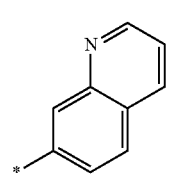 10-233

10-234
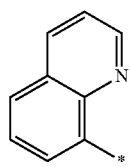
10-235
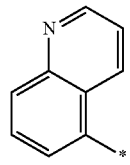
10-236
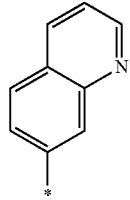
10-237
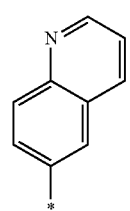
10-238
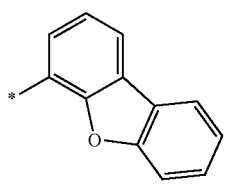
10-239
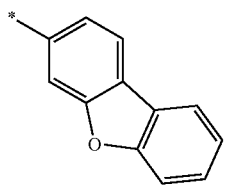
10-240
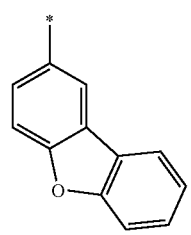
10-241
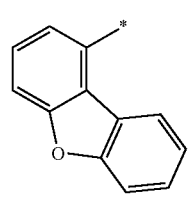
10-242
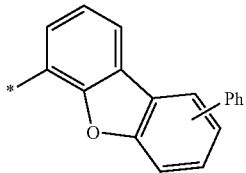
10-243
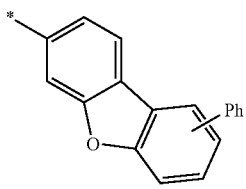
10-244
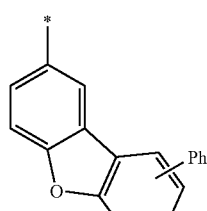
10-245
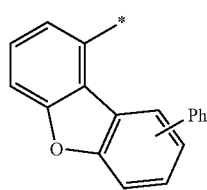
10-246
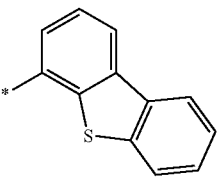
10-247
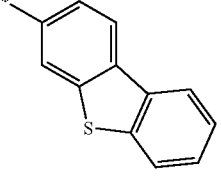
10-248
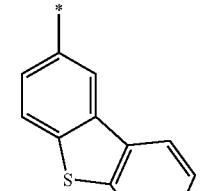
10-249
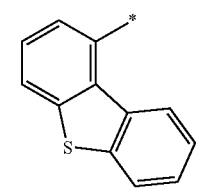

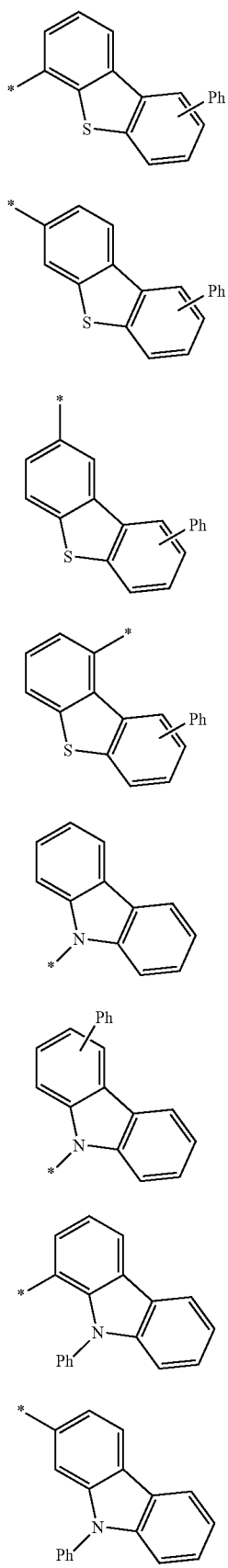
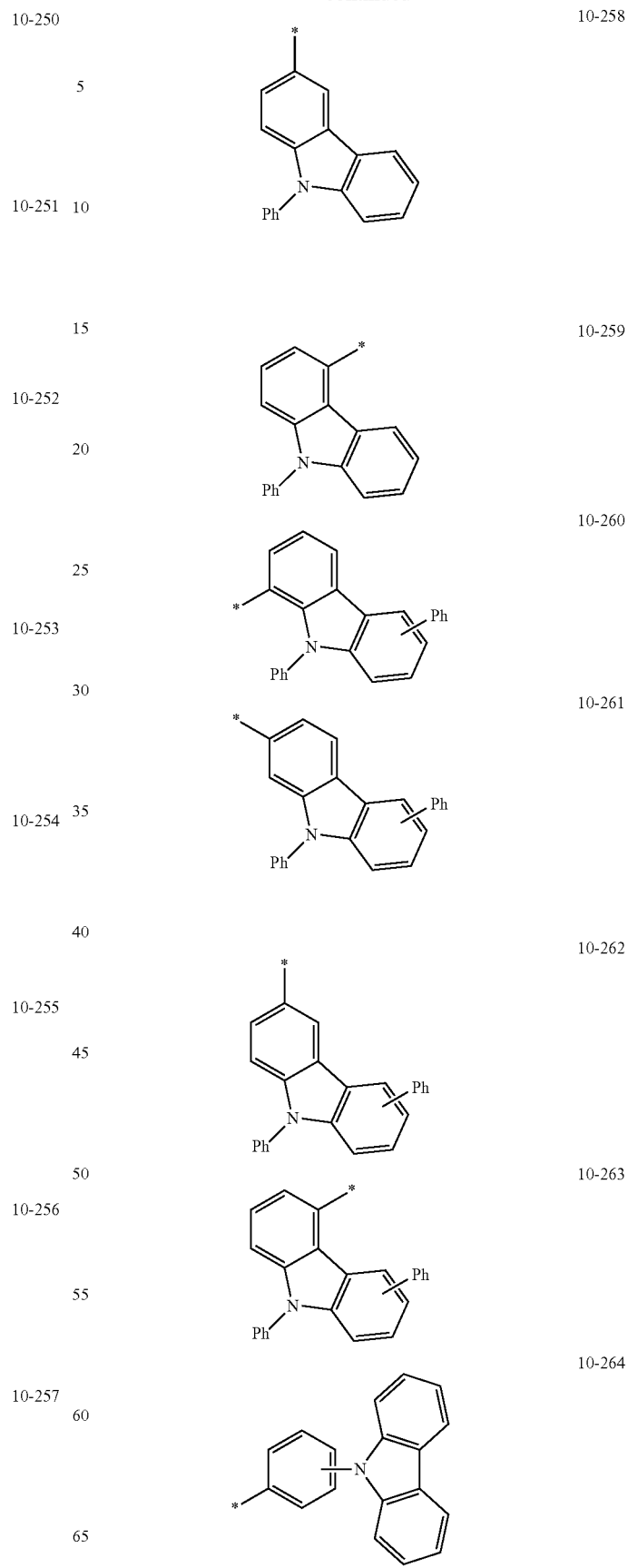

10-265 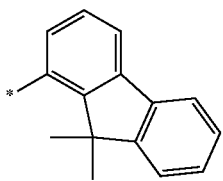
10-266 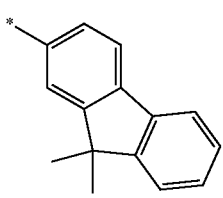
10-267 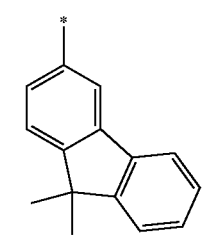
10-268 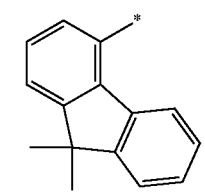
10-269 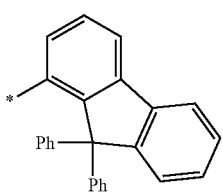
10-270 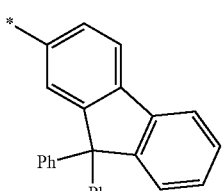
10-271 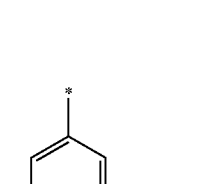
10-272 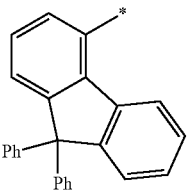
10-273 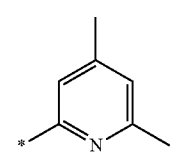
10-274 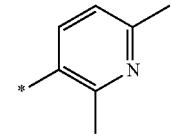
10-275 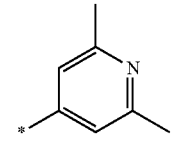
10-276 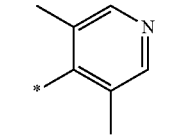
10-277 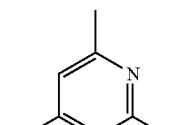
10-278 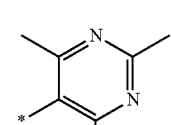
10-279 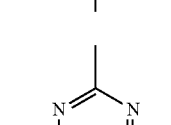
10-280 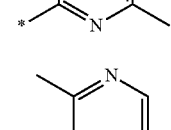
10-281 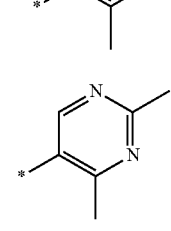

10-282 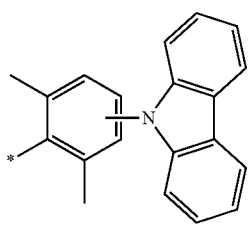
10-283 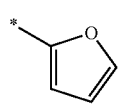
10-284 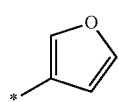
10-285 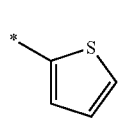
10-286 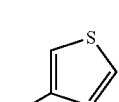
10-287 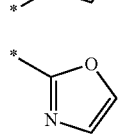
10-288 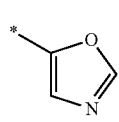
10-289 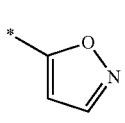
10-290 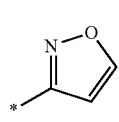
10-291 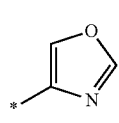
10-292 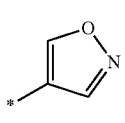
10-293 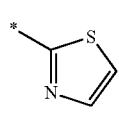
10-294 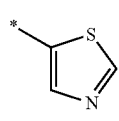
10-295 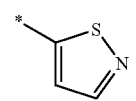
10-296 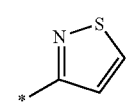
10-297 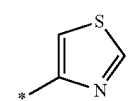
10-298 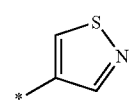
10-299 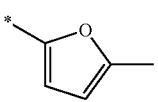
10-300 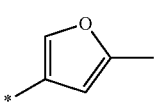
10-301 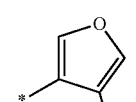
10-302 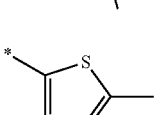
10-303 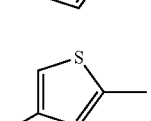
10-304 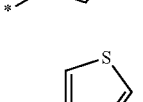
10-305 
10-306 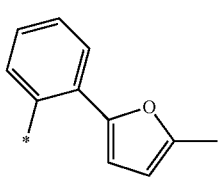

-continued
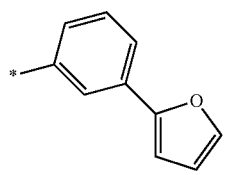 10-307
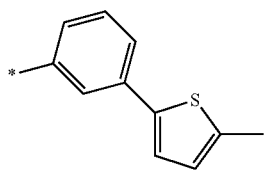 10-308
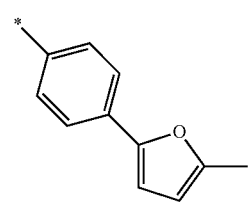 10-309
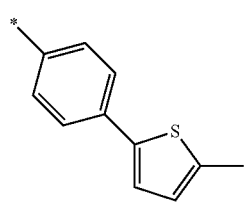 10-310
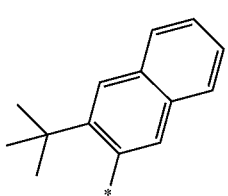 10-311
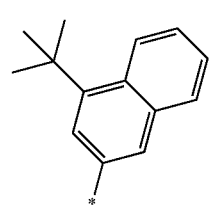 10-312
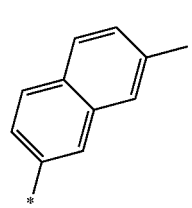 10-313
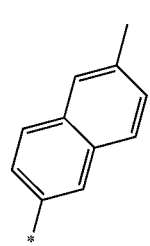 10-314
-continued
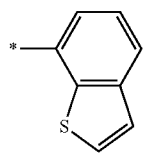 10-315
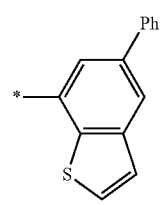 10-316
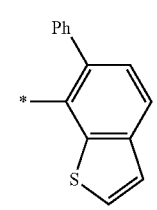 10-317
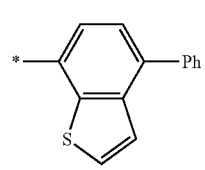 10-318
10-319
10-320
10-321
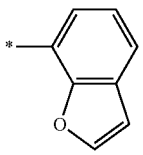 10-322

| | |
|---|---|
| 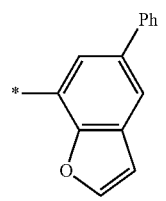 | 10-323 |
| 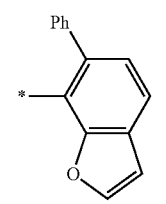 | 10-324 |
| 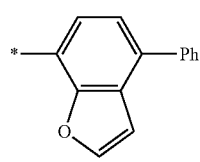 | 10-325 |
| 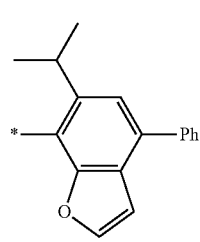 | 10-326 |
| 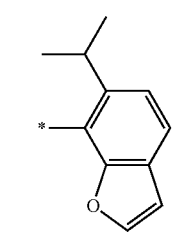 | 10-327 |
| 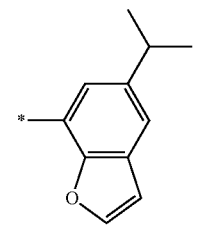 | 10-328 |
| 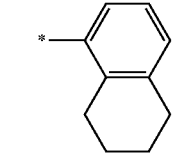 | 10-329 |
| 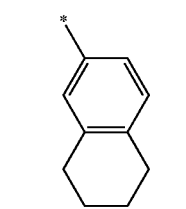 | 10-330 |
| | |
|---|---|
| 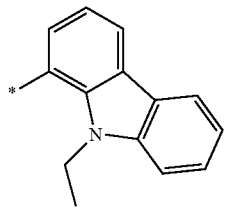 | 10-331 |
| 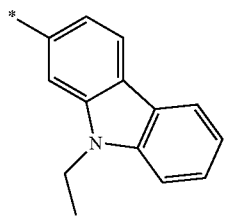 | 10-332 |
| 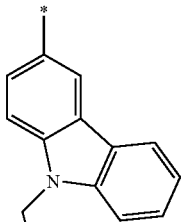 | 10-333 |
| 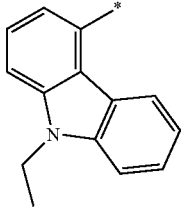 | 10-334 |
| 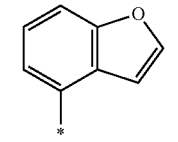 | 10-335 |
| 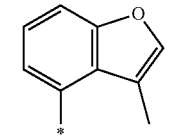 | 10-336 |
| 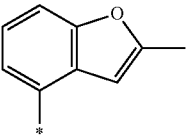 | 10-337 |
| 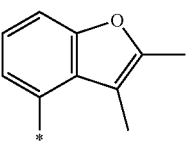 | 10-338 |

-continued 10-339 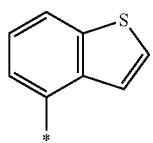

10-340 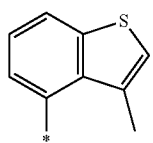

10-341 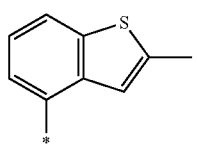

10-342 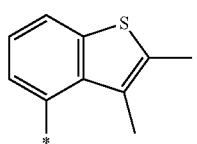

10-343 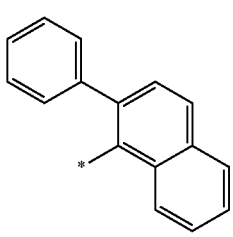

10-344 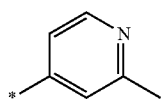

10-345 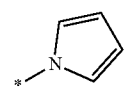

10-346 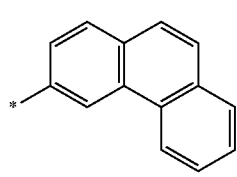

10-347 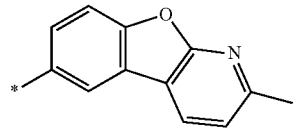

10-348 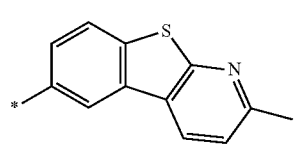

-continued 10-349 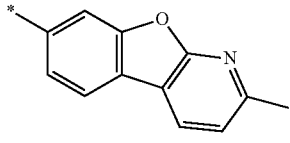

10-350 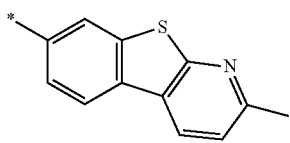

wherein, * in Formula 9-1 to 9-39, 9-201 to 9-237, 10-1 to 10-129 and 10-201 to 10-350 is a binding site to a neighboring atom, Ph is a phenyl group, TMS is a trimethylsilyl group, and TMG is a trimethylgermyl group.

The "group represented by one of Formulae 9-1 to 9-39 wherein at least one hydrogen is substituted with deuterium" and the "group represented by one of Formulae 9-201 to 9-237 wherein at least one hydrogen is substituted with deuterium" may be, for example, a group represented by one of Formulae 9-501 to 9-514 and 9-601 to 9-636:

9-501 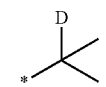

9-502 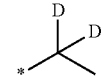

9-503 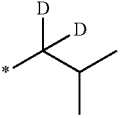

9-504 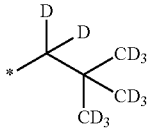

9-505 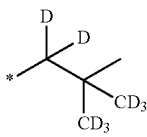

9-506 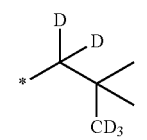

9-507 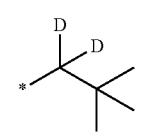

9-508 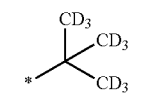

9-509 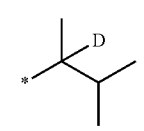
9-510 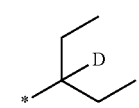
9-511 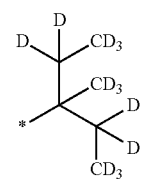
9-512 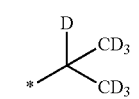
9-513 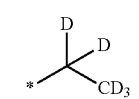
9-514 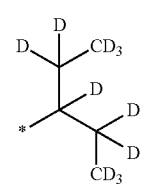
9-601 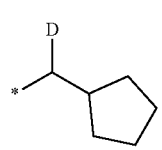
9-602 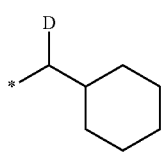
9-603 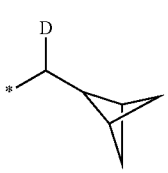
9-604 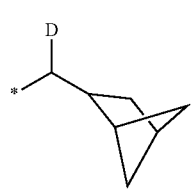
9-605 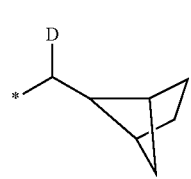
9-606 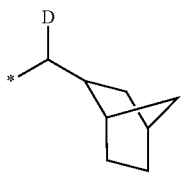
9-607 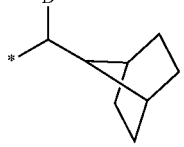
V8 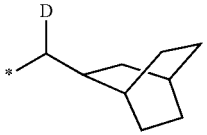
9-609 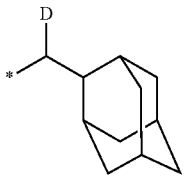
9-610 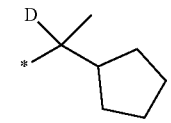
9-611 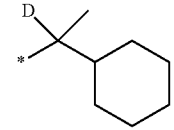
9-612 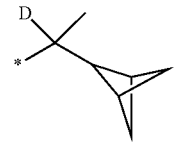
9-613 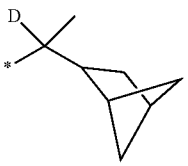
9-614 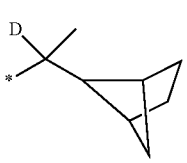
9-615 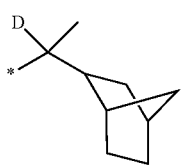

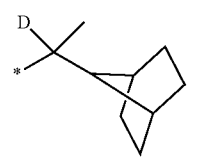
9-616
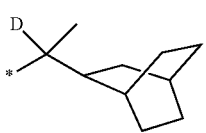
9-617
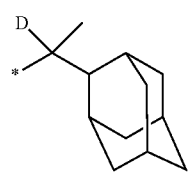
9-618
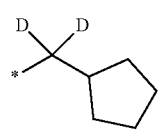
9-619
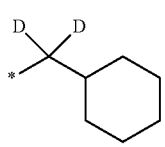
9-620
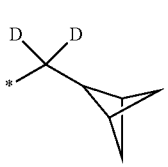
9-621
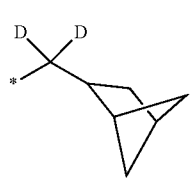
9-622
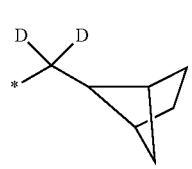
9-623
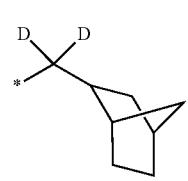
9-624
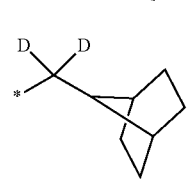
9-625
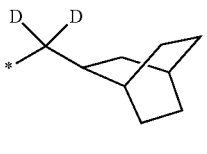
9-626
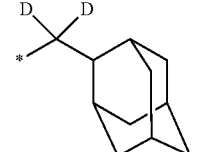
9-627
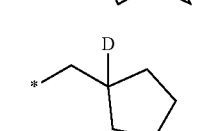
9-628
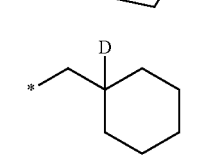
9-629
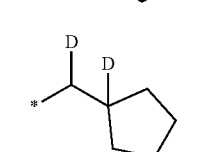
9-630
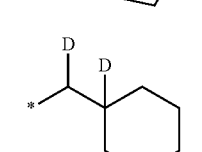
9-631
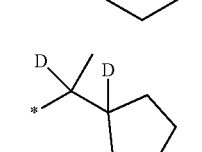
9-632
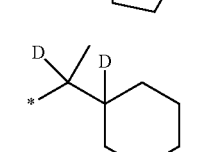
9-633
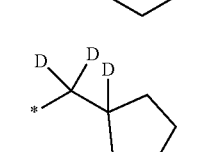
9-634
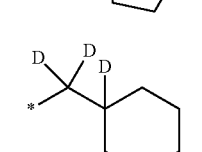
9-635
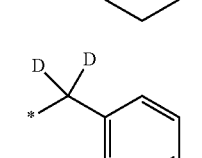
9-636

The "group represented by one of Formulae 9-1 to 9-39 wherein at least one hydrogen is substituted with —F" and the "group represented by one of Formulae 9-201 to 9-236 wherein at least one hydrogen is substituted with —F" may be, for example, a group represented by one of Formulae 9-701 to 9-710:

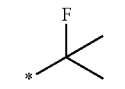
9-701

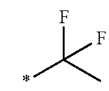
9-702

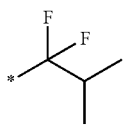
9-703

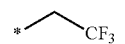
9-704

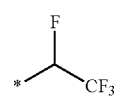
9-705

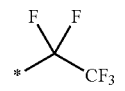
9-706

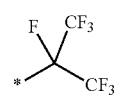
9-707

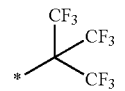
9-708

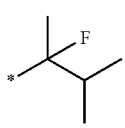
9-709

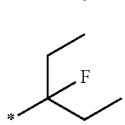
9-710

The "group represented by one of Formulae 10-1 to 10-129 wherein at least one hydrogen is substituted with deuterium" and "the group represented by one of Formulae 10-201 to 10-350 wherein at least one hydrogen is substituted with deuterium" may be, for example, a group represented by one of Formulae 10-501 to 10-553:

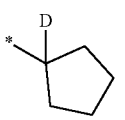
10-501

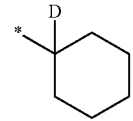
10-502

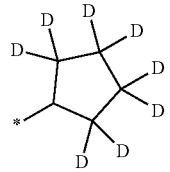
10-503

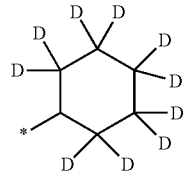
10-504

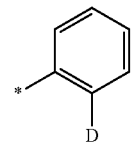
10-505

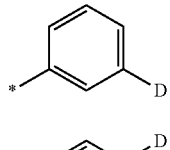
10-506

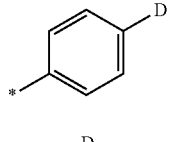
10-507

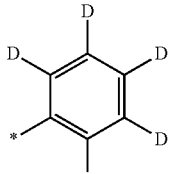
10-508

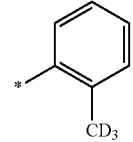
10-509

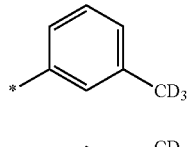
10-510

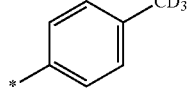
10-511

10-512
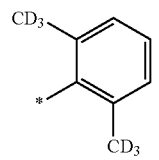
10-513
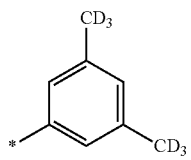
10-514
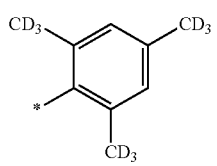
10-515
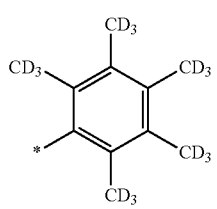
10-516
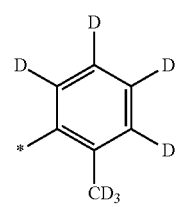
10-517
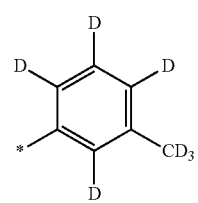
10-518
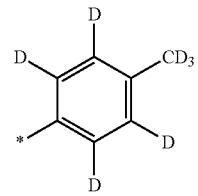
10-519
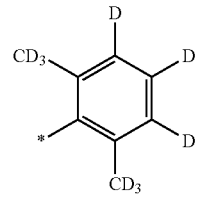
10-520
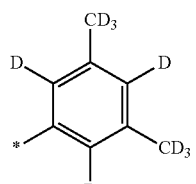
10-521
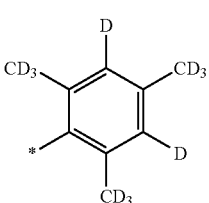
10-522
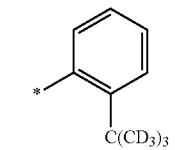
10-523
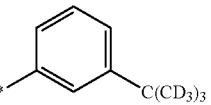
10-524
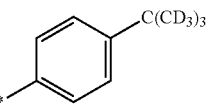
10-525
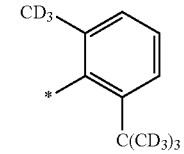
10-526
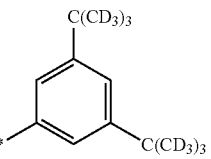
10-527
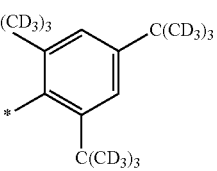
10-528
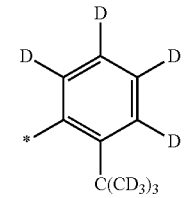

| 10-529 | 10-536 |
| 10-530 | 10-537 |
| 10-531 | 10-538 |
| 10-532 | 10-540 |
| 10-533 | 10-541 |
| 10-534 | 10-542 |
| 10-535 | 10-543 |

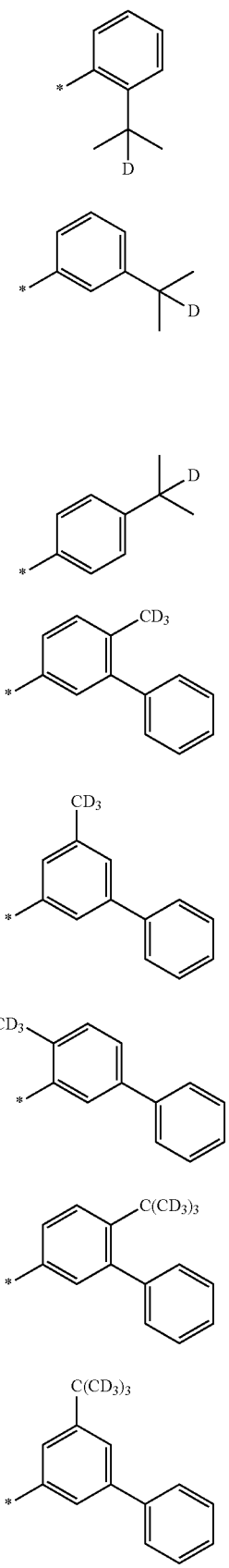
10-544
10-545
10-546
10-547
10-548
10-549
10-550
10-551
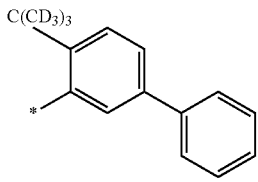
10-552
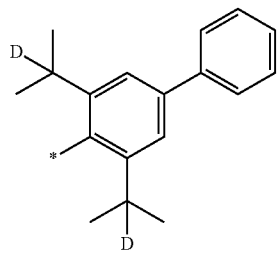
10-553
The "group represented by one of Formulae 10-1 to 10-129 wherein at least one hydrogen is substituted with —F" and "the group represented by one Formulae 10-201 to 10-350 wherein at least one hydrogen is substituted with —F" may be, for example, a group represented by one of Formulae 10-601 to 10-617:
10-601
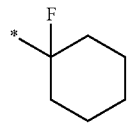
10-602
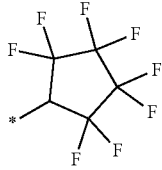
10-603
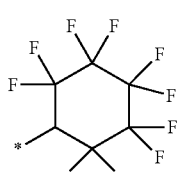
10-604
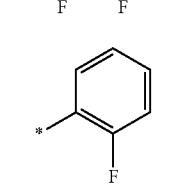
10-605
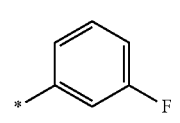
10-606

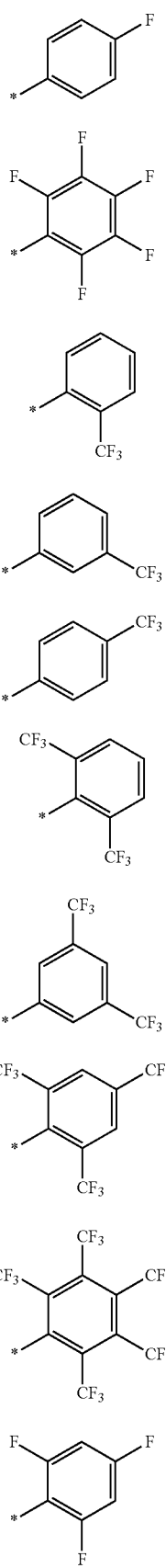

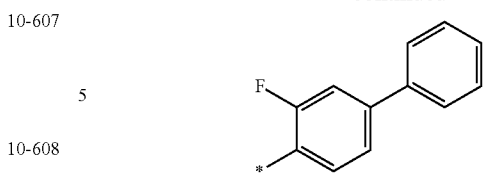

In Formulae CY1-1 to CY1-9, a0 indicates the number of groups $R_0$, and may be an integer from 0 to 20. When a0 is 2 or more, two or more of $R_0$(s) may be identical to or different from each other. For example, a0 may be an integer from 0 to 8.

In one or more embodiments, at least one of $R_{21}$ to $R_{26}$ of Formula 1 may not be hydrogen.

In one or more embodiments, at least one of $R_{23}$ to $R_{26}$ of Formula 1 may not be hydrogen.

In an embodiment, at least one of $R_{21}$ to $R_{26}$ of Formula 1 may each independently be:

deuterium, —F, or a cyano group;

a $C_1$-$C_{20}$ alkyl group unsubstituted or substituted with deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or a combination thereof;

a $C_3$-$C_{10}$ cycloalkyl group, a $C_1$-$C_{10}$ heterocycloalkyl group, a phenyl group, a biphenyl group, a naphthyl group, a pyridinyl group, a fluorenyl group, a carbazolyl group, a dibenzofuranyl group, or a bibenzothiophenyl group, unsubstituted or substituted with deuterium, —F, a cyano group, a $C_1$-$C_{20}$ alkyl group, a deuterated $C_1$-$C_{20}$ alkyl group, a $C_1$-$C_{20}$ fluorinated alkyl group, a $C_1$-$C_{20}$ alkoxy group, a deuterated $C_1$-$C_{20}$ alkoxy group, a $C_1$-$C_{20}$ fluorinated alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl) dibenzothiophenyl group, or a combination thereof, or —Si($Q_3$)($Q_4$)($Q_5$), or —Ge($Q_3$)($Q_4$)($Q_5$).

In an embodiment, at least one of $R_{23}$ to $R_{26}$ of Formula 1 may each independently be $-Si(Q_3)(Q_4)(Q_5)$, or $-Ge(Q_3)(Q_4)(Q_5)$.

In one or more embodiments, ring $CY_1$ in Formula 1 may be a group represented by one of Formulae CY1-1 to CY1-3, at least one group $R_0$ in the number of a0 of Formulae CY1-1 to CY1-3 may each independently be deuterium, $-F$, a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

In one or more embodiments, ring $CY_1$ in Formula 1 may be a group represented by one of Formulae CY1-1 to CY1-3, and at least one of $R_{23}$ to $R_{26}$ may not be hydrogen.

In one or more embodiments, ring $CY_1$ in Formula 1 may be a group represented by Formula CY1-4, CY1-5 or CY1-7. For example, $X_{17}$ in Formulae CY1-4, CY1-5 and CY1-7 may be O, S or Se.

In one or more embodiments, ring $CY_1$ in Formula 1 may be a group represented by Formula CY1-4 or CY1-5. For example, $X_{17}$ in Formulae CY1-4 and CY1-5 may be O or S. In one or more embodiments, in Formulae CY1-4 and CY1-5, $X_{11}$ may be $C(R_{11})$, and $X_{12}$ may be $C(R_{12})$.

In one or more embodiments, a group represented by one of Formulae CY1-1 to CY1-3 may be a group represented by one of Formulae CY1(1) to CY1(15):

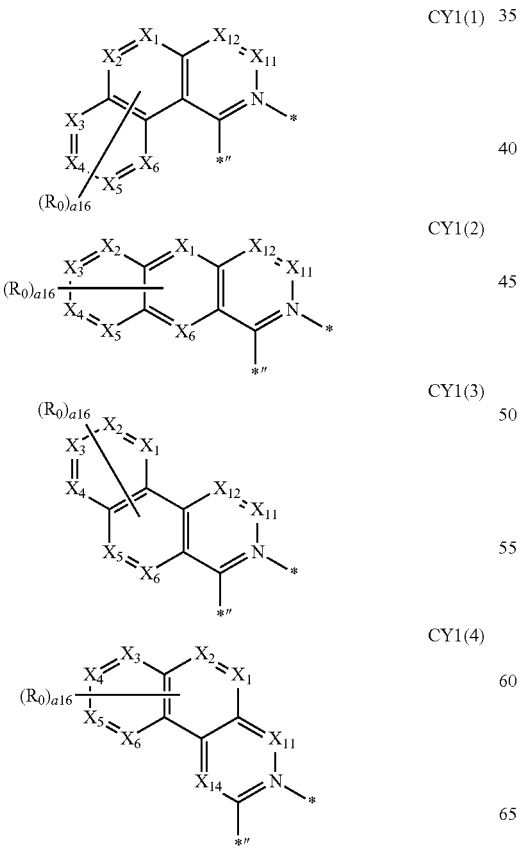

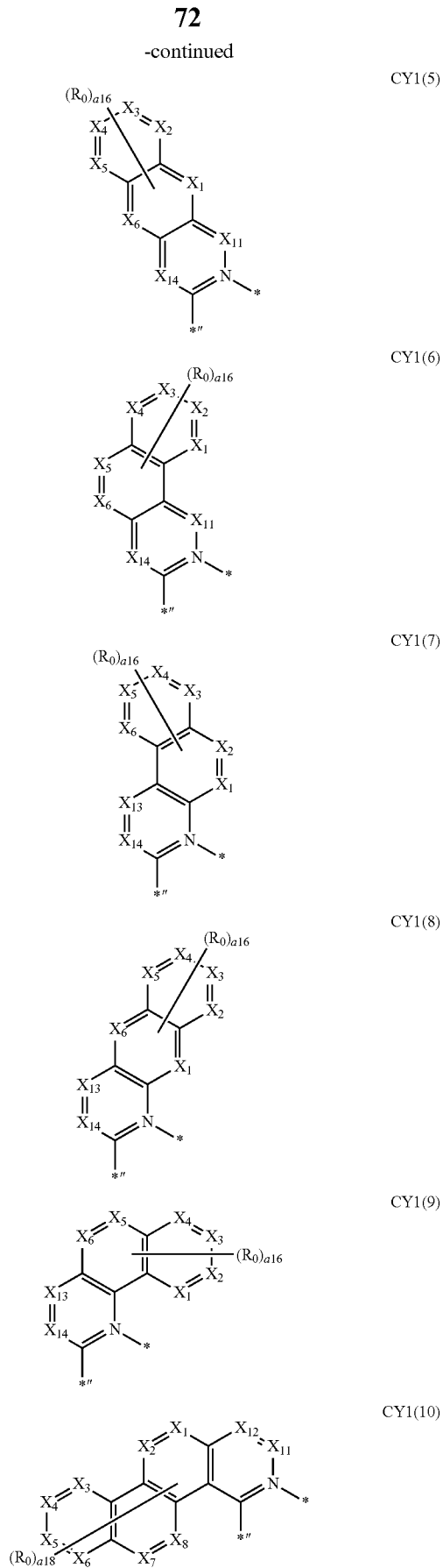

-continued

CY1(11)
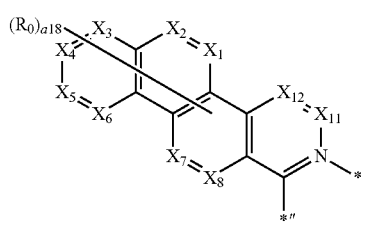

CY1(12)
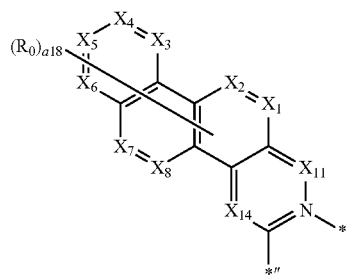

CY1(13)
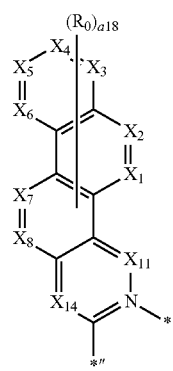

CY1(14)
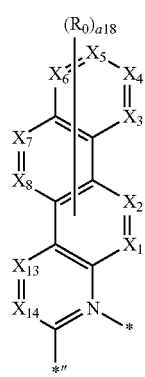

CY1(15)
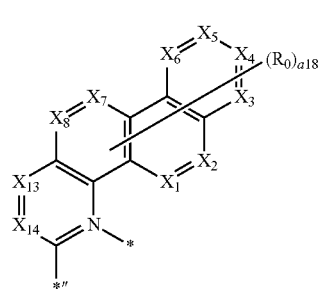

wherein, in Formulae CY1(1) to CY1(15), $X_{11}$ to $X_{14}$ and $R_0$ are each as described herein, $X_1$ to $X_8$ may each independently be C or N, wherein at least one of $X_1$ to $X_6$ of Formulae CY1(1) to CY1(9) may be C, and at least one of $X_1$ to $X_8$ of Formulae CY1(10) to CY1(15) may be C, a16 may be an integer from 0 to 6, a18 may be an integer from 0 to 8, \* is a binding site to Ir in Formula 1, and \*'' is a binding site to a neighboring carbon atom in Formula 1.

For example, in one or more embodiments, $X_1$ to $X_6$ of Formulae CY1(1) to CY1(9) may be C, and $X_1$ to $X_8$ of Formulae CY1(10) to CY1(15) may be C.

In one or more embodiments, a group represented by one of Formulae CY1-1 to CY1-3 may be a group represented by one of Formulae 3-1 to 3-210:

3-1
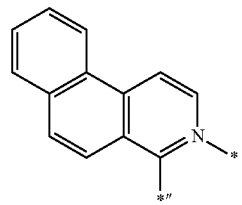

3-2
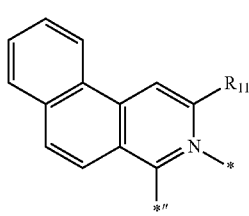

3-3
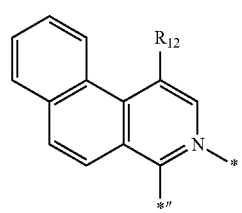

3-4
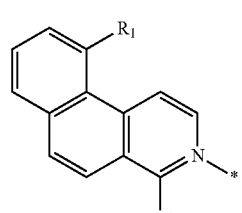

3-5
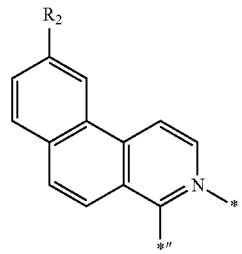

-continued
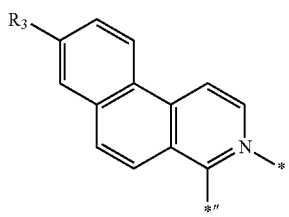
3-6
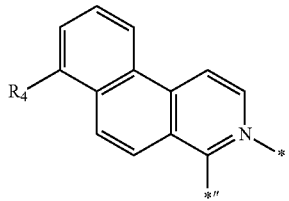
3-7
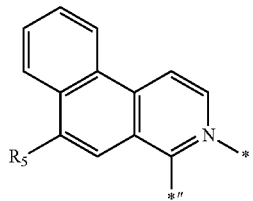
3-8
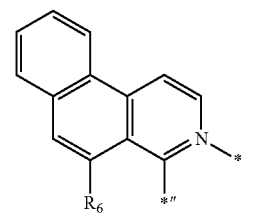
3-9
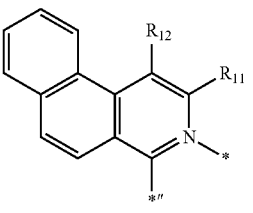
3-10
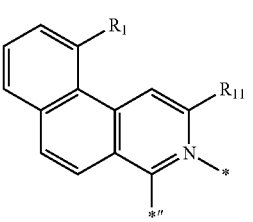
3-11
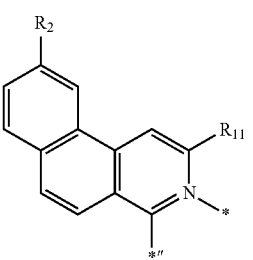
3-12
-continued
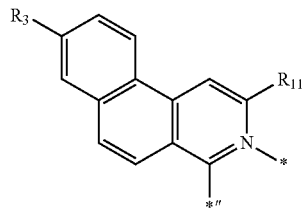
3-13
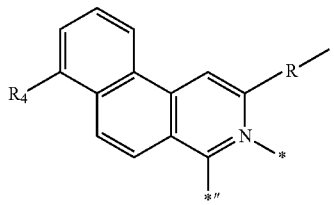
3-14
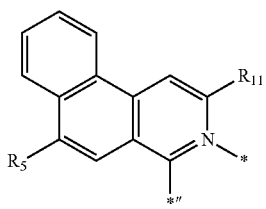
3-15
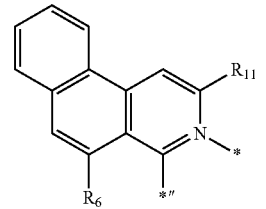
3-16
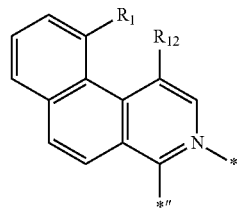
3-17
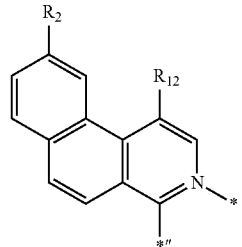
3-18
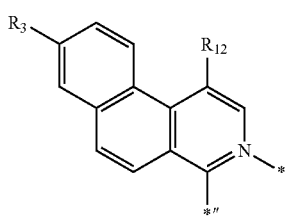
3-19

3-20 through 3-32 (chemical structures)

-continued
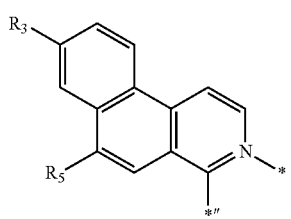
3-33
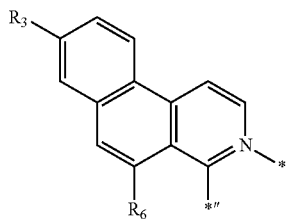
3-34
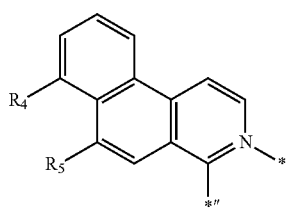
3-35
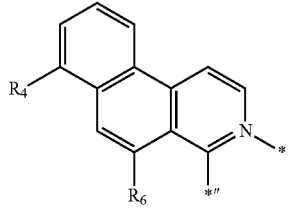
3-36
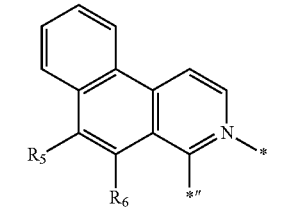
3-37
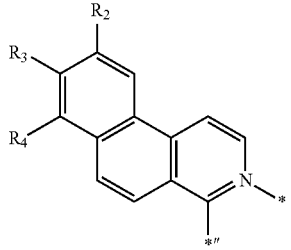
3-38
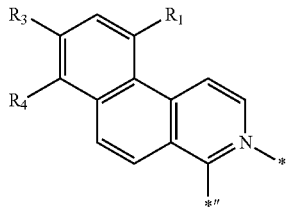
3-39
-continued
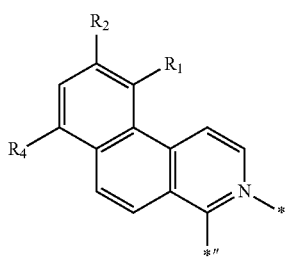
3-40
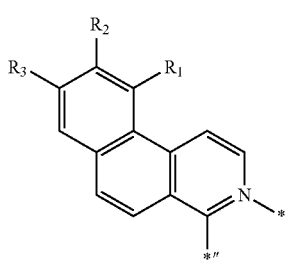
3-41
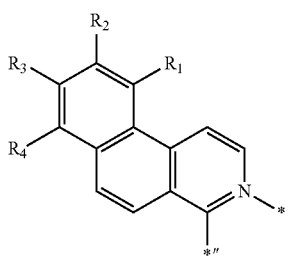
3-42
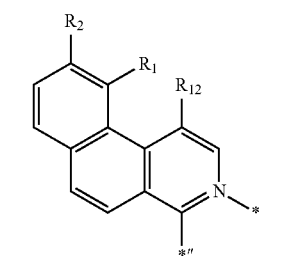
3-43
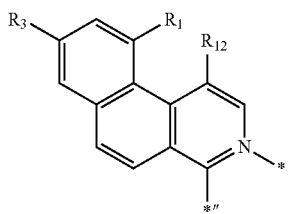
3-44
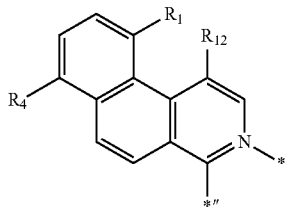
3-45

3-46
3-47
3-48
3-49
3-50
3-51
3-52
3-53
3-54
3-55
3-56
3-57
3-58
3-59

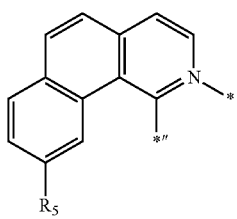
3-60
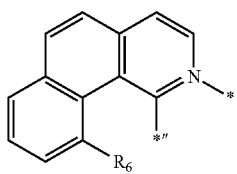
3-61
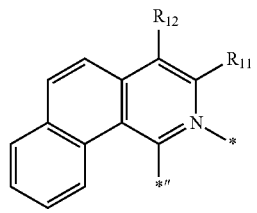
3-62
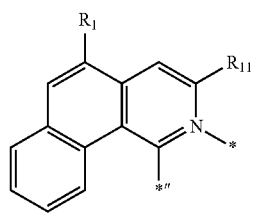
3-63
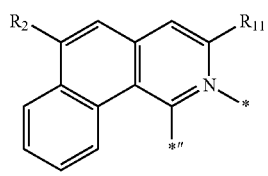
3-64
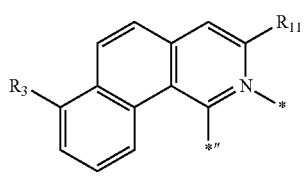
3-65
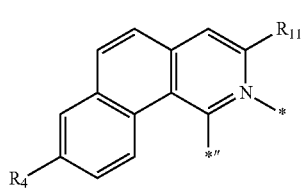
3-66
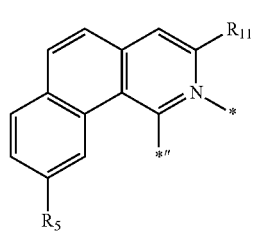
3-67
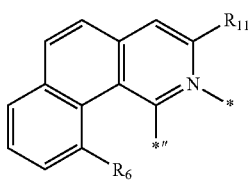
3-68
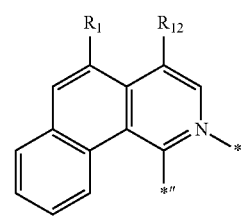
3-69
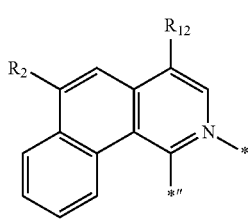
3-70
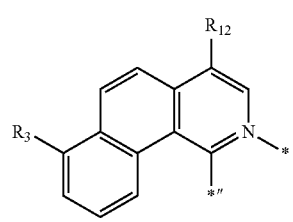
3-71
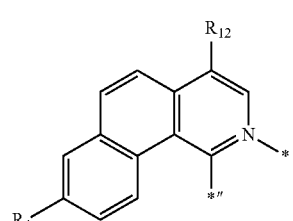
3-72
3-73
3-74
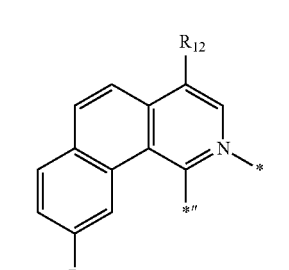

| | |
|---|---|
| 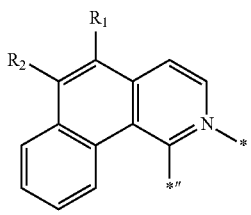 3-75 | 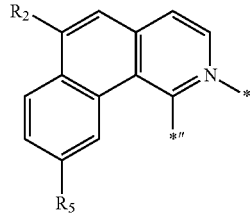 3-82 |
| 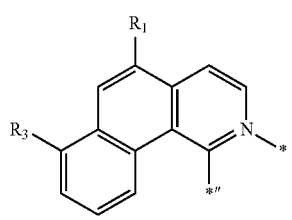 3-76 | 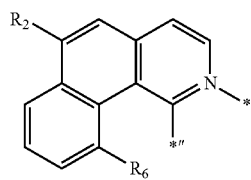 3-83 |
| 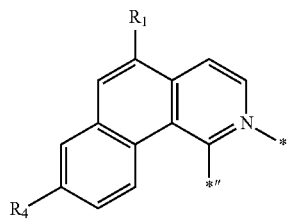 3-77 | 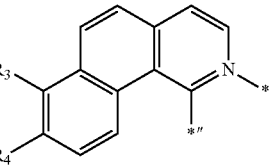 3-84 |
| 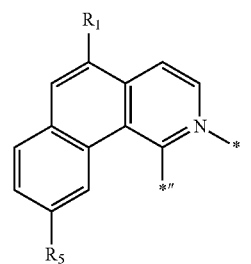 3-78 | 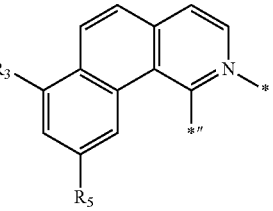 3-85 |
| 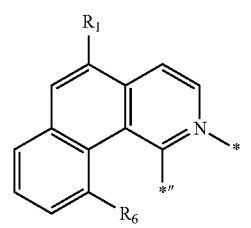 3-79 | 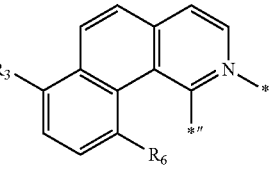 3-86 |
| 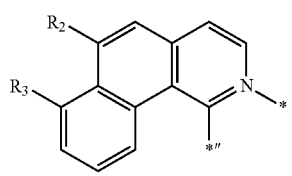 3-80 | 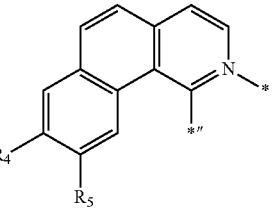 3-87 |
| 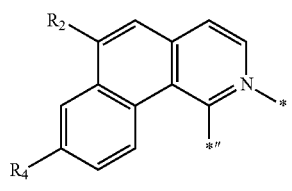 3-81 | 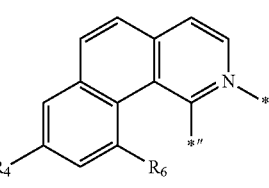 3-88 |
| | 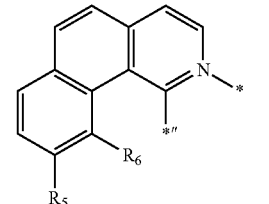 3-89 |

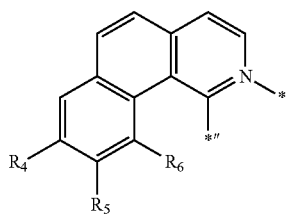 3-90
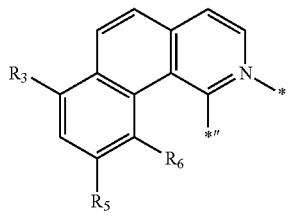 3-91
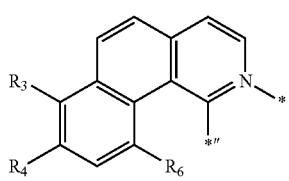 3-92
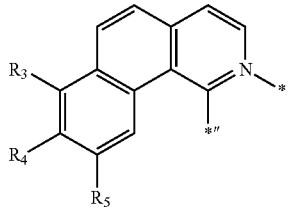 3-93
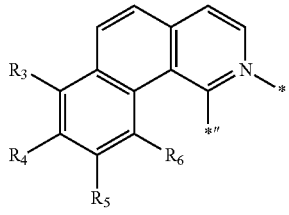 3-94
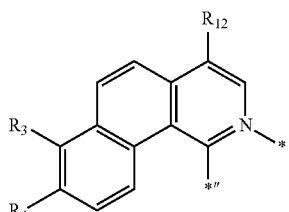 3-95
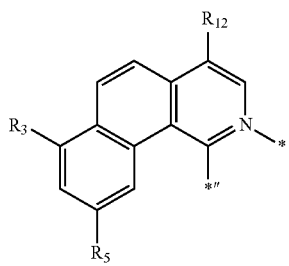 3-96
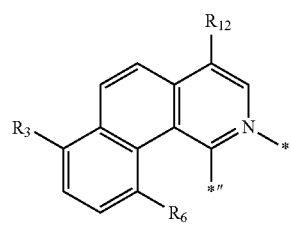 3-97
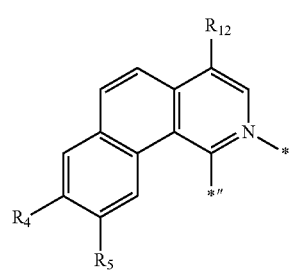 3-98
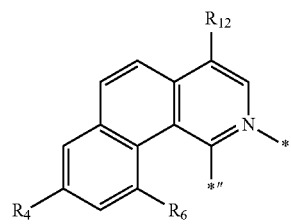 3-99
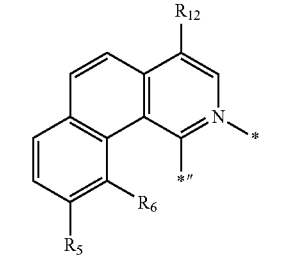 3-100
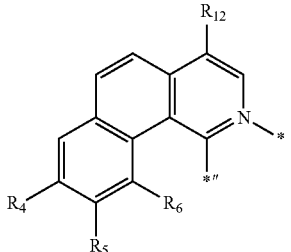 3-101
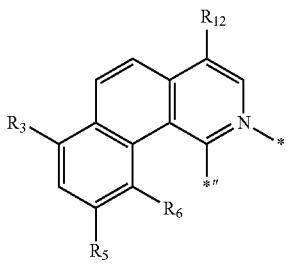 3-102

3-103 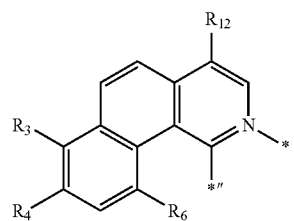
3-104 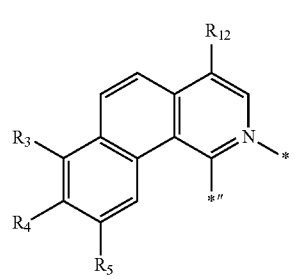
3-105 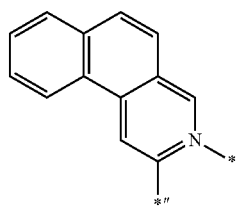
3-106 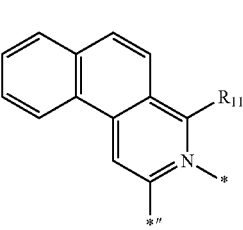
3-107 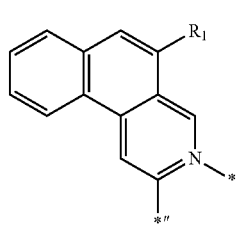
3-108 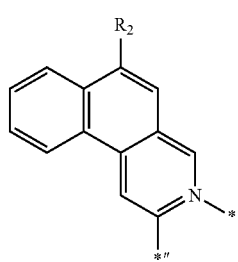
3-109 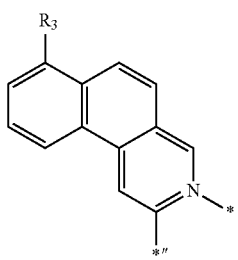
3-110 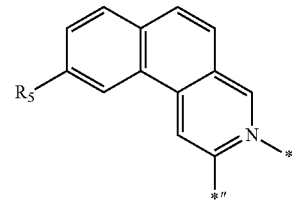
3-111 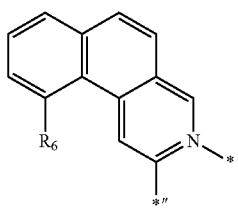
3-112 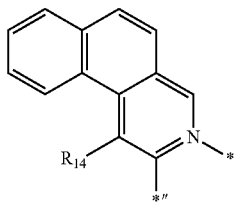
3-113 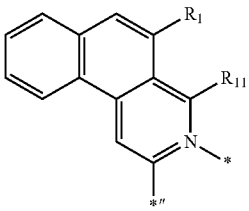
3-114 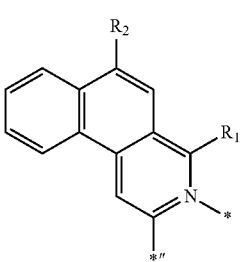
3-115 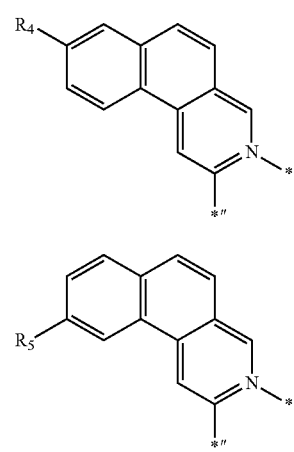

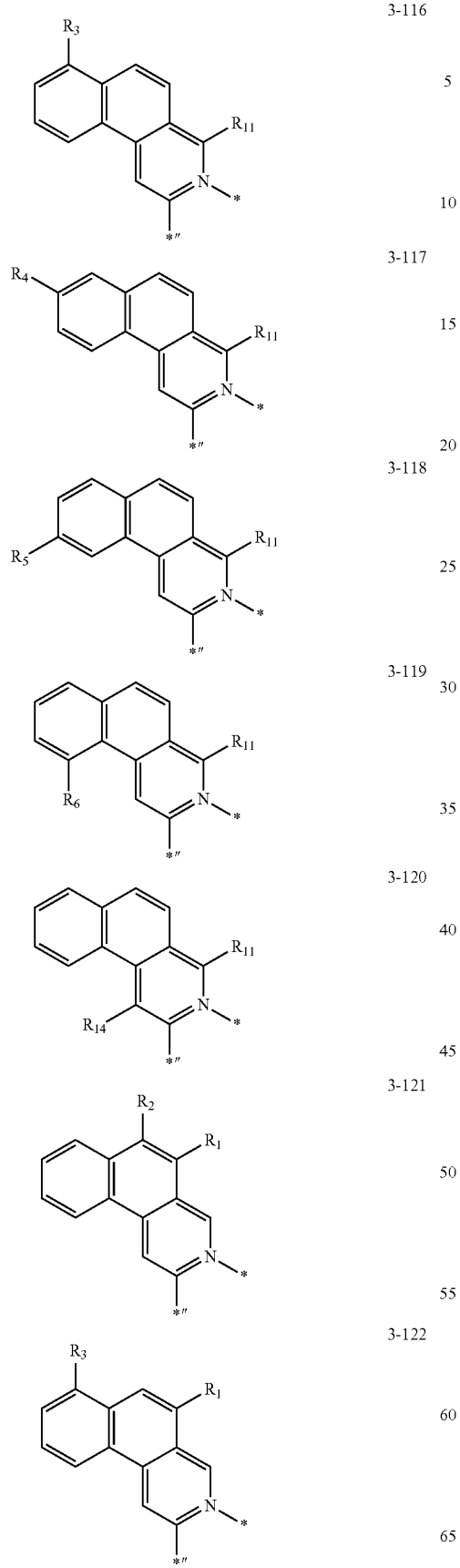
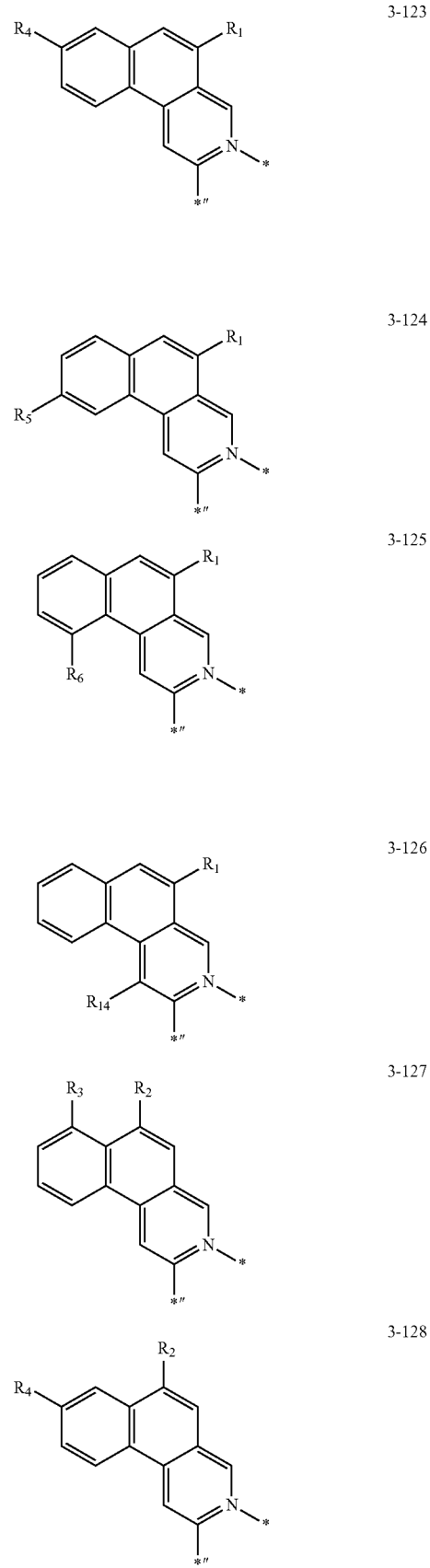

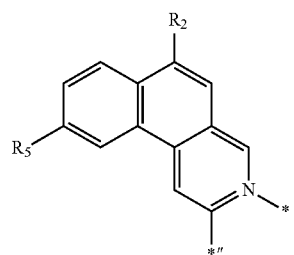
3-129
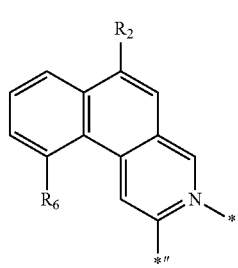
3-130
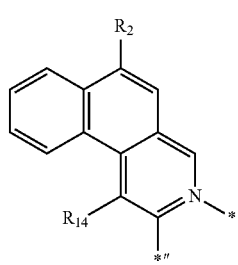
3-131
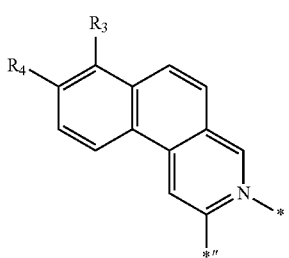
3-132
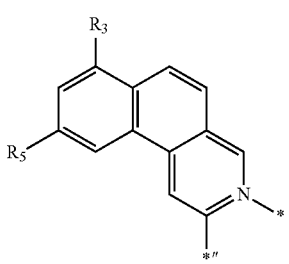
3-133
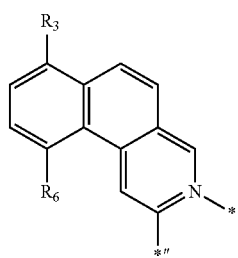
3-134
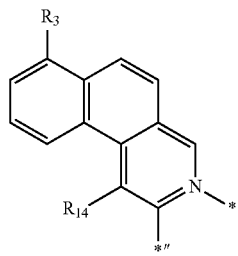
3-135
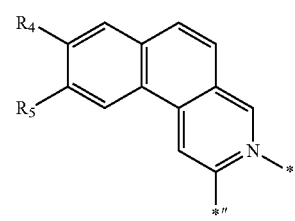
3-136
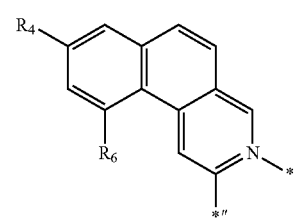
3-137
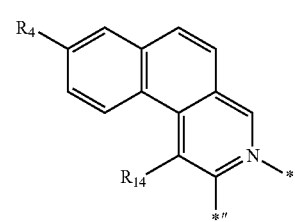
3-138
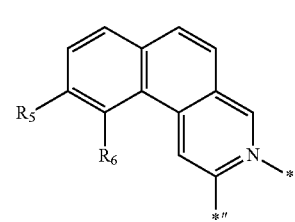
3-139
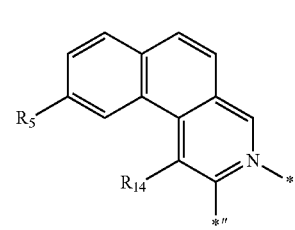
3-140
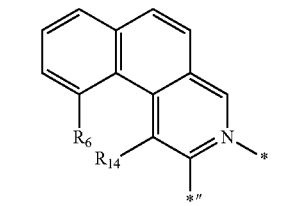
3-141

3-142 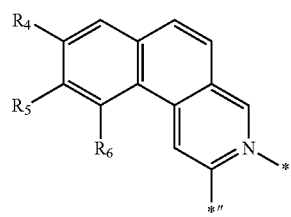
3-143 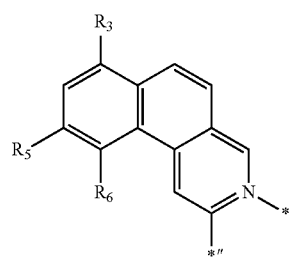
3-144 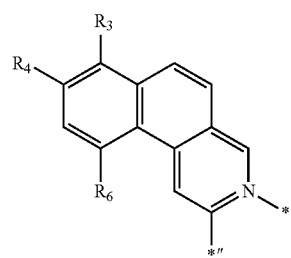
3-145 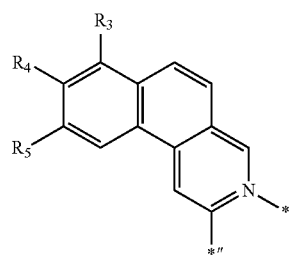
3-146 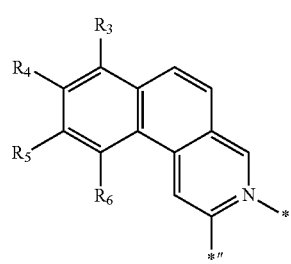
3-147 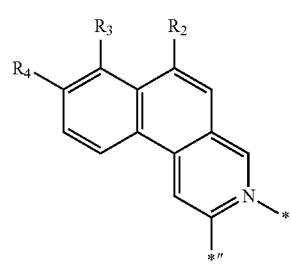
3-148 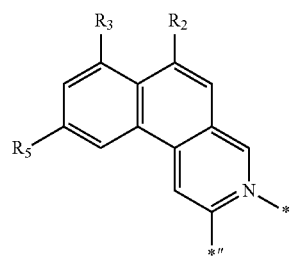
3-149 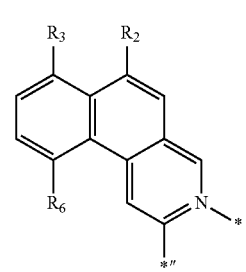
3-150 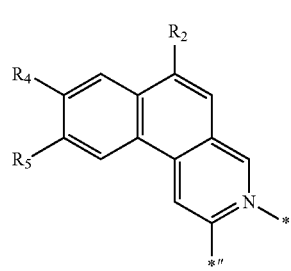
3-151 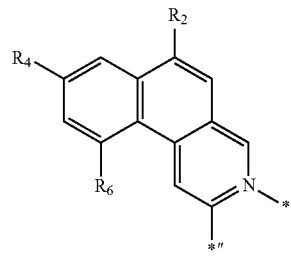
3-152 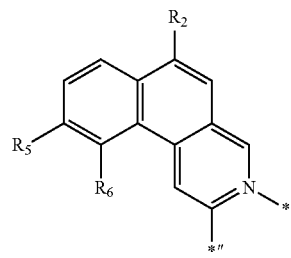
3-153 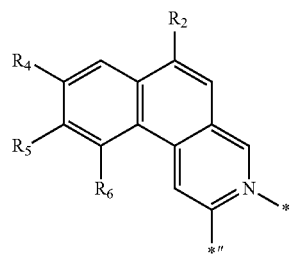

-continued
3-154
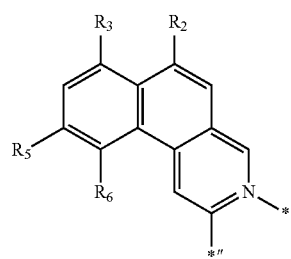
3-155
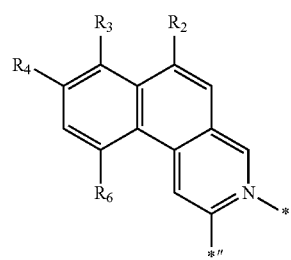
3-156
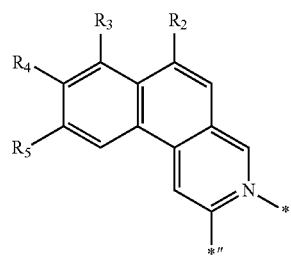
3-157
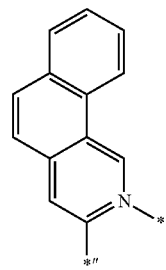
3-158
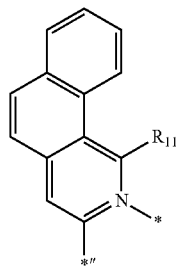
3-159
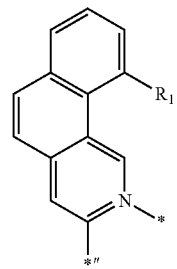
-continued
3-160
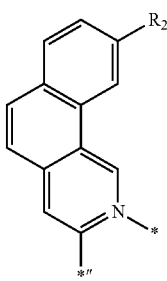
3-161
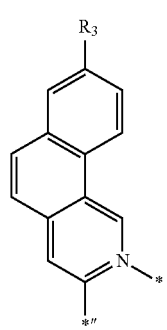
3-162
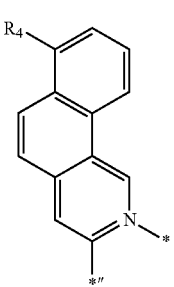
3-163
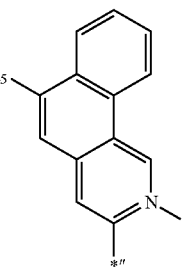
3-164
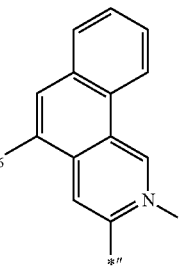

3-165
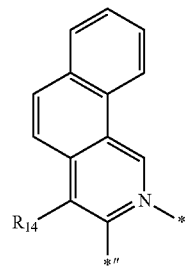
3-166
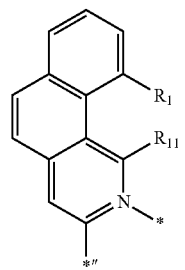
3-167
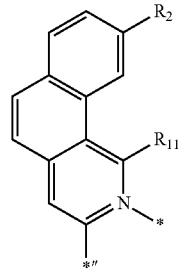
3-168
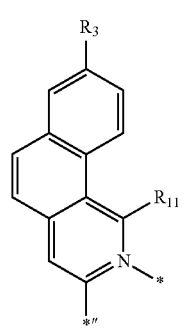
3-169
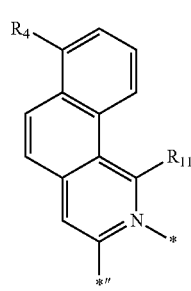
3-170
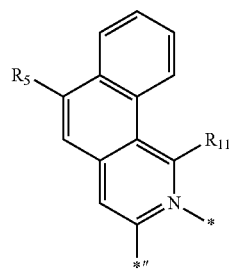
3-171
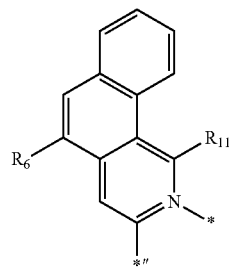
3-172
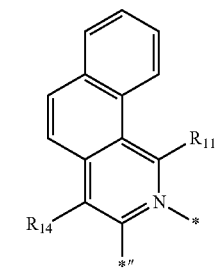
3-173
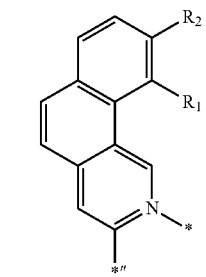
3-174
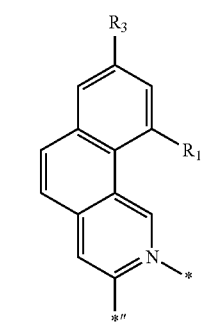

| | |
|---|---|
| 3-175 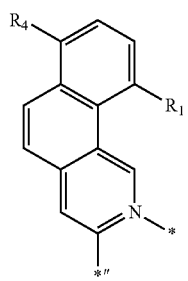 | 3-180 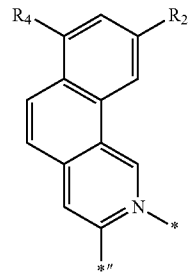 |
| 3-176 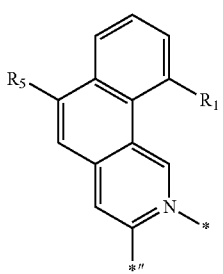 | 3-181 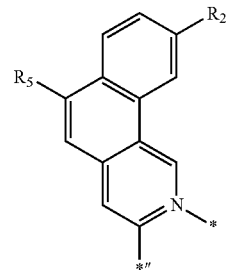 |
| 3-177 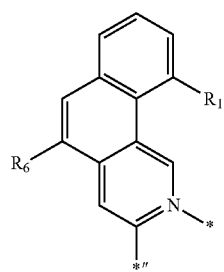 | 3-182 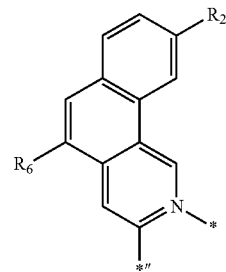 |
| 3-178 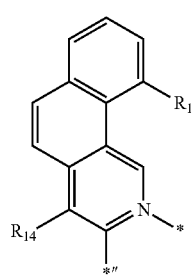 | 3-183 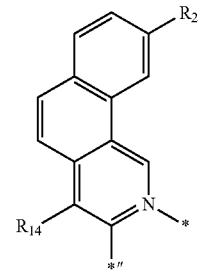 |
| 3-179 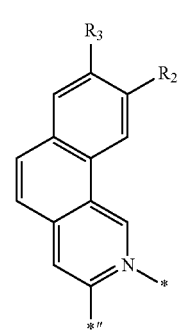 | 3-184 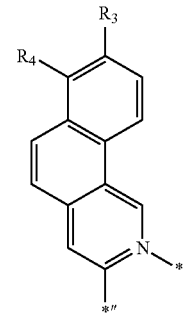 |

-continued
3-185
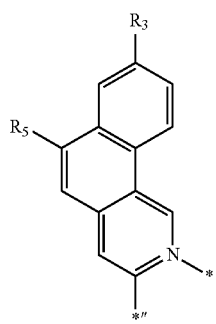
3-186
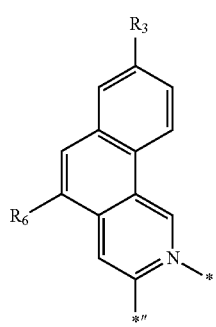
3-187
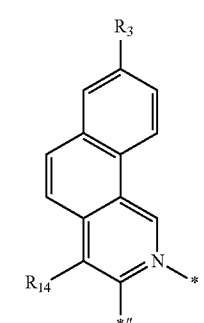
3-188
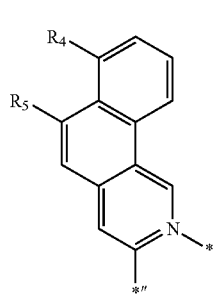
3-189
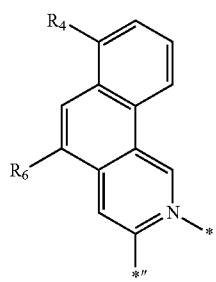
-continued
3-190
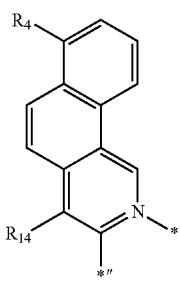
3-191
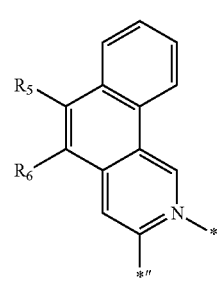
3-192
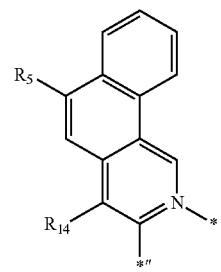
3-193
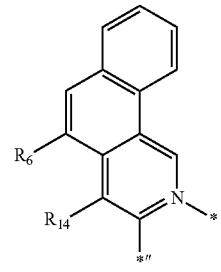
3-194
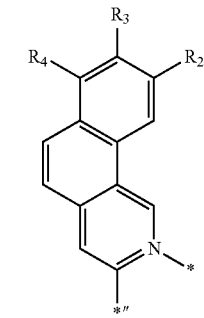

3-195 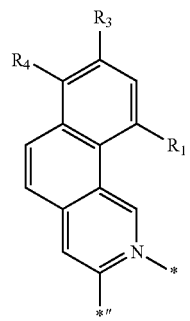
3-196
3-197
3-198
3-199 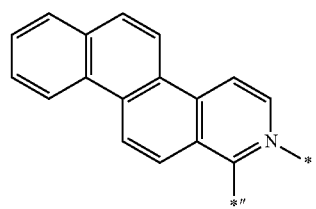
3-200 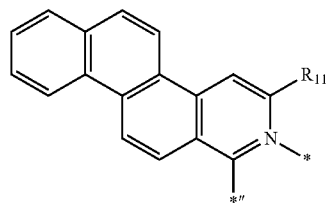
3-201 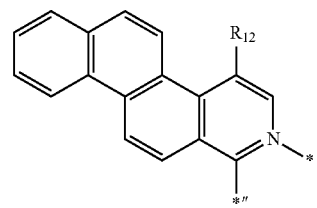
3-202 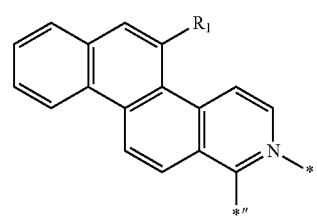
3-203 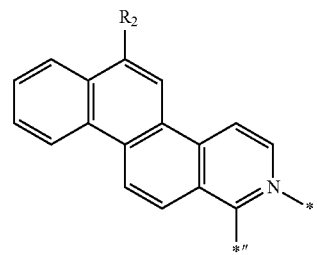
3-204 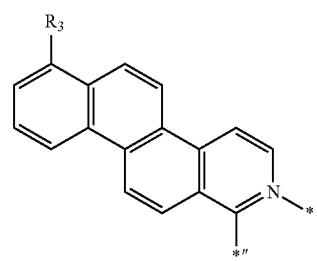
3-205 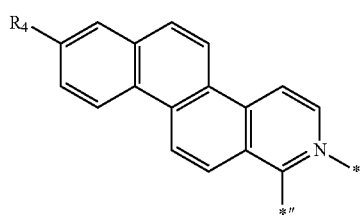
3-206 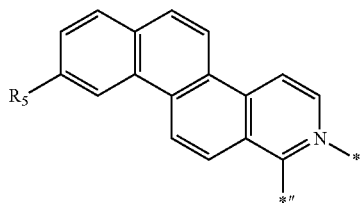

-continued

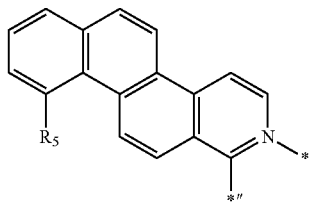
3-207

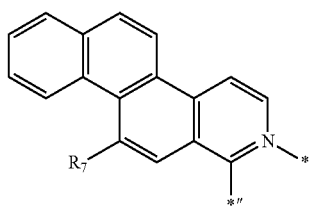
3-208

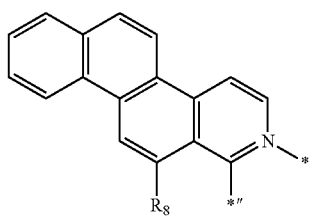
3-209

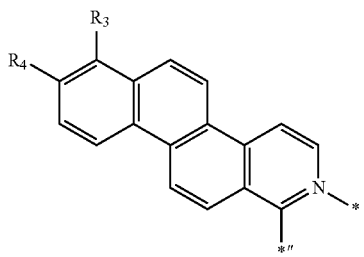
3-210 wherein, in Formulae 3-1 to 3-210, $R_{11}$ to $R_{14}$ are as described herein, and $R_1$ to $R_8$ are as described in connection with $R_0$, wherein each of $R_{11}$ to $R_{14}$ and $R_1$ to $R_8$ may not be hydrogen, \* is a binding site to Ir in Formula 1, and \*''' is a binding site to a neighboring carbon atom in Formula 1.

For example, in one or more embodiments, $R_{11}$ to $R_{14}$ and $R_1$ to $R_8$ in Formulae 3-1 to 3-210 may each independently be:

deuterium, —F, or a cyano group;

a $C_1$-$C_{20}$ alkyl group unsubstituted or substituted with deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or a combination thereof;

a $C_3$-$C_{10}$ cycloalkyl group, a $C_1$-$C_{10}$ heterocycloalkyl group, a phenyl group, a biphenyl group, a naphthyl group, a pyridinyl group, a fluorenyl group, a carbazolyl group, a dibenzofuranyl group, or a bibenzothiophenyl group, unsubstituted or substituted with deuterium, —F, a cyano group, a $C_1$-$C_{20}$ alkyl group, a deuterated $C_1$-$C_{20}$ alkyl group, a $C_1$-$C_{20}$ fluorinated alkyl group, a $C_1$-$C_{20}$ alkoxy group, a deuterated $C_1$-$C_{20}$ alkoxy group, a $C_1$-$C_{20}$ fluorinated alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or a combination thereof; or —Si($Q_3$)($Q_4$)($Q_5$), or —Ge($Q_3$)($Q_4$)($Q_5$).

In one or more embodiments, a group represented by

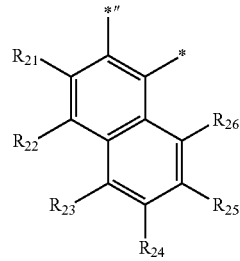

in Formula 1 may be a group represented by one of Formulae CY2-1 to CY2-59:

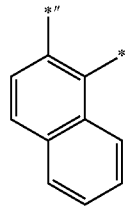
CY2-1

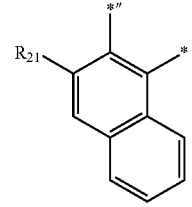
CY2-2

-continued
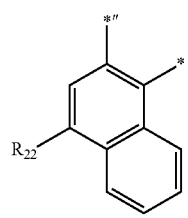
CY2-3
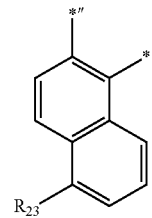
CY2-4
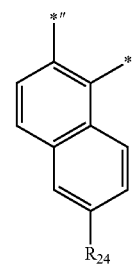
CY2-5
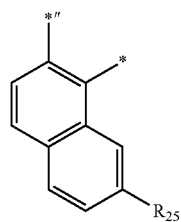
CY2-6
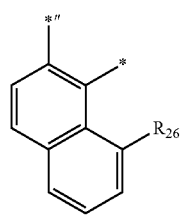
CY2-7
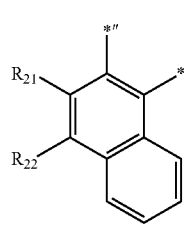
CY2-8
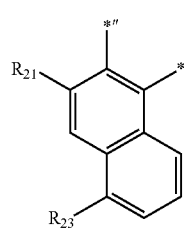
CY2-9
-continued
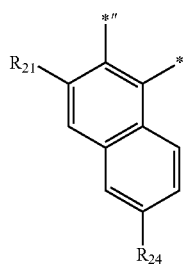
CY2-10
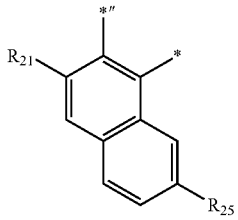
CY2-11
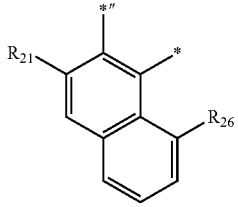
CY2-12
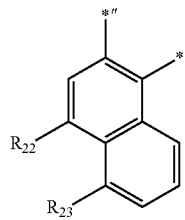
CY2-13
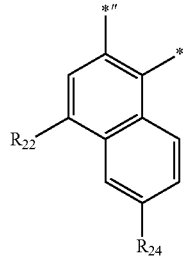
CY2-14
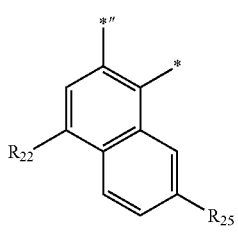
CY2-15

CY2-16
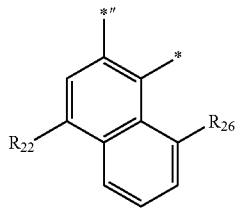
CY2-17
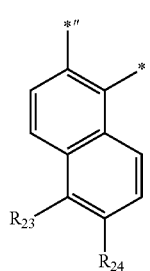
CY2-18
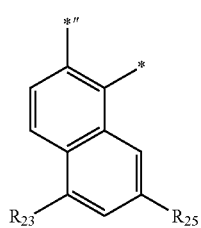
CY2-19
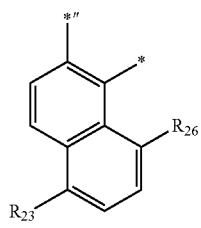
CY2-20
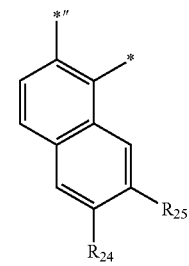
CY2-21
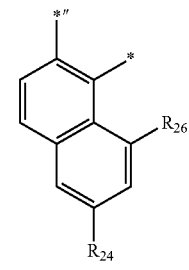
CY2-22
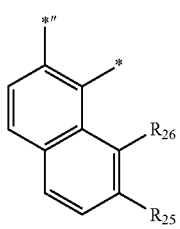
CY2-23
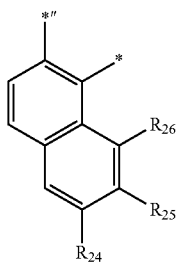
CY2-24
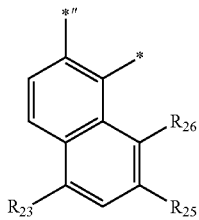
CY2-25
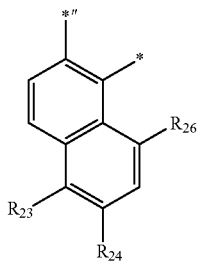
CY2-26
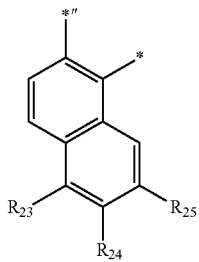
CY2-27
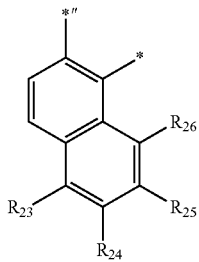

CY2-28
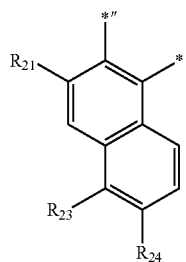
CY2-29
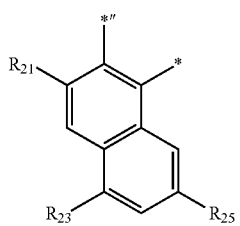
CY2-30
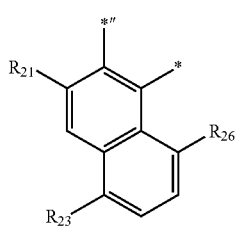
CY2-31
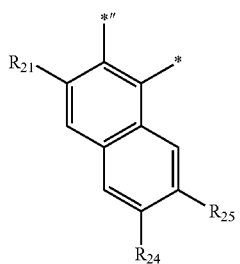
CY2-32
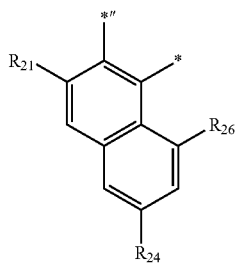
CY2-33
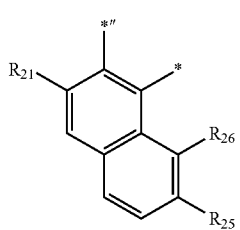
CY2-34
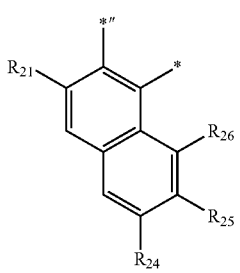
CY2-35
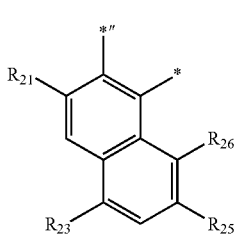
CY2-36
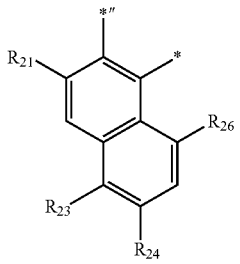
CY2-37
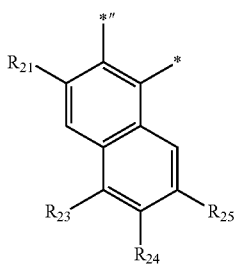
CY2-38
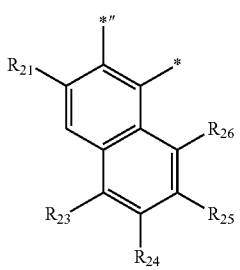
CY2-39
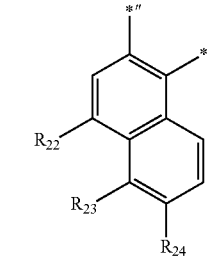

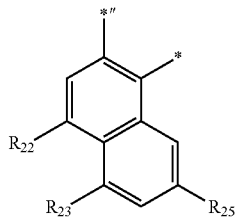 CY2-40
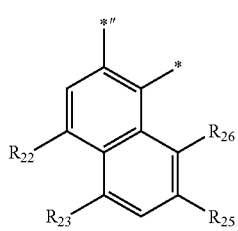 CY2-41
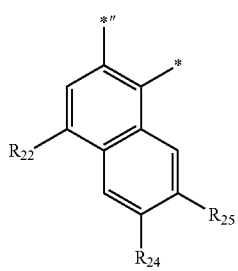 CY2-42
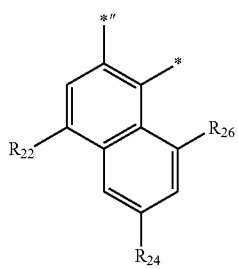 CY2-43
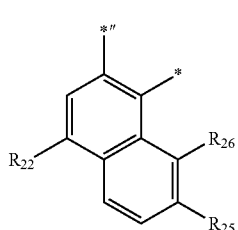 CY2-44
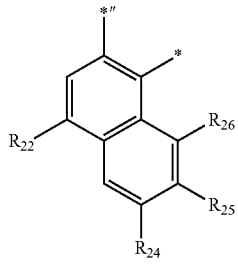 CY2-45
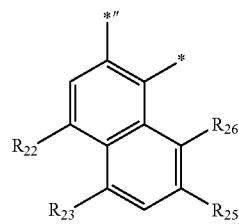 CY2-46
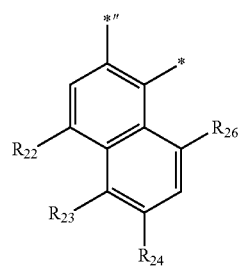 CY2-47
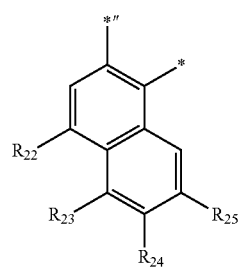 CY2-48
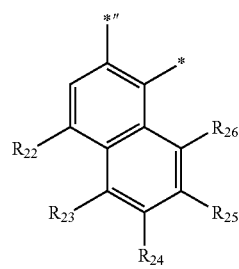 CY2-49
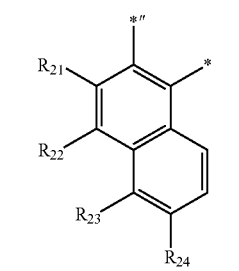 CY2-50
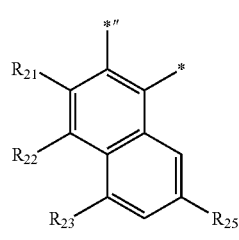 CY2-51

CY2-52

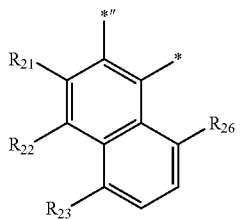

CY2-53

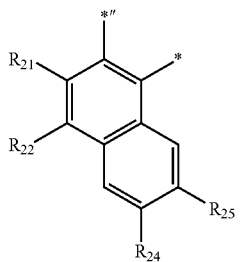

CY2-54

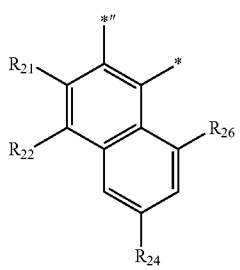

CY2-55

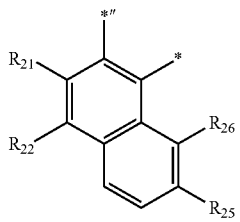

CY2-56

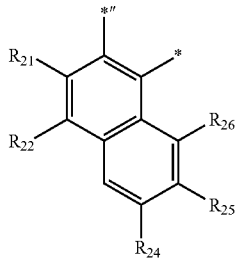

CY2-57

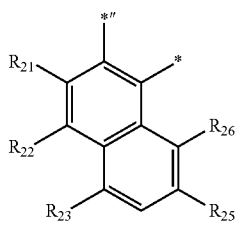

CY2-58

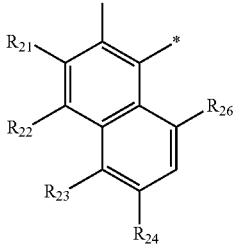

CY2-59

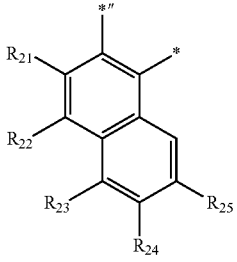

wherein, in Formulae CY2-1 to CY2-59,
$R_{21}$ to $R_{26}$ are as described herein, and each of $R_{21}$ to $R_{26}$ may not be hydrogen,

* is a binding site to Ir in Formula 1, and

*" is a binding site to a neighboring atom in Formula 1.

For example, in one or more embodiments, $R_{21}$ to $R_{26}$ in CY2-1 to CY2-59 may each independently be:

deuterium, —F, or a cyano group;

a $C_1$-$C_{20}$ alkyl group unsubstituted or substituted with deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or a combination thereof;

a $C_3$-$C_{10}$ cycloalkyl group, a $C_1$-$C_{10}$ heterocycloalkyl group, a phenyl group, a biphenyl group, a naphthyl group, a pyridinyl group, a fluorenyl group, a carbazolyl group, a dibenzofuranyl group, or a bibenzothiophenyl group, unsubstituted or substituted with deuterium, —F, a cyano group, a $C_1$-$C_{20}$ alkyl group, a deuterated $C_1$-$C_{20}$ alkyl group, a $C_1$-$C_{20}$ fluorinated alkyl group, a $C_1$-$C_{20}$ alkoxy group, a deuterated $C_1$-$C_{20}$ alkoxy group, a $C_1$-$C_{20}$ fluorinated alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl) dibenzothiophenyl group, or a combination thereof; or —Si($Q_3$)($Q_4$)($Q_5$), or —Ge($Q_3$)($Q_4$)($Q_5$).

In one or more embodiments, a group represented by

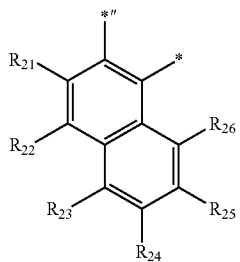

in Formula 1 may be a group represented by one of Formulae 4-1 to 4-3:

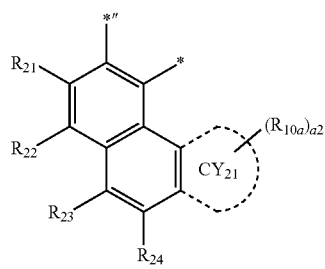

4-1

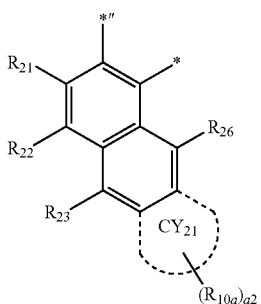

4-2

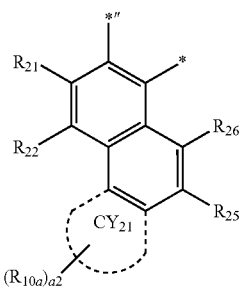

4-3 wherein, in Formulae 4-1 to 4-3,
$R_{21}$ to $R_{26}$ and $R_{10a}$ are the same as described above,
ring $CY_{21}$ may be a $C_5$-$C_{30}$ carbocyclic group or a $C_1$-$C_{30}$ heterocyclic group, a2 may be an integer from 0 to 20,
* is a binding site to Ir in Formula 1, and
*" is a binding site to a neighboring atom in Formula 1.

For example, in one or more embodiments, at least one of $R_{21}$ and $R_{22}$ in Formulae 4-1 to 4-3 may not be hydrogen.

For example, in one or more embodiments, ring $CY_{21}$ in Formula 4-1 to 4-3 may be a phenyl (benzene) group, a naphthalene group, a pyridine group, a pyrimidine group, a quinoline group, or an isoquinoline group.

Meanwhile, the number of carbon atoms included in $R_{30a}$ and $R_{30b}$ in Formula 1 may each independently be 4 or more, 5 or more, or 6 or more.

In one or more embodiments, $R_{30b}$ in Formula 1 may not be a methyl group.

In one or more embodiments, $R_{30a}$ in Formula 1 may not be a tertiary butyl group (also referred to herein as a t-butyl group or a tert-butyl group).

In one or more embodiments, $R_{30b}$ in Formula 1 may not be a tert-butyl group.

In one or more embodiments, each of $R_{30a}$ and $R_{30b}$ in Formula 1 may not be a tert-butyl group.

In one or more embodiments, $R_{30b}$ in Formula 1 may be a group represented by *—C($R_{34}$)($R_{35}$)($R_{36}$). $R_{34}$ to $R_{36}$ are as described herein in connection with $R_{31}$.

For example, in one or more embodiments, $R_{30b}$ in Formula 1 may be a group represented by *—C($R_{34}$)($R_{35}$)($R_{36}$), and at least one of $R_{34}$ to $R_{36}$ (for example, all of $R_{34}$ to $R_{36}$) may not be hydrogen.

In one or more embodiments, at least one of $R_{34}$ to $R_{36}$ (for example, all of $R_{34}$ to $R_{36}$) may not be hydrogen and deuterium.

In one or more embodiments, $R_{30a}$ in Formula 1 may be a group represented by *—C($R_{31}$)($R_{32}$)($R_{33}$), and at least one of $R_{31}$ to $R_{33}$ may not be a methyl group.

In one or more embodiments, $R_{30a}$ in Formula 1 may be a group represented by *—C($R_{31}$)($R_{32}$)($R_{33}$), $R_{30b}$ may be a group represented by *—C($R_{34}$)($R_{35}$)($R_{36}$), each of $R_{34}$ to $R_{36}$ may not be hydrogen, and at least one of $R_{31}$ to $R_{36}$ may not be a methyl group.

In one or more embodiments, $R_{30a}$ in Formula 1 may be a group represented by *—C($R_{31}$)($R_{32}$)($R_{33}$), $R_{30b}$ may be a group represented by *—C($R_{34}$)($R_{35}$)($R_{36}$), each of $R_{34}$ to $R_{36}$ may not be hydrogen and deuterium, and at least one of $R_{31}$ to $R_{36}$ may not be a methyl group.

In one or more embodiments, the organometallic compound represented by Formula 1 may satisfy at least one of Condition A1 to Condition A3, or the organometallic compound represented by Formula 1 may satisfy each of Condition A1 and Condition A2:

Condition A1
$R_{30a}$ may be a group represented by *—C($R_{31}$)($R_{32}$)($R_{33}$), and
$R_{31}$ to $R_{33}$ may each independently be a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

Condition A2
$R_{30a}$ may be a group represented by *—C($R_{31}$)($R_{32}$)($R_{33}$), and
at least one of $R_{31}$ to $R_{33}$ may independently be a substituted or unsubstituted $C_2$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

Condition A3

$R_{30a}$ may be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

In one or more embodiments, the organometallic compound represented by Formula 1 may satisfy at least one of Condition B1 to Condition B3, or the organometallic compound represented by Formula 1 may satisfy each of Condition B1 and Condition B2:

Condition B1

$R_{30b}$ may be a group represented by *—$C(R_{34})(R_{35})(R_{36})$, and $R_{34}$ to $R_{36}$ may each independently be a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

Condition B2

$R_{30b}$ may be a group represented by *—$C(R_{34})(R_{35})(R_{36})$, and at least one of $R_{34}$ to $R_{36}$ may each independently be a substituted or unsubstituted $C_2$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

Condition B3

$R_{30b}$ may be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

In one or more embodiments, $R_{37}$ in Formula 1 may be hydrogen or deuterium.

In one or more embodiments, $R_{30a}$ and $R_{30b}$ in Formula 1 may be identical to each other (i.e., the same as each other).

In one or more embodiments, $R_{30a}$ and $R_{30b}$ in Formula 1 may be different from each other.

In one or more embodiments, Formula 1 may include at least one deuterium.

In one or more embodiments, Formula 1 may include at least one fluoro group (—F).

In one or more embodiments, at least one of $R_0$ and $R_{11}$ to $R_{14}$ in Formula 1 may include a fluoro group (—F).

In one or more embodiments, $R_0$ and $R_{11}$ to $R_{14}$ in Formula 1 may not include a fluoro group (—F).

In one or more embodiments, $R_{37}$ in the organometallic compound represented by Formula 1 may be a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

In the formulae above, i) two or more of a plurality of $R_0$ may be optionally linked to each other to form a $C_5$-$C_{30}$ carbocyclic group that may be unsubstituted or substituted with at least one $R_{10a}$, or a $C_1$-$C_{30}$ heterocyclic group that may be unsubstituted or substituted with at least one $R_{10a}$, ii) two or more of $R_{11}$ to $R_{19}$ may be optionally linked to each other to form a $C_5$-$C_{30}$ carbocyclic group that may be unsubstituted or substituted with at least one $R_{10a}$, or a $C_1$-$C_{30}$ heterocyclic group that is unsubstituted or substituted with at least one $R_{10a}$, iii) two or more of $R_{11}$ to $R_{19}$, and $R_0$ may be optionally linked to each other to form a $C_5$-$C_{30}$ carbocyclic group that is unsubstituted or substituted with at least one $R_{10a}$, or a $C_1$-$C_{30}$ heterocyclic group that may be unsubstituted or substituted with at least one $R_{10a}$, iv) two or more of $R_{21}$ to $R_{26}$ may be optionally linked to each other to form a $C_5$-$C_{30}$ carbocyclic group that may be unsubstituted or substituted with at least one $R_{10a}$, or a $C_1$-$C_{30}$ heterocyclic group that may be unsubstituted or substituted with at least one $R_{10a}$, and v) two or more of $R_{30a}$, $R_{30b}$, and $R_{37}$ may be optionally linked to each other to form a $C_5$-$C_{30}$ carbocyclic group that may be unsubstituted or substituted with at least one $R_{10a}$, or a $C_1$-$C_{30}$ heterocyclic group that may be unsubstituted or substituted with at least one $R_{10a}$. $R_{10a}$ may be the same as described herein in connection with $R_0$.

In one or more embodiments, the organometallic compound represented by Formula 1 may emit a red light or may emit a green light, for example, red light or green light having a maximum emission wavelength of 500 nm or more, for example, a maximum emission wavelength in the range of 500 nm to 650 nm.

In an embodiment, the organometallic compound represented by Formula 1 may emit light having a maximum emission wavelength in the range of 525 nm to 650 nm, 550 nm to 650 nm, 575 nm to 650 nm, 600 nm to 650 nm, 610 nm to 645 nm, or 620 nm to 645 nm.

In an embodiment, the organometallic compound represented by Formula 1 may emit light having a full width at half maximum (FWHM) in the range of 25 nm to 50 nm, 30 nm to 45 nm, or 30 nm to 43 nm.

The organometallic compound represented by Formula 1 may be one of Compounds 1 to 46:
1
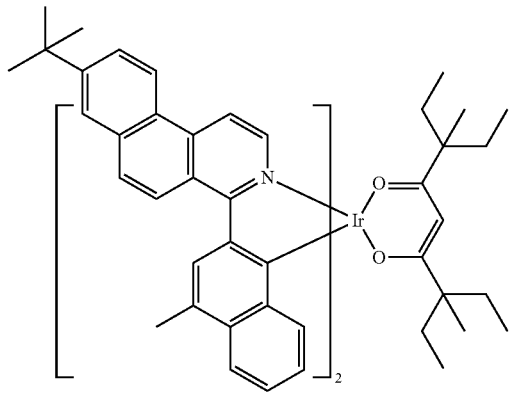
2
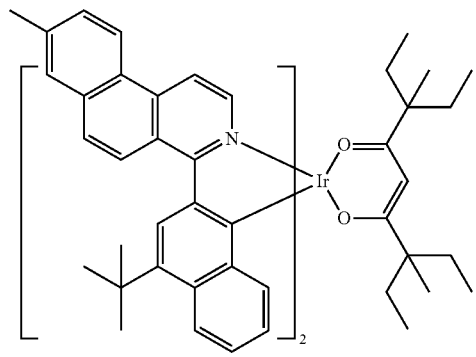
3
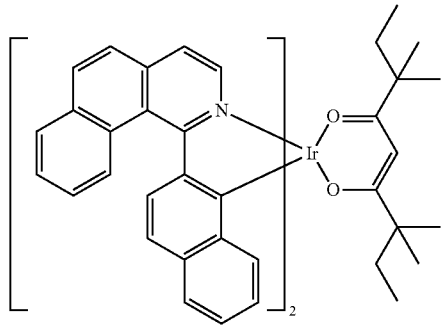
4
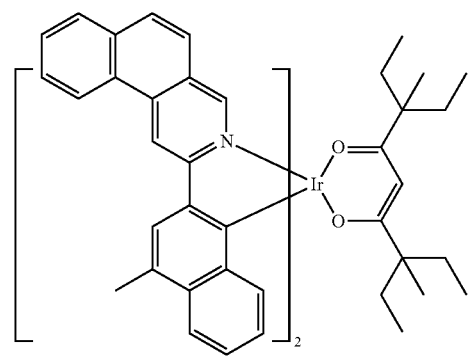
5
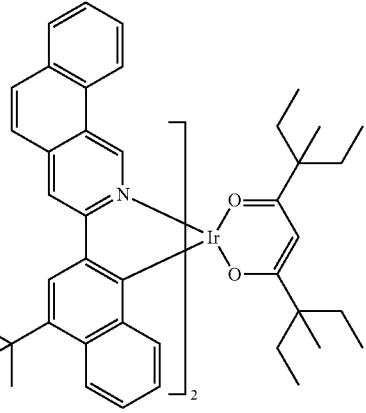
6
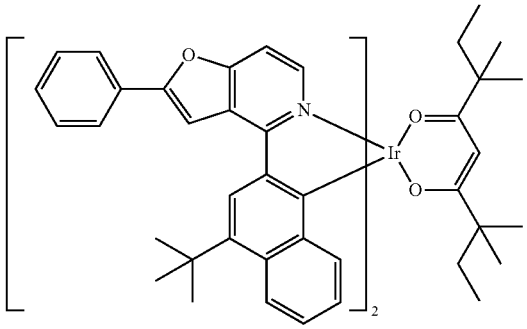
7
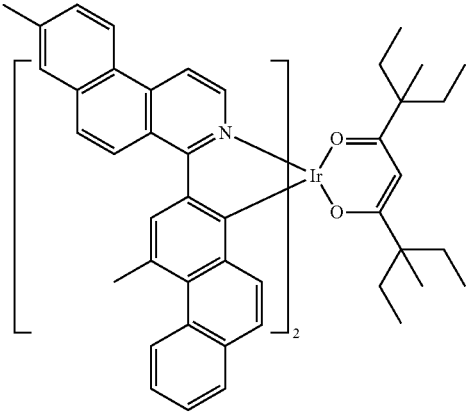
8
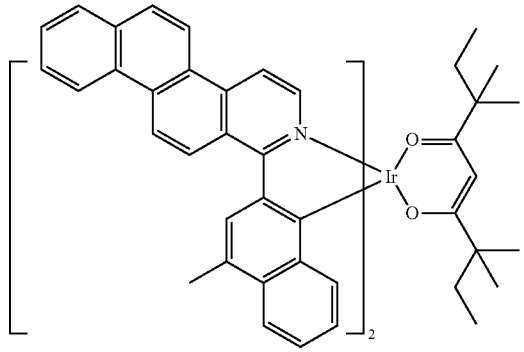

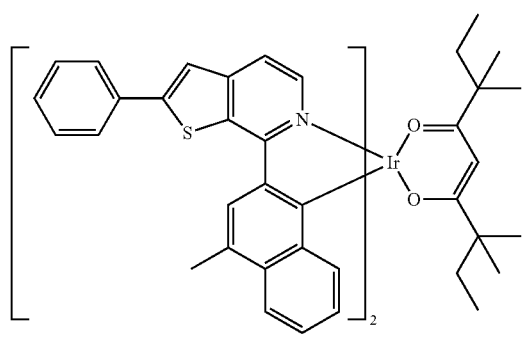
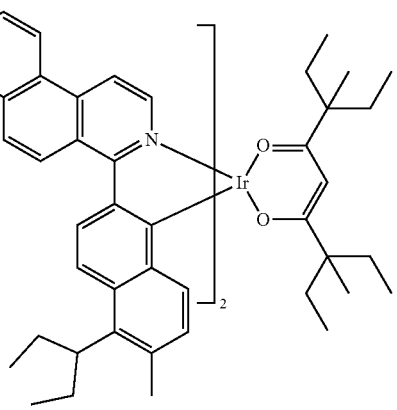
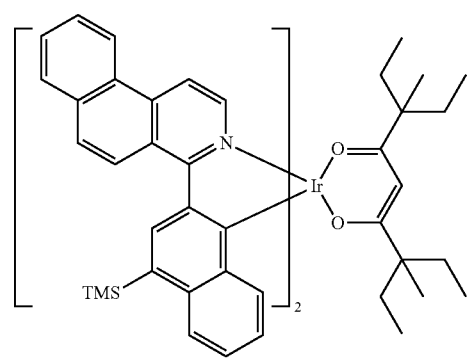
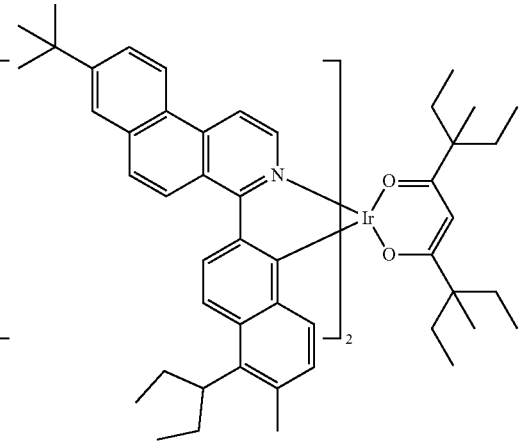
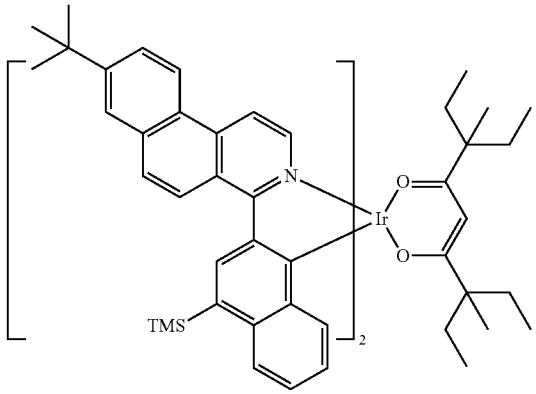
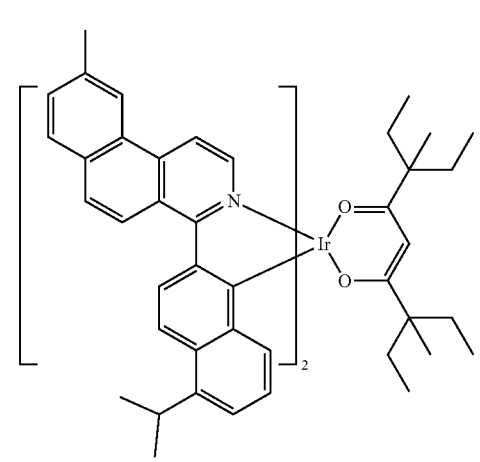
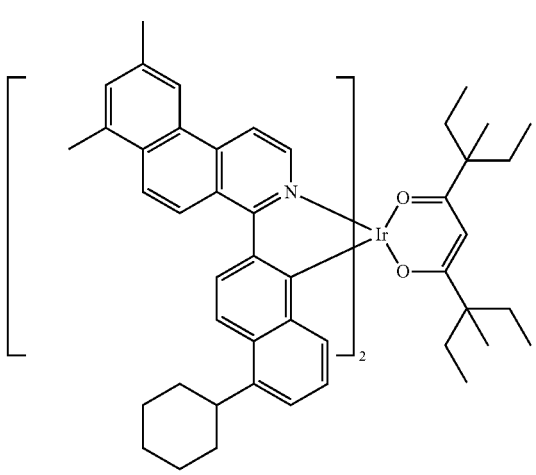

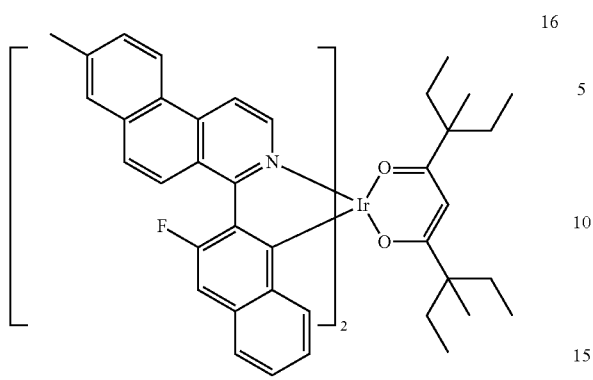
16
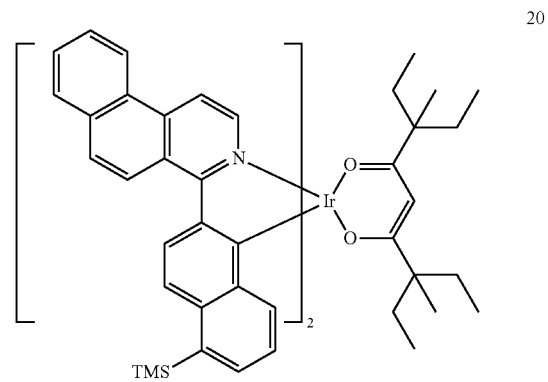
20
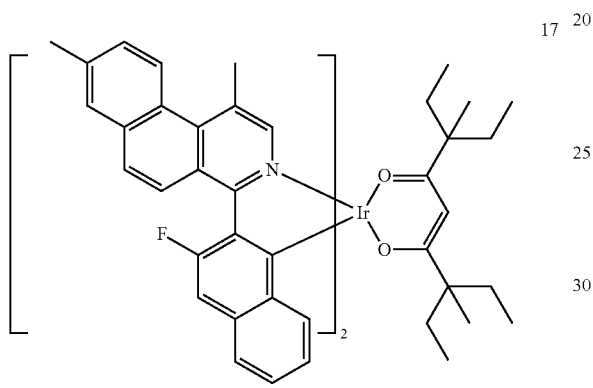
17
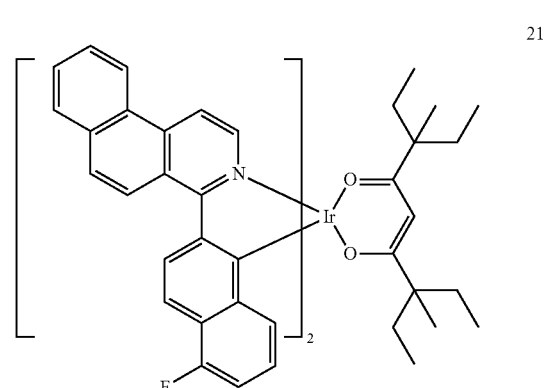
21
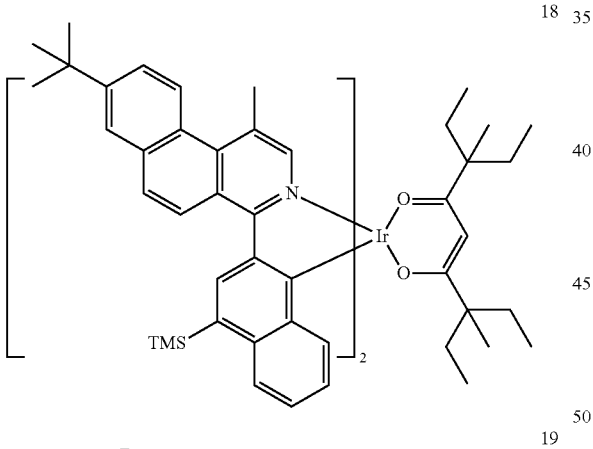
18
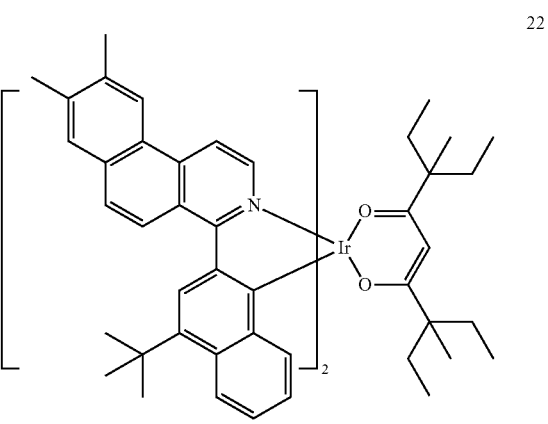
22
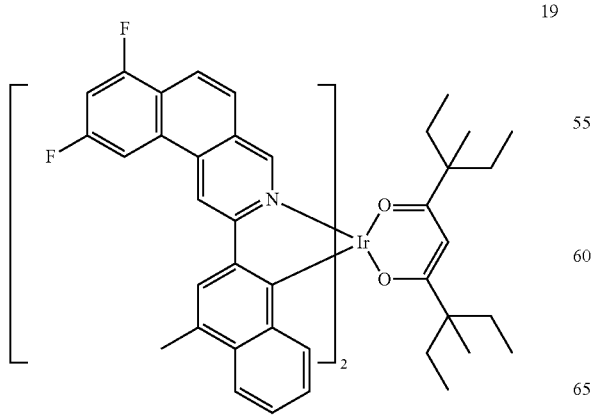
19
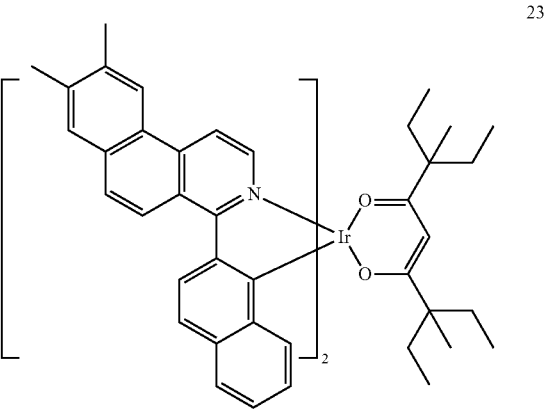
23

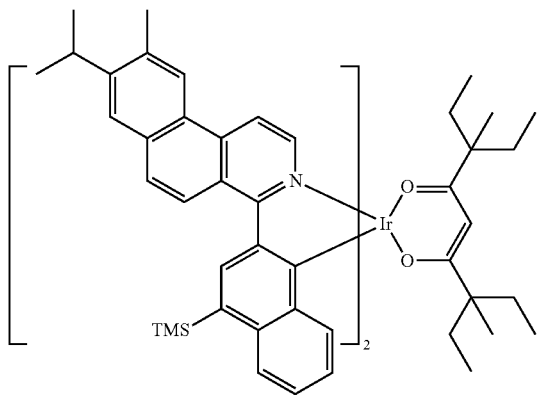
24
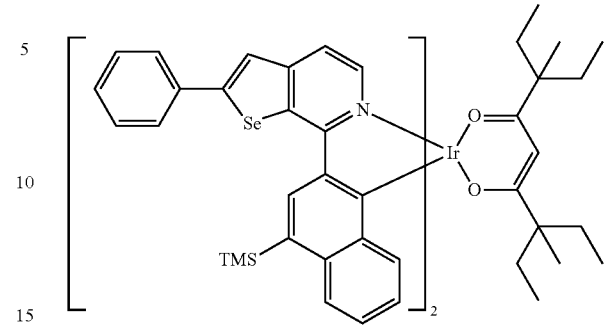
28
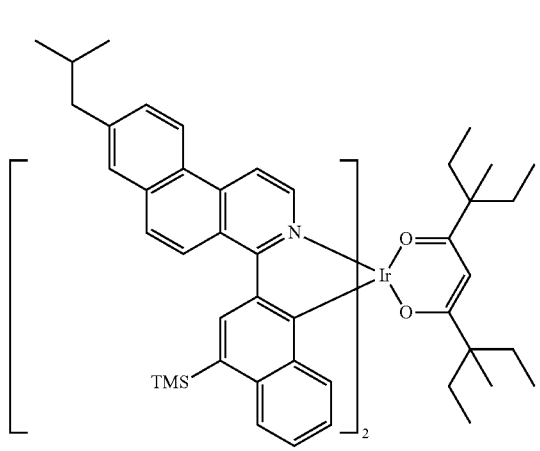
25
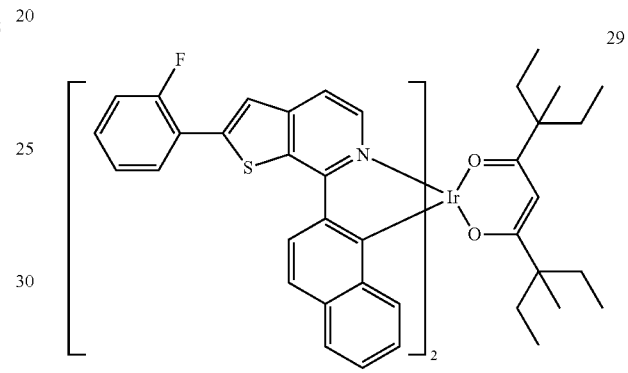
29
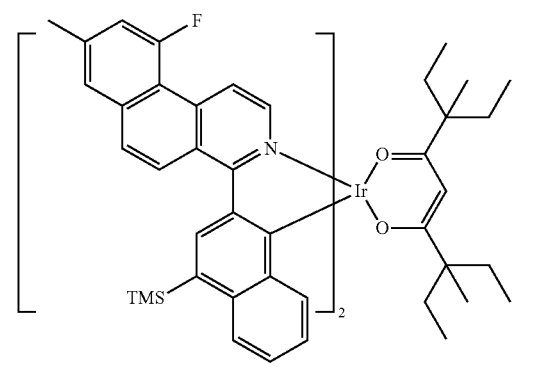
26
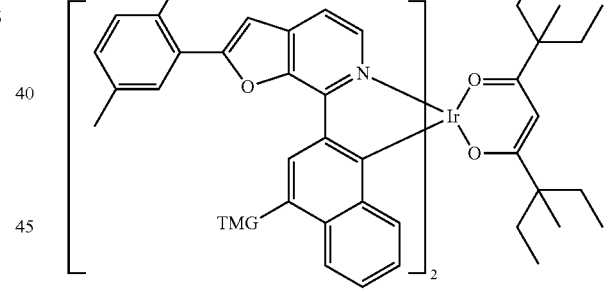
30
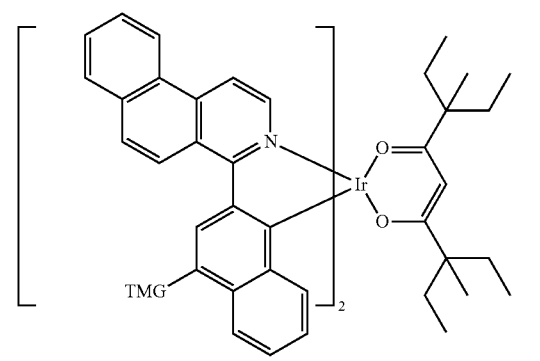
27
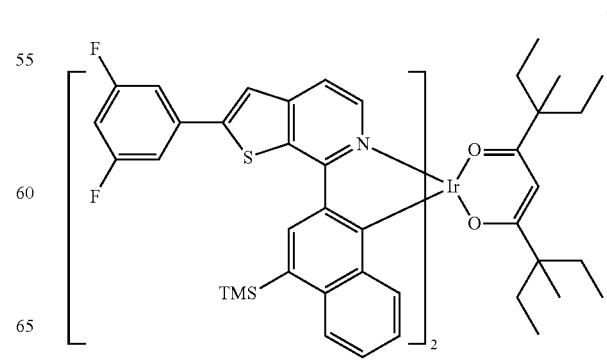
31

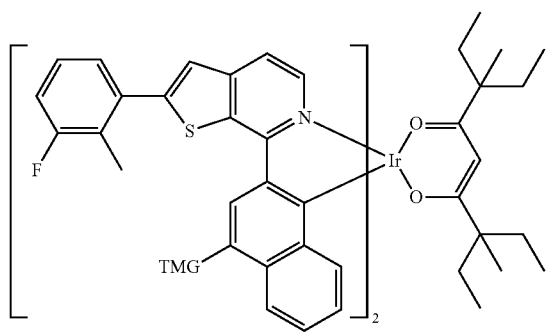
32
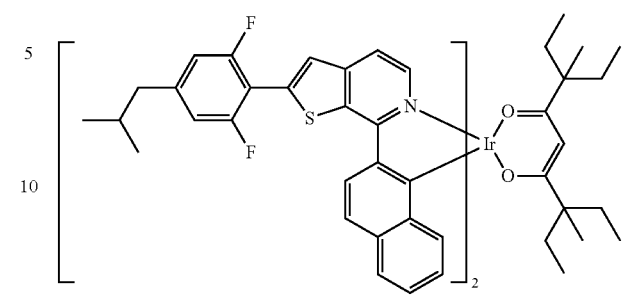
36
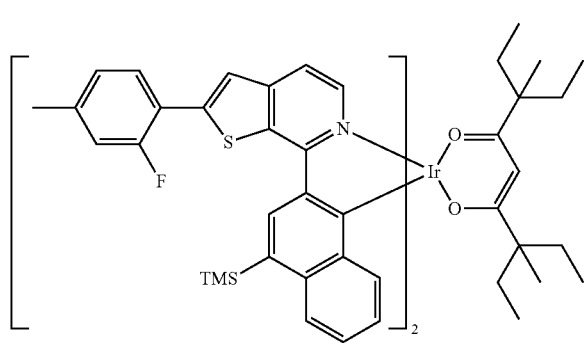
33
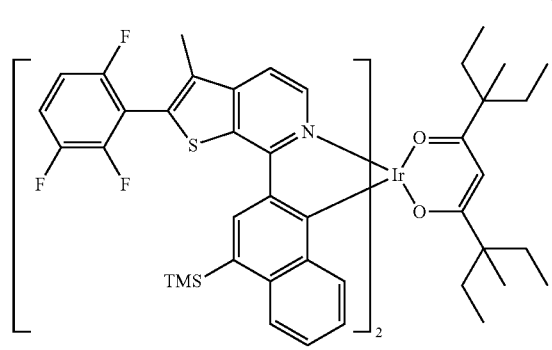
37
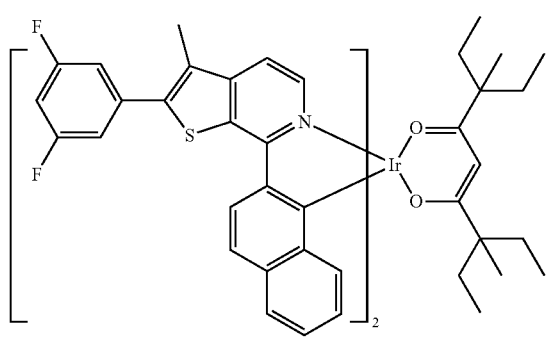
34
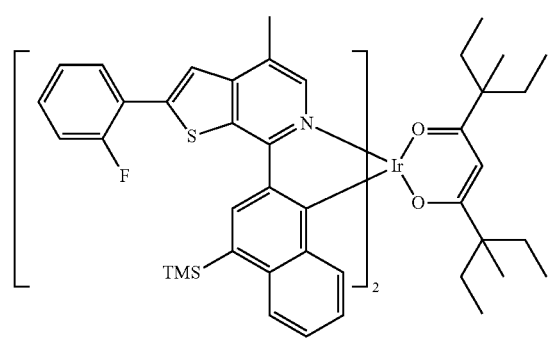
38
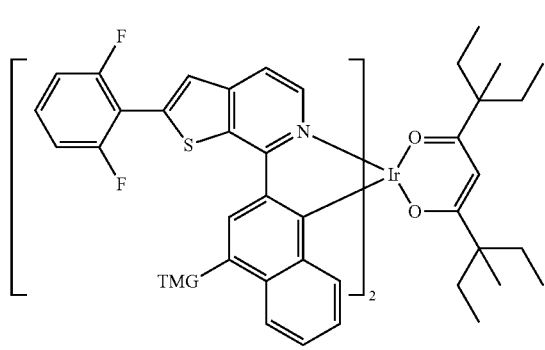
35
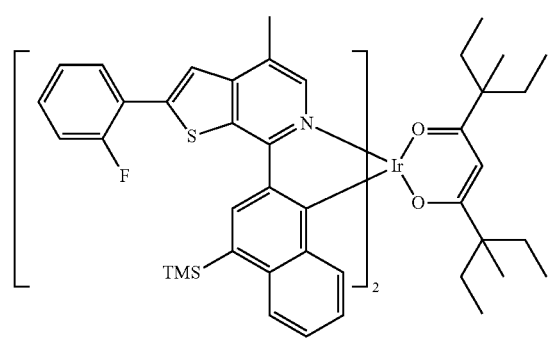
39

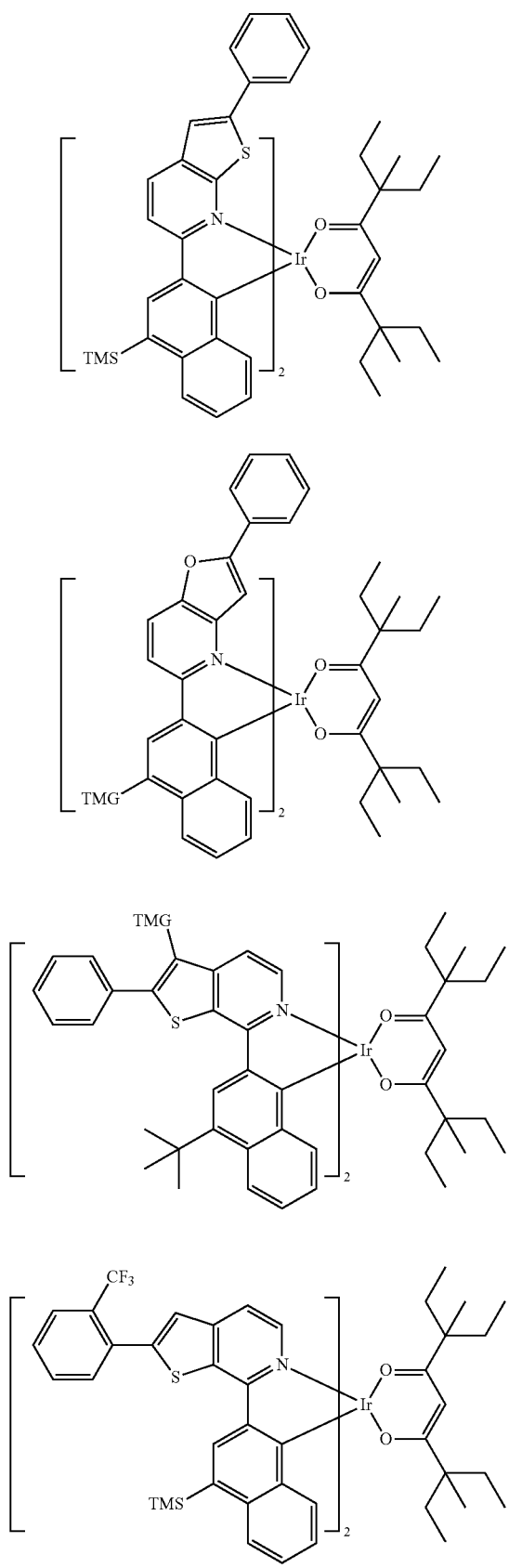
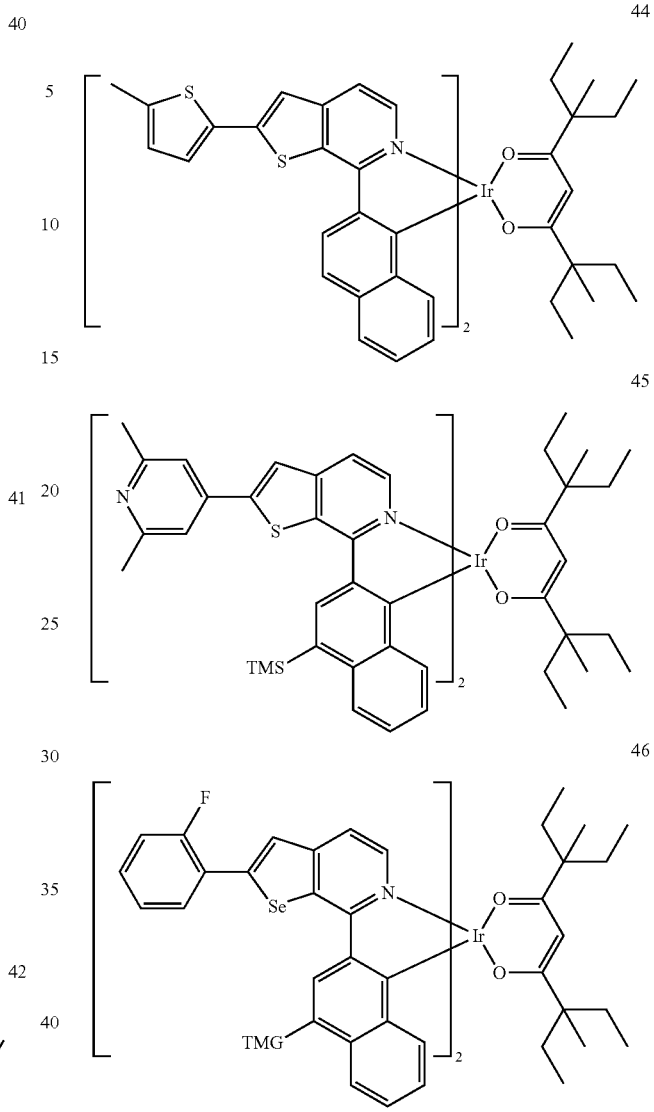

The organometallic compound has a backbone of Formula 1 as described herein. As a result of this structure, the inventors have discovered that the vibration transmission of the organometallic compound represented by Formula 1 is significantly reduced, and thus, an electronic device, for example, an organic light-emitting device using the organometallic compound represented by Formula 1, may emit light having a relatively narrow FWHM and high luminescence efficiency.

As described herein, $R_{30a}$ in Formula 1 is a group represented by *—$C(R_{31})(R_{32})(R_{33})$, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, and each of $R_{31}$ to $R_{33}$ is not hydrogen. Without wishing to be bound to theory, since the organometallic compound represented by Formula 1 has a relatively large steric hindrance, the amount of triplet-triplet quenching may be reduced. Thus, an electronic device, for example, an organic light-emitting device including the organometallic compound represented by Formula 1 may have an excellent internal photoluminescence quantum yield.

The highest occupied molecular orbital (HOMO) energy level, the lowest unoccupied molecular orbital (LUMO) energy level, and the lowest excitation triplet (Ti) energy level of selected organometallic compounds represented by Formula 1 were calculated using a density functional theory (DFT) method of the Gaussian 09 program with the molecular structure optimized at the B3LYP level, and results thereof are shown in Table 1. The energy levels are expressed in electron volts (eV).

TABLE 1

| Compound No. | HOMO(eV) | LUMO(eV) | $T_1$(eV) |
|---|---|---|---|
| 1 | −4.455 | −1.659 | 1.969 |
| 2 | −4.492 | −1.676 | 1.983 |
| 4 | −4.469 | −1.638 | 2.030 |
| 6 | −4.543 | −1.698 | 2.017 |
| 8 | −4.500 | −1.830 | 1.907 |
| 9 | −4.470 | −1.845 | 1.964 |
| 10 | −4.625 | −1.759 | 1.945 |
| 14 | −4.479 | −1.682 | 1.955 |
| 16 | −4.790 | −1.931 | 1.986 |
| 18 | −4.538 | −1.619 | 2.000 |
| 23 | −4.508 | −1.631 | 1.935 |
| 26 | −4.603 | −1.749 | 1.945 |
| 27 | −4.600 | −1.750 | 1.932 |
| 29 | −4.536 | −1.977 | 1.841 |
| 32 | −4.633 | −1.862 | 1.949 |
| 34 | −4.717 | −1.976 | 1.958 |
| 35 | −4.509 | −1.935 | 1.866 |
| 38 | −4.492 | −1.892 | 1.869 |
| 42 | −4.438 | −1.625 | 1.975 |

In an embodiment, an absolute value of HOMO energy level of the organometallic compound represented by Formula 1 may be in the range of 4.4 eV to 4.8 eV, for example, 4.438 eV or 4.790 eV.

In an embodiment, an absolute value of LUMO energy level of the organometallic compound represented by Formula 1 may be in the range of 1.6 eV to 2.0 eV, for example, 1.619 eV or 1.977 eV.

In an embodiment, an absolute value of $T_1$ energy level of the organometallic compound represented by Formula 1 may be in the range of 1.8 eV to 2.1 eV, for example, 1.841 eV or 2.030 eV.

The HOMO HOMO energy level, LUMO energy level and $T_1$ energy level may be evaluated by DFT, for example DFT using the Gaussian 09 program.

Referring to Table 1, it was confirmed that the organometallic compound represented by Formula 1 had electronic characteristics that are desirable for a dopant in an electric device, for example, as a dopant in an organic light-emitting device.

Synthesis methods of the organometallic compound represented by Formula 1 may be recognizable by one of ordinary skill in the art by referring to Synthesis Examples provided below.

Accordingly, the organometallic compound represented by Formula 1 is suitable as a material for an organic layer of organic light-emitting device. For example, in one or more embodiments, the organometallic compound represented by Formula 1 is suitable as a dopant in an emission layer of the organic layer, as described herein.

According to another aspect, one or more embodiments describe an organic light-emitting device including a first electrode; a second electrode; and an organic layer located between the first electrode and the second electrode, wherein the organic layer includes an emission layer, and wherein the organic layer further includes at least one organometallic compound represented by Formula 1.

According to one or more embodiments, the organic light-emitting device including an organic layer including the organometallic compound represented by Formula 1 may have excellent electronic characteristics, including a low driving voltage, a high external quantum efficiency, a long lifespan, and a relatively narrow FWHM emission peak in an electroluminescent (EL) spectrum.

In one or more embodiments, the organometallic compound represented by Formula 1 may be located or disposed between a pair of electrodes of an organic light-emitting device. For example, the organometallic compound represented by Formula 1 may be included in the emission layer of an organic light-emitting device. In this regard, the organometallic compound may act as a dopant, and the emission layer may further include a host. In one or more embodiments, an amount (for example, a weight) of the organometallic compound represented by Formula 1 in the emission layer is less than an amount (for example, a weight) of the host in the emission layer. The emission layer including the organometallic compound represented by Formula 1 (or, the organic light-emitting device including the emission layer) may emit a red light or a green light, for example, a red light or a green light having a maximum emission wavelength of 500 nm or more, for example, a maximum emission wavelength in the range of 500 nm to 650 nm.

In an embodiment, the emission layer including the organometallic compound represented by Formula 1 (or, the organic light-emitting device including the emission layer) may emit light having a maximum emission wavelength in the range of 525 nm to 650 nm, 550 nm to 650 nm, 575 nm to 650 nm, 600 nm to 650 nm, 610 nm to 645 nm, or 620 nm to 645 nm.

In an embodiment, the emission layer including the organometallic compound represented by Formula 1 (or, the organic light-emitting device including the emission layer) may emit light having a FWHM in the range of 25 nm to 50 nm, 30 nm to 45 nm, or 30 nm to 43 nm.

The maximum emission wavelength and FWHM may be may be evaluated from an EL spectrum of the organic light-emitting device.

In one or more embodiments, the emission layer including the organometallic compound represented by Formula 1 (or, the organic light-emitting device including the emission layer) may emit a red light.

The first electrode may be an anode, which may be a hole injection electrode, and the second electrode may be a cathode, which may be an electron injection electrode; or the first electrode may be a cathode, which may be an electron injection electrode, and the second electrode may be an anode, which may be a hole injection electrode.

In one or more embodiments, and as described in further detail herein, in the organic light-emitting device, the first electrode may be an anode, and the second electrode may be a cathode, and the organic layer may further include a hole transport region located between the first electrode and the emission layer, and an electron transport region located between the emission layer and the second electrode, and the hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

The term "organic layer" as used herein refers to a single organic layer and/or a plurality of organic layers that are located between the first electrode and the second electrode of the organic light-emitting device. The "organic layer" may include, in addition to an organic compound, an organometallic complex including a metal.

As used herein, the expressions "(an organic layer) includes at least one of organometallic compound" and "(an organic layer) including at least one organometallic compound" include a case wherein the organic layer includes one organometallic compound represented by Formula 1, and a case wherein the organic layer includes two or more different organometallic compounds represented by Formula 1.

For example, an organic layer may include, as the organometallic compound, only one Compound 1 (e.g., only one organometallic compound represented by Formula 1). In this embodiment, a Compound 1 may be included in the emission layer of the organic light-emitting device. In one or more embodiments, the organic layer may include, as the organometallic compound, a Compound 1 and a Compound 2. In this regard, a Compound 1 and a Compound 2 may exist (i.e., may be located) in the same organic layer (for example, a Compound 1 and a Compound 2 may be located in an emission layer).

The FIG. 1 is a schematic cross-sectional view of an organic light-emitting device 10 according to one or more embodiments. Hereinafter, the structure of an organic light-emitting device according to one or more embodiments of the present disclosure and a method of manufacturing an organic light-emitting device according to one or more embodiments of the present disclosure will be described with reference to the FIGURE.

In the FIGURE, the organic light-emitting device 10 includes a first electrode 11, an organic layer 15, and a second electrode 19, which are sequentially stacked.

A substrate may be additionally located under (i.e., below) the first electrode 11 or above (i.e., on top of) the second electrode 19. For use as the substrate, any substrate that is used in organic light-emitting devices, including those available in the art, may be used. In one or more embodiments, the substrate may be a glass substrate or a transparent plastic substrate, each having excellent mechanical strength, thermal stability, transparency, surface smoothness, ease of handling, and water resistance.

In one or more embodiments, the first electrode 11 may be formed (i.e., prepared) by depositing or sputtering a material for forming the first electrode 11 on the substrate. The first electrode 11 may be an anode. The material for forming the first electrode 11 may include materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), zinc oxide (ZnO), or a combination thereof. In one or more embodiments, the material for forming the first electrode 11 may be magnesium (Mg), aluminum (Al), silver (Ag), aluminum-lithium (Al—Li), calcium (Ca), magnesium-indium (Mg—In), magnesium-silver (Mg—Ag), or a combination thereof.

The first electrode 11 may have a structure with a single layer, or the first electrode 11 may have a multi-layered structure including two or more layers. For example, in one or more embodiments, the first electrode 11 may have a three-layered structure of ITO/Ag/ITO.

The organic layer 15 may be located on or disposed on the first electrode 11.

The organic layer 15 may include a hole transport region, an emission layer, an electron transport region, or a combination thereof.

The hole transport region may be located between the first electrode 11 and the emission layer.

The hole transport region may include a hole injection layer, a hole transport layer, an electron blocking layer, a buffer layer, or a combination thereof.

The hole transport region may include either a hole injection layer or a hole transport layer. In one or more embodiments, the hole transport region may have a hole injection layer/hole transport layer structure, or the hole transport region may have a hole injection layer/hole transport layer/electron blocking layer structure, wherein, for each structure, each layer is sequentially stacked in this stated order from the first electrode 11 towards the second electrode 19.

When the hole transport region includes a hole injection layer, the hole injection layer may be formed on the first electrode 11 by using one or more suitable methods, for example, by vacuum deposition, spin coating, casting, and/or Langmuir-Blodgett (LB) deposition.

When a hole injection layer is formed by vacuum deposition, the deposition conditions may vary according to a material that may be used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C.

Conditions for forming a hole transport layer and an electron blocking layer may be understood by referring to conditions for forming the hole injection layer.

In one or more embodiments, the hole transport region may include m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or a combination thereof:

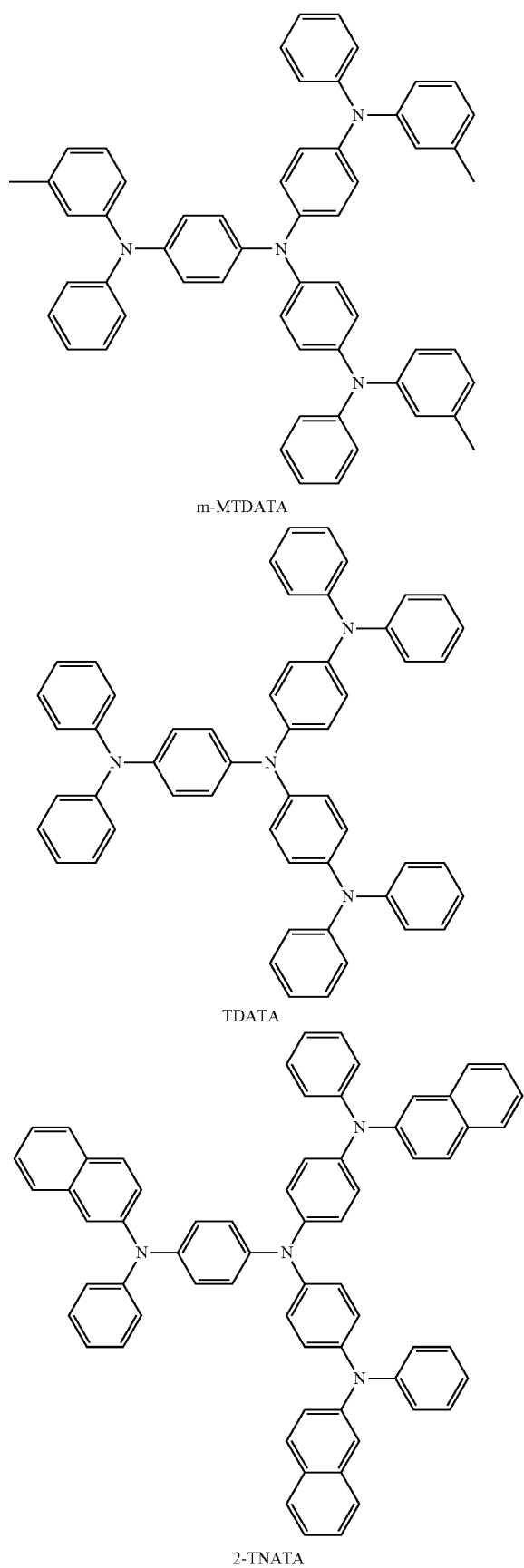
m-MTDATA
TDATA
2-TNATA
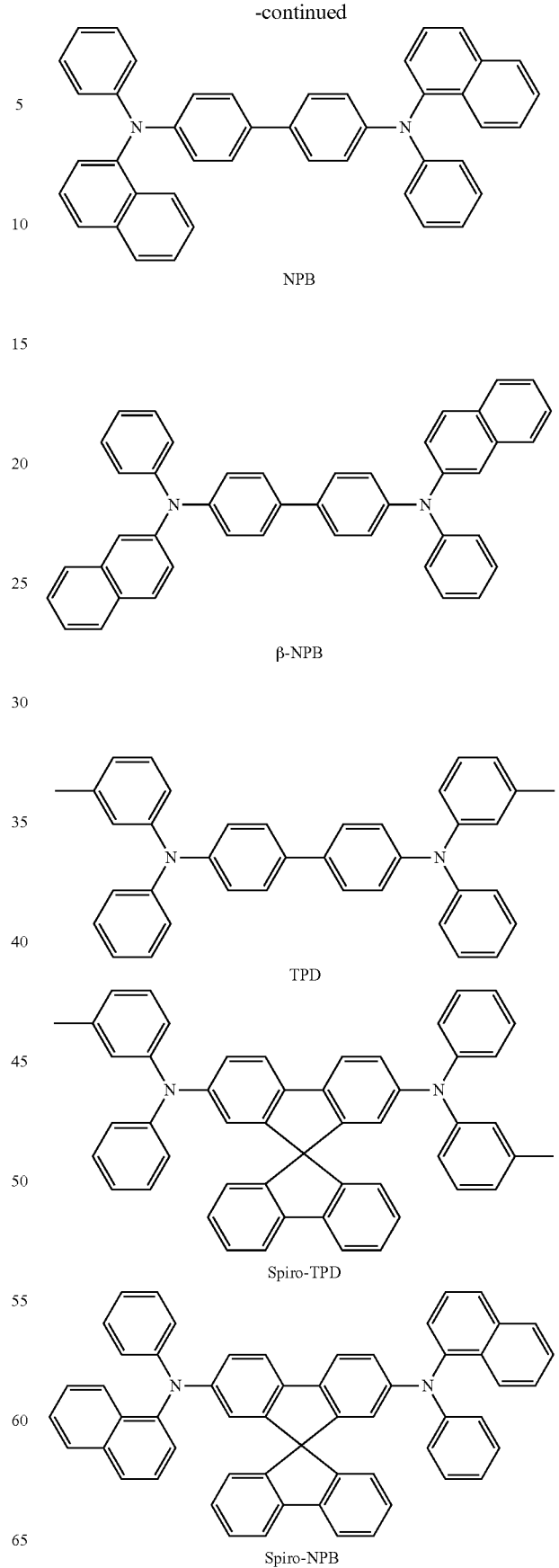
NPB
β-NPB
TPD
Spiro-TPD
Spiro-NPB -continued

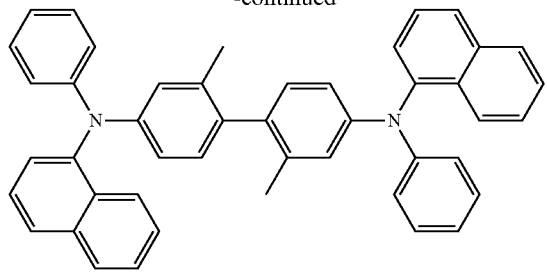

methylated NPB

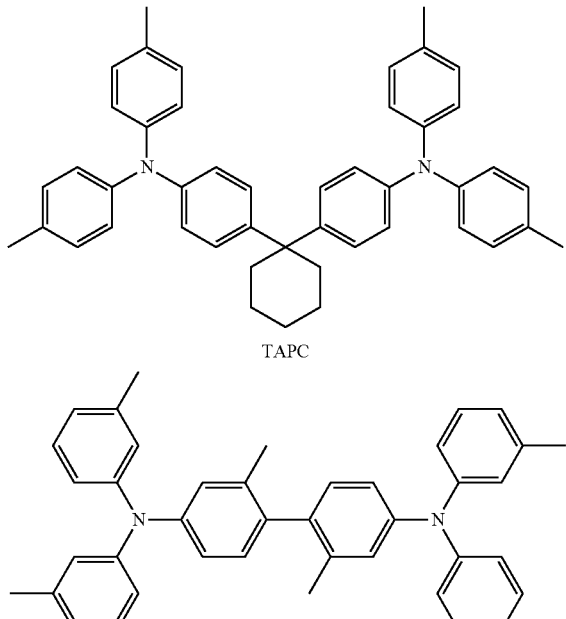

TAPC

HMTPD

Formula 201

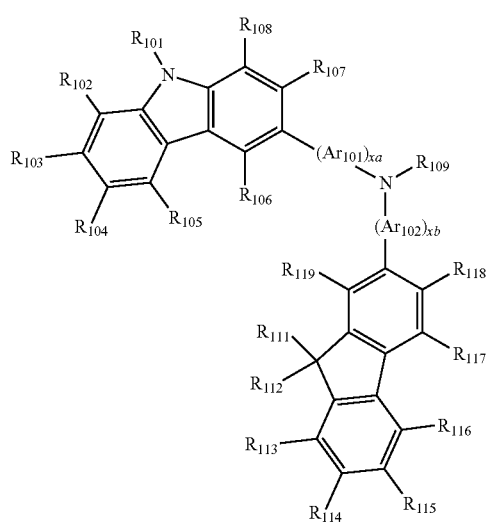

-continued

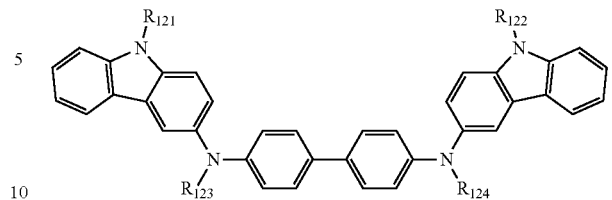

Formula 202

Ar$_{101}$ and Ar$_{102}$ in Formula 201 may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_3$-$C_{10}$ cycloalkenyl group, a $C_1$-$C_{60}$ heterocycloalkyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, or a combination thereof.

xa and xb in Formula 201 may each independently be an integer from 0 to 5, or 0, 1, or 2. For example, in one or more embodiments, xa may be 1 and xb may be 0.

R$_{101}$ to R$_{108}$, R$_{111}$ to R$_{119}$ and R$_{121}$ to R$_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, etc.), or a $C_1$-$C_{10}$ alkoxy group (for example, a methoxy group, an ethoxy group, a propoxy group, a butoxy group, a pentoxy group, etc.);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or a combination thereof.

$R_{109}$ in Formula 201 may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or a combination thereof.

In one or more embodiments, the compound represented by Formula 201 may be a compound represented by Formula 201A:

Formula 201A

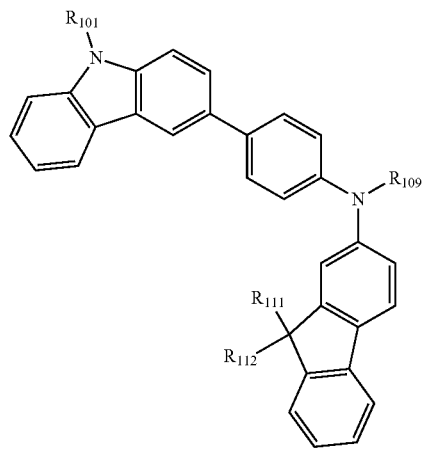

$R_{101}$, $R_{111}$, $R_{112}$, and $R_{109}$ in Formula 201A may be understood by referring to the description provided herein.

For example, the hole transport region may include one or more of Compounds HT1 to HT21:

HT1

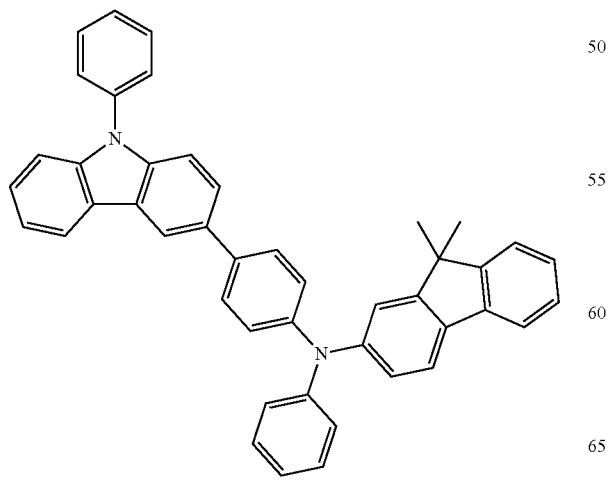

HT2

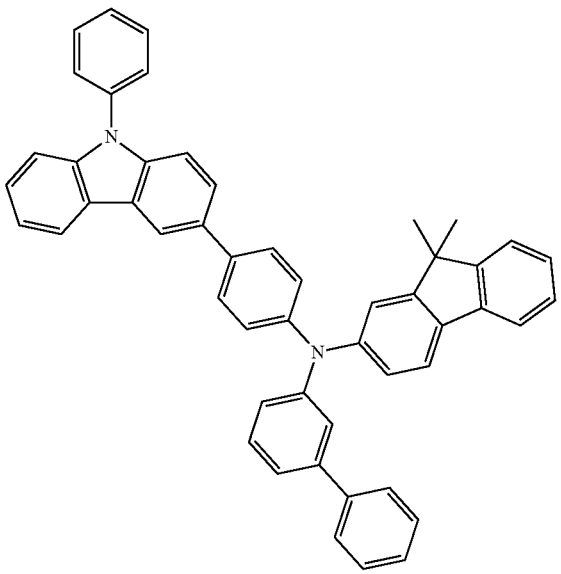

HT3

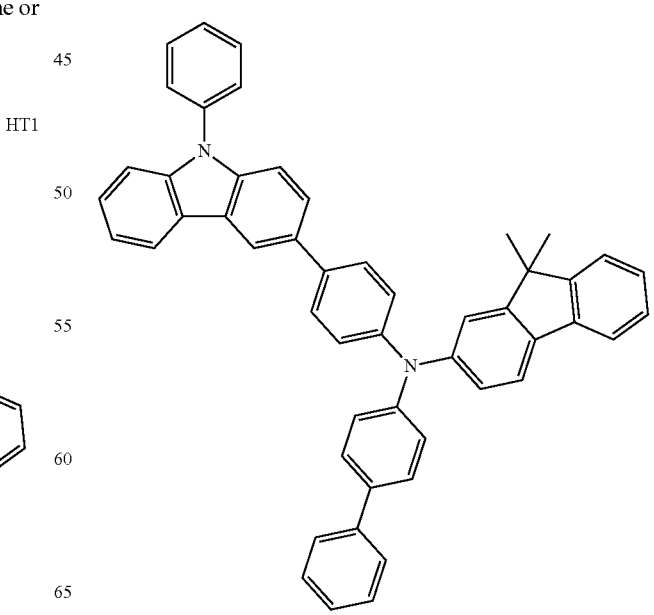

HT4
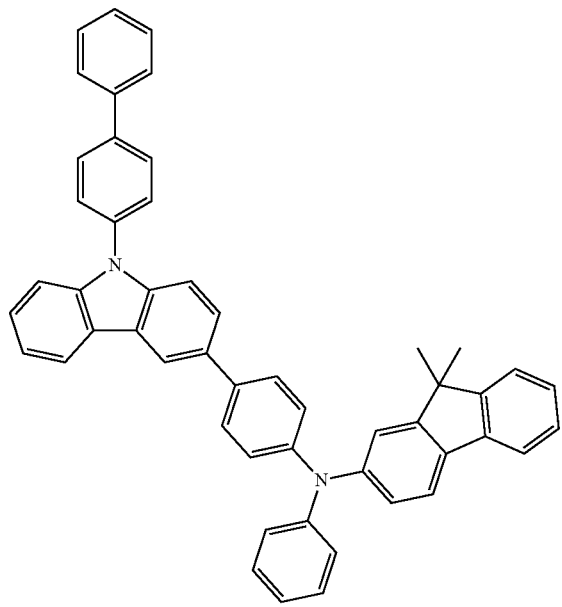
HT5
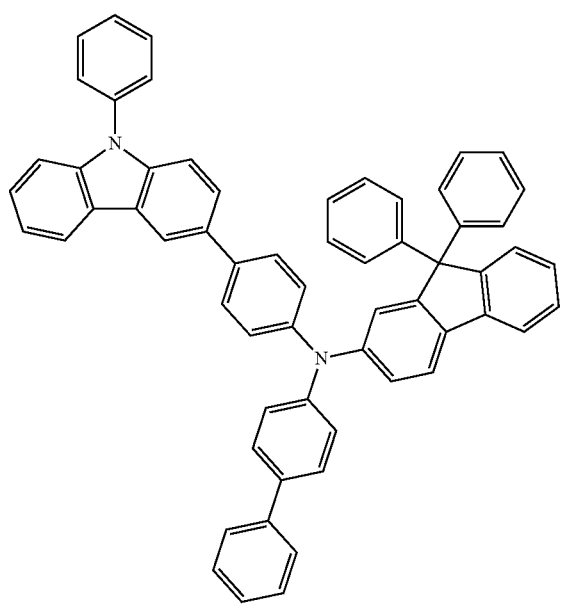
HT6
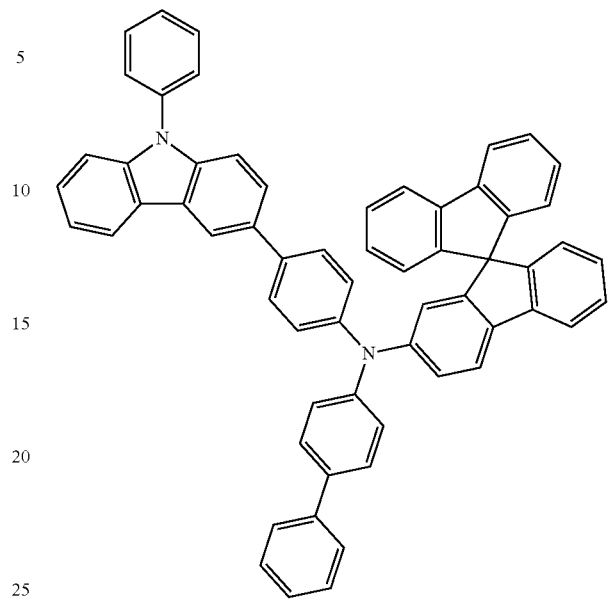
HT7
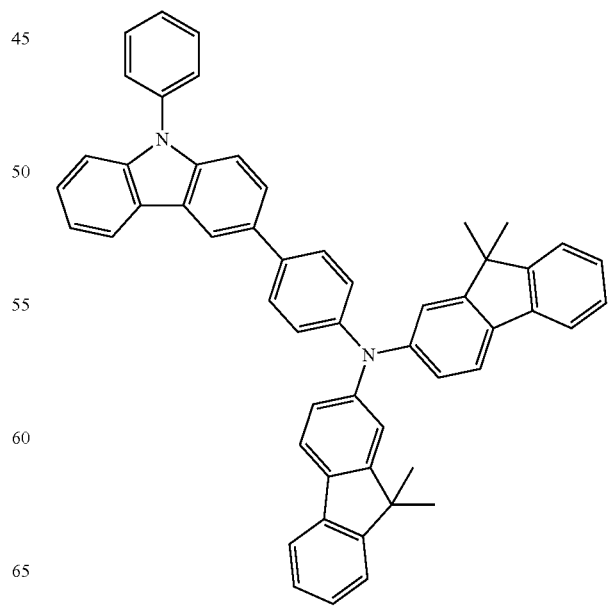

HT8
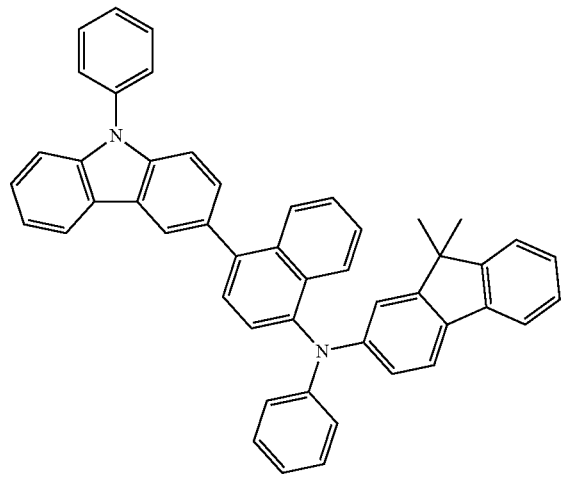
HT9
HT11
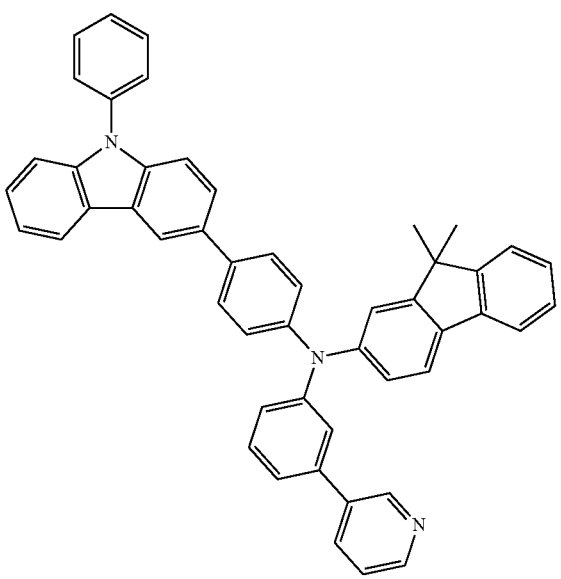
HT12
HT10
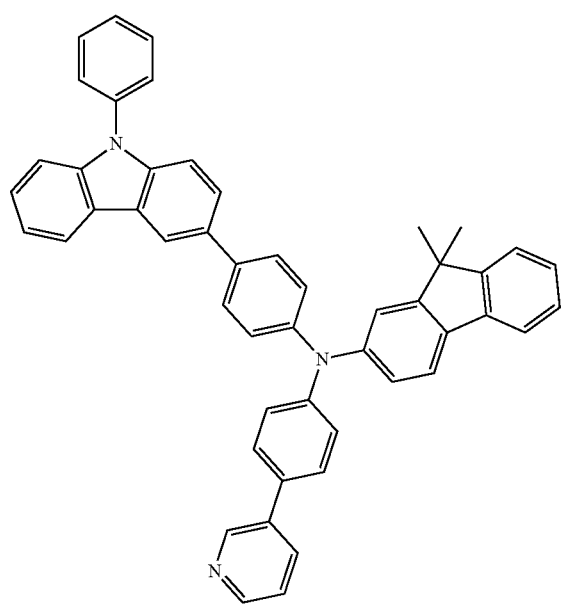
HT13
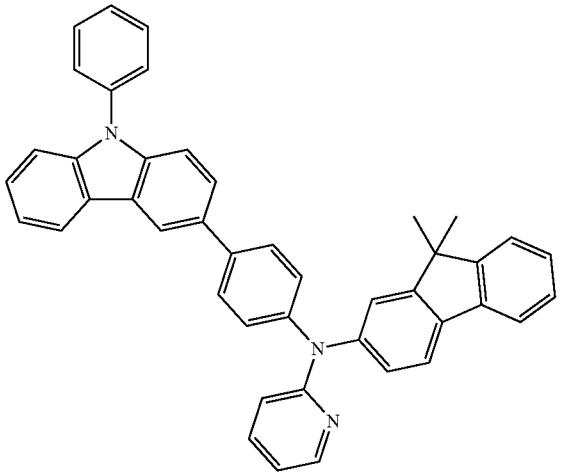
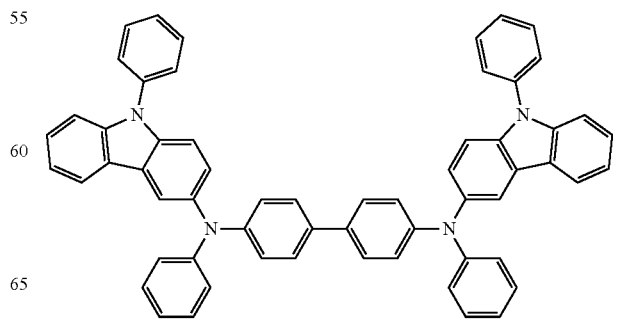

HT14
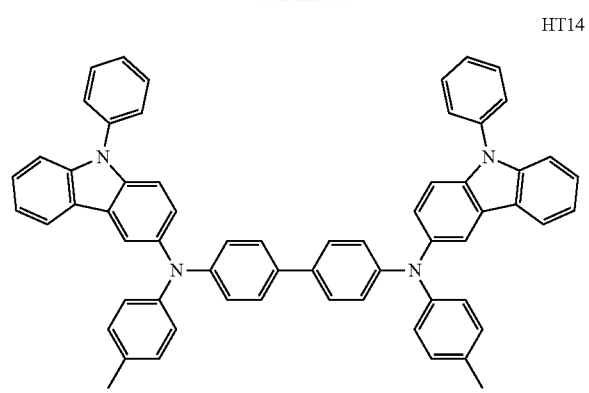
HT15
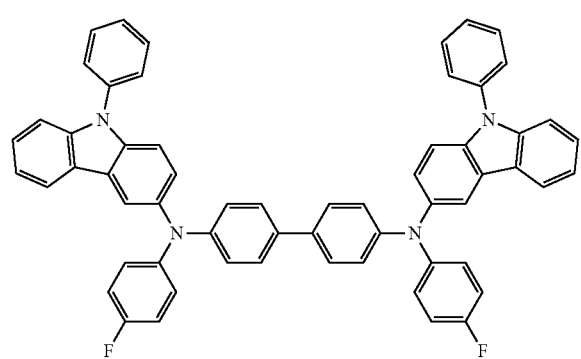
HT16
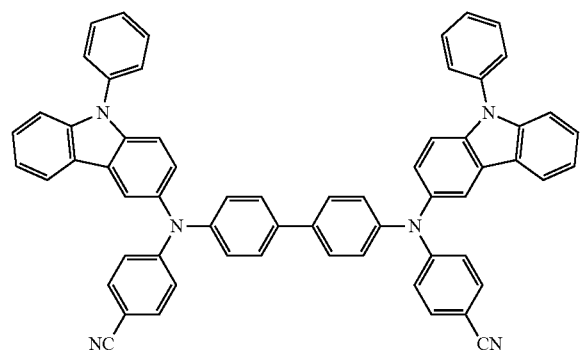
HT17
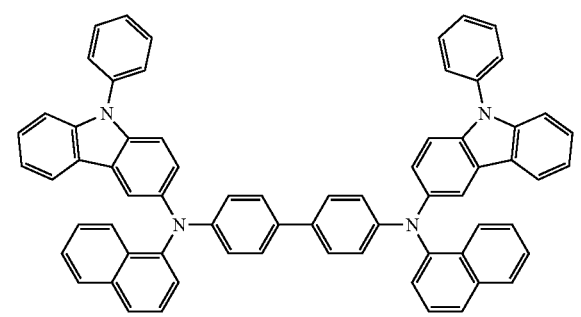
HT18
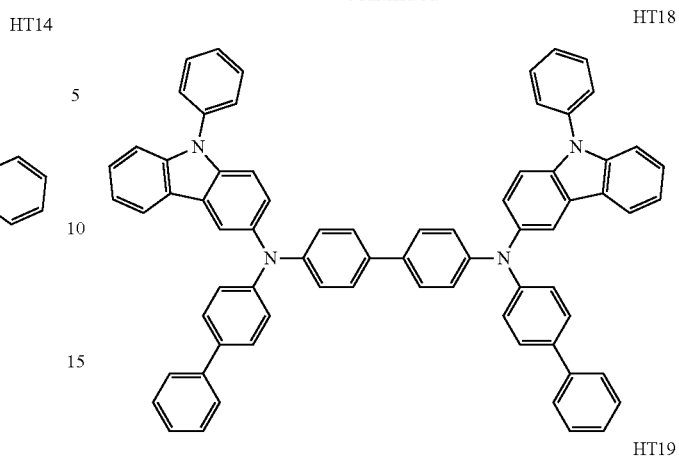
HT19
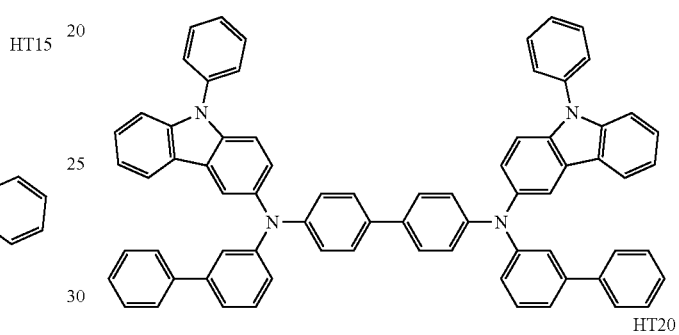
HT20
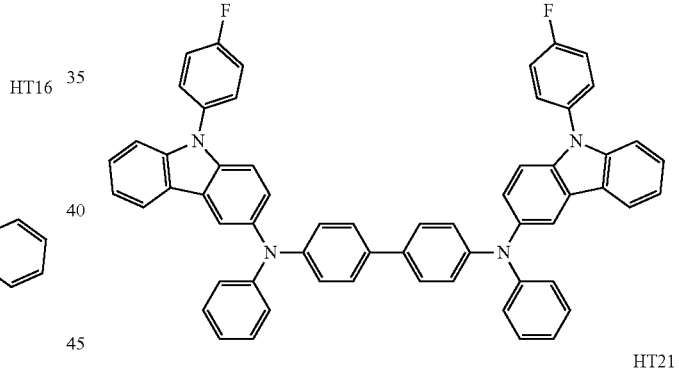
HT21
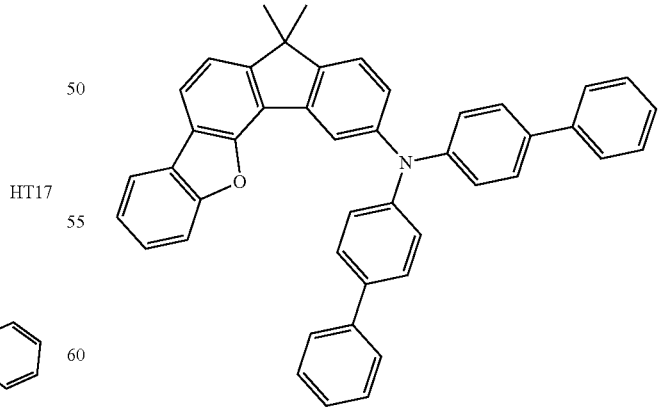
A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. Without wishing to be bound to theory, when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may include a quinone derivative, a metal oxide, a cyano group-containing compound, or a combination thereof. For example, the p-dopant may include: a quinone derivative such as tetracyanoquinodimethane (TCNQ), 2,3,5,6-tetrafluoro-tetracyano-1,4-benzoquinodimethane (F4-TCNQ), or F6-TCNNQ; a metal oxide, such as tungsten oxide and molybdenum oxide; a cyano group-containing compound, such as Compound HT-D1; or a combination thereof.

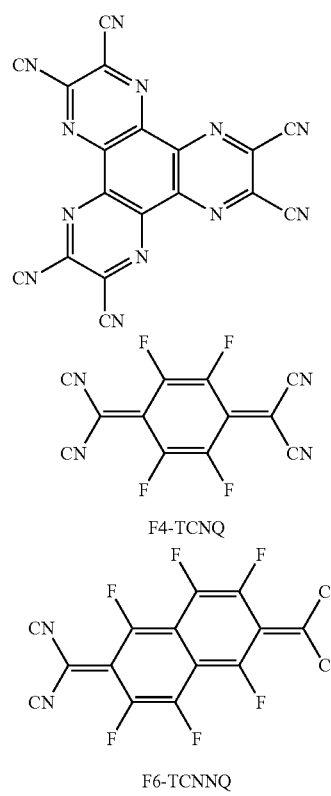

In one or more embodiments, the hole transport region may include a buffer layer.

Without wishing to be bound to theory, the buffer layer may compensate for an optical resonance distance according to a wavelength of light emitted from the emission layer, and thus, efficiency of a formed organic light-emitting device may be improved.

In one or more embodiments, the hole transport region includes an electron blocking layer, and a material for forming the electron blocking layer includes a material that is used in the hole transport region as described herein, a host material as described herein, or a combination thereof. For example, when the hole transport region includes an electron blocking layer, mCP, the Compound H21 (or any other host compounds as described herein) may be used as the material for forming the electron blocking layer.

In one or more embodiments, an emission layer (EML) may be formed on the hole transport region by vacuum deposition, spin coating, casting, LB deposition, or the like. When the emission layer is formed by vacuum deposition or spin coating, the deposition or coating conditions may be similar to those used in forming the hole injection layer, although the deposition or coating conditions may vary according to the materials that are used to form the emission layer.

The emission layer may include a host and a dopant, and the dopant may include the organometallic compound represented by Formula 1 as described herein.

The host may include 1,3,5-tri(1-phenyl-1H-benzo[d]imidazol-2-yl)phenyl (TPBi), 3-tert-butyl-9,10-di(naphth-2-yl)anthracene (TBADN), distyrylarylene (DSA), 9,10-di(naphthalene-2-yl)anthracene (ADN) (also referred to as "DNA"), 4,4'-bis(N-carbazolyl)-1,1'-biphenyl (CBP), 4,4'-bis(9-carbazolyl)-2,2'-dimethyl-biphenyl (CDBP), 1,3,5-tris(carbazole-9-yl)benzene (tCP), 1,3-bis(N-carbazolyl)benzene (mCP), Compound H50, Compound H51, Compound H52, or a combination thereof:

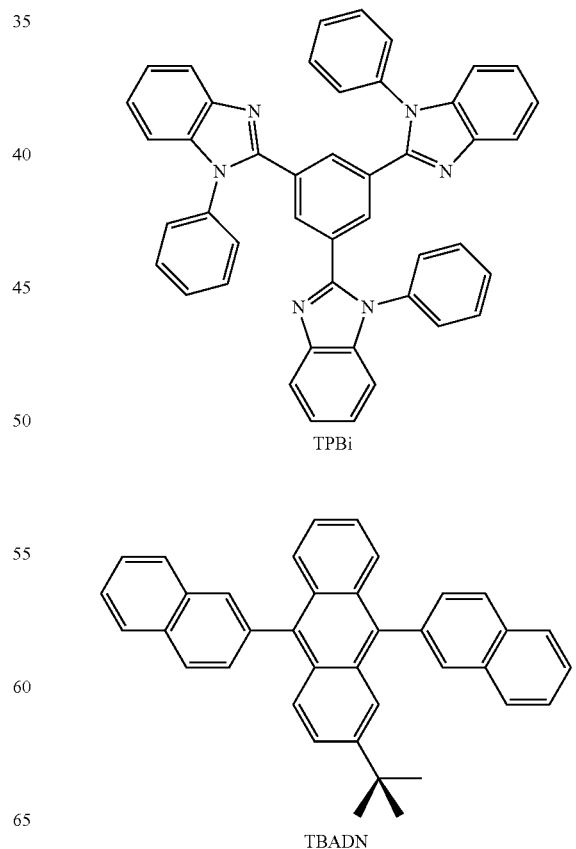

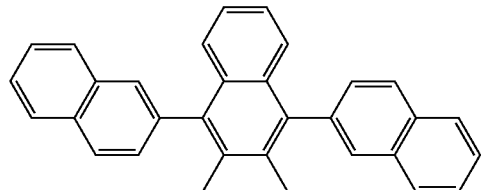
ADN

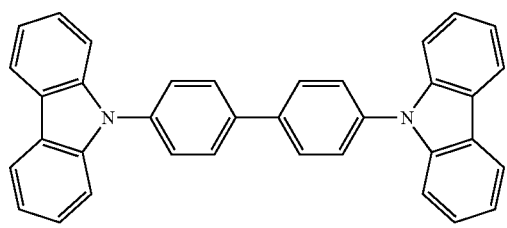
CBP

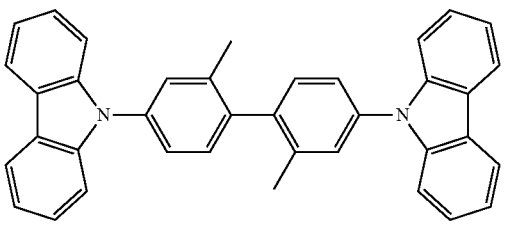
CDBP

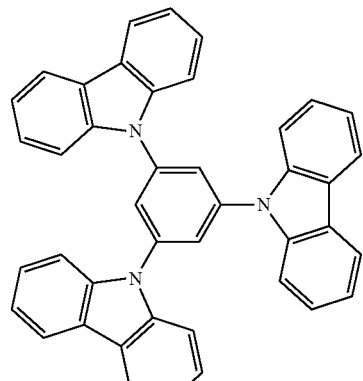
TCP

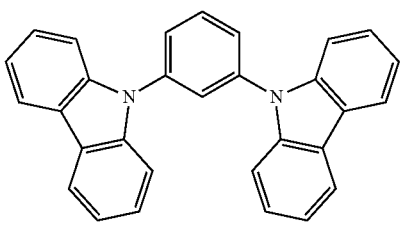
mCP

H50
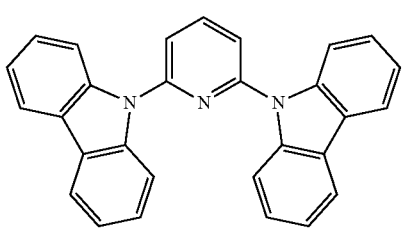

H51
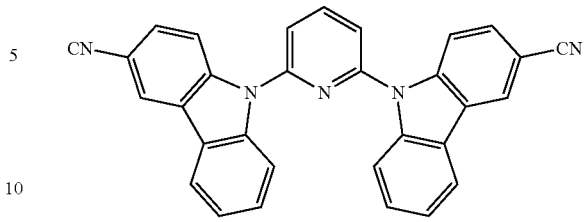

H52
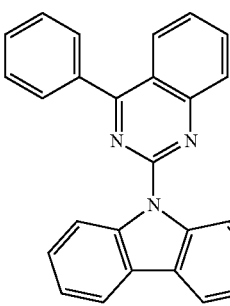
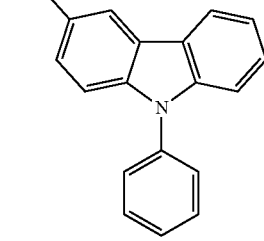

When the organic light-emitting device is a full-color organic light-emitting device, the emission layer may be patterned into a red emission layer, a green emission layer, and a blue emission layer, or a combination thereof. In one or more embodiments, an organic light-emitting device including a stacked structure of emission layers including a red emission layer, a green emission layer, a blue emission layer, or a combination thereof, the stacked emission layer may emit white light.

When the emission layer includes a host and a dopant, an amount of the dopant may be in a range of about 0.01 parts by weight to about 15 parts by weight based on 100 parts by weight of the host.

A thickness of the emission layer may be in a range of about 100 Å to about 1,000 Å, for example, about 200 Å to about 600 Å. Without wishing to be bound to theory, when the thickness of the emission layer is within this range, excellent light-emission characteristics may be obtained without a substantial increase in driving voltage.

In one or more embodiments, an electron transport region may be located on the emission layer.

The electron transport region may include a hole blocking layer, an electron transport layer, an electron injection layer, or a combination thereof.

For example, the electron transport region may include a hole blocking layer/electron transport layer/electron injection layer structure, or an electron transport layer/electron injection layer structure. The electron transport layer may have a single-layered structure or a multi-layered structure including two or more different material layers.

Conditions for forming the hole blocking layer, the electron transport layer, and the electron injection layer which constitute the electron transport region may be understood by referring to the conditions described herein for forming the hole injection layer.

When the electron transport region includes a hole blocking layer, the hole blocking layer may include, for example, one or more of 2,9-dimethyl-4,7-diphenyl-1,10-phenanthroline (BCP), 4,7-diphenyl-1,10-phenanthroline (Bphen), or bis(2-methyl-8-quinolinolato-N1,O8)-(1,1'-biphenyl-4-olato)aluminum (BAlq).

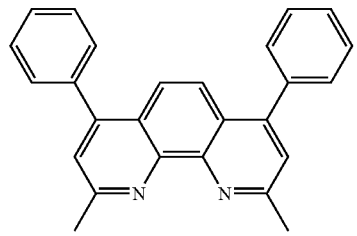

BCP

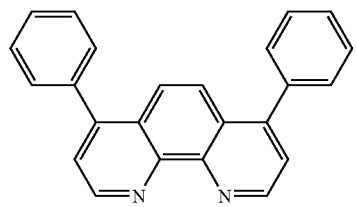

BCP

In one or more embodiments, the hole blocking layer may include a host, a material for forming an electron transport layer, a material for forming an electron injection layer, or a combination thereof.

A thickness of the hole blocking layer may be in a range of about 20 Å to about 1,000 Å, for example, about 30 Å to about 600 Å. Without wishing to be bound to theory, when the thickness of the hole blocking layer is within these ranges, the hole blocking layer may have excellent hole blocking characteristics without a substantial increase in driving voltage.

The electron transport layer may include BCP, Bphen, TPBi, tris(8-hydroxy-quinolinato)aluminum (Alq₃), Balq, 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), or a combination thereof.

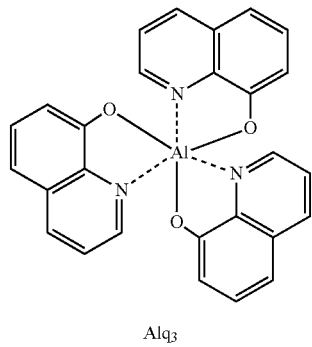

Alq₃

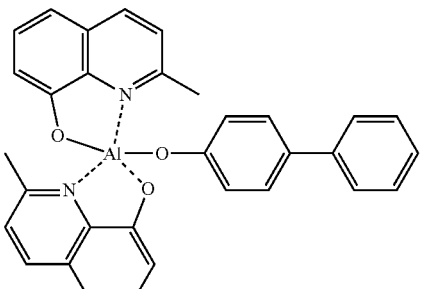

BAlq

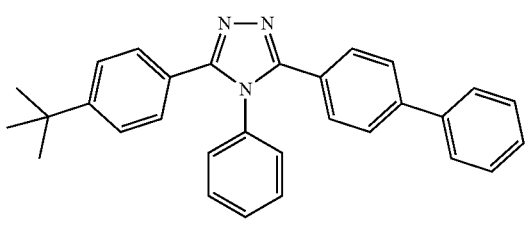

TAZ

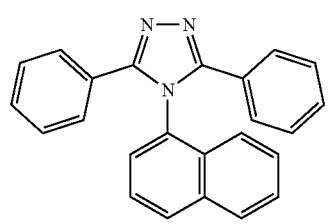

NTAZ

In one or more embodiments, the electron transport layer may include one or more of Compounds ET1 to ET25:

ET1

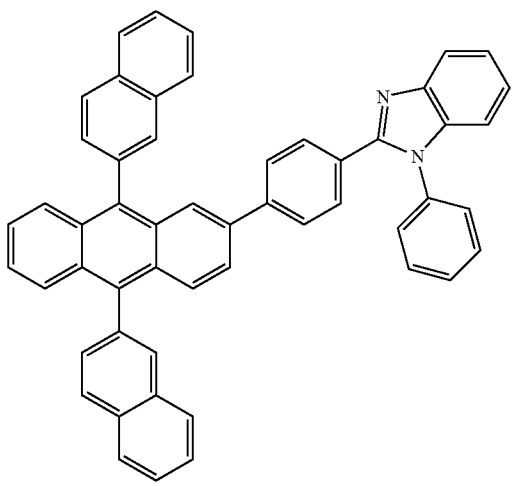

ET2
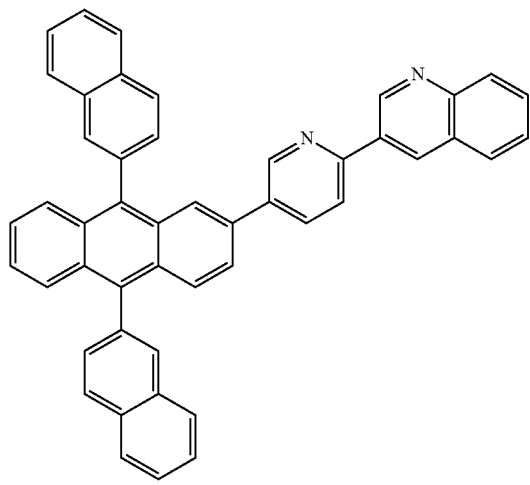
ET3
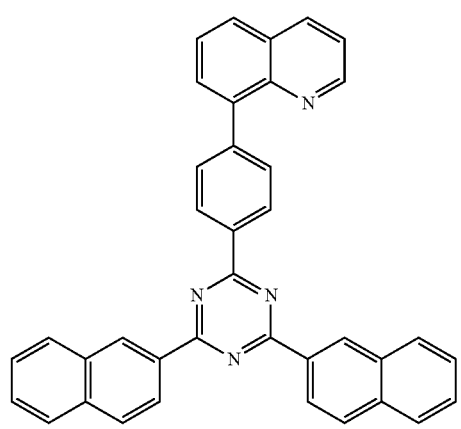
ET4
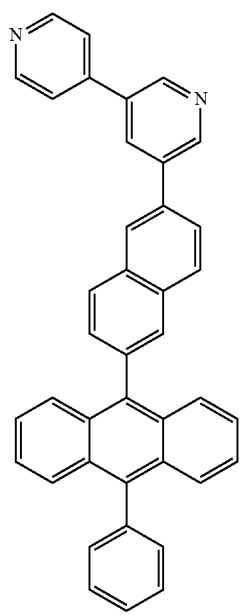
ET5
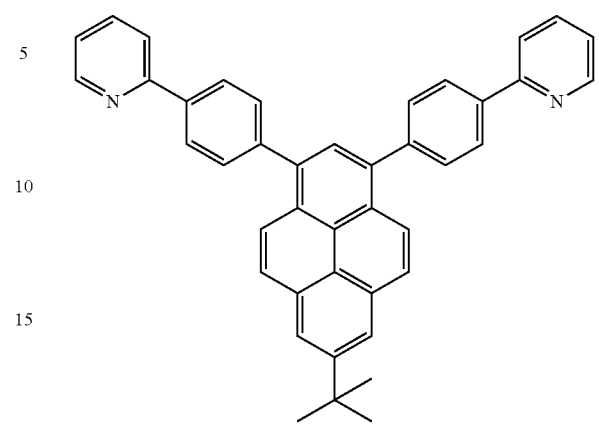
ET6
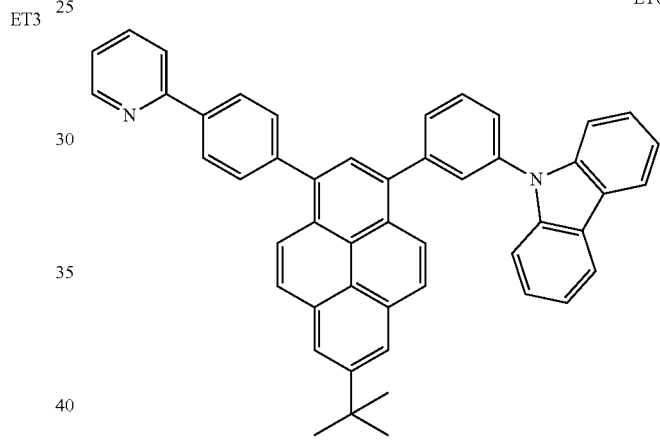
ET7
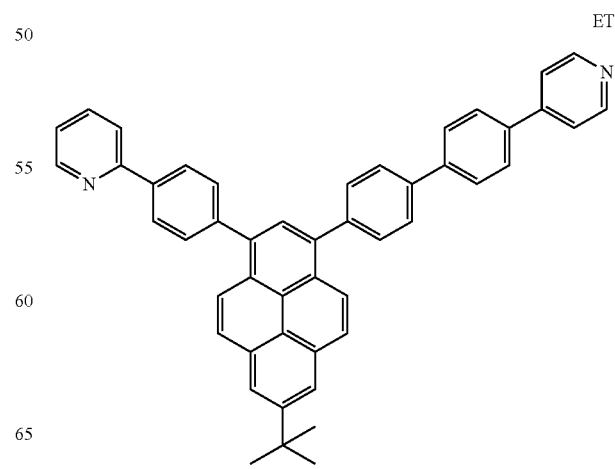

159
-continued
ET8
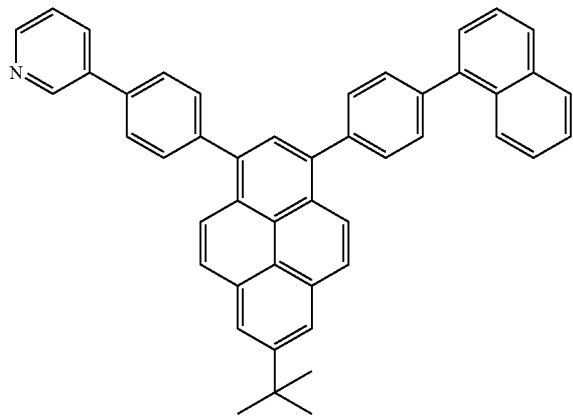
ET9
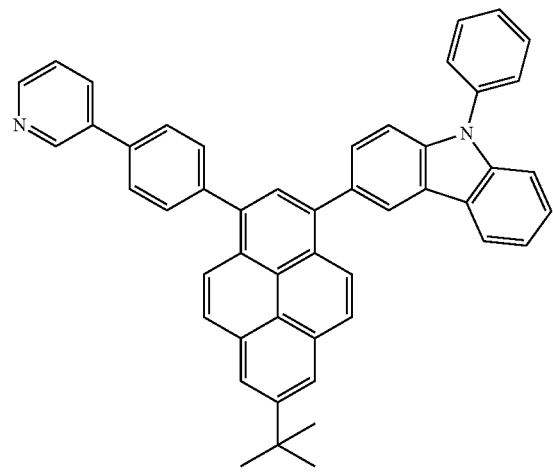
ET10
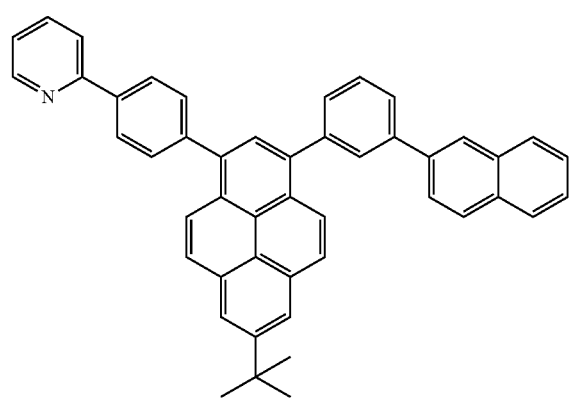
ET11
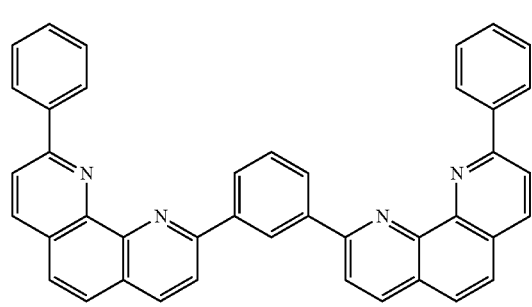
160
-continued
ET12
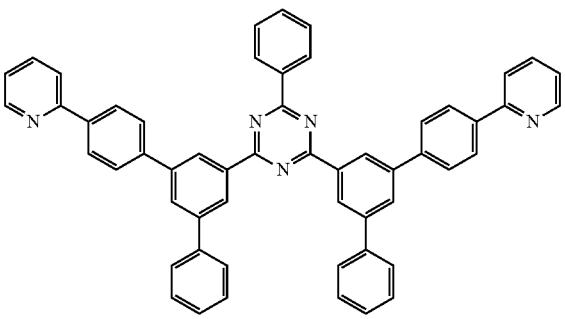
ET13
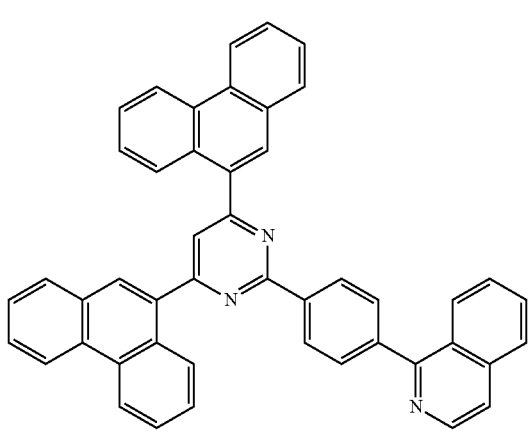
ET14
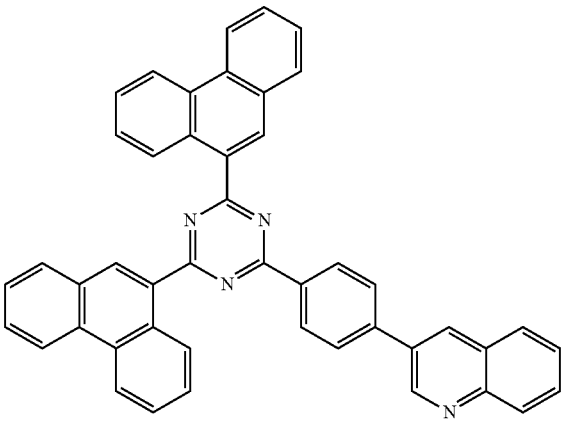
ET15
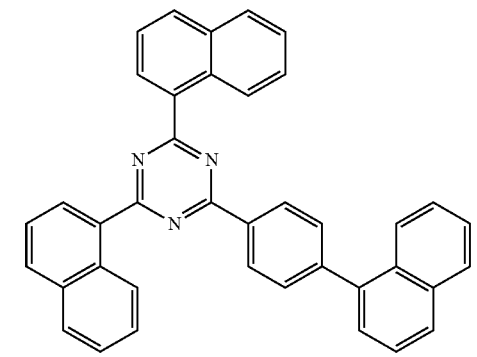

ET16
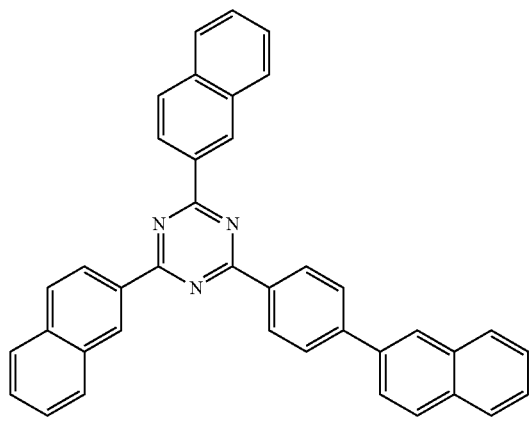
ET17
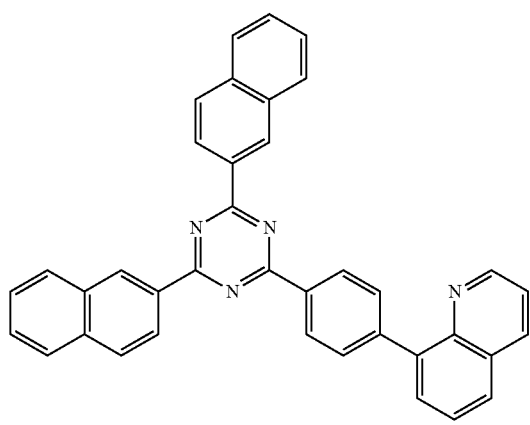
ET18
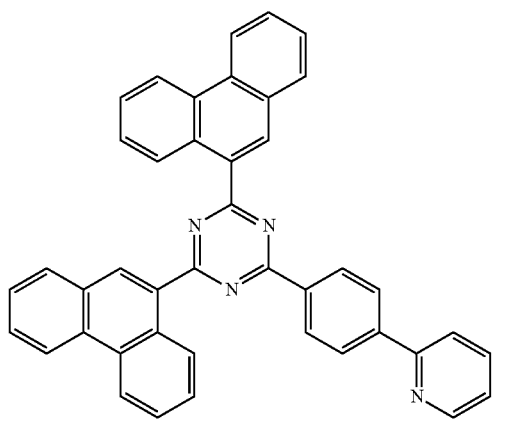
ET19
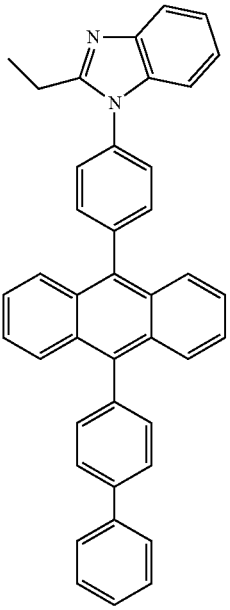
ET20
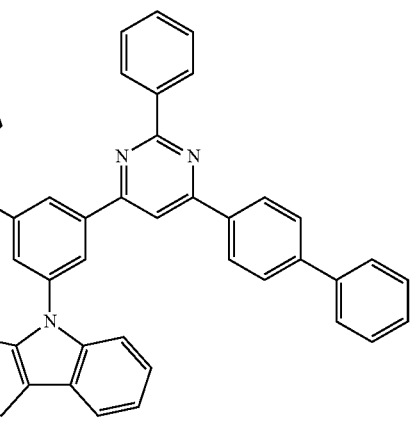
ET21
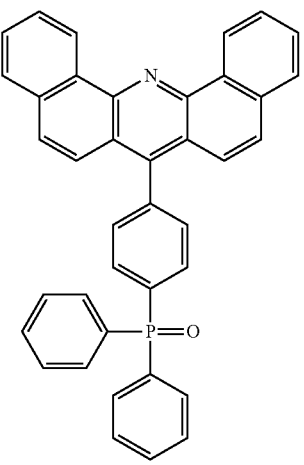

ET22
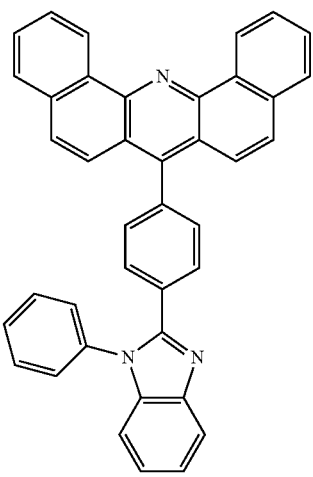

ET23
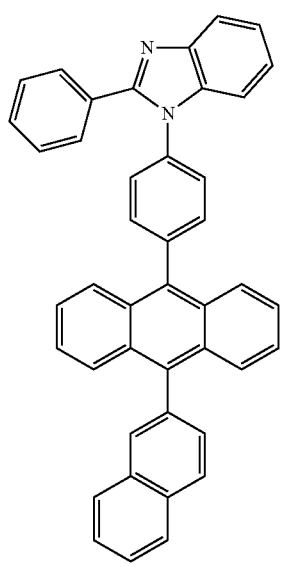

ET24
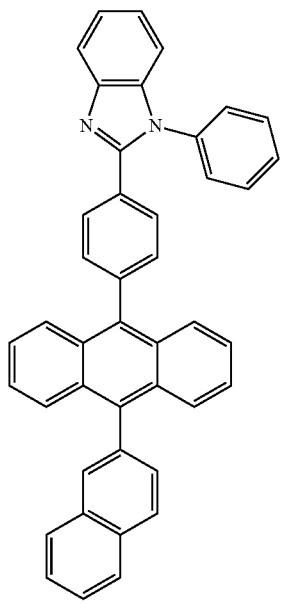

ET25
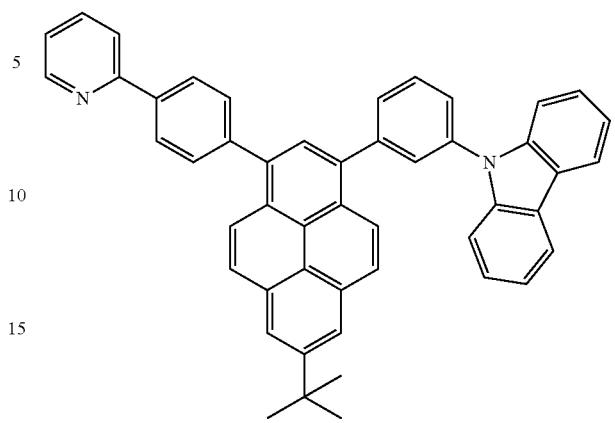

A thickness of the electron transport layer may be in a range of about 100 Å to about 1,000 Å, for example, about 150 Å to about 500 Å. Without wishing to be bound to theory, when the thickness of the electron transport layer is within the range described above, the electron transport layer may have suitable electron transport characteristics without a substantial increase in driving voltage.

In one or more embodiments, the electron transport layer may further include, in addition to the materials described above, a metal-containing material.

The metal-containing material may include a Li complex. The Li complex may include, for example, Compound ET-D1 or ET-D2:

ET-D1
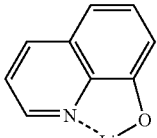

ET-D2
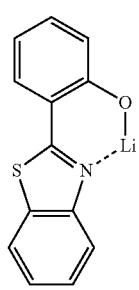

The electron transport region may include an electron injection layer (EIL) that promotes the flow of electrons from the second electrode 19 thereinto.

The electron injection layer may include LiF, NaCl, CsF, $Li_2O$, BaO, or a combination thereof.

A thickness of the electron injection layer may be in a range of about 1 Å to about 100 Å, and, for example, about 3 Å to about 90 Å. Without wishing to be bound to theory, when the thickness of the electron injection layer is within the range described above, the electron injection layer may have satisfactory electron injection characteristics without a substantial increase in driving voltage.

The second electrode 19 may be located on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as the material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to the FIGURE, but embodiments of the present disclosure are not limited thereto.

According to another aspect, the organic light-emitting device may be included in an electronic apparatus. In one or more embodiments, an electronic apparatus including the organic light-emitting device is provided. The electronic apparatus may include, for example, a display, an illumination, a sensor, or the like.

Another aspect provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnostic kit, a diagnostic reagent, a biosensor, a biomarker, or the like.

The term "$C_1$-$C_{60}$ alkyl group" as used herein refers to a linear or branched saturated aliphatic hydrocarbons monovalent group having 1 to 60 carbon atoms, and the term "$C_1$-$C_{60}$ alkylene group" as used here refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or any combination thereof. For example, Formula 9-33 is a branched C alkyl group, for example, a tert-butyl group that is substituted with two methyl groups.

The term "$C_1$-$C_{60}$ alkoxy group" as used herein refers to a monovalent group having the formula of —$OA_{101}$ (where $A_{101}$ is the $C_1$-$C_{60}$ alkyl group).

Examples of the $C_1$-$C_{60}$ alkoxy group, a $C_1$-$C_{20}$ alkoxy group or $C_1$-$C_{10}$ alkoxy group include a methoxy group, an ethoxy group, a propoxy group, a butoxy group, and a pentoxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms, and the term "$C_3$-$C_{10}$ cycloalkylene group" as used herein refers to a divalent group having the same structure as the $C_3$-$C_{10}$ cycloalkyl group.

Examples of the $C_3$-$C_{10}$ cycloalkyl group include a cyclopropyl group, a cyclobutyl group, a cyclopentyl, cyclohexyl group, a cycloheptyl group, a cyclooctyl group, an adamantanyl group, a norbornanyl group (a bicyclo[2.2.1]heptyl group), a bicyclo[1.1.1]pentyl group, a bicyclo[2.1.1]hexyl group, and a bicyclo[2.2.2]octyl group.

The term "$C_1$-$C_{10}$ heterocycloalkyl group" as used herein refers to a saturated cyclic group that includes at least one hetero atom selected from N, O, P, Si, S, Se, Ge, and B as a ring-forming atom and 1 to 10 carbon atoms, and the $C_1$-$C_{10}$ heterocycloalkylene group refers to a divalent group having the same structure as the $C_1$-$C_{10}$ heterocycloalkyl group.

Examples of the $C_1$-$C_{10}$ heterocycloalkyl group include a silolanyl group, a silinanyl group, tetrahydrofuranyl group, a tetrahydro-2H-pyranyl group, a tetrahydrothiophenyl group, and the like.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, S, Se, Ge, and B as a ring-forming atom instead of a carbon atom, 1 to 10 carbon atoms, and at least one carbon-carbon double bond in its ring. Examples of the $C_1$-$C_{10}$ heterocycloalkenyl group include a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_7$-$C_{60}$ alkyl aryl group" used herein refers to a $C_6$-$C_{60}$ aryl group substituted with at least one $C_1$-$C_{60}$ alkyl group. The term "$C_7$-$C_{60}$ aryl alkyl group" as used herein refers to a $C_1$-$C_{60}$ alkyl group substituted with at least one $C_6$-$C_{60}$ aryl group.

The term "$C_1$-$C_6$ heteroaryl group" as used herein refers to a monovalent group having at least one heteroatom selected from N, O, P, Si, S, Se, Ge, and B as a ring-forming atom instead of carbon and a cyclic aromatic system having 1 to 60 carbon atoms, and the term "$C_1$-$C_{60}$ heteroarylene group" as used herein refers to a divalent group having at least one heteroatom selected from N, O, P, Si, S, Se, Ge, and B as a ring-forming atom instead of carbon and a cyclic aromatic system having 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the rings may be fused to each other.

The term "$C_2$-$C_{60}$ alkyl heteroaryl group" as used herein refers to a $C_1$-$C_{60}$ heteroaryl group substituted with at least one $C_1$-$C_{60}$ alkyl group. The term "$C_2$-$C_{60}$ heteroaryl alkyl group" as used herein refers to a $C_1$-$C_{60}$ alkyl group substituted with at least one $C_1$-$C_{60}$ heteroaryl group.

The term "$C_6$-$C_{60}$ aryloxy group" as used herein indicates a group of the formula —$OA_{102}$ (wherein $A_{102}$ indicates the $C_6$-$C_{60}$ aryl group), the $C_6$-$C_{60}$ arylthio group indicates a group of the formula —$SA_{103}$ (wherein $A_{103}$ indicates the $C_6$-$C_{60}$ aryl group), and the $C_1$-$C_{60}$ alkylthio group indicates a group of the formula —$SA_{104}$ (wherein $A_{104}$ indicates the $C_1$-$C_{60}$ alkyl group).

The term "$C_1$-$C_{60}$ heteroaryloxy group" as used herein indicates a group of formula —$OA_{102a}$ (wherein $A_{102a}$ indicates the $C_1$-$C_{60}$ heteroaryl group), and the $C_1$-$C_{60}$ heteroarylthio group indicates a group of formula —$SA_{103a}$ (wherein $A_{103a}$ indicates the $C_1$-$C_{60}$ heteroaryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, a heteroatom selected from N, O, P, Si, S, Se, Ge, and B, as a ring-forming atom instead of carbon, and no aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. Examples of the $C_5$-$C_{30}$ carbocyclic group include an adamantane group, a norbornane group (a bicyclo[2.2.1]heptane group), a norbornene group, a bicyclo[1.1.1]pentane group, a bicyclo[2.1.1]hexane group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, and a fluorene group, each of which is unsubstituted or substituted with at least one $R_{10a}$ as described herein.

The term "$C_1$-$C_{30}$ heterocyclic group" as used herein refers to a saturated or unsaturated cyclic group having, as a ring-forming atom, at least one heteroatom selected from N, O, P, Si, Se, Ge, B, and S instead of carbon, and 1 to 30 carbon atoms. The $C_1$-$C_{30}$ heterocyclic group may be a monocyclic group or a polycyclic group. The $C_1$-$C_{30}$ heterocyclic group may be, for example, a thiophene group, a furan group, a pyrrole group, a silole group, borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, each of which is unsubstituted or substituted with at least one $R_{10a}$ as described herein.

The terms "fluorinated $C_1$-$C_{60}$ alkyl group (or a fluorinated $C_1$-$C_{20}$ alkyl group or the like)", "fluorinated $C_3$-$C_{10}$ cycloalkyl group", "fluorinated $C_1$-$C_{10}$ heterocycloalkyl group," and "fluorinated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group (—F). For example, the "fluorinated $C_1$ alkyl group (that is, the fluorinated methyl group)" may include —$CF_3$, —$CF_2H$, and —$CFH_2$. The "fluorinated $C_1$-$C_{60}$ alkyl group (or, a fluorinated $C_1$-$C_{20}$ alkyl group, or the like)", "the fluorinated $C_3$-$C_{10}$ cycloalkyl group", "the fluorinated $C_1$-$C_{10}$ heterocycloalkyl group", or "the fluorinated a phenyl group" may be i) a fully fluorinated $C_1$-$C_{60}$ alkyl group (or, a fully fluorinated $C_1$-$C_{20}$ alkyl group, or the like), a fully fluorinated $C_3$-$C_{10}$ cycloalkyl group, a fully fluorinated $C_1$-$C_{10}$ heterocycloalkyl group, or a fully fluorinated phenyl group, wherein, in each group, all hydrogen atoms included therein are substituted with a fluoro (—F) group, or ii) a partially fluorinated $C_1$-$C_{60}$ alkyl group (or, a partially fluorinated $C_1$-$C_{20}$ alkyl group, or the like), a partially fluorinated $C_3$-$C_{10}$ cycloalkyl group, a partially fluorinated $C_1$-$C_{10}$ heterocycloalkyl group, or a partially fluorinated phenyl group, wherein, in each group, some of the hydrogen atoms are substituted with a fluoro group, but not all hydrogen atoms included therein are substituted with a fluoro group.

The terms "deuterated $C_1$-$C_{60}$ alkyl group (or a deuterated $C_1$-$C_{20}$ alkyl group or the like)", "deuterated $C_3$-$C_{10}$ cycloalkyl group", "deuterated $C_1$-$C_{10}$ heterocycloalkyl group," and "deuterated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one deuterium. For example, the "deuterated $C_1$ alkyl group (that is, the deuterated methyl group)" may include —$CD_3$, —$CD_2H$, and —$CDH_2$, and examples of the "deuterated $C_3$-$C_{10}$ cycloalkyl group" are, for example, Formula 10-501 and the like. The "deuterated $C_1$-$C_{60}$ alkyl group (or, the deuterated $C_1$-$C_{20}$ alkyl group or the like)", "the deuterated $C_3$-$C_{10}$ cycloalkyl group", "the deuterated $C_1$-$C_{10}$ heterocycloalkyl group", or "the deuterated phenyl group" may be i) a fully deuterated $C_1$-$C_{60}$ alkyl group (or, a fully deuterated $C_1$-$C_{20}$ alkyl group or the like), a fully deuterated $C_3$-$C_{10}$ cycloalkyl group, a fully deuterated $C_1$-$C_{10}$ heterocycloalkyl group, or a fully deuterated phenyl group, wherein, in each group, all hydrogen atoms included therein are substituted with deuterium, or ii) a partially deuterated $C_1$-$C_{60}$ alkyl group (or, a partially deuterated $C_1$-$C_{20}$ alkyl group or the like), a partially deuterated $C_3$-$C_{10}$ cycloalkyl group, a partially deuterated $C_1$-$C_{10}$ heterocycloalkyl group, or a partially deuterated phenyl group, wherein, in each group, some of the hydrogen atoms are substituted with deuterium, but not all hydrogen atoms included therein are substituted with deuterium.

The term "($C_1$-$C_{20}$ alkyl) 'X' group" as used herein refers to an 'X' group that is substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group. The term "($C_1$-$C_{20}$ alkyl)phenyl group" as used herein is a $C_7$-$C_{60}$ alkyl aryl group and refers to a phenyl group substituted with at least one $C_1$-$C_{20}$ alkyl group. An example of a ($C_1$ alkyl) phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene group, and a 5,5-dioxide group" respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene group, and a 5,5-dioxide group," wherein, in each group, at least one ring-forming carbon atom is substituted with nitrogen.

Substituent(s) of the substituted $C_5$-$C_{30}$ carbocyclic group, the substituted $C_2$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may each independently be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{10}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(=O)($Q_{28}$)($Q_{29}$), —P($Q_{28}$)($Q_{29}$), or a combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$); or a combination thereof.

$Q_1$ to $Q_9$, $Q_{11}$ to $Q_{19}$, $Q_{21}$ to $Q_{29}$, and $Q_{31}$ to $Q_{39}$ as used herein are each independently: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_1$-$C_{60}$ heteroaryl group; a $C_1$-$C_{60}$ heteroaryl group which is unsubstituted or substituted with deuterium, a $C_1$-$C_{60}$ alkyl group, a $C_6$-$C_{60}$ aryl group, or a combination thereof; a $C_1$-$C_{60}$ heteroaryloxy group; a $C_1$-$C_{60}$ heteroarylthio group; $C_1$-$C_{60}$ heteroaryloxy group; a $C_1$-$C_{60}$ heteroarylthio group; a monovalent non-aromatic condensed polycyclic group; or a monovalent non-aromatic condensed heteropolycyclic group.

Hereinafter, an organometallic compound and an organic light-emitting device according to one or more embodiments are described in detail with reference to the Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Compound 1)

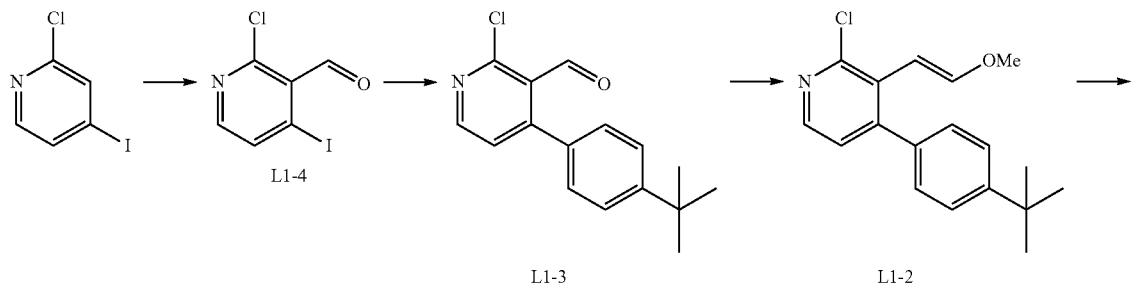

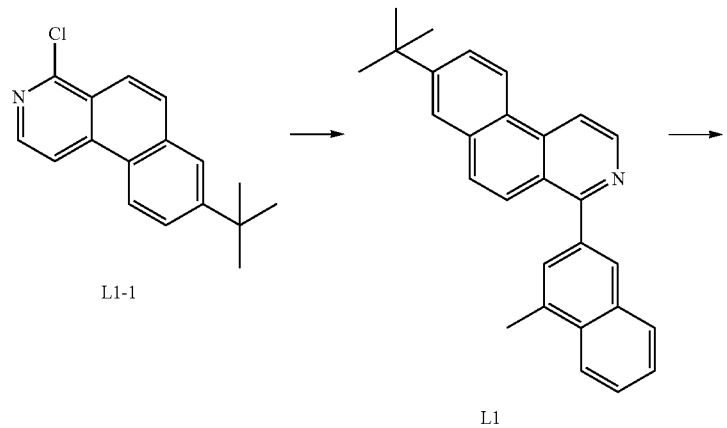

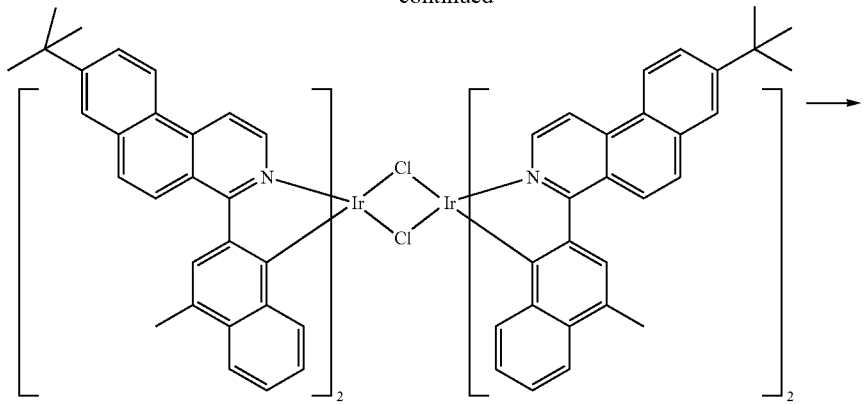

L1 Dimer

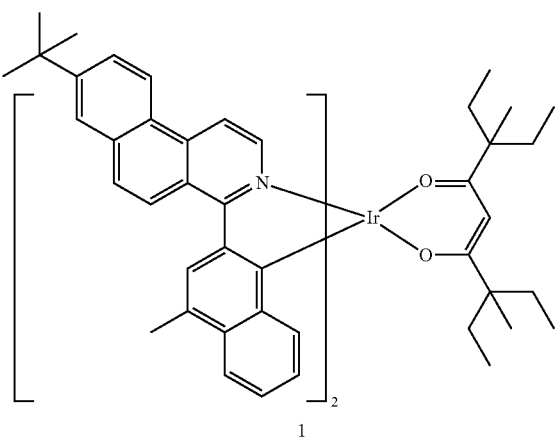

1

Synthesis of Intermediate L1-4

5 grams (g) (20.9 millimoles (mmol)) of 2-chloro-4-iodopyridine was dissolved in 50 milliliters (mL) of anhydrous tetrahydrofuran (THF), and 12.5 mL (25 mmol) of 2.0 molar (M) lithium diisopropylamide (in THF) was slowly added dropwise thereto at a temperature of −78° C. After about 3 hours, 2.5 mL (32 mmol) of ethyl formate was slowly added dropwise thereto, followed by stirring at room temperature for 18 hours. When the reaction was completed, water and ethyl acetate were added to the reaction mixture and an extraction process was performed thereon, and the obtained organic layer was dried using magnesium sulfate and the solvent removed under reduced pressure. The resultant product was purified by liquid chromatography to obtain 2.2 g of Intermediate L1-4 (yield of 40%).

Synthesis of Intermediate L1-3

2.0 g (7.5 mmol) of Intermediate L1-4 was dissolved in 60 mL of acetonitrile and 15 mL of water, and then, 0.6 g (0.5 mmol) of $PdCl_2(PPh_3)_2$ (Bis(triphenylphosphine)palladium (II) dichloride), 1.4 g (8.0 mmol) of (4-(tert-butyl)phenyl) boronic acid, and 2.6 g (18.8 mmol) of $K_2CO_3$ were added thereto and the resulting mixture was heated at reflux at a temperature of 80° C. for 18 hours. When the reaction was completed, the reaction mixture was concentrated under reduced pressure, dichloromethane and water were added thereto, followed by extraction, and the obtained organic layer was dried using magnesium sulfate and the solvent was removed under reduced pressure. The resultant product was purified by liquid chromatography to obtain 1.4 g of Intermediate L1-3 (yield of 84%).

Synthesis of Intermediate L1-2

5.4 g (15.8 mmol) of (methoxymethyl)triphenylphosphonium chloride was dissolved in 50 mL of anhydrous diethyl ether, and then, 16 mL of 1.0 M potassium tert-butoxide solution was added dropwise thereto. After stirring at room temperature for about 1 hour, 1.7 g (6.3 mmol) of Intermediate L1-3 dissolved in 30 mL of anhydrous THF was slowly added dropwise thereto and stirred at room temperature for 18 hours. When the reaction was completed, water and ethyl acetate were added to the reaction mixture and an extraction process was performed thereon, and the obtained organic layer was dried using magnesium sulfate and the solvent was removed under reduced pressure. The resultant product was purified by liquid chromatography to obtain 1.6 g of Intermediate L1-2 (yield of 95%).

Synthesis of Intermediate 1-1

1.4 g (5.1 mmol) of Intermediate L1-2 was dissolved in 40 mL of dichloromethane, and 3.0 mL of methanesulfonic acid was slowly added dropwise thereto, followed by stirring at room temperature for about 18 hours. After the reaction was completed, an extraction process was performed thereon after adding a saturated aqueous sodium hydrogen carbonate solution thereto, and the obtained organic layer was dried using magnesium sulfate and the solvent was removed under reduced pressure. The resultant product was purified by liquid chromatography to obtain 1.0 g of Intermediate 1-1 (yield of 90%).

Synthesis of Intermediate L1

1.0 g (4.1 mmol) of Intermediate 1-1 was dissolved in 40 mL of THF and 10 mL of water, and then, 1.6 g (6.2 mmol)

of 3,5-4,4,5,5-tetramethyl-2-(4-methylnaphthalen-2-yl)-1,3,2-dioxaborolane, 0.09 g (0.4 mmol) of palladium(II) acetate (Pd(OAc)$_2$), 0.35 g (0.82 mmol) of 2-dicyclohexylphosphino-2',6'-dimethoxybiphenyl (SPhos), 1.4 g (10.3 mmol) of K$_2$CO$_3$ were added thereto, and the resultant mixture was heated a reflux at 70° C. for about 24 hours. After the reaction was completed, an extraction process was performed thereon after adding ethyl acetate and water thereto, and the obtained organic layer was dried using magnesium sulfate and the solvent was removed under reduced pressure. The resultant product was purified by liquid chromatography to obtain 1.1 g of Intermediate L1 (yield of 85%).

Synthesis of Intermediate L1 Dimer 1.05 g (3.4 mmol) of Intermediate L1 and 0.6 g (1.6 mmol) of iridium chloride were added to 40 mL of ethoxyethanol and 15 mL of distilled water, followed by heating a reflux at 70° C. for 24 hours. After the reaction was completed, the temperature was reduced to room temperature, and the solid produced therefrom was filtered and washed sufficiently in the order of water/methanol/hexane. The obtained solid was dried in a vacuum oven to obtain 1.1 g of Intermediate L1 Dimer.

Synthesis of Compound 1

40 mL of ethoxyethanol was mixed with 1.0 g (0.63 mmol) of Intermediate L1 Dimer, 0.9 g (4.5 mmol) of 3,7-diethyl-3,7-dimethyl nonane-4,6-dione, and 0.48 g (4.5 mmol) of Na$_2$CO$_3$, and the resultant mixture was stirred for 24 hours at a temperature of 90° C. After the reaction was completed, the temperature was reduced to room temperature, and the solid produced therefrom was filtered and purified by liquid chromatography to obtain 0.5 g of Compound 1 (yield of 40%).

Liquid chromatography-mass spectrometry (LC-MS) m/z=1181 (M+H)$^+$

Synthesis Example 2 (Compound 6)

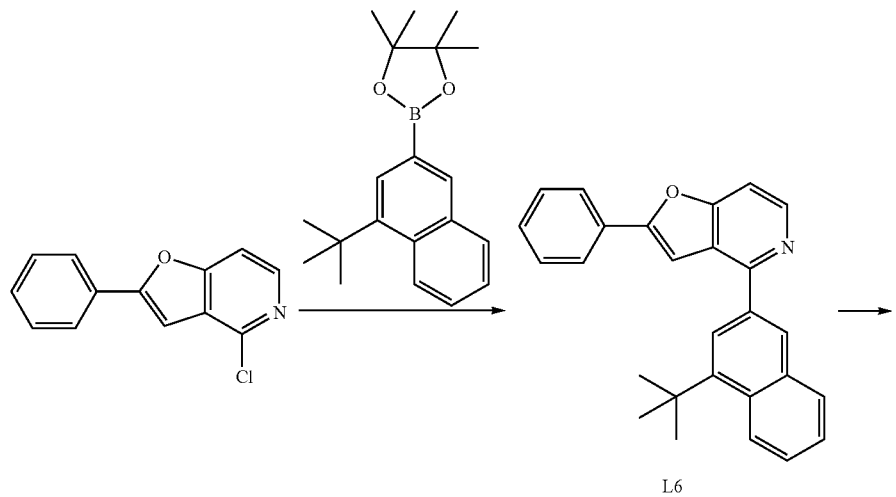

L6

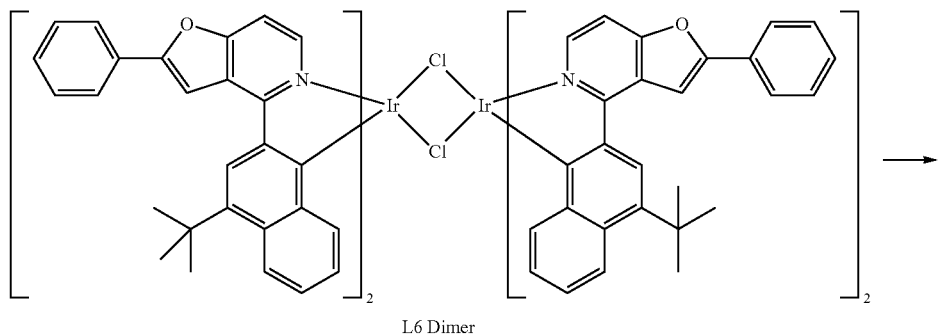

L6 Dimer

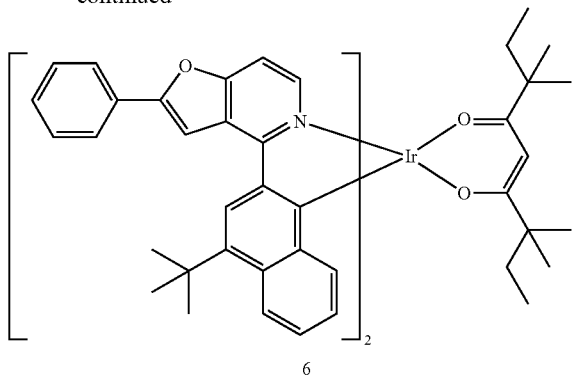

6

Synthesis of Intermediate L6

0.9 g (yield of 84%) of Intermediate L6 was obtained in the same manner as used to obtain Intermediate L1 of Synthesis Example 1, except that 4-chloro-2-phenylfuro[3,2-c]pyridine was used instead of Intermediate 1-1 and 2-(4-(tert-butyl)naphthalen-2-yl)-4,4,5,5-tetramethyl-1,3,2-dioxaborolane was used instead of tetramethyl-2-(4-methylnaphthalen-2-yl)-1,3,2-dioxaborolane.

LC-MS m/z=378 (M+H)$^+$

Synthesis of Intermediate L6 Dimer 0.7 g of Intermediate L6 Dimer was obtained in the same manner as used to obtain Intermediate L1 Dimer of Synthesis Example 1, except that Intermediate L6 was used instead of Intermediate L1.

Synthesis of Compound 6

0.3 g (yield of 42%) of Compound 6 was obtained in the same manner as used to obtain Compound 1 of Synthesis Example 1, except that Intermediate L6 Dimer was used instead of Intermediate L1 Dimer and 3,3,7,7-tetramethyl-nonane-4,6-dione was used instead of 3,7-diethyl-3,7-dimethylnonane-4,6-dione.

LC-MS m/z=1185 (M+H)$^+$

Synthesis Example 3 (Compound 11)

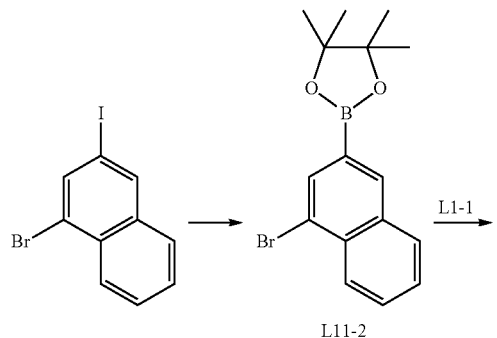

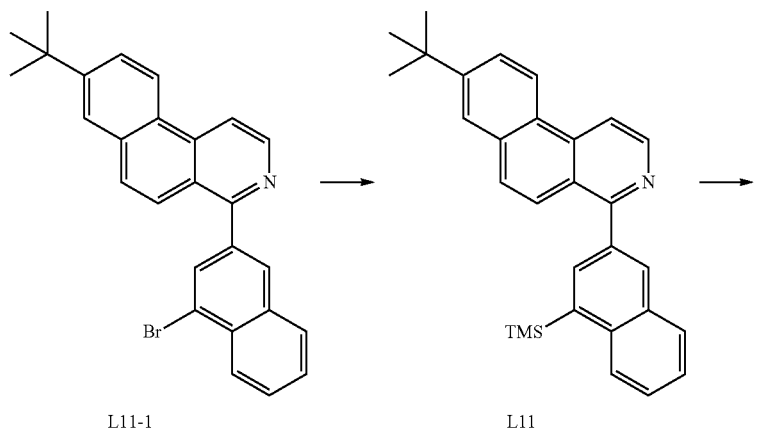

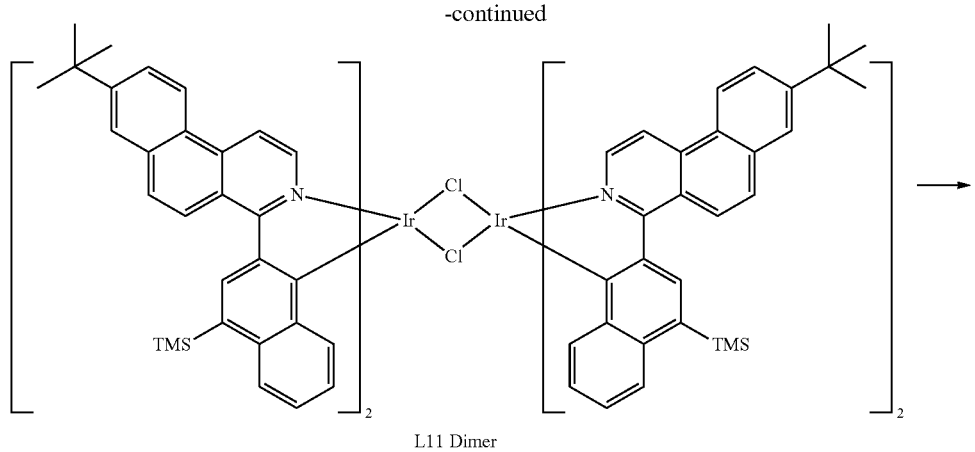

L11 Dimer

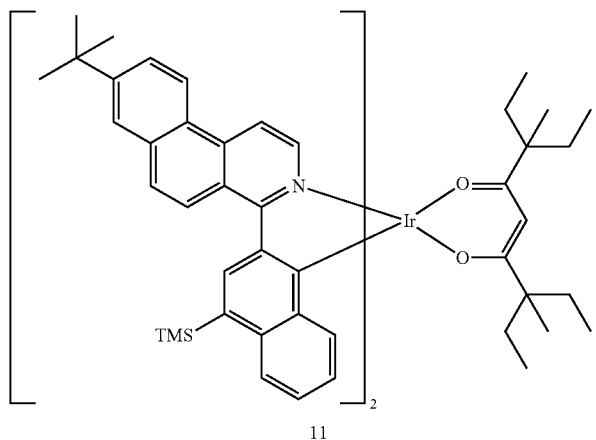

11

Synthesis of Intermediate L11-2

2.5 g (7.4 mmol) of 1-bromo-3-iodonaphthalene was mixed with 60 mL of anhydrous THF, and then, 4.8 ml (7.4 mmol) of 1.6 M n-butyl lithium (n-BuLi) solution in hexane was slowly added thereto at a temperature of −78° C. After about 1 hour, 1.8 mL (8.9 mmol) of 2-isopropoxy-4,4,5,5-tetramethyl-1,3,2-dioxaborolane was slowly added dropwise thereto and the resulting mixture was stirred at room temperature for 14 hours. After completion of the reaction, the organic layer, obtained by extraction with 50 mL of water and ethyl acetate, was dried using magnesium sulfate and the solvent was removed under reduced pressure. The resultant product was purified by liquid chromatography to obtain 2.2 g of Intermediate L11-2 (yield of 90%).

Synthesis of Intermediate L11-1

2.3 g (yield of 80%) of Intermediate L11-1 was obtained in the same manner as used to obtain Intermediate L1 of Synthesis Example 1, except that Intermediate L11-2 was used instead of 4,4,5,5-tetramethyl-2-(4-methylnaphthalen-2-yl)-1,3,2-dioxaborolane.

LC-MS m/z=440 (M+H)$^+$

Synthesis of Intermediate L11

2.2 g (5.0 mmol) of Intermediate L11-1 was mixed with 40 mL of anhydrous THF, and then, at a temperature of −78° C., 3.4 mL (5.5 mmol) of 1.6 M BuLi solution in hexane was slowly added thereto. After about 1 hour, 0.8 mL (6.0 mmol) of chlorotrimethylsilane was slowly added dropwise thereto and the resulting mixture was stirred at room temperature for 12 hours. After completion of the reaction, the organic layer, obtained by extraction with 40 mL of water and ethyl acetate, was dried using magnesium sulfate and the solvent was removed under reduced pressure. The resultant product was purified by liquid chromatography to obtain 2.0 g (yield of 95%) of Intermediate L11.

LC-MS m/z=434 (M+H)$^+$

Synthesis of Intermediate L11 Dimer

Intermediate L11 Dimer was obtained in the same manner as used to obtain Intermediate L1 Dimer of Synthesis Example 1, except that Intermediate L11 was used instead of Intermediate L1 and refluxing was performed while heating at 100° C. for 24 hours.

Synthesis of Compound 11

0.3 g (yield of 15%) of Compound 11 was obtained in the same manner as used to obtain Compound 1 of Synthesis Example 1, except that Intermediate L11 Dimer was used instead of Intermediate L1 Dimer.

LC-MS m/z=1297 (M+H)$^+$

Synthesis Example 4 (Compound 13)
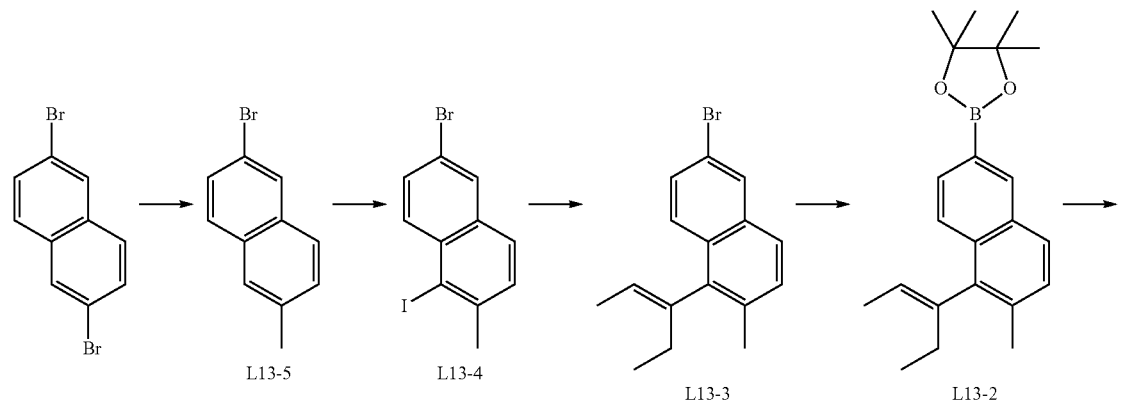
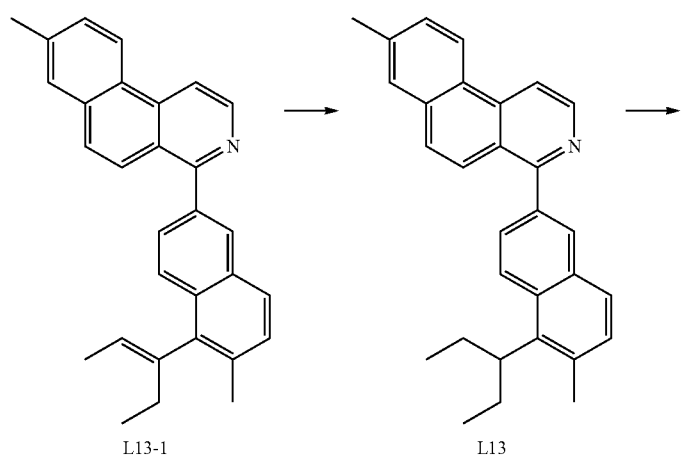
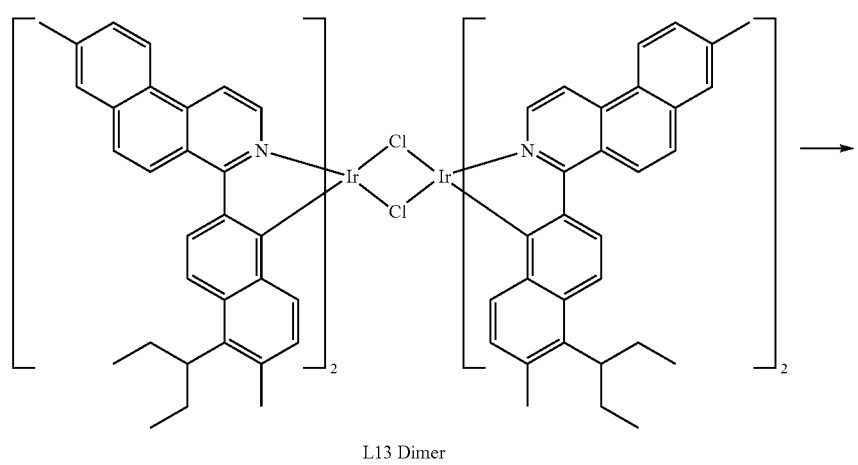
L13 Dimer

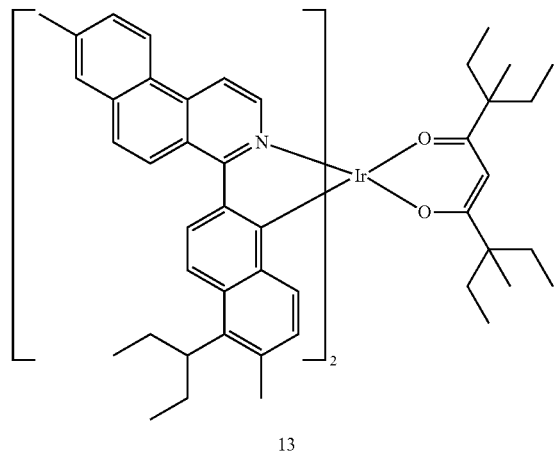

13

Synthesis of Intermediate L13-5

10.0 g (34.9 mmol) of 2,6-dibromonaphthalene was mixed with 120 mL of anhydrous THF, and then, at a temperature of −78° C., 24.0 mL (38.0 mmol) of 1.6 M BuLi solution in hexane was slowly added thereto. After about 1 hour, 2.6 mL (42.0 mmol) of iodomethane was slowly added dropwise thereto and the resulting mixture was stirred at room temperature for 18 hours. After completion of the reaction, the organic layer, obtained by extraction with 60 mL of water and ethyl acetate, was dried using magnesium sulfate and the solvent was removed under reduced pressure. The resultant was purified by liquid chromatography to obtain 6.9 g (yield of 90%) of Intermediate L13-5.

LC-MS m/z=221 (M+H)$^+$

Synthesis of Intermediate L13-4

6.9 g (31.4 mmol) of Intermediate L13-5 was dissolved in 120 mL of acetonitrile, and then, 0.8 mL (9.4 mmol) of trifluoroacetic acid and 8.5 mL (37.7 mmol) of N-iodosuccinimide were added dropwise thereto, and then, the resultant mixture was heated at a temperature of 80° C. for 18 hours. After completion of the reaction, the organic layer obtained by extraction with aqueous ethyl acetate and sodium thiosulfate and was dried by using magnesium sulfate. The reaction mixture was filtered, concentrated under reduced pressure, and purified by liquid chromatography to obtain 9.8 g (yield of 90%) of Intermediate L13-4.

LC-MS m/z=347 (M+H)$^+$

Synthesis of Intermediate L13-3

6.1 g (yield of 75%) of Intermediate L13-3 was obtained in the same manner as used to obtain Intermediate L1 of Synthesis Example 1, except that 4,4,5,5-tetramethyl-2-(pent-2-en-3-yl)-1,3,2-dioxaborolane was used instead of tetramethyl-2-(4-methylnaphthalen-2-yl)-1,3,2-dioxaborolane, and Intermediate L13-4 was used instead of Intermediate 1-1.

Synthesis of Intermediate L13-2

6.4 g (yield of 90%) of Intermediate L13-2 was obtained in the same manner as used to obtain Intermediate L11-2 of Synthesis Example 3, except that Intermediate L13-3 was used instead of 1-bromo-3-iodonaphthalene.

Synthesis of Intermediate L13-1

6.3 g (yield of 82%) of Intermediate L13-1 was obtained in the same manner as used to obtain Intermediate L1 of Synthesis Example 1, except that Intermediate L13-2 was used instead of 4,4,5,5-tetramethyl-2-(4-methylnaphthalen-2-yl)-1,3,2-dioxaborolane and 4-chloro-8-methylbenzo[f]isoquinoline was used instead of 1-1.

Synthesis of Intermediate L13

6.0 g (14.9 mmol) of Intermediate L13-1 was mixed with 60 mL of ethanol, and 0.6 g (10 wt %) of Pd/C (palladium on carbon) was added thereto, and then, hydrogen gas was added thereto, followed by stirring for 18 hours at room temperature. After completion of the reaction, the reaction mixture was passed through a celite pad, concentrated under reduced pressure, and then purified by liquid chromatography to obtain 5.4 g (yield of 90%) of Intermediate L13.

LC-MS m/z=404 (M+H)$^+$

Synthesis of Intermediate L13 Dimer 2.0 g of Intermediate L13 Dimer was obtained in the same manner as used to obtain Intermediate L1 Dimer of Synthesis Example 1, except that Intermediate L13 was used instead of Intermediate L1.

Synthesis of Compound 13

1.3 g (yield of 46%) of Compound 13 was obtained in the same manner as used to obtain Compound 1 of Synthesis Example 1, except that Intermediate L13 Dimer was used instead of Intermediate L1 Dimer.

LC-MS m/z=1238 (M+H)$^+$

Synthesis Example 5 (Compound 16)

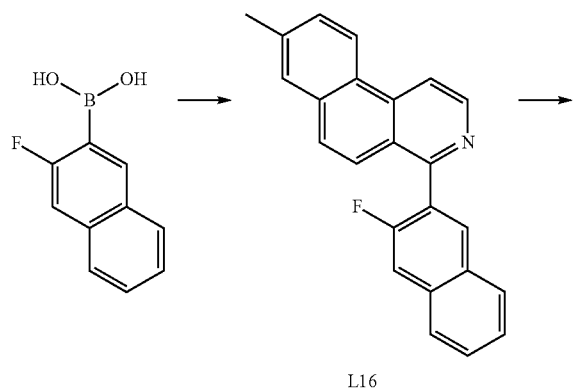

L16

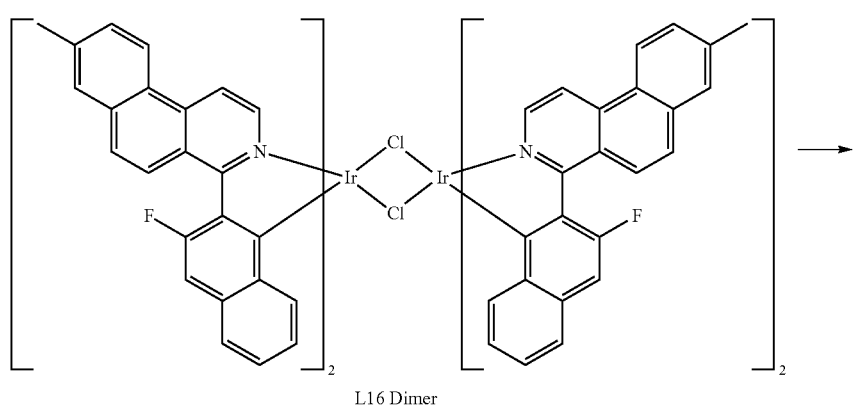

L16 Dimer

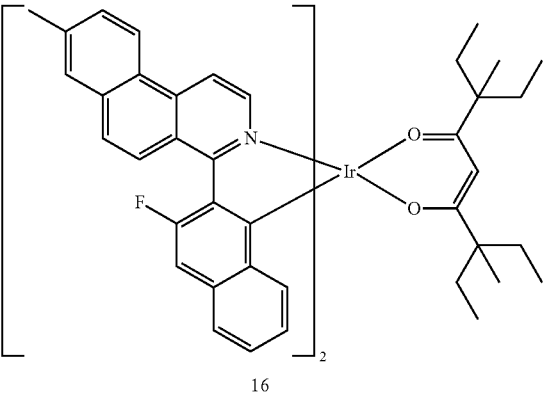

16

Synthesis of Intermediate L16

1.1 g (yield of 74%) of Intermediate L16-1 was obtained in the same manner as used to obtain Intermediate L1 of Synthesis Example 1, except that (3-fluoronaphthalen-2-yl) boronic acid was used instead of 4,4,5,5-tetramethyl-2-(4-methylnaphthalen-2-yl)-1,3,2-dioxaborolane and 4-chloro-8-methylbenzo[f]isoquinoline was used instead of 1-1.

LC-MS m/z=338 (M+H)$^+$

Synthesis of Intermediate L16 Dimer 0.9 g of Intermediate L16 Dimer was obtained in the same manner as used to obtain Intermediate L1 Dimer of Synthesis Example 1, except that Intermediate L16 was used instead of Intermediate L1.

Synthesis of Compound 16

0.7 g (yield of 40%) of Compound 16 was obtained in the same manner as used to obtain Compound 1 of Synthesis Example 1, except that Intermediate L16 Dimer was used instead of Intermediate L1 Dimer.

LC-MS m/z=1105 (M+H)$^+$

Synthesis Example 6 (Compound 23)

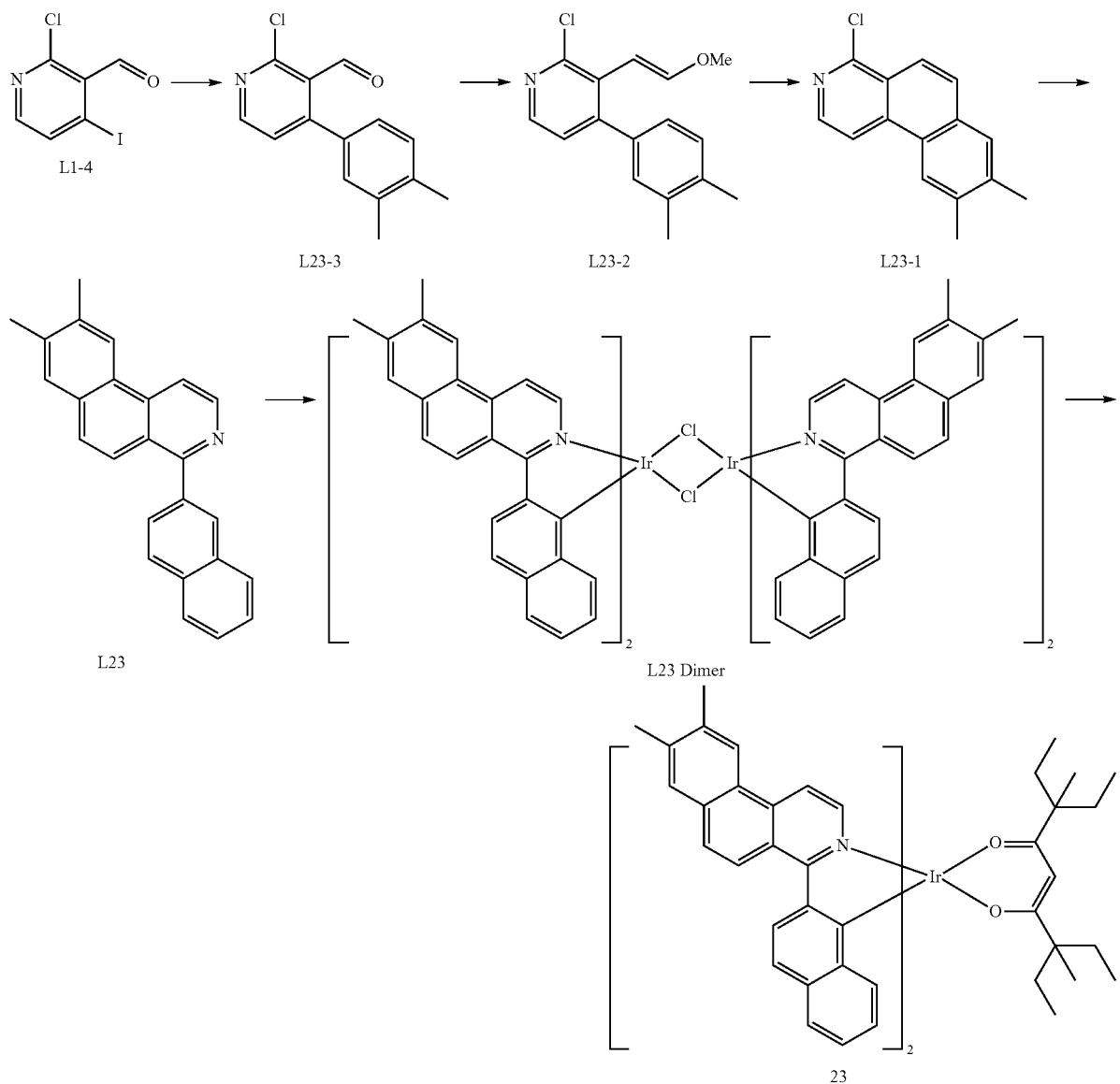

Synthesis of Intermediate L23-3

3.5 g (yield of 80%) of Intermediate L23-3 was obtained in the same manner as used to obtain Intermediate L1-3 of Synthesis Example 1, except that (3,4-dimethylphenyl)boronic acid was used instead of (4-(tert-butyl)phenyl)boronic acid.

Synthesis of Intermediate L23-2

3.5 g (yield of 90%) of Intermediate L23-2 was obtained in the same manner as used to obtain Intermediate L1-2 of Synthesis Example 1, except that Intermediate L23-3 was used instead of Intermediate L1-3.

Synthesis of Intermediate L23-1

1.9 g (yield of 63%) of Intermediate L23-1 was obtained in the same manner as used to obtain Intermediate 1-1 of Synthesis Example 1, except that Intermediate L23-2 was used instead of Intermediate L1-2.

Synthesis of Intermediate L23

0.8 g (yield of 80%) of Intermediate L23 was obtained in the same manner as used to obtain Intermediate L1 of Synthesis Example 1, except that Intermediate L23-1 was used instead of Intermediate 1-1 and 4,4,5,5-tetramethyl-2-(naphthalen-2-yl)-1,3,2-dioxaborolane was used instead of 4,4,5,5-tetramethyl-2-(4-methylnaphthalen-2-yl)-1,3,2-dioxaborolane.

Synthesis of Intermediate L23 Dimer 40 mL of ethoxyethanol was mixed with Intermediate L23 (3.4 mmol) and iridium chloride (1.6 mmol), followed by refluxing while heating at 125° C. for 48 hours. Once the reaction was completed, the temperature was cooled to room temperature, and a solid material formed therefrom was filtered and washed thoroughly with water and methanol in this stated order. The obtained solid was dried in a vacuum oven to obtain 0.6 g of Intermediate L23 Dimer.

Synthesis of Compound 23

40 mL of ethoxyethanol was mixed with Intermediate L23 Dimer (1 equiv.), 3,7-diethyl-3,7-dimethylnonane-4,6-dione (2.5 equiv.), and $K_2CO_3$ (2.5 equiv.), and the resultant was stirred for 24 hours at room temperature to cause a reaction. Once the reaction was completed, methanol was added thereto to filter the resulting solid, and the obtained solid was purified through liquid chromatography to obtain 70 mg (yield of 10%) of Compound 23.

LC-MS m/z=1098 (M+H)$^+$

Synthesis Example 7 (Compound 27)

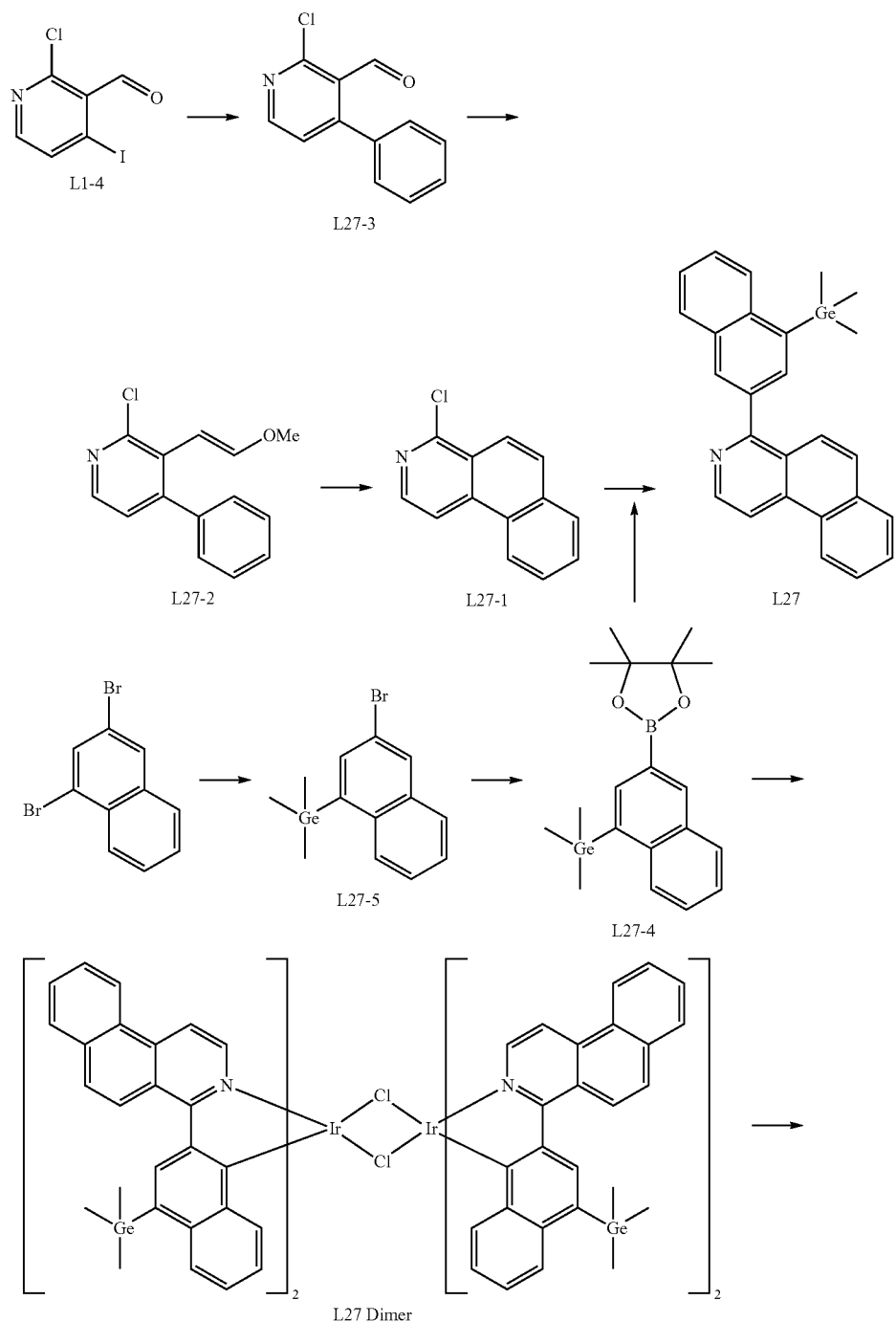

-continued

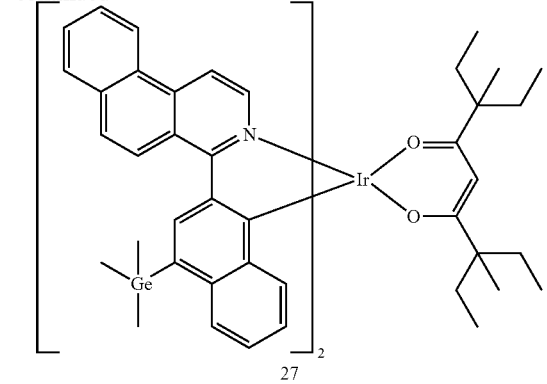

Synthesis of Intermediate L27-5

10.0 g (42.4 mmol) of 1,3-dibromonaphthalene was dissolved in 100 ml of diethyl ether, and then, at a temperature of −78° C., 28.0 ml (44.5 mmol) of 1.6M BuLi solution in hexane was slowly added thereto. After about 1 hour of stirring, 6.6 ml (53.4 mmol) of chlorotrimethylgermane was slowly added dropwise thereto and stirred for 18 hours at room temperature. After completion of the reaction, an organic layer obtained by extraction using water and ethylacetate, was dried using magnesium sulfate and purified through liquid chromatography to obtain 12.5 g (yield of 90%) of Intermediate L27-5.

Synthesis of Intermediate L27-4

12.0 g (37.1 mmol) of Intermediate L27-5 and 150 ml of toluene were mixed, and 14.0 g (55.6 mmol) of diboron, 3.0 g (2.6 mmol) of Pd(PPh$_3$)$_4$, and 12.8 g (92.7 mmol) of K$_2$CO$_3$ were added thereto, followed by refluxing while heating at a temperature of 110° C. for 16 hours. After completion of the reaction, the reaction mixture was concentrated under reduced pressure, extracted using ethylacetate, and purified through liquid chromatography to obtain 10.0 g (6.0 mmol, yield of 75%) of Intermediate L27-4.

Synthesis of Intermediate L27-3

3.2 g (yield of 85%) of Intermediate L27-3 was obtained in the same manner as used to obtain Intermediate L1-3 of Synthesis Example 1, except that phenylboronic acid was used instead of (4-(tert-butyl)phenyl)boronic acid.

Synthesis of Intermediate L27-2

3.3 g (yield of 92%) of Intermediate L27-2 was obtained in the same manner as used to obtain Intermediate L1-2 of Synthesis Example 1, except that Intermediate L27-3 was used instead of Intermediate L1-3.

Synthesis of Intermediate L27-1

1.9 g (yield of 65%) of Intermediate L27-1 was obtained in the same manner as used to obtain Intermediate 1-1 of Synthesis Example 1, except that Intermediate L27-2 was used instead of Intermediate L1-2.

Synthesis of Intermediate L27

2.8 g (yield of 75%) of Intermediate L27 was obtained in the same manner as used to obtain Intermediate L1 of Synthesis Example 1, except that Intermediate L27-1 was used instead of Intermediate 1-1 and Intermediate L27-4 was used instead of 4,4,5,5-tetramethyl-2-(4-methylnaphthalen-2-yl)-1,3,2-dioxaborolane.

LC-MS m/z=423 (M+H)+

Synthesis of Intermediate L27 Dimer 0.9 g of Intermediate L27 Dimer was obtained in the same manner as used to obtain Intermediate L1 Dimer of Synthesis Example 1, except that Intermediate L27 was used instead of Intermediate L1.

Synthesis of Compound 27

0.2 g (yield of 12%) of Compound 27 was obtained in the same manner as used to obtain Compound 1 of Synthesis Example 1, except that Intermediate L27 Dimer was used instead of Intermediate L1 Dimer.

LC-MS m/z=1275 (M+H)+

Synthesis Example 8 (Compound 10)

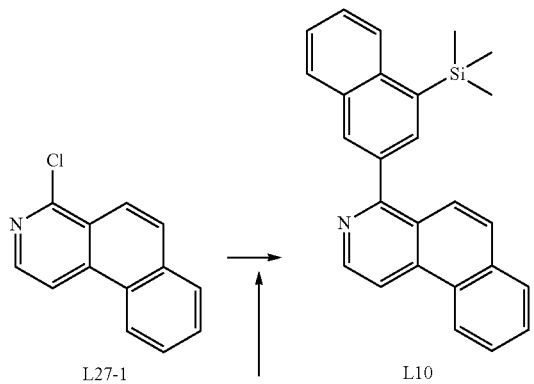

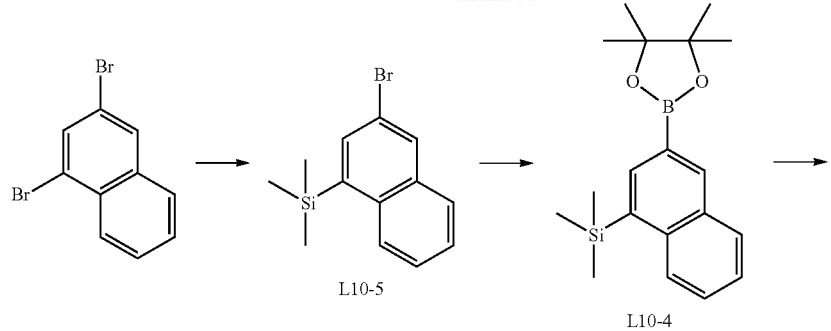

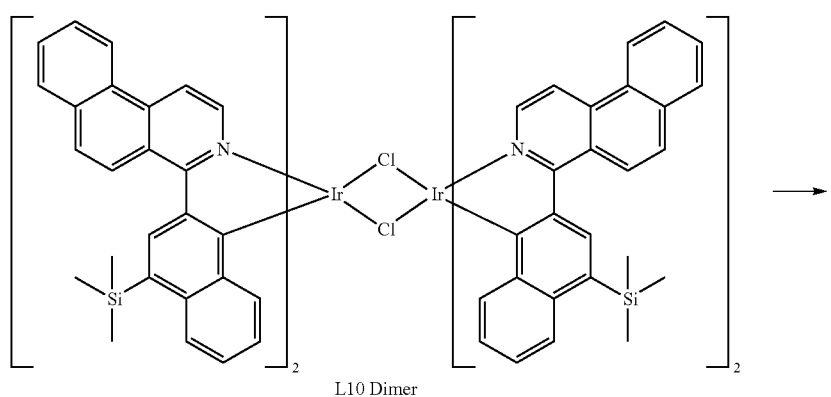

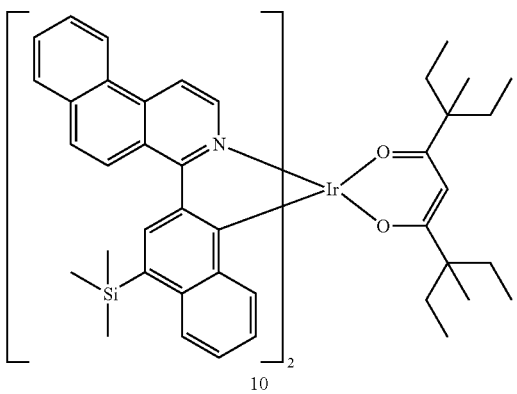

Synthesis of Intermediate L10

4.8 g (yield of 85%) of Intermediate L10-5 was obtained in the same manner as used to obtain Intermediate L27-5 of Synthesis Example 7, except that chlorotrimethylsilane was used instead of chlorotrimethylgermane.

Synthesis of Intermediate L10-4

4.2 g (yield of 76%) of Intermediate L10-4 was obtained in the same manner as used to obtain Intermediate L27-4 of Synthesis Example 7, except that Intermediate L10-5 was used instead of Intermediate L27-5.

Synthesis of Intermediate L10

Intermediate L10 was obtained in the same manner as used to obtain Intermediate L27 of Synthesis Example 7, except that Intermediate L10-4 was used instead of Intermediate L27-4.

Synthesis of Intermediate L10 Dimer 0.8 g of Intermediate L10 Dimer was obtained in the same manner as used to obtain Intermediate L27 Dimer of Synthesis Example 7, except that Intermediate L10 was used instead of Intermediate L27.

Synthesis of Compound 10

0.2 g (yield of 20%) of Compound 10 was obtained in the same manner as used to obtain Compound 27 of Synthesis Example 7, except that Intermediate L10 Dimer was used instead of Intermediate L27 Dimer.

LC-MS m/z=1185 (M+H)$^+$

Synthesis Example 9 (Compound 24)
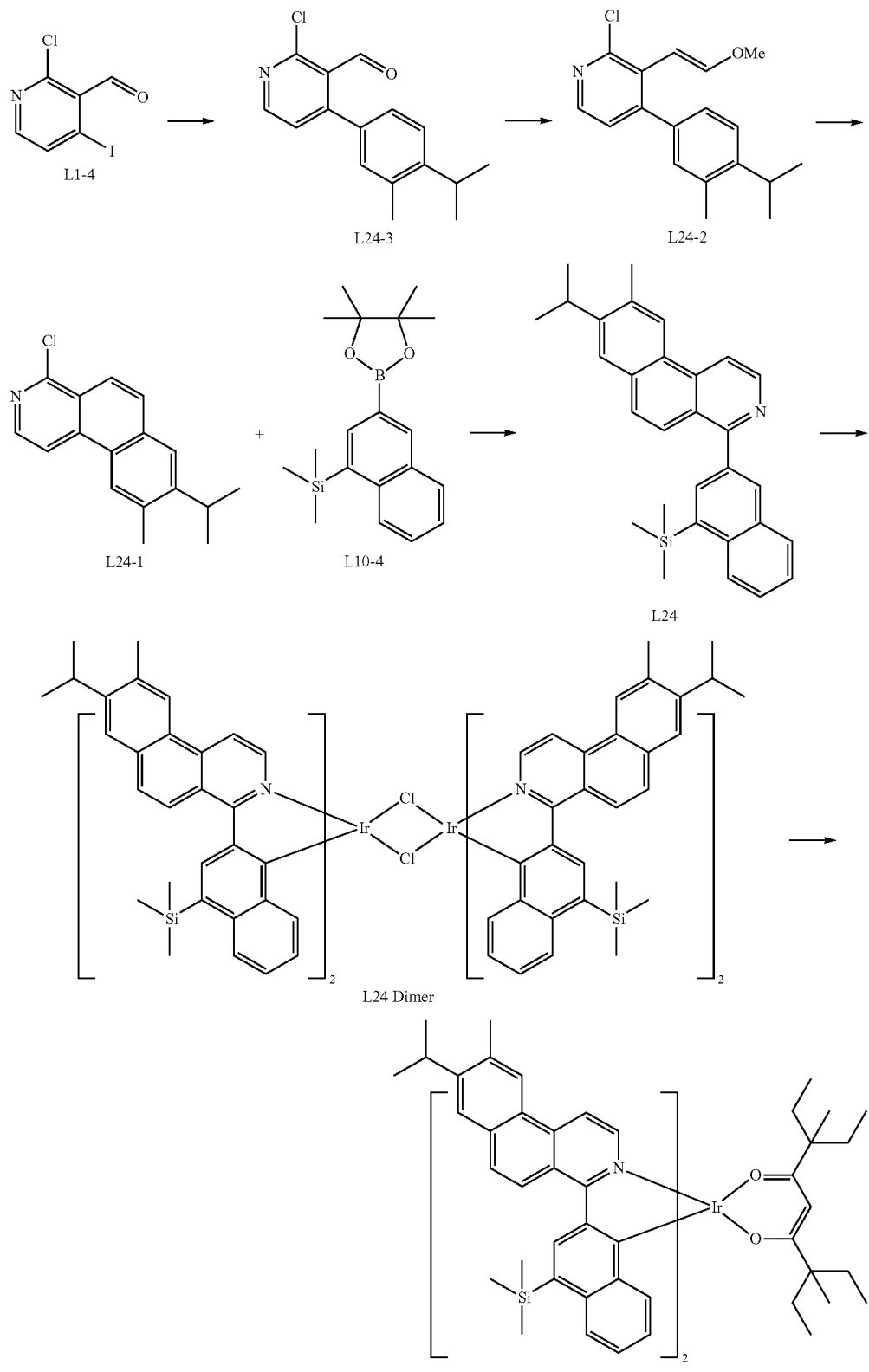

Synthesis of Intermediate L24-3

2.7 g (yield of 78%) of Intermediate L24-3 was obtained in the same manner as used to obtain Intermediate L1-3 of Synthesis Example 1, except that (4-isopropyl-3-methylphenyl)boronic acid was used instead of (4-(tert-butyl)phenyl) boronic acid.

Synthesis of Intermediate L24-2

2.7 g (yield of 92%) of Intermediate L24-2 was obtained in the same manner as used to obtain Intermediate L1-2 of Synthesis Example 1, except that Intermediate L24-3 was used instead of Intermediate L1-3.

Synthesis of Intermediate L24-1

1.3 g (yield of 55%) of Intermediate L24-1 was obtained in the same manner as used to obtain Intermediate 1-1 of Synthesis Example 1, except that Intermediate L24-2 was used instead of Intermediate L1-2.

Synthesis of Intermediate L24

1.6 g (yield of 75%) of Intermediate L24 was obtained in the same manner as used to obtain Intermediate L1 of Synthesis Example 1, except that Intermediate L24-1 was used instead of Intermediate 1-1 and Intermediate L10-4 was used instead of 4,4,5,5-tetramethyl-2-(4-methylnaphthalen-2-yl)-1,3,2-dioxaborolane.

Synthesis of Intermediate L24 Dimer 1.0 g of Intermediate L24 Dimer was obtained in the same manner as used to obtain Intermediate L1 Dimer of Synthesis Example 1, except that Intermediate L24 was used instead of Intermediate L1.

Synthesis of Compound 24

0.4 g (yield of 35%) of Compound 24 was obtained in the same manner as used to obtain Compound 1 of Synthesis Example 1, except that Intermediate L24 Dimer was used instead of Intermediate L1 Dimer.

LC-MS m/z=1297 (M+H)$^+$

Synthesis Example 10 (Compound 26)

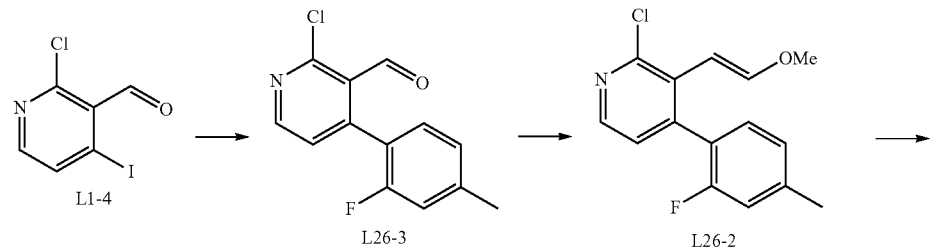

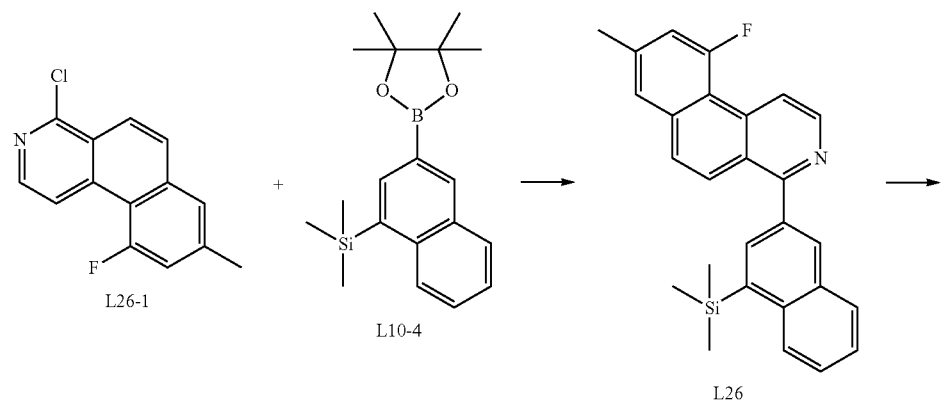

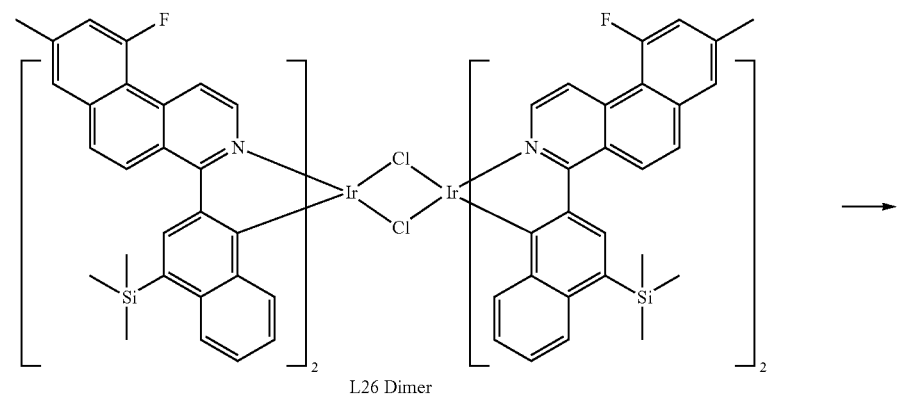

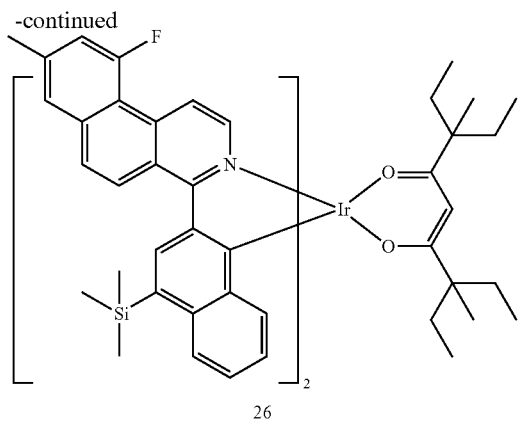

26

Synthesis of Intermediate L26-3

2.5 g (yield of 75%) of Intermediate L26-3 was obtained in the same manner as used to obtain Intermediate L1-3 of Synthesis Example 1, except that (2-fluoro-4-methylphenyl)boronic acid was used instead of (4-(tert-butyl)phenyl)boronic acid.

Synthesis of Intermediate L26-2

2.4 g (yield of 88%) of Intermediate L26-2 was obtained in the same manner as used to obtain Intermediate L1-2 of Synthesis Example 1, except that Intermediate L26-3 was used instead of Intermediate L1-3.

Synthesis of Intermediate L26-1

1.0 g (yield of 50%) of Intermediate L26-1 was obtained in the same manner as used to obtain Intermediate 1-1 of Synthesis Example 1, except that Intermediate L26-2 was used instead of Intermediate L1-2.

Synthesis of Intermediate L26

1.2 g (yield of 70%) of Intermediate L26 was obtained in the same manner as used to obtain Intermediate L1 of Synthesis Example 1, except that Intermediate L26-1 was used instead of Intermediate 1-1 and Intermediate L10-4 was used instead of 4,4,5,5-tetramethyl-2-(4-methylnaphthalen-2-yl)-1,3,2-dioxaborolane.

Synthesis of Intermediate L26 Dimer 0.8 g of Intermediate L26 Dimer was obtained in the same manner as used to obtain Intermediate L1 Dimer of Synthesis Example 1, except that Intermediate L26 was used instead of Intermediate L1.

Synthesis of Compound 26

0.3 g (yield of 40%) of Compound 26 was obtained in the same manner as used to obtain Compound 1 of Synthesis Example 1, except that Intermediate L26 Dimer was used instead of Intermediate L1 Dimer.

LC-MS m/z=1249 (M+H)$^+$

Synthesis Example 11 (Compound 32)

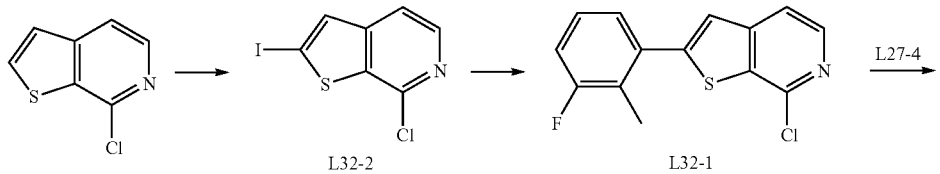

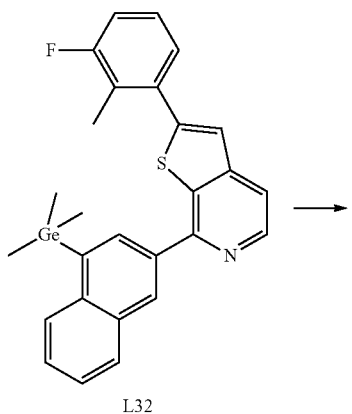

L32

-continued

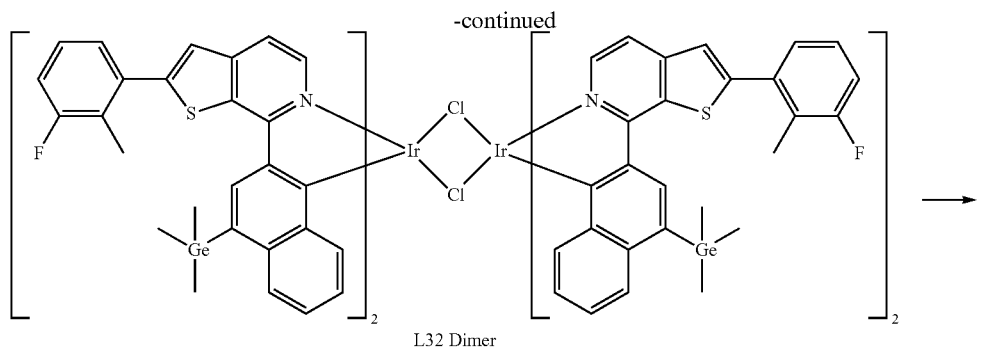

L32 Dimer

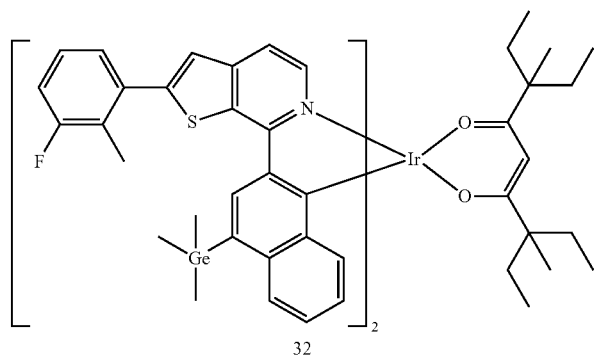

32

Synthesis of Intermediate L32-2

6.0 g (35.4 mmol) of 7-chlorothieno[2,3-c]pyridine was dissolved in 60 ml of anhydrous THF, and then, at a temperature of −78° C., 43.0 ml (42.5 mmol) of 11.0 g LDA solution in THE was slowly added thereto. After about 1 hour of stirring, 11.0 g (43.0 mmol) of iodine dissolved in anhydrous THE was slowly added dropwise thereto and stirred at room temperature for 18 hours. After completion of the reaction, extraction was performed using water and ethylacetate, followed by a purification process through liquid chromatography to obtain 10.0 g (yield of 95%) of Intermediate L32-2.

LC-MS m/z=296 (M+H)$^+$

Synthesis of Intermediate L32-1

10.0 g (33.8 mmol) of Intermediate L32-2 was dissolved in 60 ml of 95% EtOH aqueous solution, and then, 5.4 g (35.5 mmol) of 3-fluoro-2-methylphenylboronic acid, 0.5 g (2.5 mmol) of Pd(OAc)$_2$, 1.9 g (4.7 mmol) of SPhos, and 11.7 g (84.5 mmol) of K$_2$CO$_3$ were added thereto, and refluxed while heating at a temperature of 80° C. for 18 hours. After completion of the reaction, the mixture obtained by concentrating the reactants was extracted using ethylacetate and water, and purified through liquid chromatography to obtain 7.8 g (yield of 83%) of Intermediate L32-1.

LC-MS m/z=278 (M+H)$^+$

Synthesis of Intermediate L32

7.0 g (25.2 mmol) of Intermediate L32-1 was dissolved in 60 ml of THE and 15 ml of water, and then, 11.2 g (30.2 mmol) of Intermediate L27-4, 2.0 g (1.8 mmol) of Pd (PPh$_3$)$_4$, and 8.7 g (63.0 mmol) of K$_2$CO$_3$ were added thereto and heated at a temperature of 70° C. for one day. Once the reaction was completed, ethylacetate and water were added thereto, followed by extraction, and an organic layer was dried using magnesium sulfate and purified through liquid chromatography, to obtain 12.0 g (yield of 70%) of Intermediate L32.

LC-MS m/z=487 (M+H)$^+$

Synthesis of Intermediate L32 Dimer 1.1 g of Intermediate L32 Dimer was obtained in the same manner as used to obtain Intermediate L1 Dimer of Synthesis Example 1, except that Intermediate L32 was used instead of Intermediate L1.

Synthesis of Compound 32

0.1 g (yield of 10%) of Compound 32 was obtained in the same manner as used to obtain Compound 1 of Synthesis Example 1, except that Intermediate L32 Dimer was used instead of Intermediate L1 Dimer.

LC-MS m/z=1405 (M+H)$^+$

Synthesis Example 12 (Compound 35)
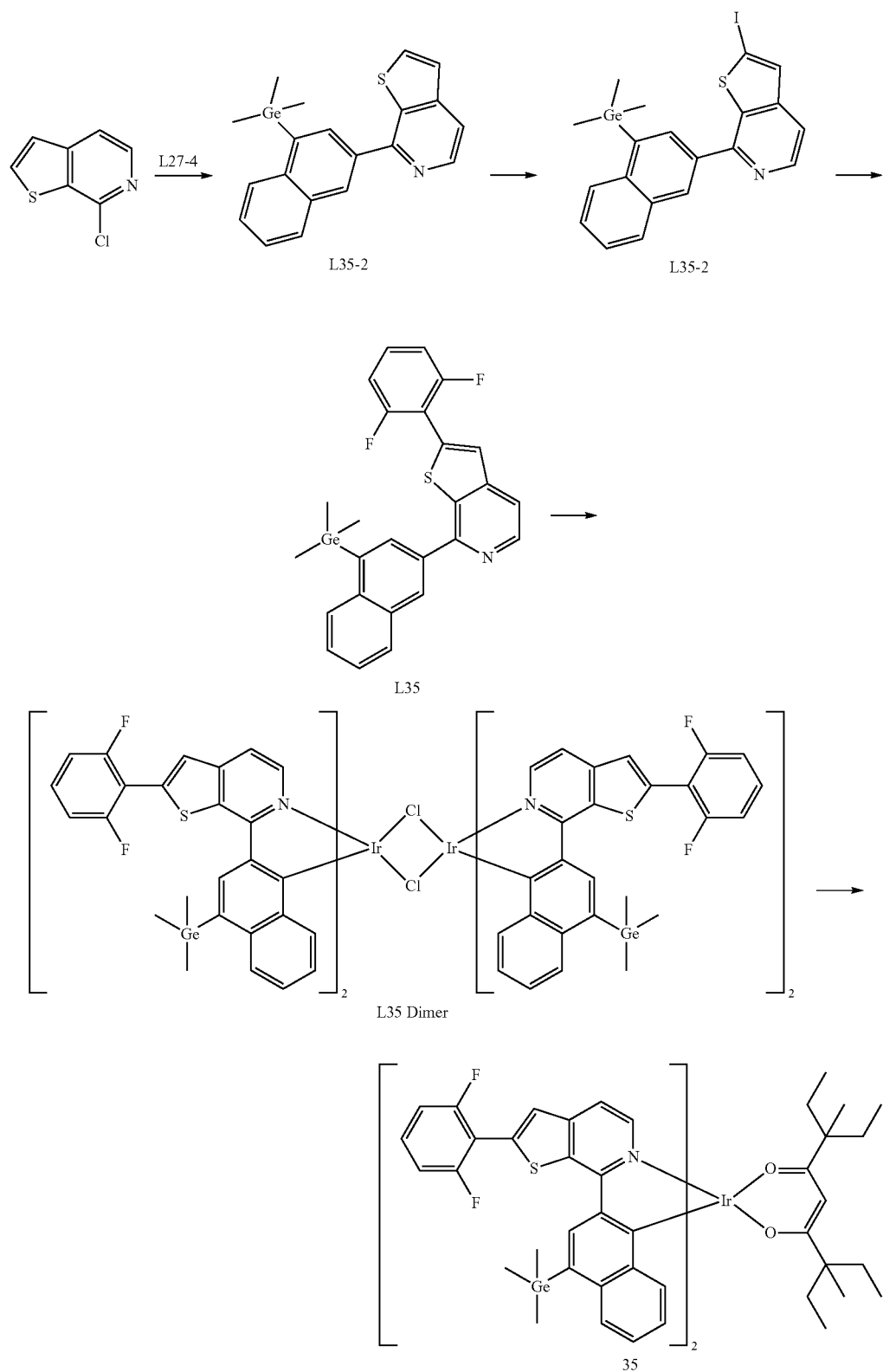

Synthesis of Intermediate L35-2

5.2 g (yield of 68%) of Intermediate L35-2 was obtained in the same manner as used to obtain Intermediate L1 of Synthesis Example 1, except that 7-chlorothieno[2,3-c]pyridine was used instead of Intermediate 1-1 and Intermediate L27-4 was used instead of 4,4,5,5-tetramethyl-2-(4-methyl-naphthalen-2-yl)-1,3,2-dioxaborolane.

Synthesis of Intermediate L35-1

Intermediate L35-1 was obtained in the same manner as used to obtain Intermediate 32-3 of Synthesis Example 11, except that Intermediate L35-2 was used instead of 7-chlorothieno[2,3-c]pyridine and was used in the following reaction without an additional purification.

Synthesis of Intermediate L35

6.3 g (12.6 mmol) of Intermediate L35-1 was dissolved in 80 ml of DMF, and then, 2.4 g (15.1 mmol) of 2,6-difluorophenyl boronic acid, 1.0 g (0.9 mmol) of Pd(PPh$_3$)$_4$, 3.5 g (15.1 mmol) of Ag$_2$O, and 6.7 g (31.5 mmol) of K$_3$PO$_4$ were added thereto and heated at a temperature of 90° C. for one day. Once the reaction was completed, dichloromethane and water were added thereto, followed by extraction, and an organic layer was dried using magnesium sulfate and purified through liquid chromatography to obtain 2.5 g (yield of 40%) of Intermediate L35.

LC-MS m/z=492 (M+H)$^+$

Synthesis of Intermediate L35 Dimer 1.5 g of Intermediate L35 Dimer was obtained in the same manner as used to obtain Intermediate L1 Dimer of Synthesis Example 1, except that Intermediate L35 was used instead of Intermediate L1.

Synthesis of Compound 35

0.2 g (yield of 12%) of Compound 35 was obtained in the same manner as used to obtain Compound 1 of Synthesis Example 1, except that Intermediate L35 Dimer was used instead of Intermediate L1 Dimer.

LC-MS m/z=1275 (M+H)$^+$

Synthesis Example 13 (Compound 37)

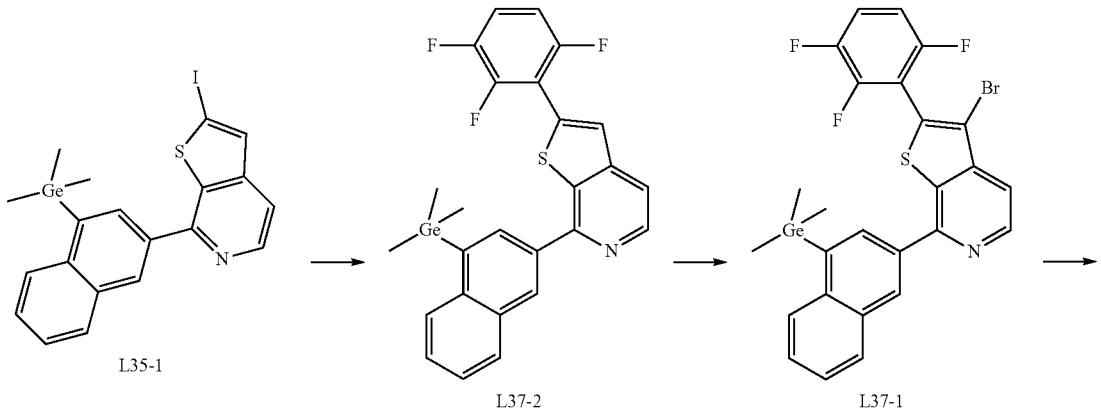

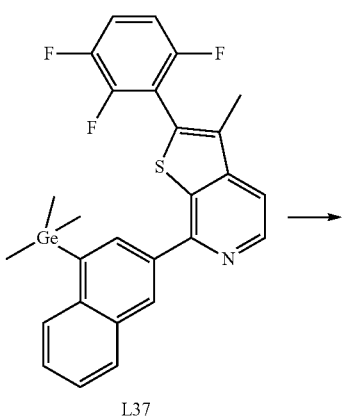

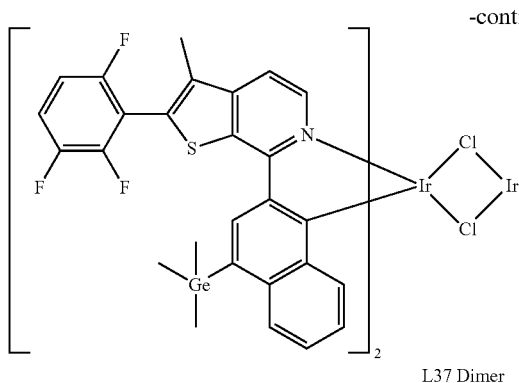
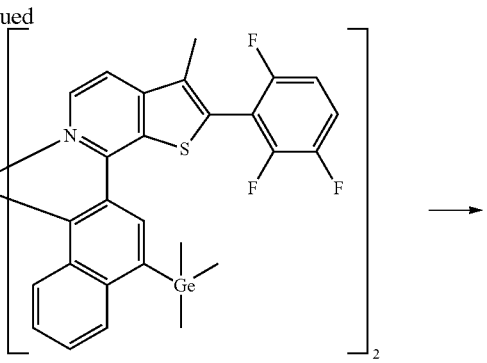

L37 Dimer

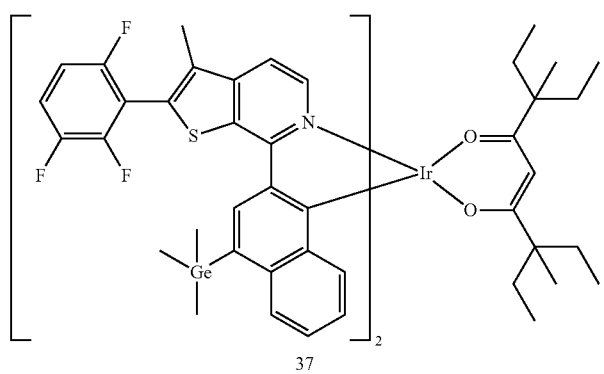

37

Synthesis of Intermediate L37-2

3.3 g (yield of 45%) of Intermediate L37-2 was obtained in the same manner as used to obtain Intermediate L35 of Synthesis Example 12, except that 2,3,6-trifluorophenylboronic acid was used instead of 2,6-difluorophenyl boronic acid.

LC-MS m/z=510 (M+H)$^+$

Synthesis of Intermediate L37-1

3.0 g (5.90 mmol) of Intermediate L37-2 was dissolved in 50 ml of dichloromethane, and then, 1.2 g (7.08 mmol) of N-bromosuccinimide was added thereto and stirred at room temperature for 18 hours. Once the reaction was completed, the resultant solution was subjected to an extraction process using saturated Na$_2$CO$_3$ aqueous solution, followed by drying using magnesium sulfate and distillation under reduced pressure. The result was purified through liquid chromatography to obtain 2.8 g (yield of 80%) of Intermediate L37-1.

LC-MS m/z=588 (M+H)$^+$

Synthesis of Intermediate L37

1.3 g (2.2 mmol) of Intermediate L37-1 was dissolved in 60 ml of THF, and then, 0.03 g (0.03 mmol) of Pd$_2$(dba)$_3$ (Tris(dibenzylideneacetone)dipalladium(0)), 0.03 g (0.07 mmol) of Xphos (2-Dicyclohexylphosphino-2',4',6'-triisopropylbiphenyl), and 0.8 g (3.3 mmol) of bis(trimethylaluminum)-1,4-diazabicyclo[2.2.2]octane adduct were added thereto and refluxed while heating for 18 hours. After completion of the reaction, ice water was added thereto and stirred for about 1 hour. An organic layer obtained after extraction using ethylacetate was purified through liquid chromatography to obtain 1.0 g (yield of 86%) of Intermediate L37.

LC-MS m/z=524 (M+H)$^+$

Synthesis of Intermediate L37 Dimer 0.8 g of Intermediate L37 Dimer was obtained in the same manner as used to obtain Intermediate L1 Dimer of Synthesis Example 1, except that Intermediate L37 was used instead of Intermediate L1 and refluxing was performed while heating at 100° C. for 24 hours.

Synthesis of Compound 37

40 mL of ethoxyethanol was mixed with Intermediate L27 Dimer (0.63 mmol), 0.9 g of 3,7-diethyl-3,7-dimethyl-nonane-4,6-dione (4.5 mmol), and K$_2$CO$_3$ (4.5 mmol), and the resultant was stirred for 48 hours at room temperature to cause a reaction. Once the reaction was completed, methanol was added thereto to filter the resulting solid and recrystallized using dichloromethane and methanol, and the obtained solid was purified through liquid chromatography to obtain 0.1 g (yield of 15%) of Compound 37.

LC-MS m/z=1477 (M+H)$^+$

Synthesis Example 14 (Compound 40)
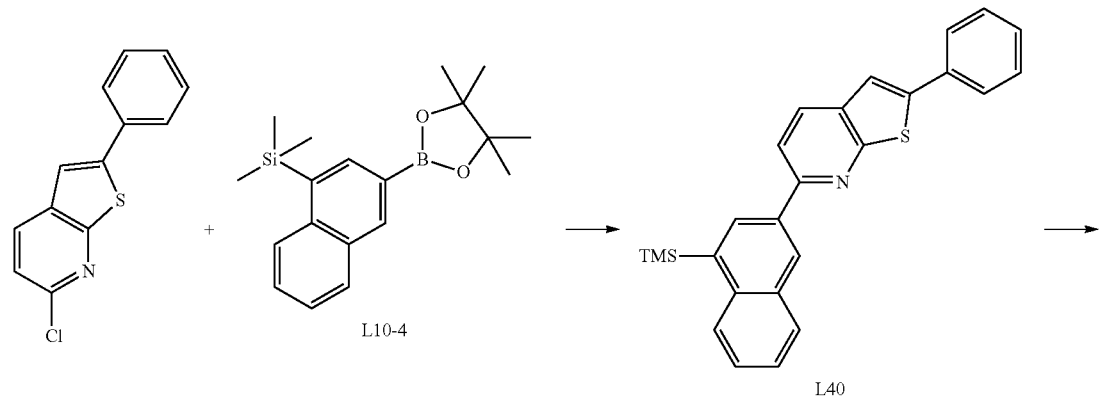
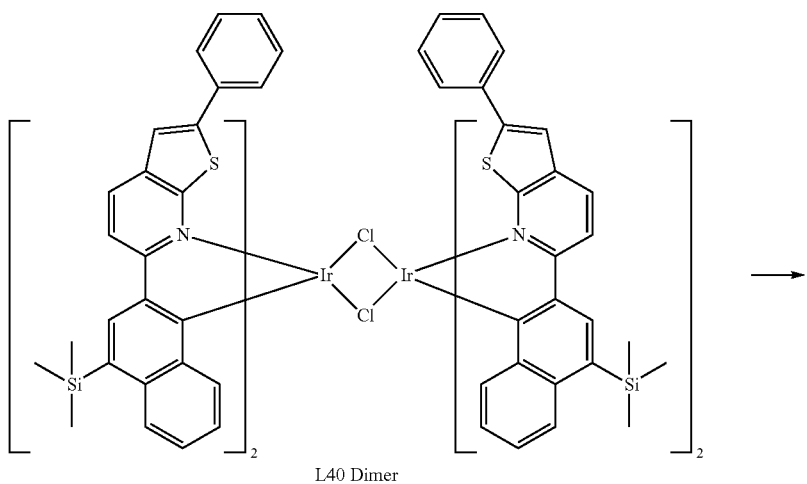
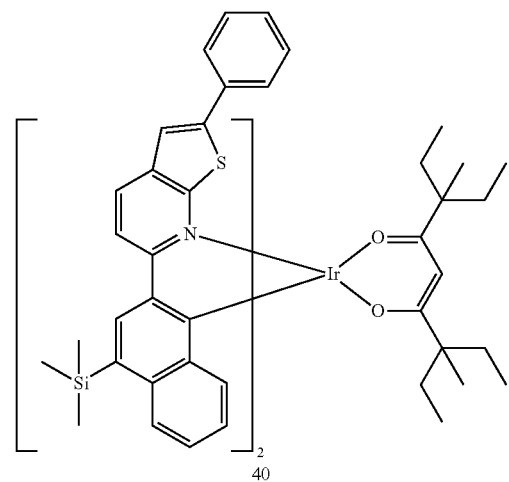

Synthesis of Intermediate L40

1.2 g (yield of 85%) of Intermediate L40 was obtained in the same manner as used to obtain Intermediate L27 of Synthesis Example 7, except that 6-chloro-2-phenylthieno[2,3-b]pyridine was used instead of Intermediate L27-1 and Intermediate L10-4 was used instead of Intermediate L27-4.

LC-MS m/z=410 (M+H)+

Synthesis of Intermediate L40 Dimer 0.9 g of Intermediate L40 Dimer was obtained in the same manner as used to obtain Intermediate L27 Dimer of Synthesis Example 7, except that Intermediate L40 was used instead of Intermediate L27.

Synthesis of Compound 40

0.1 g (yield of 10%) of Compound 40 was obtained in the same manner as used to obtain Compound 27 of Synthesis Example 7, except that Intermediate L40 Dimer was used instead of Intermediate L27 Dimer.

LC-MS m/z=1275 (M+H)+

Synthesis Example 15 (Compound 42)

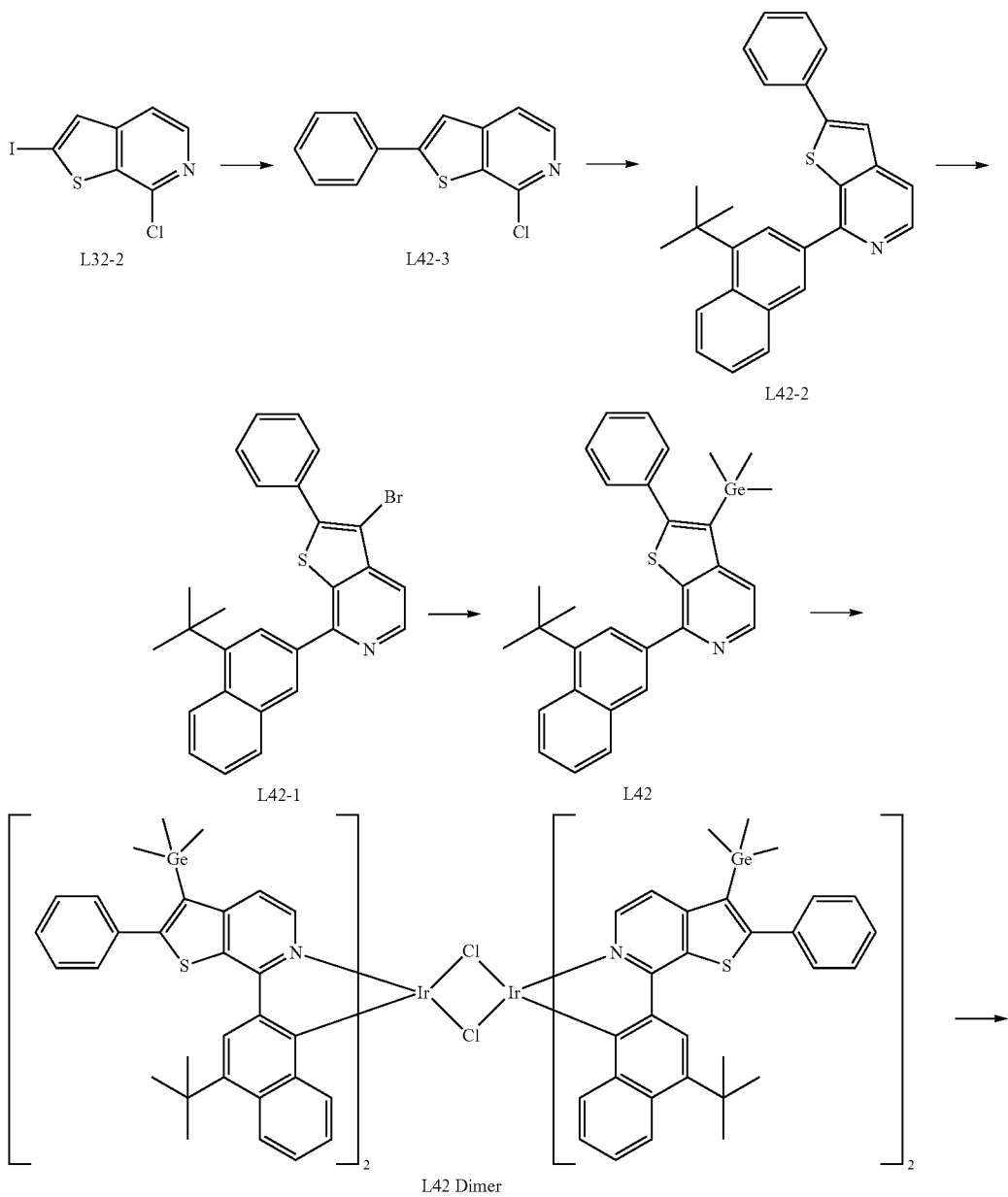

-continued

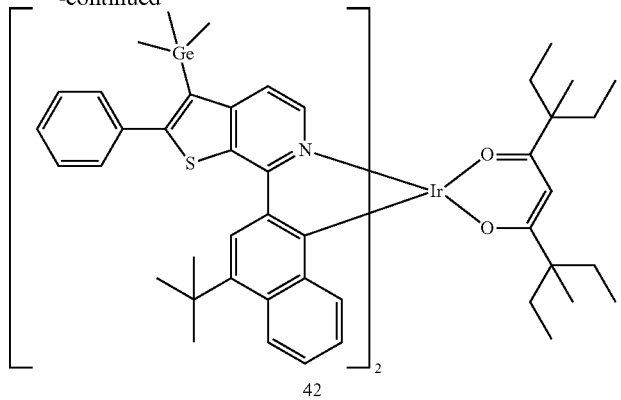
42

Synthesis of Intermediate L42-3

2.7 g (yield of 60%) of Intermediate L42-3 was obtained in the same manner as used to obtain Intermediate L32-1 of Synthesis Example 11, except that phenylboronic acid was used instead of 3-fluoro-2-methylphenylboronic acid.

Synthesis of Intermediate L42-2

1.7 g (yield of 80%) of Intermediate L42-2 was obtained in the same manner as used to obtain Intermediate L6 of Synthesis Example 2, except that Intermediate L42-3 was used instead of 4-chloro-2-phenylfuro[3,2-c]pyridine.

LC-MS m/z=394 (M+H)+

Synthesis of Intermediate L42-1

1.6 g (yield of 78%) of Intermediate L42-1 was obtained in the same manner as used to obtain Intermediate L37-1 of Synthesis Example 13, except that Intermediate L42-2 was used instead of Intermediate L37-2.

LC-MS m/z=472 (M+H)+

Synthesis of Intermediate L42

1.0 g (2.1 mmol) of Intermediate L42-1 was dissolved in 40 ml of anhydrous tetrahydrofuran (THF), and then, at a temperature of −78° C., 1.5 ml (2.3 mmol) of 1.6 M BuLi solution in hexane was slowly added thereto. After about 1 hour, 0.5 g (3.1 mmol) of chlorotrimethylgermane was slowly added dropwise thereto and stirred at room temperature for 12 hours. After completion of the reaction, the organic layer, obtained by extraction using ethyl acetate and saturated Na$_2$CO$_3$ aqueous solution, was dried using magnesium sulfate and distilled under reduced pressure. The resultant was purified by liquid chromatography to obtain 0.8 g (yield 76%) of Intermediate L42.

LC-MS m/z=512 (M+H)+

Synthesis of Intermediate L42 Dimer 0.6 g of Intermediate L42 Dimer was obtained in the same manner as used to obtain Intermediate L37 Dimer of Synthesis Example 13, except that Intermediate L42 was used instead of Intermediate L37.

Synthesis of Compound 42

0.3 g (yield of 42%) of Compound 42 was obtained in the same manner as used to obtain Compound 37 of Synthesis Example 13, except that Intermediate L42 Dimer was used instead of Intermediate L37 Dimer.

LC-MS m/z=1453 (M+H)+

Synthesis Example 16 (Compound 29)

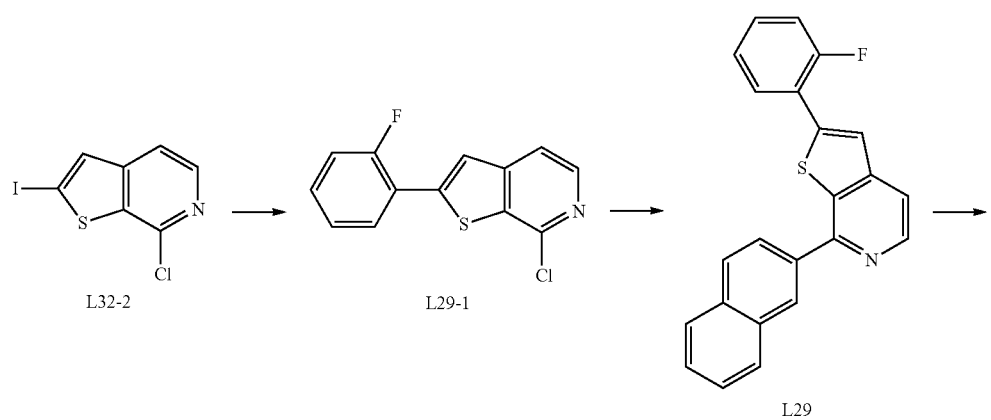

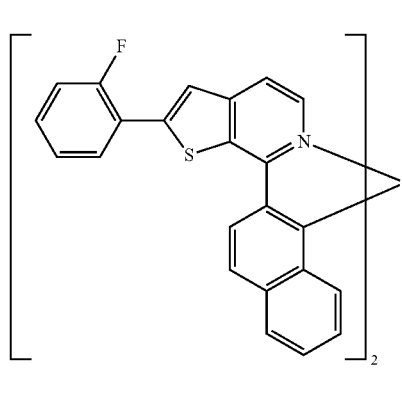
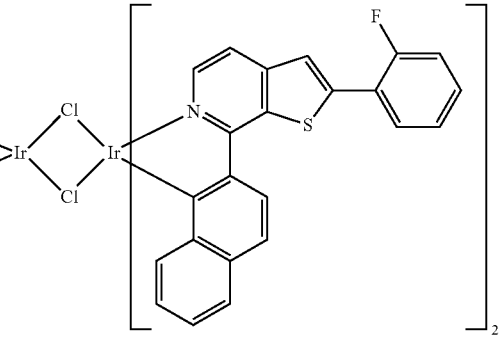

L29 Dimer

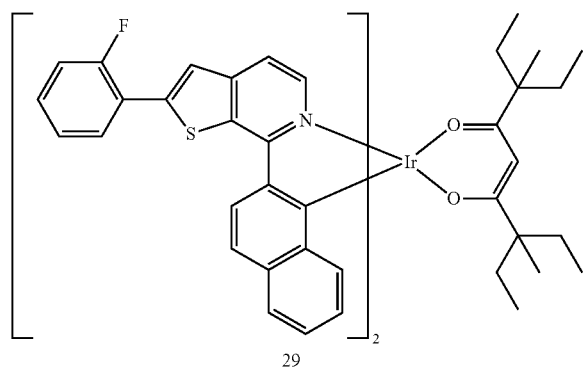

29

Synthesis of Intermediate L29-1

Intermediate L29-1 was obtained in the same manner as used to obtain Intermediate 32-1 of Synthesis Example 11, except that (2-fluorophenyl)boronic acid was used instead of 3-fluoro-2-methylphenylboronic acid and was used in the following reaction without an additional purification.

Synthesis of Intermediate L29

1.1 g (yield of 80%) of Intermediate L29 was obtained in the same manner as used to obtain Intermediate L32 of Synthesis Example 11, except that Intermediate L29-1 was used instead of Intermediate L31-1 and 4,4,5,5-tetramethyl-2-(naphthalen-2-yl)-1,3,2-dioxaborolane was used instead of Intermediate L27-4.

Synthesis of Intermediate L29 Dimer 0.8 g of Intermediate L29 Dimer was obtained in the same manner as used to obtain Intermediate L32 Dimer of Synthesis Example 11, except that Intermediate L29 was used instead of Intermediate L32.

Synthesis of Compound 29

50 mg (yield of 9%) of Compound 29 was obtained in the same manner as used to obtain Compound 32 of Synthesis Example 11, except that Intermediate L29 Dimer was used instead of Intermediate L32 Dimer.

LC-MS m/z=1141 (M+H)$^+$

Synthesis Example 17 (Compound 30)

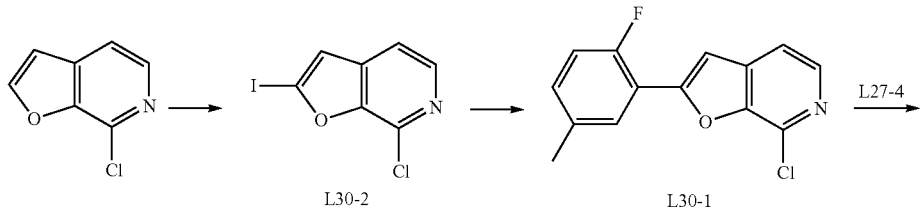

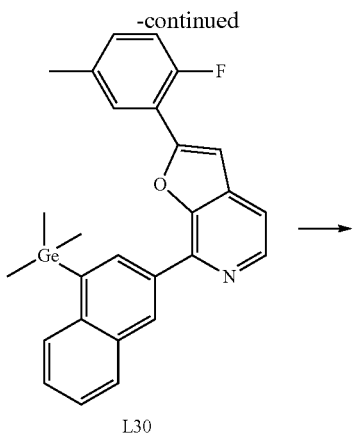

L30

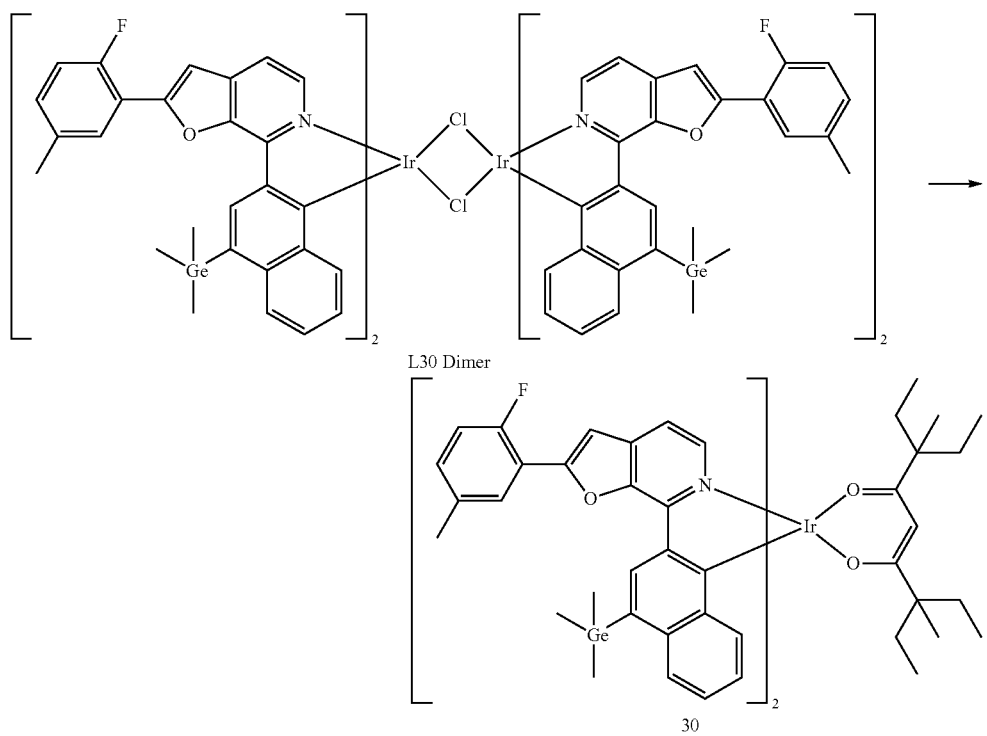

L30 Dimer

30

Synthesis of Intermediate L30-2

3.1 g (yield of 87%) of Intermediate L30-2 was obtained in the same manner as used to obtain Intermediate L32-2 of Synthesis Example 11, except that 7-chlorofuro[2,3-c]pyridine was used instead of 7-chlorothieno[2,3-c]pyridine.

Synthesis of Intermediate L30-1

Intermediate L30-1 was obtained in the same manner as used to obtain Intermediate 32-1 of Synthesis Example 11, except that Intermediate L30-2 was used instead of Intermediate L32-2 and (2-fluoro-5-methylphenyl)boronic acid was used instead of 3-fluoro-2-methylphenylboronic acid and was used in the following reaction without an additional purification.

Synthesis of Intermediate L30

3.1 g (yield of 75%) of Intermediate L30 was obtained in the same manner as used to obtain Intermediate L32 of Synthesis Example 11, except that Intermediate L30-1 was used instead of Intermediate L32-1.

Synthesis of Intermediate L30 Dimer 1.1 g of Intermediate L30 Dimer was obtained in the same manner as used to obtain Intermediate L32 Dimer of Synthesis Example 11, except that Intermediate L30 was used instead of Intermediate L32.

Synthesis of Compound 30

0.2 g (yield of 25%) of Compound 30 was obtained in the same manner as used to obtain Compound 32 of Synthesis Example 11, except that Intermediate L30 Dimer was used instead of Intermediate L32 Dimer.

LC-MS m/z=1370 (M+H)$^+$

Synthesis Example 18 (Compound 33)

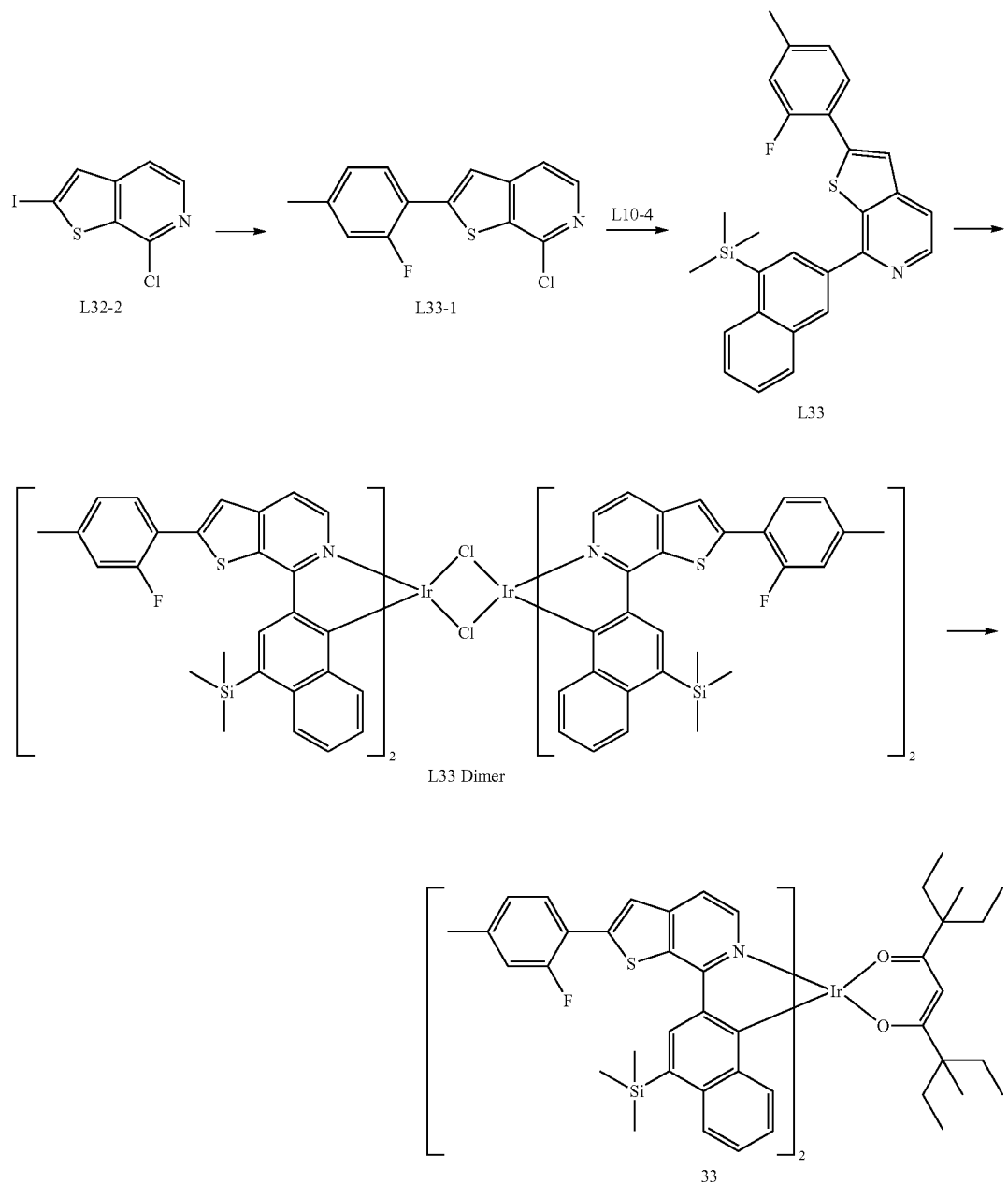

Synthesis of Intermediate L33-1

Intermediate L33-1 was obtained in the same manner as used to obtain Intermediate 32-1 of Synthesis Example 11, except that (2-fluoro-4-methylphenyl)boronic acid was used instead of 3-fluoro-2-methylphenylboronic acid and was used in the following reaction without an additional purification.

Synthesis of Intermediate L33

1.8 g (yield of 76%) of Intermediate L33 was obtained in the same manner as used to obtain Intermediate L32 of Synthesis Example 11, except that Intermediate L33-1 was used instead of Intermediate L32-1 and Intermediate L10-4 was used instead of Intermediate L27-4.

Synthesis of Intermediate L33 Dimer 0.8 g of Intermediate L33 Dimer was obtained in the same manner as used to obtain Intermediate L32 Dimer of Synthesis Example 11, except that Intermediate L33 was used instead of Intermediate L32.

Synthesis of Compound 33

0.1 g (yield of 16%) of Compound 33 was obtained in the same manner as used to obtain Compound 32 of Synthesis Example 11, except that Intermediate L33 Dimer was used instead of Intermediate L32 Dimer.

LC-MS m/z=1313 (M+H)$^+$

Synthesis Example 19 (Compound 34)

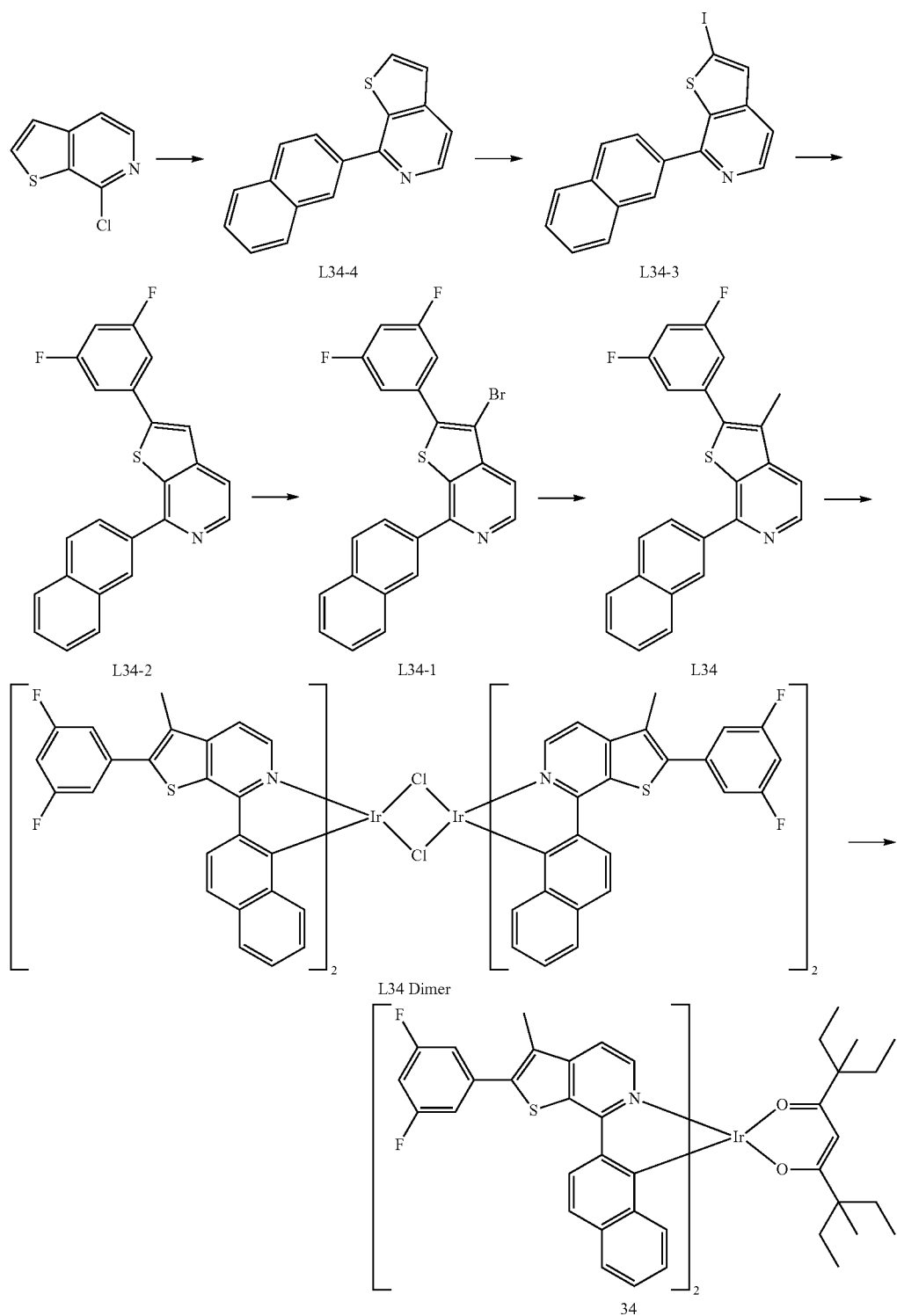

Synthesis of Intermediate L34-4

2.4 g (yield of 70%) of Intermediate L34-4 was obtained in the same manner as used to obtain Intermediate L35-2 of Synthesis Example 12, except that naphthalen-2-ylboronic acid was used instead of Intermediate L27-4.

Synthesis of Intermediate L34-3

3.2 g (yield of 90%) of Intermediate L34-3 was obtained in the same manner as used to obtain Intermediate L35-1 of Synthesis Example 12, except that Intermediate L34-4 was used instead of Intermediate L35-2.

Synthesis of Intermediate L34-2

2.3 g (yield of 76%) of Intermediate L34-2 was obtained in the same manner as used to obtain Intermediate L35 of Synthesis Example 12, except that Intermediate L34-3 was used instead of Intermediate L35-1 and 3,5-Difluorophenyl boronic acid was used instead of 2,6-Difluorophenyl boronic acid.

Synthesis of Intermediate L34-1

2.0 g (yield of 70%) of Intermediate L34-1 was obtained in the same manner as used to obtain Intermediate L37-1 of Synthesis Example 13, except that Intermediate L34-2 was used instead of Intermediate L37-2.

Synthesis of Intermediate L34

1.4 g (yield of 82%) of Intermediate L34 was obtained in the same manner as used to obtain Intermediate L37 of Synthesis Example 13, except that Intermediate L34-1 was used instead of Intermediate L37-1.

Synthesis of Intermediate L34 Dimer 1.3 g of Intermediate L34 Dimer was obtained in the same manner as used to obtain Intermediate L37 Dimer of Synthesis Example 13, except that Intermediate L34 was used instead of Intermediate L37.

Synthesis of Compound 34

120 mg (yield of 9%) of Compound 34 was obtained in the same manner as used to obtain Compound 37 of Synthesis Example 13, except that Intermediate L34 Dimer was used instead of Intermediate L37 Dimer.

LC-MS m/z=1205 (M+H)$^+$

Synthesis Example 20 (Compound 38)

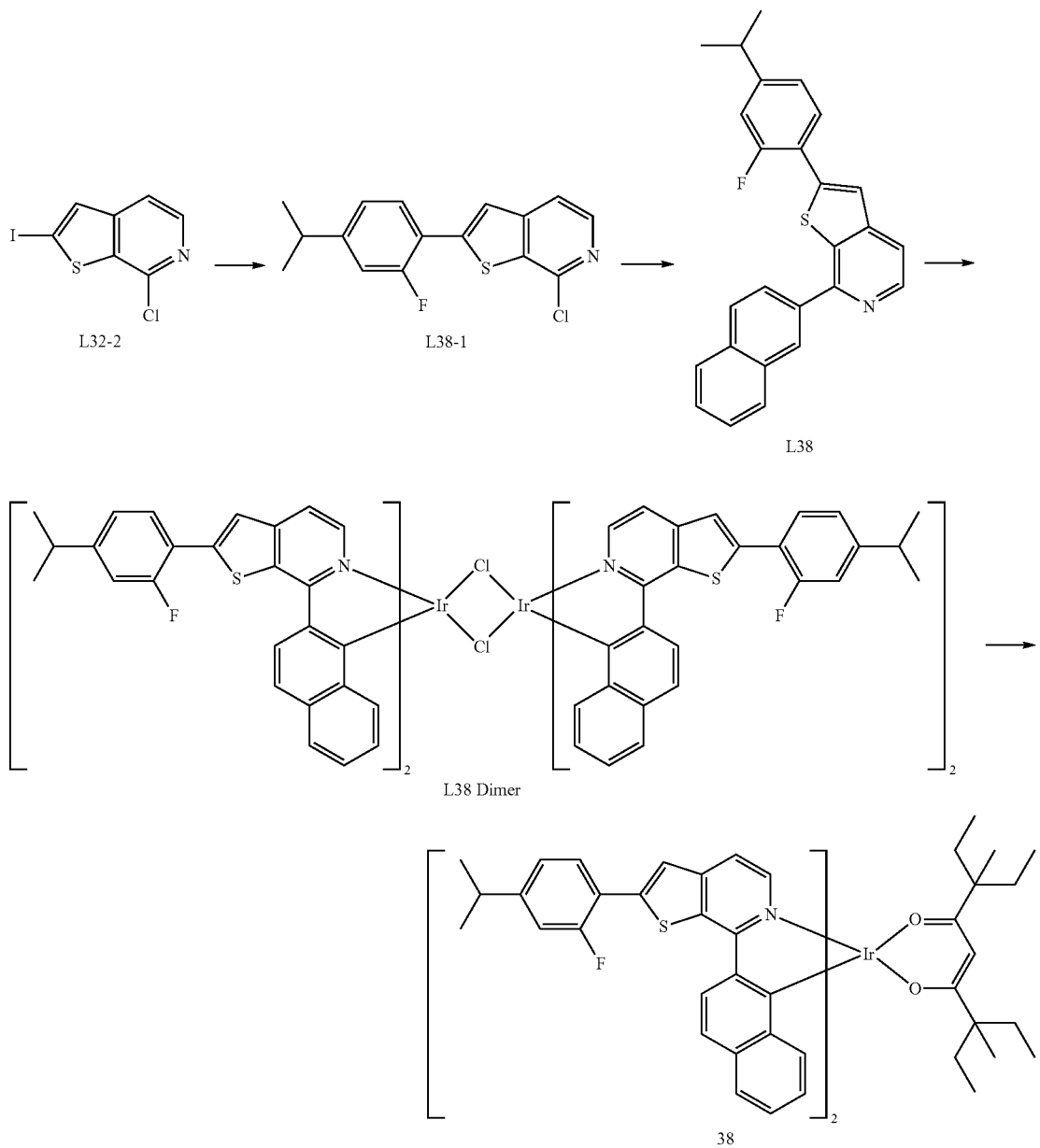

Synthesis of Intermediate L38-1

Intermediate L38-1 was obtained in the same manner as used to obtain Intermediate 32-1 of Synthesis Example 11, except that (2-fluoro-4-isopropylphenyl)boronic acid was used instead of 3-fluoro-2-methylphenylboronic acid and was used in the following reaction without an additional purification.

Synthesis of Intermediate L38

2.8 g (yield of 78%) of Intermediate L38 was obtained in the same manner as used to obtain Intermediate L32 of Synthesis Example 11, except that Intermediate L38-1 was used instead of Intermediate L32-1 and 4,4,5,5-tetramethyl-2-(naphthalen-2-yl)-1,3,2-dioxaborolane was used instead of Intermediate L27-4.

Synthesis of Intermediate L33 Dimer 1.6 g of Intermediate L38 Dimer was obtained in the same manner as used to obtain Intermediate L32 Dimer of Synthesis Example 11, except that Intermediate L38 was used instead of Intermediate L32.

Synthesis of Compound 38

0.1 g (yield of 7%) of Compound 38 was obtained in the same manner as used to obtain Compound 32 of Synthesis Example 11, except that Intermediate L38 Dimer was used instead of Intermediate L32 Dimer.

LC-MS m/z=1226 (M+H)$^+$

Synthesis Example 21 (Compound 46)

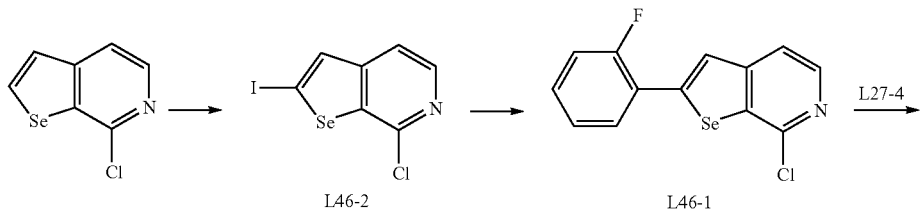

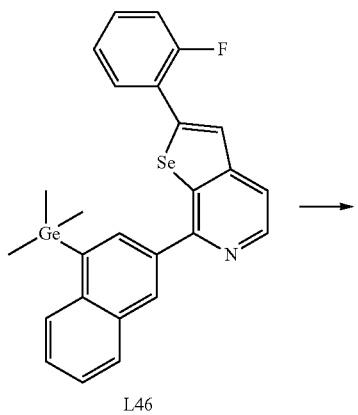

L46

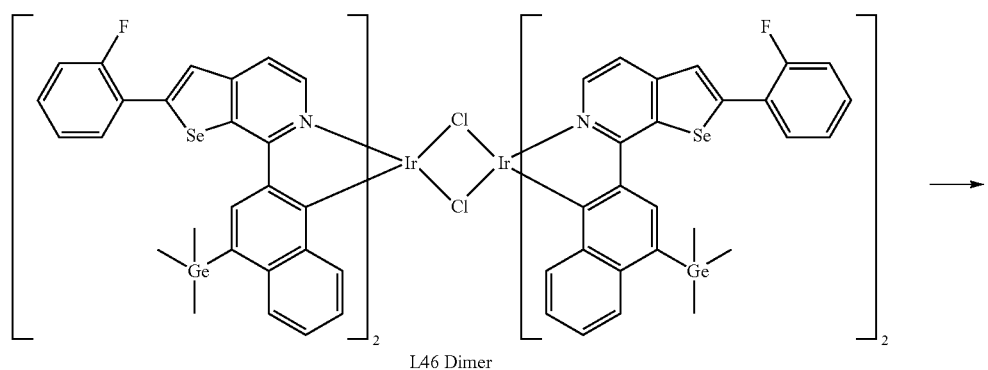

L46 Dimer

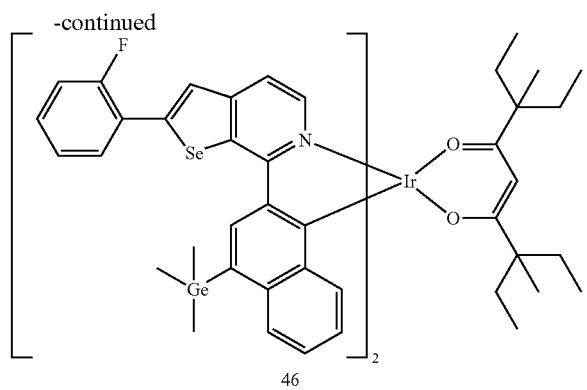

46

Synthesis of Intermediate L46-2

4.6 g (yield of 62%) of Intermediate L46-2 was obtained in the same manner as used to obtain Intermediate L32-2 of Synthesis Example 11, except that 7-chloroselenopheno[2,3-c]pyridine was used instead of 7-chlorothieno[2,3-c]pyridine.

Synthesis of Intermediate L46-1

Intermediate L46-1 was obtained in the same manner as used to obtain Intermediate 32-1 of Synthesis Example 11, except that Intermediate L46-2 was used instead of Intermediate L32-2 and 2-fluorophenyl boronic acid was used instead of 3-fluoro-2-methylphenylboronic acid and was used in the following reaction without an additional purification.

Synthesis of Intermediate L46

3.1 g (yield of 63%) of Intermediate L46 was obtained in the same manner as used to obtain Intermediate L32 of Synthesis Example 11, except that Intermediate L46-1 was used instead of Intermediate L32-1.

Synthesis of Intermediate L46 Dimer 1.0 g of Intermediate L46 Dimer was obtained in the same manner as used to obtain Intermediate L32 Dimer of Synthesis Example 11, except that Intermediate L46 was used instead of Intermediate L32.

Synthesis of Compound 46

0.2 g (yield of 36%) of Compound 46 was obtained in the same manner as used to obtain Compound 32 of Synthesis Example 11, except that Intermediate L46 Dimer was used instead of Intermediate L32 Dimer.

LC-MS m/z=1469 (M+H)$^+$

Evaluation Example 1: Evaluation of Photoluminescence Quantum Yields (PLQY)

Compound H52 and Compound 1 were co-deposited at a vacuum of 10-7 torr at a weight ratio of 98:2 to produce a film with a thickness of 40 nm.

The PLQY of Compound 1 in film was evaluated by using a Hamamatsu Photonics absolute PL quantum yield measurement system equipped with a xenon light source, a monochromator, a photonic multichannel analyzer, and an integrating sphere, and using PLQY measurement software (Hamamatsu Photonics, Ltd., Shizuoka, Japan). Results thereof are shown in Table 2.

The PLQY measurements were performed on Compounds 6, 10, 11, 13, 16, 23, 24, 26, 27, 29, 30, 32, 33, 34, 35, 38, 42, 46, A1, A2, B1, and B2, respectively, and results thereof are shown in Table 2.

TABLE 2

| Comopund No. | PLQY in film (%) |
|---|---|
| 1 | 99 |
| 6 | 98 |
| 10 | 98 |
| 11 | 99 |
| 13 | 99 |
| 16 | 98 |
| 23 | 98 |
| 24 | 99 |
| 26 | 98 |
| 27 | 97 |
| 29 | 98 |
| 30 | 99 |
| 32 | 98 |
| 33 | 98 |
| 34 | 96 |
| 35 | 97 |
| 38 | 98 |
| 42 | 97 |
| 46 | 98 |
| A1 | 87 |
| A2 | 93 |
| B1 | 92 |
| B2 | 81 |

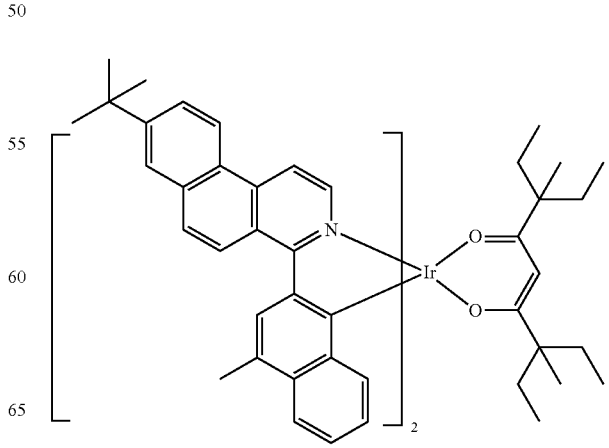

1

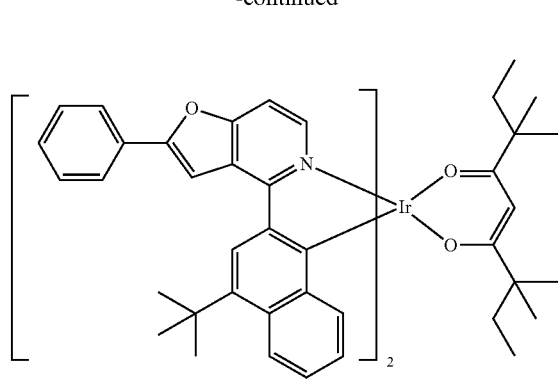
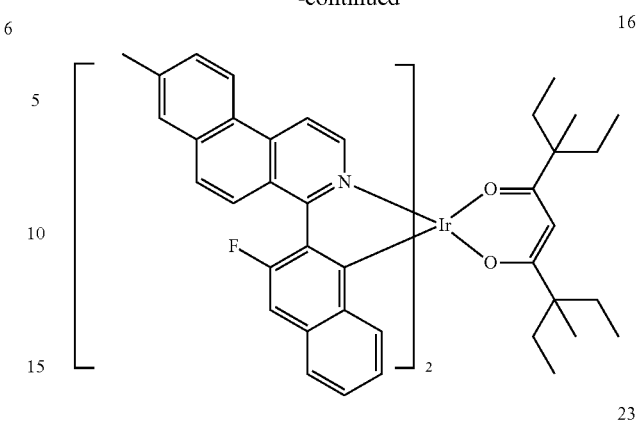
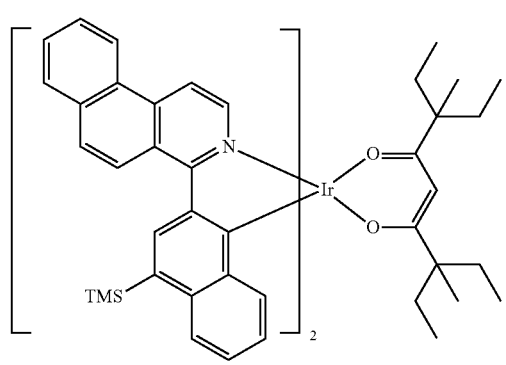
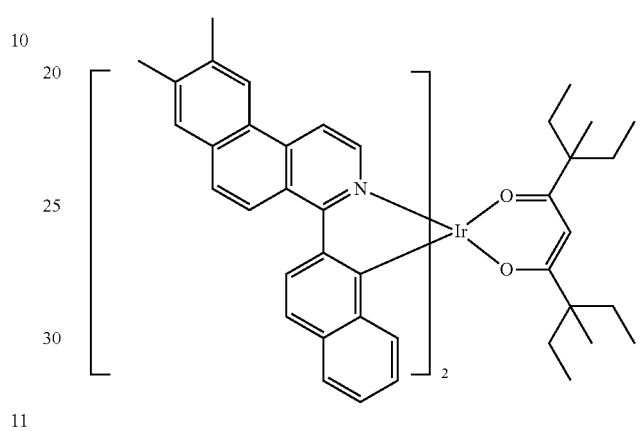
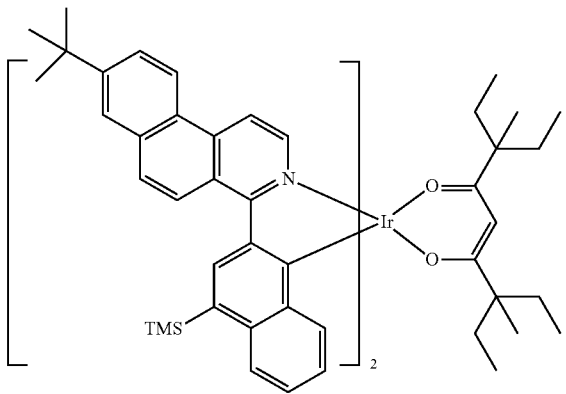
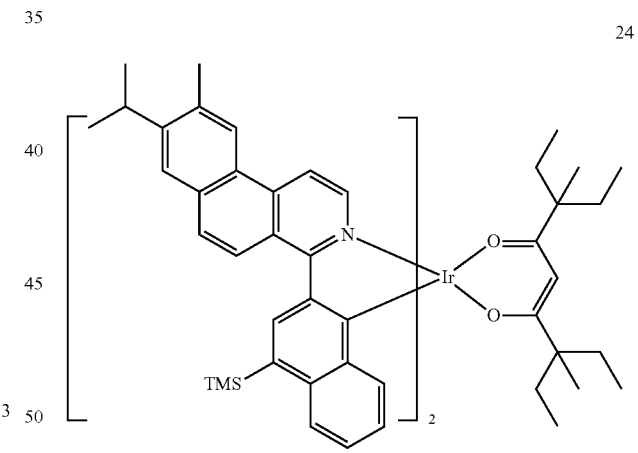
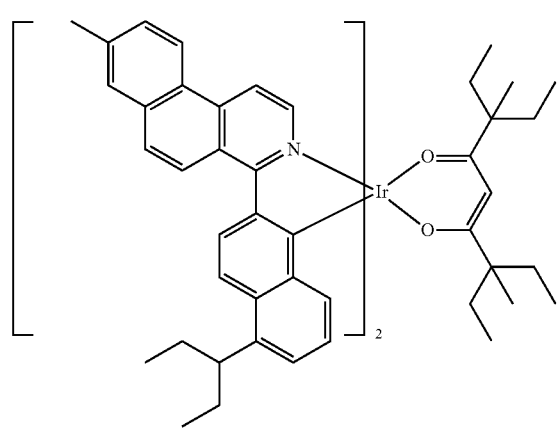
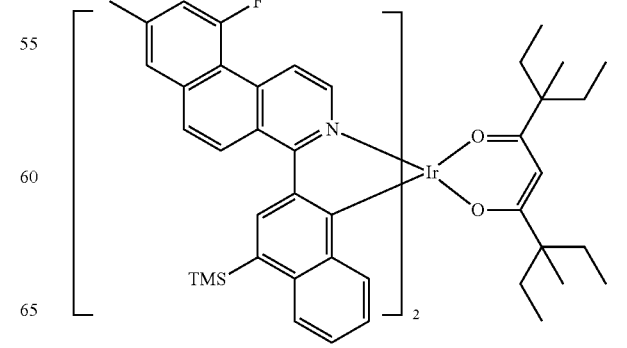

231
-continued
232
-continued
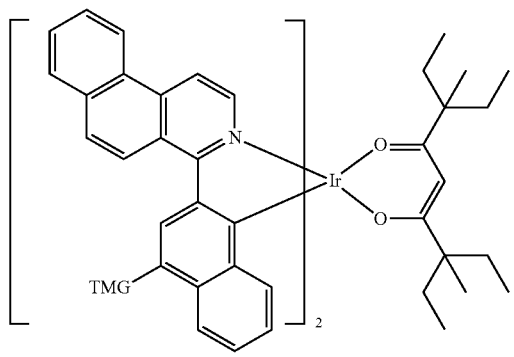
27
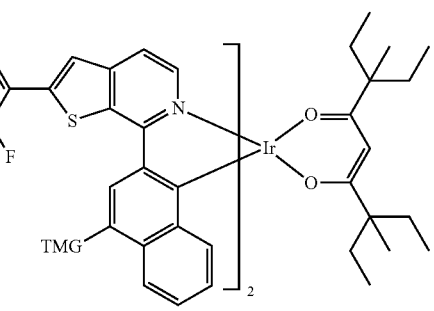
33
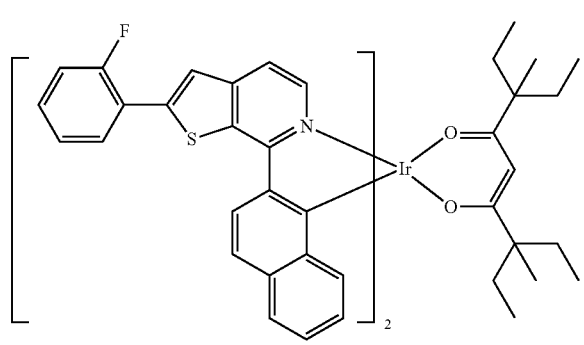
29
34
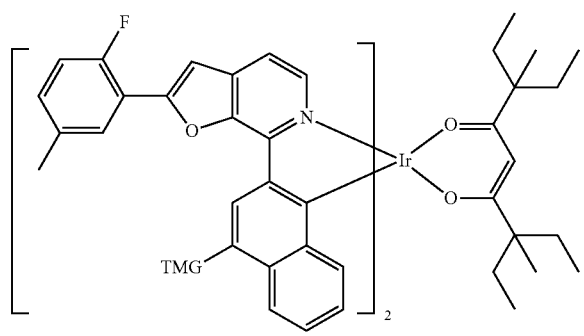
30
35
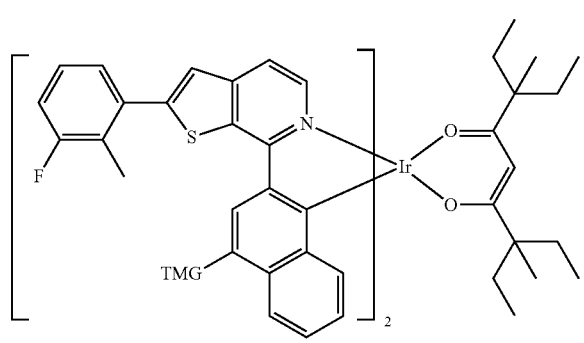
32
38

-continued

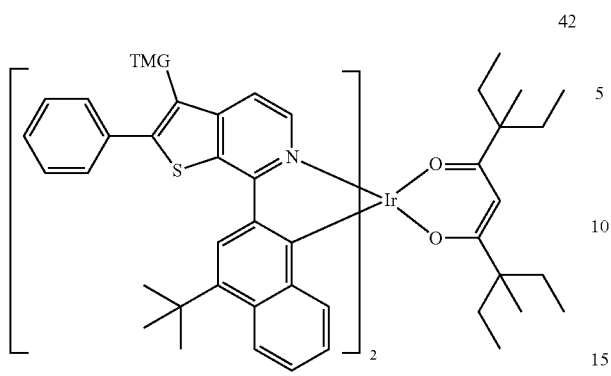
42

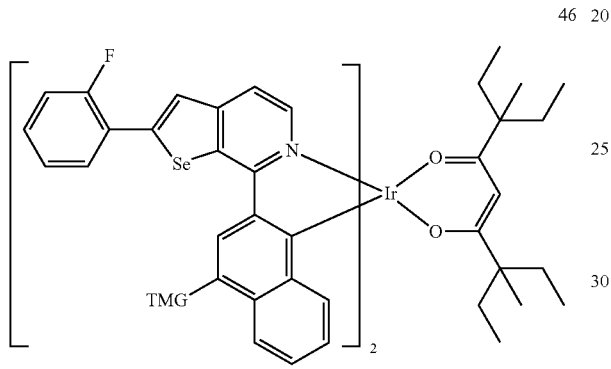
46

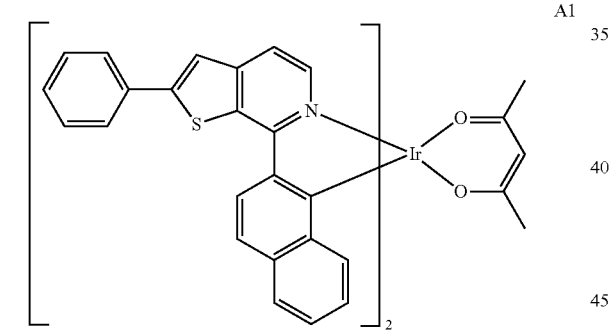
A1

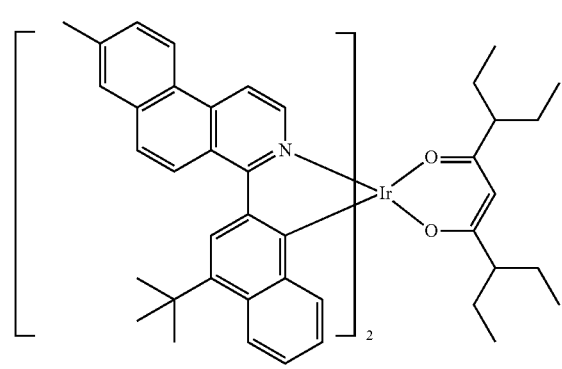
A2

-continued

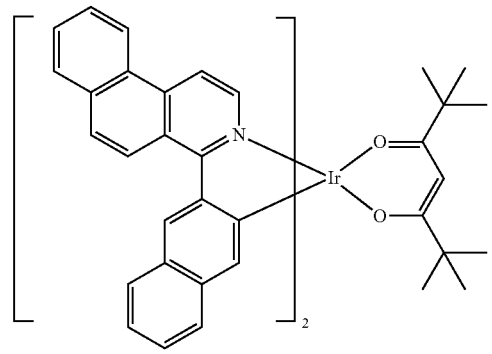
B1

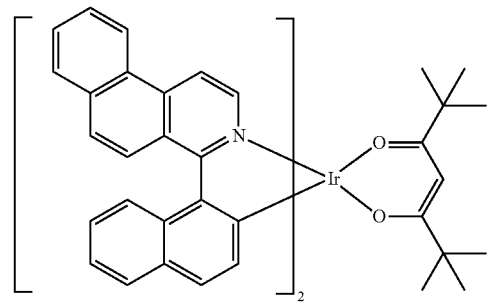
B2

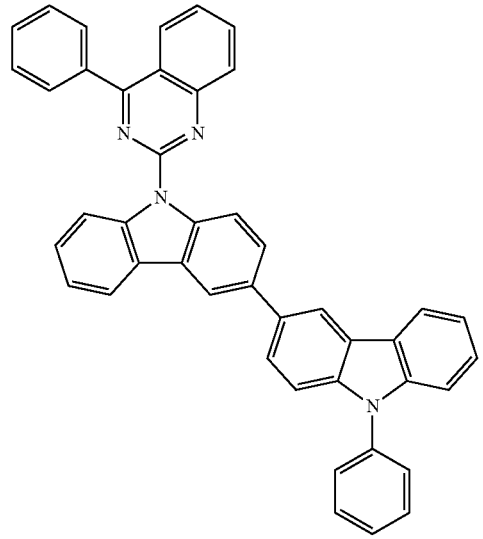
H52

From Table 2, it can be seen that Compounds 1, 6, 10, 11, 13, 16, 23, 24, 26, 27, 29, 30, 32, 33, 34, 35, 38, 42 and 46 have superior PLQY characteristics compared to Compounds A1, A2, B1, and B2.

Evaluation Example 2: Evaluation of Horizontal Orientation Ratio (Optical Orientation Ratio)

In a vacuum deposition apparatus having a vacuum degree of $1\times10^{-7}$ torr, Compound H52 and Compound 1 were co-deposited at a weight ratio of 98:2 on a fused silica layer (thickness: 1 mm) to form a film having a thickness of 40 nm, and then sealed with glass and glue under a nitrogen atmosphere.

Meanwhile, an angle-dependent PL measurement apparatus having the same structure as that shown in FIG. 3 of Korean Patent Application Publication No. 2013-0150834 was prepared. Detailed specifications are as follows:

Excitation-light wavelength: 325 nm
Source of excitation-light: He—Cd laser of Melles Griot Inc.
Excitation-light irradiation member: optical fiber having a diameter of 1 mm of Thorlabs Inc.
Semi-cylindrical prism: a fused silica having a diameter of 100 mm and a length of 30 mm
Emitted-light detection member: photomultiplier tube of Acton Inc.
Polarizer mounted on emitted-light detection member: linear polarizer of Thorlabs Inc.
Recorder: SpectraSense of Acton Inc.
Incidence angle of excitation light: θP=45°, θH=0°
Distance from a sample to the emitted-light detection member (or a radius of a movement path of the emitted-light detection member): 900 mm Subsequently, the film was fixed on a semi-cylindrical lens and irradiated with a 325 nm laser to emit light. The emitted light passed through a polarization film, and then, in order to measure a p-polarized photoluminescence intensity with respect to light in a Max wavelength of a spectrum in a range of 90 degree to 0 degree, the semi-cylindrical lens, on which the sample was fixed, was rotated by 1 degree with respect to an axis of the semi-cylindrical lens by using a charge-coupled device (CCD).

The p-polarized photoluminescence intensity (a first p-polarized photoluminescence intensity) in a case where each compound is vertically aligned and the p-polarized photoluminescence intensity (a second p-polarized photoluminescence intensity) in a case where each compound is horizontally aligned were respectively calculated within a range of 0 degree to 90 degrees. The p-polarized photoluminescence intensity obtained by multiplying the first p-polarized photoluminescence intensity and the second p-polarized photoluminescence intensity respectively by a weight value was obtained to obtain a weight value corresponding to the measured p-polarization photoluminescence intensity. Then, the horizontal orientation ratio of each compound shown in Table 3 was measured and results thereof are shown in Table 3. Here, the angle-dependent photoluminescence spectrum was analyzed using a classical dipole model which regards light emitted from excitons as dissipated power from an oscillating dipole, and the horizontal orientation ratio for Compound 1 was evaluated.

This measurement was performed on each of Compounds 6, 11, 13, 16, 23, 26, 27, 29, 32, 35, 40, 42, A1, A2, B1 and B2, respectively, and results are shown in Table 3.

TABLE 3

| Co-deposition materials | Horizontal orientation ratio (optical orientation ratio) (%) |
|---|---|
| H52: Compound 1(2 wt %) | 94 |
| H52: Compound 6(2 wt %) | 95 |
| H52: Compound 11(2 wt %) | 94 |
| H52: Compound 13(2 wt %) | 94 |
| H52: Compound 16(2 wt %) | 93 |
| H52: Compound 23(2 wt %) | 92 |
| H52: Compound 26(2 wt %) | 91 |
| H52: Compopnd 27(2 wt %) | 91 |
| H52: Compound 29(2 wt %) | 92 |
| H52: Compound 32(2 wt %) | 93 |
| H52: Compound 35(2 wt %) | 93 |
| H52: Compopnd 40(2 wt %) | 88 |
| H52: Compound 42(2 wt %) | 90 |
| H52: Compound A1(2 wt %) | 88 |
| H52: Compound A2(2 wt %) | 88 |

TABLE 3-continued

| Co-deposition materials | Horizontal orientation ratio (optical orientation ratio) (%) |
|---|---|
| H52: Compound B1(2 wt %) | 88 |
| H52: Compound B2(2 wt %) | 85 |

From Table 3, it can be seen that Compounds 1, 6, 11, 13, 16, 23, 26, 27, 29, 32, 35, 40 and 42 have superior horizontal orientation ratio characteristics compared to Compounds A1, A2, B1, and B2.

Example 1

As an anode, an ITO-patterned glass substrate was cut to a size of 50 mm×50 mm×0.5 mm, sonicated with isopropyl alcohol and deionized water each for 5 minutes, and then cleaned by exposure to ultraviolet radiation and ozone for 30 minutes. Then, the ITO-patterned glass substrate was provided to a vacuum deposition apparatus.

HT3 and F6-TCNNQ were vacuum-co deposited on the ITO anode at the weight ratio of 98:2 to form a hole injection layer having a thickness of 100 Å, and HT3 was vacuum-deposited on the hole injection layer to form a hole transport layer having a thickness of 1350 Å, and then, HT21 was vacuum-deposited on the hole transport layer to form an electron blocking layer having a thickness of 300 Å.

Then, H52 (host) and Compound 1 (dopant) were co-deposited at the weight ratio of 98:2 on the electron blocking layer to form an emission layer having a thickness of 400 Å.

Thereafter, ET3 and ET-D1 were co-deposited at a volume ratio of 50:50 on the emission layer to form an electron transport layer having a thickness of 350 Å, ET-D1 was vacuum-deposited on the electron transport layer to form an electron injection layer having a thickness of 10 Å, and Al was vacuum-deposited on the electron injection layer to form a cathode having a thickness of 1,000 Å, thereby completing the manufacture of an organic light-emitting device having a structure of ITO (1,500 Å)/HT3+F6TCNNQ (2 wt %) (100 Å)/HT3 (1350 Å)/HT21 (300 Å)/H52+Compound 1 (2 wt %) (400 Å)/ET3+ET-D1 (50%) (350 Å)/ET-D1 (10 Å)/Al (1,000 Å).

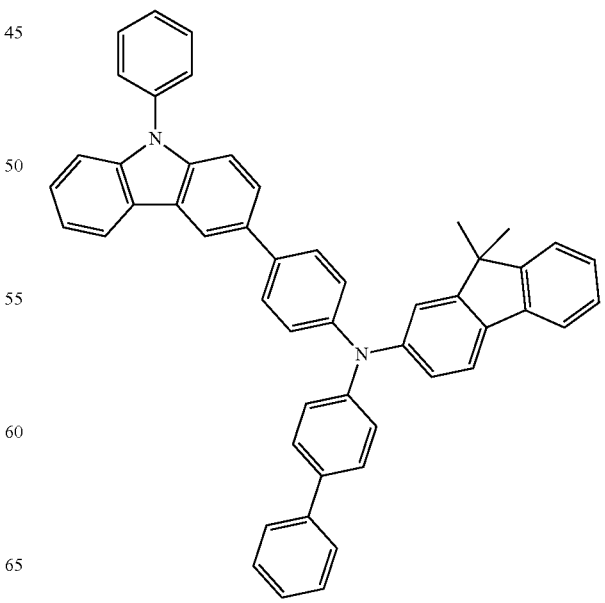

HT3

-continued

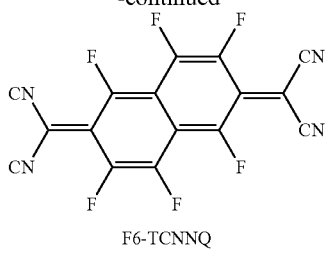

F6-TCNNQ

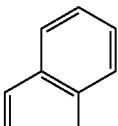

HT21

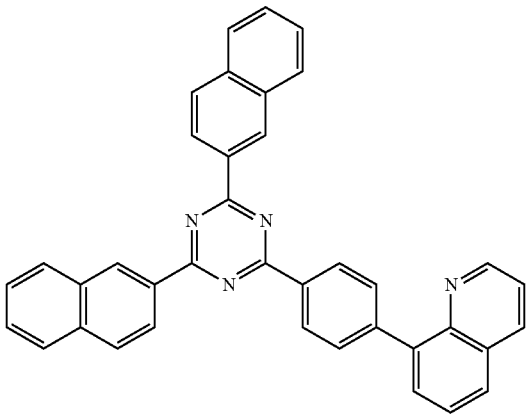

ET3

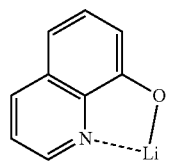

ET-D1

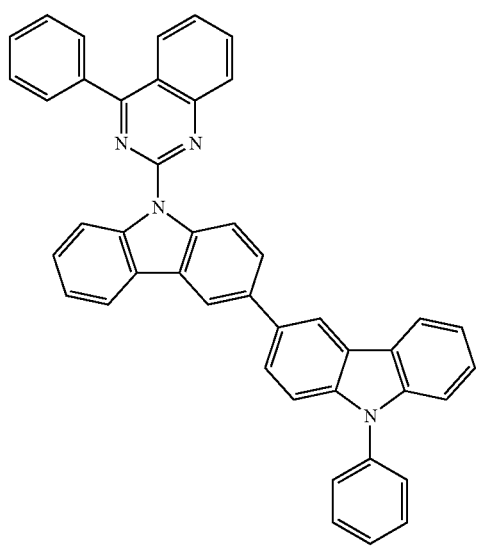

H52

Examples 2 to 14 and Comparative Examples A1, A2, B1, and B2

Organic light-emitting devices were manufactured in the same manner as in Example 1, except that Compounds shown in Table 4 were each used instead of Compound 1 as a dopant in forming an emission layer.

Evaluation Example 3: Evaluation of Device Characteristics

The driving voltage (V), current density (mA/cm$^2$), maximum value of external quantum efficiency (Max EQE) (%), FWHM of an emission peak of electroluminescent (EL) spectrum (FWHM, nm), maximum emission wavelength ($\lambda_{max}$, nm), and lifespan (LT$_{97}$) (candela per square meter (cd/m$^2$) or nits) of the organic light-emitting devices manufactured according to Examples 1 to 14 and Comparative Examples A1, A2, B1, and B2 were evaluated. Results thereof are shown in Table 4. As an evaluation device, a current-voltmeter (Keithley 2400) and a luminance meter (Minolta Cs-1000A) were used, and the lifespan (LT$_{97}$) (at 3500 cd/m$^2$) was evaluated as the time taken for luminance to reduce to 97% of 100% of the initial luminance.

TABLE 4

| | Compound No. as dopant in emission layer | Driving Voltage (V) | Current density (mA/cm$^2$) | Max EQE (Relative value, %) | FWHM (nm) | Maximum emission wavelength (nm) | LT$_{97}$ (at 3500 cd/m$^2$) (Relative value, %) |
|---|---|---|---|---|---|---|---|
| Example 1 | 1 | 4.0 | 10 | 27 | 37 | 641 | 140 |
| Example 2 | 6 | 4.0 | 10 | 28 | 36 | 632 | 125 |
| Example 3 | 11 | 3.8 | 10 | 29 | 38 | 628 | 150 |
| Example 4 | 13 | 3.9 | 10 | 29 | 39 | 628 | 180 |
| Example 5 | 16 | 4.0 | 10 | 30 | 38 | 623 | 170 |
| Example 6 | 23 | 3.8 | 10 | 31 | 38 | 627 | 250 |
| Example 7 | 26 | 3.8 | 10 | 31 | 37 | 625 | 220 |
| Example 8 | 27 | 3.9 | 10 | 29 | 36 | 628 | 250 |
| Example 9 | 29 | 3.4 | 10 | 32 | 35 | 623 | >200 |
| Example 10 | 32 | 3.5 | 10 | 33 | 34 | 626 | >200 |
| Example 11 | 35 | 3.5 | 10 | 32 | 35 | 623 | >250 |

TABLE 4-continued
| | Compound No. as dopant in emission layer | Driving Voltage (V) | Current density (mA/cm$^2$) | Max EQE (Relative value, %) | FWHM (nm) | Maximum emission wavelength (nm) | LT$_{97}$ (at 3500 cd/m$^2$) (Relative value, %) |
|---|---|---|---|---|---|---|---|
| Example 12 | 37 | 3.6 | 10 | 31 | 36 | 621 | 150 |
| Example 13 | 40 | 3.7 | 10 | 29 | 41 | 625 | 120 |
| Example 14 | 42 | 3.7 | 10 | 28 | 43 | 622 | 110 |
| Comparative Example A1 | A1 | 4.0 | 10 | 25 | 50 | 635 | 100 |
| Comparative Example A2 | A2 | 4.0 | 10 | 27 | 38 | 635 | 100 |
| Comparative Example B1 | B1 | 4.1 | 10 | 27 | 63 | 623 | 90 |
| Comparative Example B2 | B2 | 4.3 | 10 | 25 | 68 | 645 | 75 |
-continued
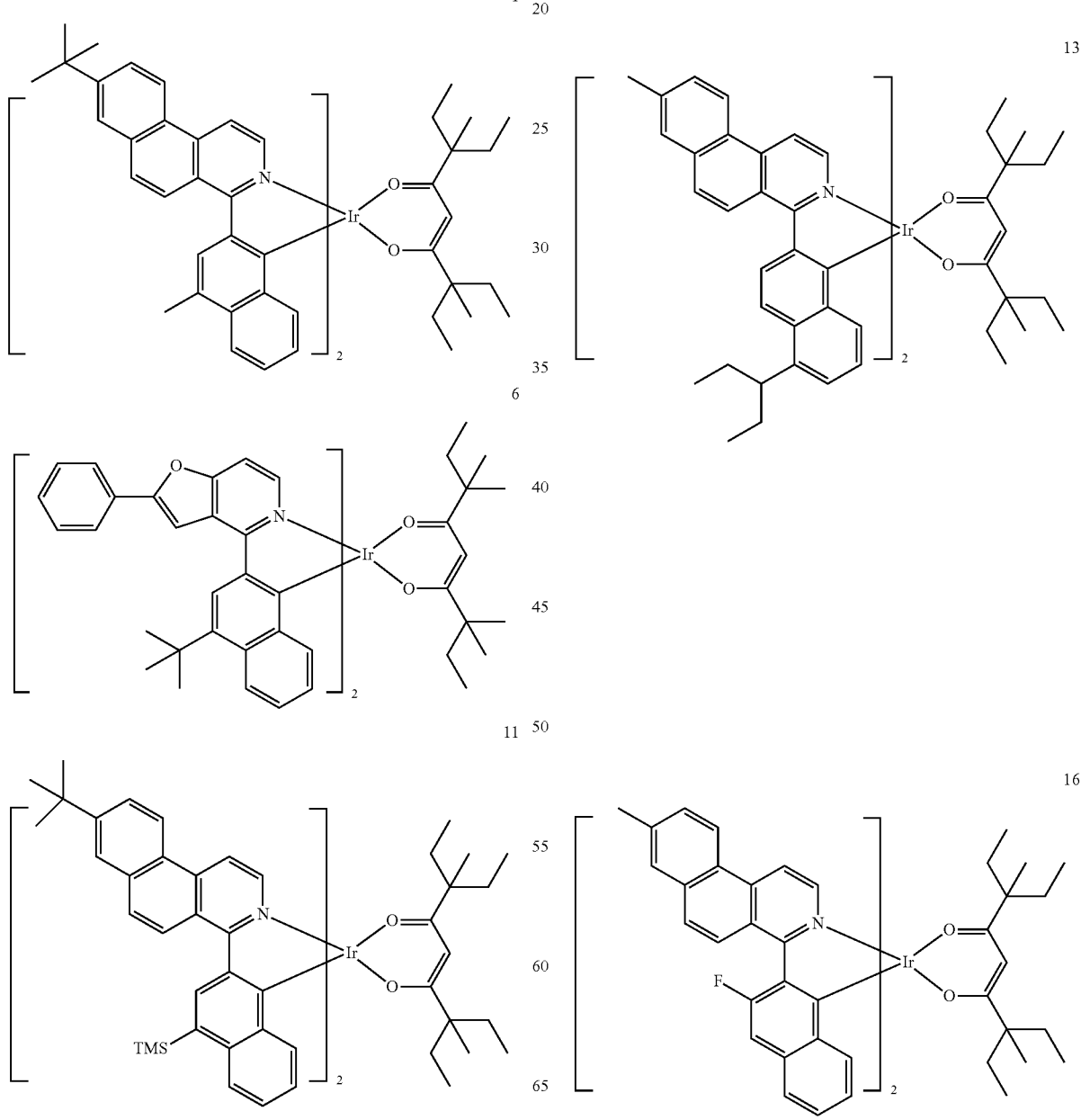

23
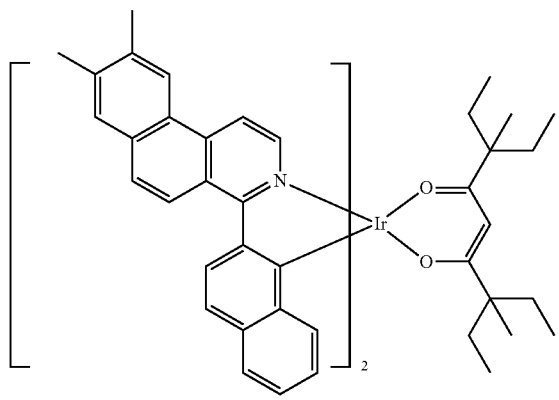
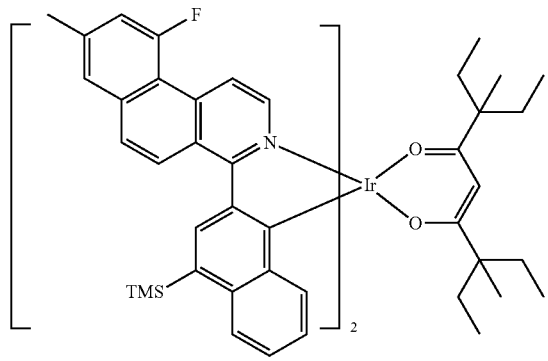
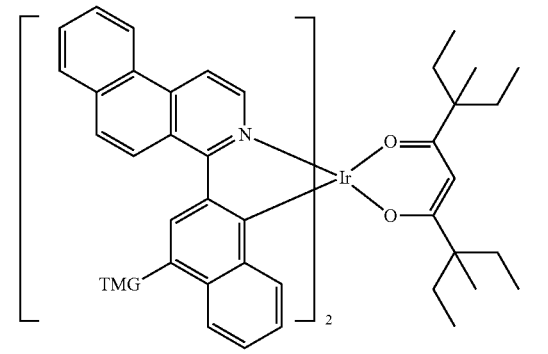
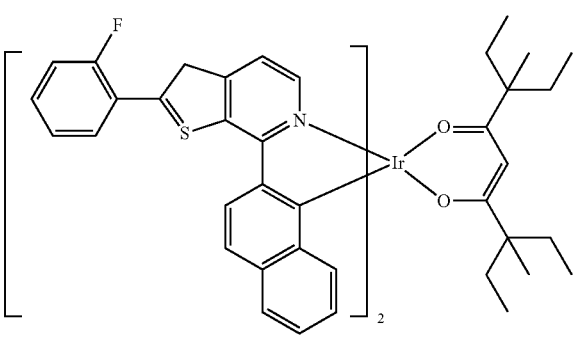
32
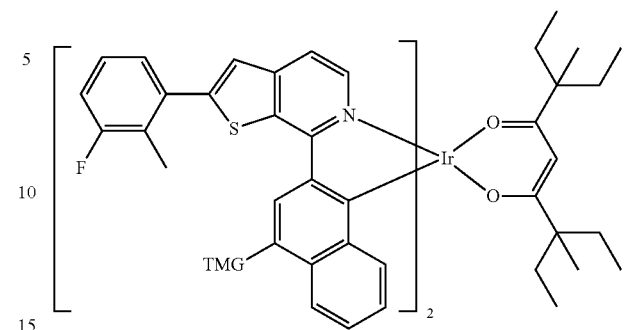
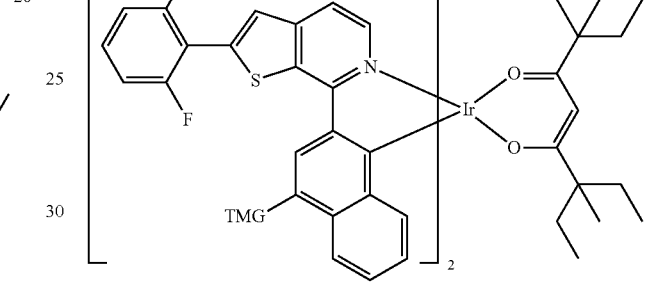
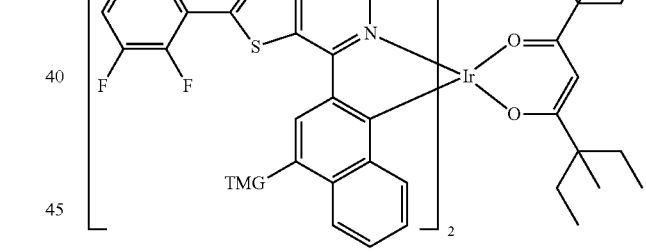
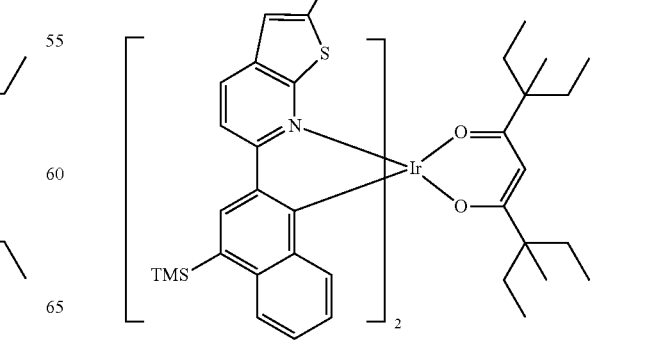

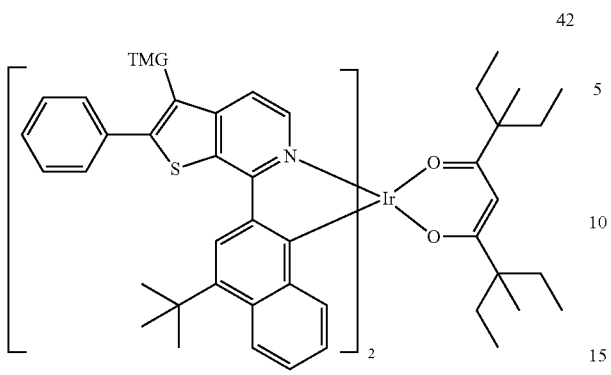

42

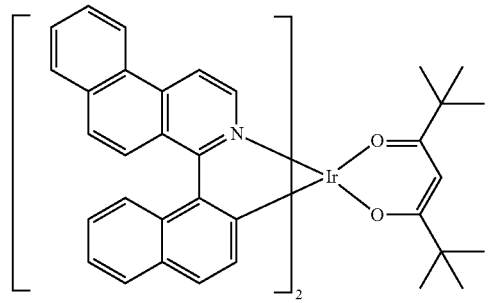

B2

From Table 4, it was confirmed that the organic light-emitting devices of Examples 1 to 14 have improved driving voltage, improved external quantum efficiency, and improved lifespan characteristics compared to the organic light-emitting devices of Comparative Examples A1, A2, B1 and B2. The organic light-emitting devices of Examples 1 to 5 may emit light having a relatively narrow FWHM.

The organometallic compounds as described herein have excellent electronic characteristics. Accordingly, an electronic device, for example, an organic light-emitting device, using the organometallic compounds may have improved driving voltage, improved external quantum efficiency, and improved lifespan characteristics, and may emit light having a relatively narrow FWHM.

It should be understood that the exemplary embodiments described herein should be considered in a descriptive sense only and not for purposes of limitation. Descriptions of features or aspects within each exemplary embodiment should typically be considered as available for other similar features or aspects in other embodiments. While one or more exemplary embodiments have been described with reference to the FIGURE, it will be understood by those of ordinary skill in the art that various changes in form and details may be made therein without departing from the spirit and scope as defined by the following claims.

What is claimed is:

1. An organometallic compound, represented by Formula 1:

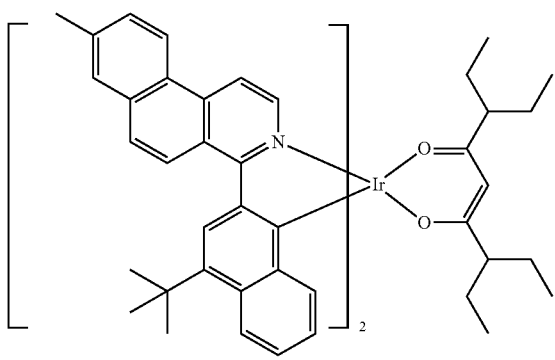

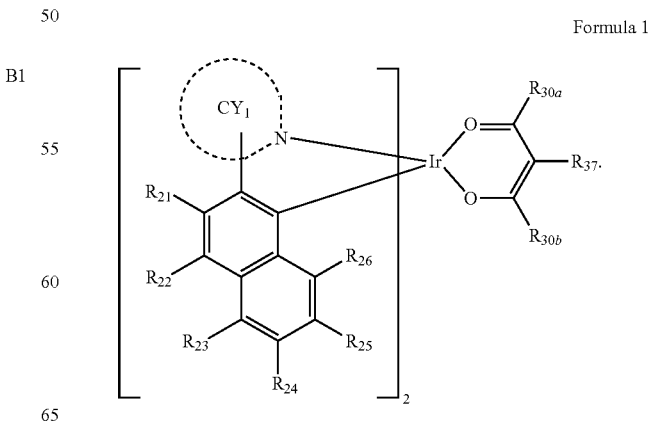

Formula 1 wherein, in Formula 1,
ring $CY_1$ is a group represented by one of Formulae CY1(1) to CY1(15):
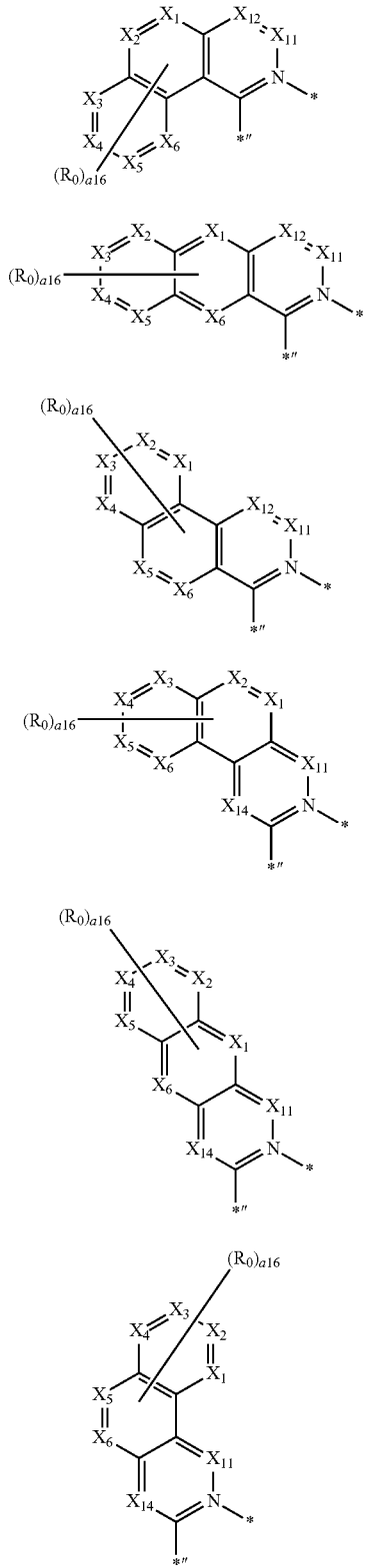
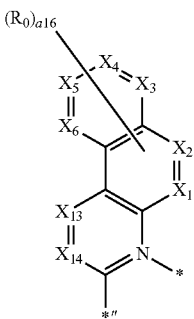
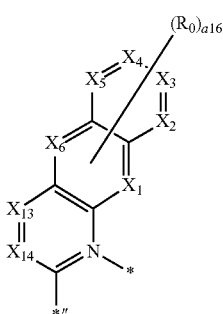
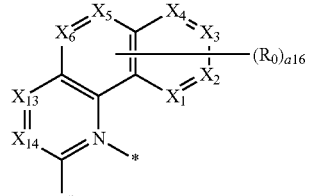
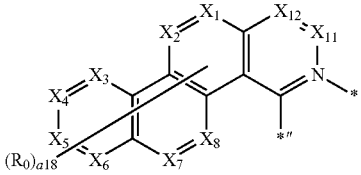
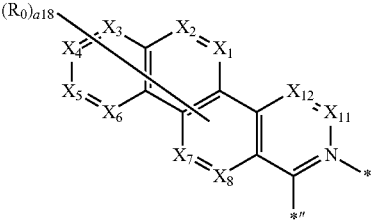
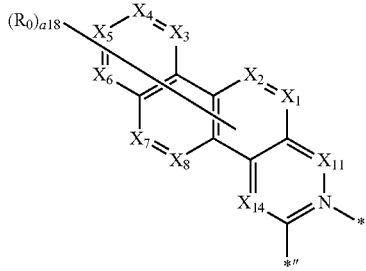

-continued

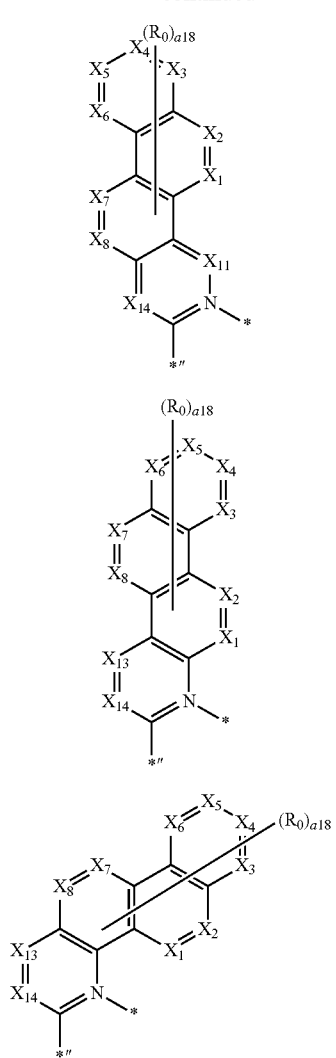

CY1(13)

CY1(14)

CY1(15)

wherein,
X$_1$ to X$_8$ are each independently C or N, wherein at least one of X$_1$ to X$_6$ of Formulae CY1(1) to CY1(9) is C, and at least one of X$_1$ to X$_8$ of Formulae CY1(10) to CY1(15) is C,
X$_{11}$ is C(R$_{11}$) or N, X$_{12}$ is C(R$_{12}$) or N, X$_{13}$ is C(R$_{13}$) or N, and X$_{14}$ is C(R$_{14}$) or N,
a16 is an integer from 0 to 6,
a18 is an integer from 0 to 8,
in Formulae CY1(1) to CY1(15), * is a binding site to Ir in Formula 1, and *″ is a binding site to a neighboring carbon atom in Formula 1,
R$_{30a}$ is a group represented by *—C(R$_{31}$)(R$_{32}$)(R$_{33}$), a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_1$-C$_{60}$ heteroaryl group, a substituted or unsubstituted monovalent non-aromatic condensed polycyclic group, or a substituted or unsubstituted monovalent non-aromatic condensed heteropolycyclic group,
R$_{30b}$ is a group represented by *—C(R$_{34}$)(R$_{35}$)(R$_{36}$), a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_1$-C$_{60}$ heteroaryl group, a substituted or unsubstituted monovalent non-aromatic condensed polycyclic group, or a substituted or unsubstituted monovalent non-aromatic condensed heteropolycyclic group,
R$_0$, R$_{11}$ to R$_{19}$, R$_{21}$ to R$_{26}$, and R$_{31}$ to R$_{36}$ are each independently hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_1$-C$_{60}$ alkylthio group, a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_7$-C$_{60}$ alkyl aryl group, a substituted or unsubstituted C$_7$-C$_{60}$ aryl alkyl group, a substituted or unsubstituted C$_6$-C$_{60}$ aryloxy group, a substituted or unsubstituted C$_6$-C$_{60}$ arylthio group, a substituted or unsubstituted C$_1$-C$_{60}$ heteroaryl group, a substituted or unsubstituted C$_2$-C$_{60}$ alkyl heteroaryl group, a substituted or unsubstituted C$_2$-C$_{60}$ heteroaryl alkyl group, a substituted or unsubstituted C$_1$-C$_{60}$ heteroaryloxy group, a substituted or unsubstituted C$_1$-C$_{60}$ heteroarylthio group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —Ge(Q$_3$)(Q$_4$)(Q$_5$), —B(Q$_6$)(Q$_7$), —P(=O)(Q$_8$)(Q$_9$), or —P(Q$_8$)(Q$_9$), provided that each of R$_{31}$ to R$_{33}$ is not hydrogen, and provided that each of R$_{34}$ to R$_{36}$ is not hydrogen;
R$_{37}$ is hydrogen, deuterium, a substituted or unsubstituted C$_1$-C$_{60}$ alkyl group, a substituted or unsubstituted C$_3$-C$_{10}$ cycloalkyl group, a substituted or unsubstituted C$_1$-C$_{10}$ heterocycloalkyl group, a substituted or unsubstituted C$_6$-C$_{60}$ aryl group, a substituted or unsubstituted C$_1$-C$_{60}$ heteroaryl group, a substituted or unsubstituted monovalent non-aromatic condensed polycyclic group, or a substituted or unsubstituted monovalent non-aromatic condensed heteropolycyclic group,
two or more of a plurality of R$_0$ are optionally linked to form a C$_5$-C$_{30}$ carbocyclic group that is unsubstituted or substituted with at least one R$_{10a}$, or a C$_1$-C$_{30}$ heterocyclic group that is unsubstituted or substituted with at least one R$_{10a}$,
two or more of R$_{11}$ to R$_{19}$ are optionally linked to form a C$_5$-C$_{30}$ carbocyclic group that is unsubstituted or substituted with at least one R$_{10a}$, or a C$_1$-C$_{30}$ heterocyclic group that is unsubstituted or substituted with at least one R$_{10a}$,
two or more of R$_{11}$ to R$_{19}$ and R$_0$ are optionally linked to form a C$_5$-C$_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of $R_{21}$ to $R_{26}$ are optionally linked to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of $R_{30a}$, $R_{30b}$, and $R_{37}$ are optionally linked to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $R_{10a}$ is as described in connection with $R_0$, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(=O)($Q_{28}$)($Q_{29}$), —P($Q_{28}$)($Q_{29}$), or a combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$); or a combination thereof, wherein $Q_1$ to $Q_9$, $Q_{11}$ to $Q_{19}$, $Q_{21}$ to $Q_{29}$, and $Q_{31}$ to $Q_{39}$ are each independently hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_1$-$C_{60}$ heteroaryl group; a $C_1$-$C_{60}$ heteroaryl group which is unsubstituted or substituted with deuterium, a $C_1$-$C_{60}$ alkyl group, a $C_6$-$C_{60}$ aryl group, or a combination thereof; a $C_1$-$C_{60}$ heteroaryloxy group; a $C_1$-$C_{60}$ heteroarylthio group; a monovalent non-aromatic condensed polycyclic group; or a monovalent non-aromatic condensed heteropolycyclic group.

2. The organometallic compound of claim 1, wherein ring $CY_{11}$ in Formulae CY1-1 to CY1-3 is a condensed cyclic group wherein two or more first rings are condensed with each other, a condensed cyclic group wherein two or more second rings are condensed with each other, or a condensed cyclic group wherein at least one first ring is condensed with at least one second ring, ring $CY_{12}$ in Formulae CY1-4 to CY1-9 is a first ring, a second ring, a condensed cyclic group wherein two or more first rings are condensed with each other, a condensed cyclic group wherein two or more second rings are condensed with each other, or a condensed cyclic group wherein at least one first ring is condensed with at least one second ring, the first ring is a cyclopentane group, a cyclopentene group, a furan group, a thiophene group, a pyrrole group, a silole group, a germole group, a borole group, a selenophene group, a phosphole group, an oxazole group, an oxadiazole group, an oxatriazole group, a thiazole group, a thiadiazole group, a thiatriazole group, a pyrazole group, an imidazole group, a triazole group, a tetrazole group, an azasilole group, an azagermole group, an azaborole group, an azaselenophene group, or an azaphosphole group, and the second ring is an adamantane group, a norbornane group, a norbornene group, a bicyclo [1.1.1] pentane group, a bicyclo [2.1.1] hexane group, a bicyclo [2.2.2] octane group, a cyclohexane group, a cyclohexene group, a benzene group, a pyridine group, a pyrimidine group, a pyrazine group, a pyridazine group, or a triazine group.

3. The organometallic compound of claim 1, wherein $R_0$, $R_{11}$ to $R_{19}$, $R_{21}$ to $R_{26}$, $R_{31}$ to $R_{33}$, and $R_{30b}$ are each independently:

hydrogen, deuterium, —F, or a cyano group;

a $C_1$-$C_{20}$ alkyl group unsubstituted or substituted with deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl) $C_1$-$C_{10}$ heterocycloalkyl group, a phenyl group, a deuterated phenyl group, a fluorinated phenyl group, a ($C_1$-$C_{20}$ alkyl) phenyl group, a biphenyl group, a deuterated biphenyl group, a fluorinated biphenyl group, a ($C_1$-$C_{20}$ alkyl) biphenyl group, a dibenzofuranyl group, a deuterated dibenzofuranyl group, a fluorinated dibenzofuranyl group, a ($C_1$-$C_{20}$ alkyl) dibenzofuranyl group, a dibenzothiophenyl group, a deuterated dibenzothiophenyl group, a fluorinated dibenzothiophenyl group, a ($C_1$-$C_{20}$ alkyl) dibenzothiophenyl group, or a combination thereof;

a $C_3$-$C_{10}$ cycloalkyl group, a $C_1$-$C_{10}$ heterocycloalkyl group, a phenyl group, a biphenyl group, a naphthyl group, a pyridinyl group, a fluorenyl group, a carbazolyl group, a dibenzofuranyl group, or a dibenzothiophenyl group, unsubstituted or substituted with deuterium, —F, a cyano group, a $C_1$-$C_{20}$ alkyl group, a deuterated $C_1$-$C_{20}$ alkyl group, a $C_1$-$C_{20}$ fluorinated alkyl group, a $C_1$-$C_{20}$ alkoxy group, a deuterated $C_1$-$C_{20}$ alkoxy group, a $C_1$-$C_{20}$ fluorinated alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl) $C_1$-$C_{10}$ heterocycloalkyl group, a phenyl group, a deuterated phenyl group, a fluorinated phenyl group, a ($C_1$-$C_{20}$ alkyl) phenyl group, a biphenyl group, a deuterated biphenyl group, a fluorinated biphenyl group, a ($C_1$-$C_{20}$ alkyl) biphenyl group, a dibenzofuranyl group, a deuterated dibenzofuranyl group, a fluorinated dibenzofuranyl group, a ($C_1$-$C_{20}$ alkyl) dibenzofuranyl group, a dibenzothiophenyl group, a deuterated dibenzothiophenyl group, a fluorinated dibenzothiophenyl group, a ($C_1$-$C_{20}$ alkyl) dibenzothiophenyl group, or a combination thereof; or —Si($Q_3$)($Q_4$)($Q_5$), or —Ge($Q_3$)($Q_4$)($Q_5$);

wherein each of $R_{31}$ to $R_{33}$ is not hydrogen.

4. The organometallic compound of claim 1, wherein at least one of $R_{21}$ to $R_{26}$ is not hydrogen.

5. The organometallic compound of claim 1, wherein at least one of $R_{21}$ to $R_{26}$ is:

deuterium, —F, or a cyano group;

a $C_1$-$C_{20}$ alkyl group unsubstituted or substituted with deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl) $C_1$-$C_{10}$ heterocycloalkyl group, a phenyl group, a deuterated phenyl group, a fluorinated phenyl group, a ($C_1$-$C_{20}$ alkyl) phenyl group, a biphenyl group, a deuterated biphenyl group, a fluorinated biphenyl group, a ($C_1$-$C_{20}$ alkyl) biphenyl group, a dibenzofuranyl group, a deuterated dibenzofuranyl group, a fluorinated dibenzofuranyl group, a ($C_1$-$C_{20}$ alkyl) dibenzofuranyl group, a dibenzothiophenyl group, a deuterated dibenzothiophenyl group, a fluorinated dibenzothiophenyl group, a ($C_1$-$C_{20}$ alkyl) dibenzothiophenyl group, or a combination thereof;

a $C_3$-$C_{10}$ cycloalkyl group, a $C_1$-$C_{10}$ heterocycloalkyl group, a phenyl group, a biphenyl group, a naphthyl group, a pyridinyl group, a fluorenyl group, a carbazolyl group, a dibenzofuranyl group, or a dibenzothiophenyl group, unsubstituted or substituted with deuterium, —F, a cyano group, a $C_1$-$C_{20}$ alkyl group, a deuterated $C_1$-$C_{20}$ alkyl group, a $C_1$-$C_{20}$ fluorinated alkyl group, a $C_1$-$C_{20}$ alkoxy group, a deuterated $C_1$-$C_{20}$ alkoxy group, a $C_1$-$C_{20}$ fluorinated alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl) $C_1$-$C_{10}$ heterocycloalkyl group, a phenyl group, a deuterated phenyl group, a fluorinated phenyl group, a ($C_1$-$C_{20}$ alkyl) phenyl group, a biphenyl group, a deuterated biphenyl group, a fluorinated biphenyl group, a ($C_1$-$C_{20}$ alkyl) biphenyl group, a dibenzofuranyl group, a deuterated dibenzofuranyl group, a fluorinated dibenzofuranyl group, a ($C_1$-$C_{20}$ alkyl) dibenzofuranyl group, a dibenzothiophenyl group, a deuterated dibenzothiophenyl group, a fluorinated dibenzothiophenyl group, a ($C_1$-$C_{20}$ alkyl) dibenzothiophenyl group, or a combination thereof; or —Si($Q_3$)($Q_4$)($Q_5$), or —Ge($Q_3$)($Q_4$)($Q_5$).

6. The organometallic compound of claim 1, wherein ring $CY_1$ is a group represented by one of Formulae CY1-1 to CY1-3, and at least one $R_0$ in the number of a0 in Formulae CY1-1 to CY1-3 is each independently deuterium, —F, a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

7. The organometallic compound of claim 1, wherein ring $CY_1$ is a group represented by one of Formulae CY1-1 to CY1-3, and at least one of $R_{23}$ to $R_{26}$ is not hydrogen.

8. The organometallic compound of claim 1, wherein a group represented by
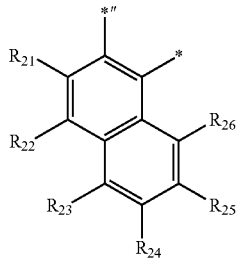
in Formula 1 is a group represented by one of Formulae CY2-1 to CY2-59:
CY2-1
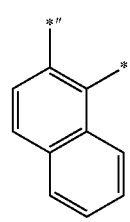
CY2-2
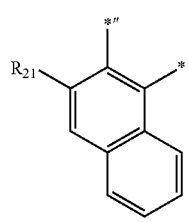
CY2-3
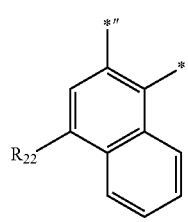
CY2-4
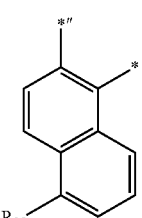
CY2-5
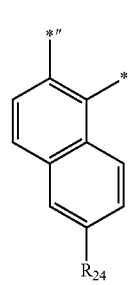
CY2-6
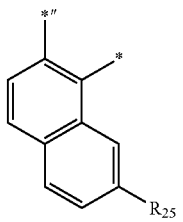
CY2-7
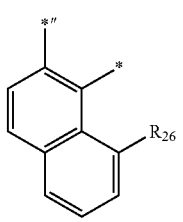
CY2-8
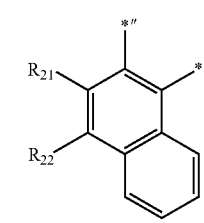
CY2-9
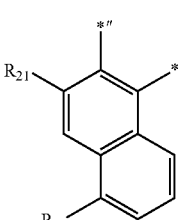
CY2-10
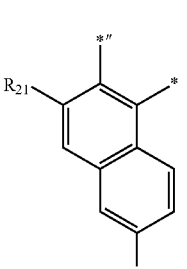
CY2-11
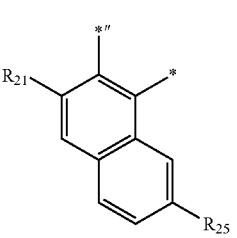
CY2-12
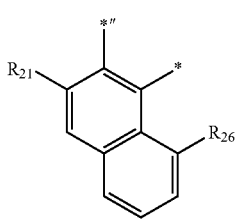

| | |
|---|---|
| 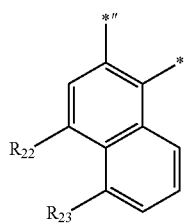 CY2-13 | 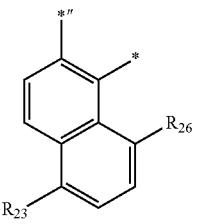 CY2-19 |
| 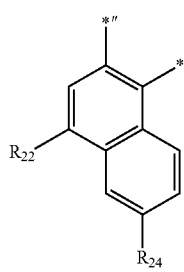 CY2-14 | 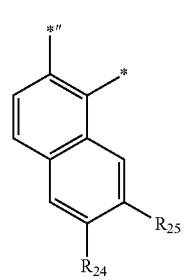 CY2-20 |
| 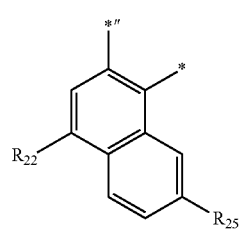 CY2-15 | 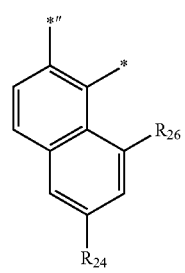 CY2-21 |
| 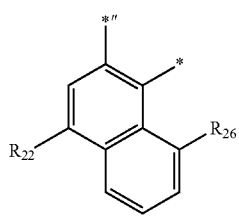 CY2-16 | 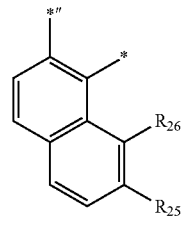 CY2-22 |
| 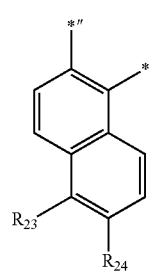 CY2-17 | 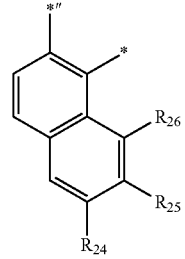 CY2-23 |
| 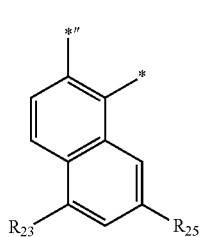 CY2-18 | 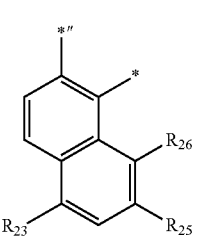 CY2-24 |

-continued
CY2-25
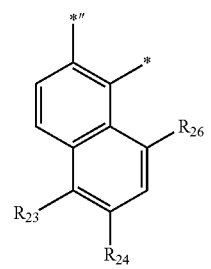
CY2-26
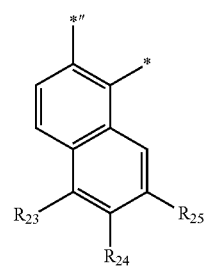
CY2-27
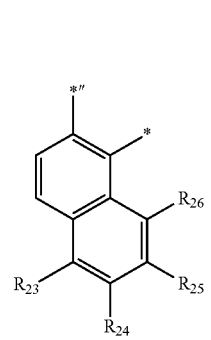
CY2-28
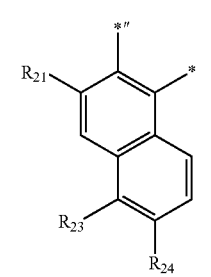
CY2-29
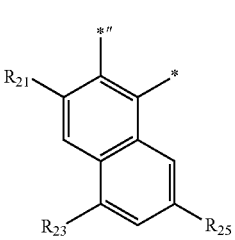
CY2-30
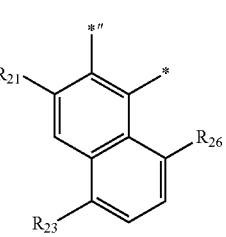
CY2-31
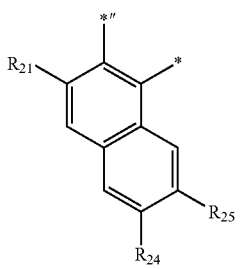
CY2-32
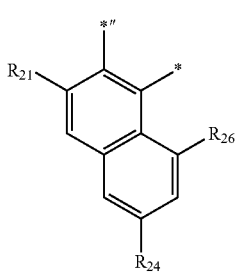
CY2-33
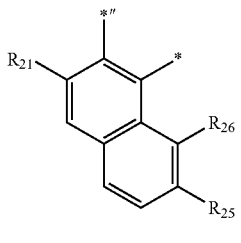
CY2-34
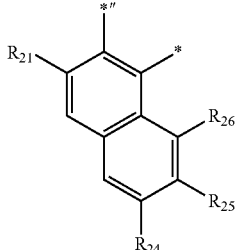
CY2-35
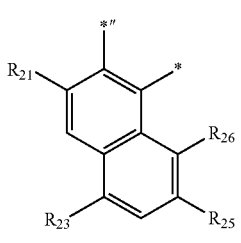
CY2-36
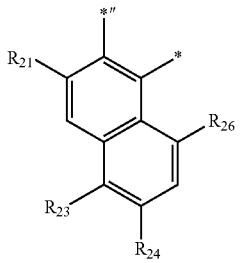

-continued
CY2-37
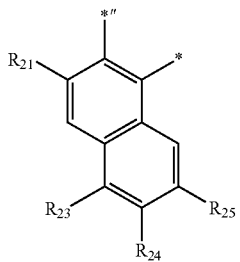
CY2-38
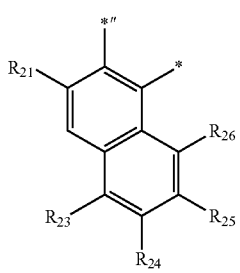
CY2-39
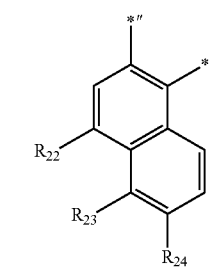
CY2-40
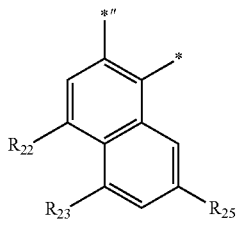
CY2-41
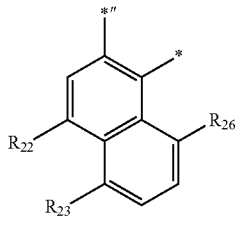
CY2-42
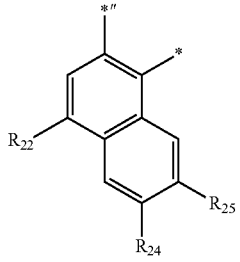
CY2-43
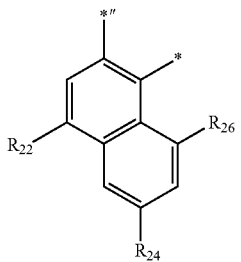
CY2-44
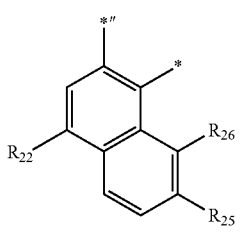
CY2-45
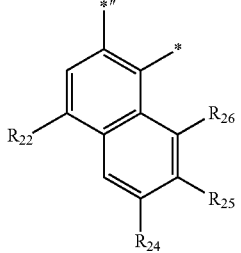
CY2-46
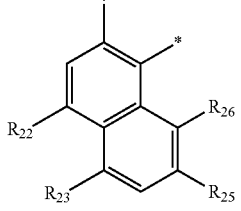
CY2-47
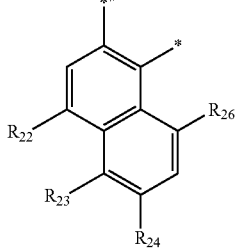
CY2-48
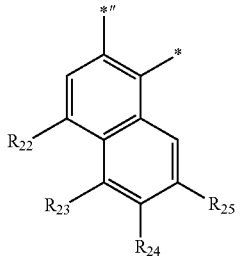

CY2-49
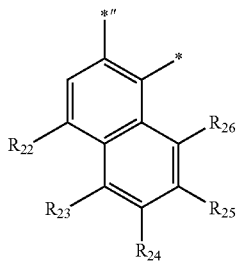
CY2-50
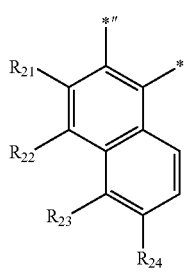
CY2-51
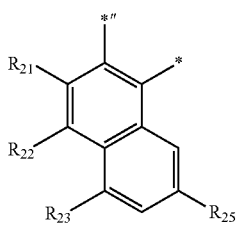
CY2-52
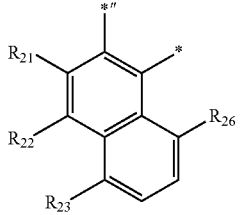
CY2-53
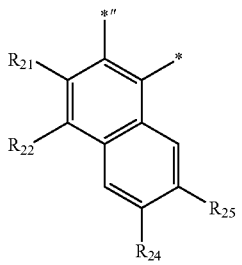
CY2-54
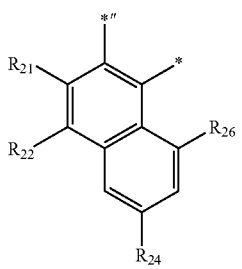
CY2-55
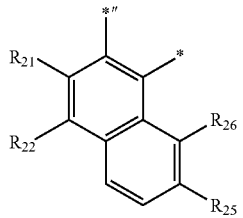
CY2-56
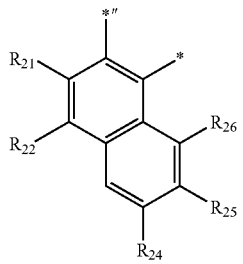
CY2-57
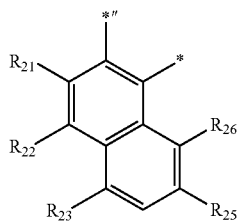
CY2-58
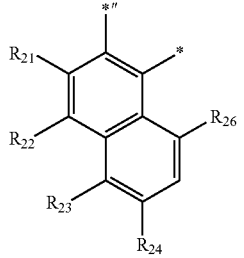
CY2-59
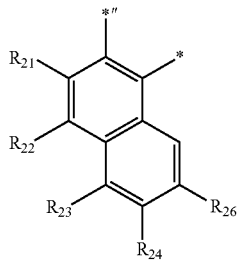
wherein, in Formulae CY2-1 to CY2-59,
  $R_{21}$ to $R_{26}$ are each independently a group as described in claim 1, provided that each of $R_{21}$ to $R_{26}$ is not hydrogen,
  \* is a binding site to Ir in Formula 1, and
  \*″ is a binding site to a neighboring atom in Formula 1.

9. The organometallic compound of claim 1, wherein a group represented by

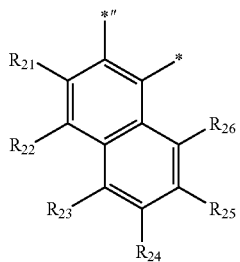

in Formula 1 is a group represented by one of Formulae 4-1 to 4-3:

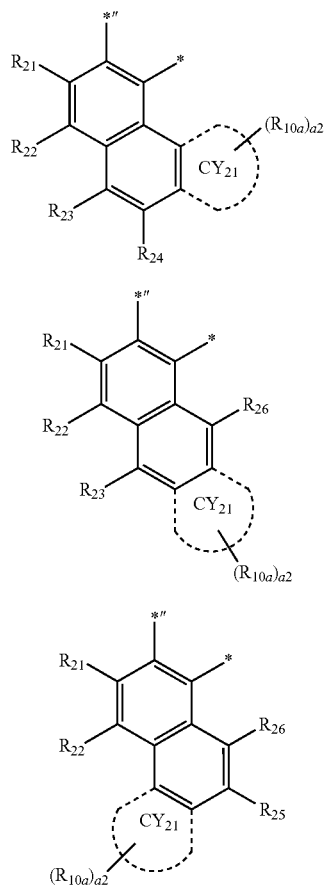

wherein, in Formulae 4-1 to 4-3,
$R_{21}$ to $R_{26}$ and $R_{10a}$ are each independently a group as described in claim 1,
ring $CY_{21}$ is a $C_5$-$C_{30}$ carbocyclic group or a $C_1$-$C_{30}$ heterocyclic group,
a2 is an integer from 0 to 20,
* is a binding site to Ir in Formula 1, and
*" is a binding site to a neighboring atom in Formula 1.

10. The organometallic compound of claim 1, wherein $R_{30b}$ is a group represented by *—$C(R_{34})(R_{35})(R_{36})$,
$R_{34}$ to $R_{36}$ are each independently a group as described in claim 1, and
each of $R_{34}$ to $R_{36}$ is not hydrogen or deuterium.

11. The organometallic compound of claim 1, wherein $R_{30a}$ is a group represented by *—$C(R_{31})(R_{32})(R_{33})$,
$R_{31}$ to $R_{33}$ are each independently a group as described in claim 1, and
at least one of $R_{31}$ to $R_{33}$ is not a methyl group.

12. The organometallic compound of claim 1, wherein
at least one of Condition A1 to Condition A3 is satisfied, or
Condition A1 and Condition A2 are each satisfied,
Condition A1
$R_{30a}$ is a group represented by *—$C(R_{31})(R_{32})(R_{33})$, and
$R_{31}$ to $R_{33}$ are each independently a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group,
Condition A2
$R_{30a}$ is a group represented by *—$C(R_{31})(R_{32})(R_{33})$,
$R_{31}$ to $R_{33}$ are each independently a group as defined in Condition A1, and
at least one of $R_{31}$ to $R_{33}$ is independently a substituted or unsubstituted $C_2$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group,
Condition A3
$R_{30a}$ is a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

13. The organometallic compound of claim 1, wherein
at least one of Condition B1 to Condition B3 is satisfied, or
Condition B1 and Condition B2 are each satisfied,
Condition B1
$R_{30b}$ is a group represented by *—$C(R_{34})(R_{35})(R_{36})$, and
$R_{34}$ to $R_{36}$ are each independently a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, Condition B2

R$_{30b}$ is a group represented by *—C(R$_{34}$)(R$_{35}$)(R$_{36}$),

R$_{34}$ to R$_{36}$ are each independently a group as defined in Condition B1, at least one of R$_{34}$ to R$_{36}$ is independently a substituted or unsubstituted C$_2$-C$_{60}$ alkyl group, a substituted or unsubstituted C$_3$-C$_{10}$ cycloalkyl group, a substituted or unsubstituted C$_1$-C$_{10}$ heterocycloalkyl group, a substituted or unsubstituted C$_6$-C$_{60}$ aryl group, a substituted or unsubstituted C$_1$-C$_{60}$ heteroaryl group, a substituted or unsubstituted monovalent non-aromatic condensed polycyclic group, or a substituted or unsubstituted monovalent non-aromatic condensed heteropolycyclic group, Condition B3

R$_{30b}$ is a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_1$-C$_{60}$ heteroaryl group, a substituted or unsubstituted monovalent non-aromatic condensed polycyclic group, or a substituted or unsubstituted monovalent non-aromatic condensed heteropolycyclic group.

14. The organometallic compound of claim 1, wherein the organometallic compound represented by Formula 1 is one of Compounds 1 to 5, 7 to 8, or 10 to 27:

1

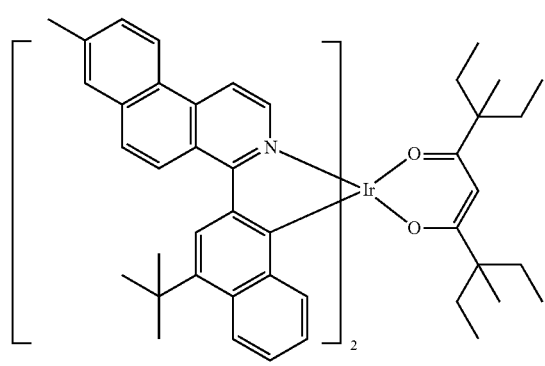

2

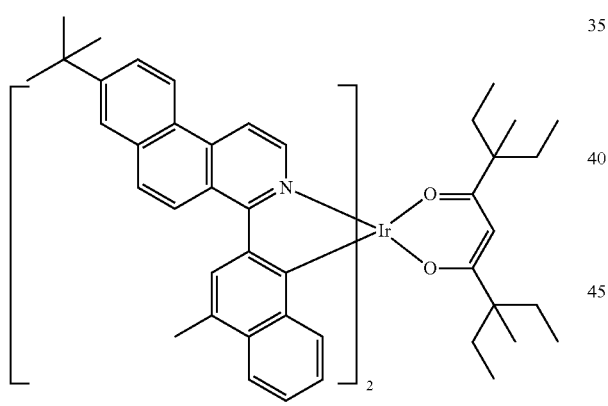

3

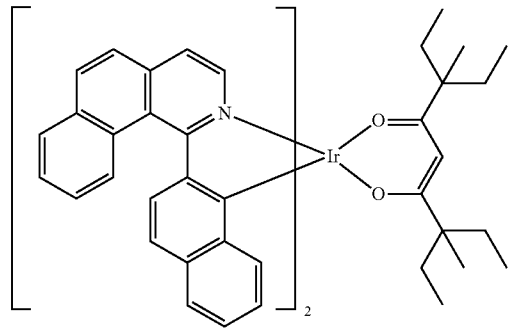

4

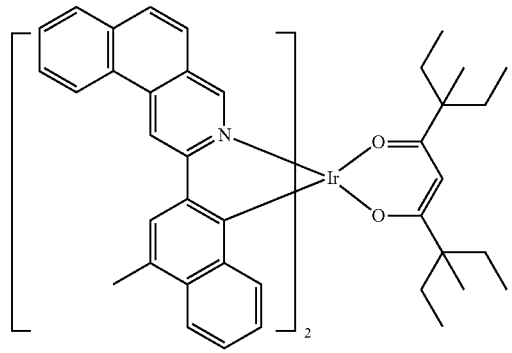

5

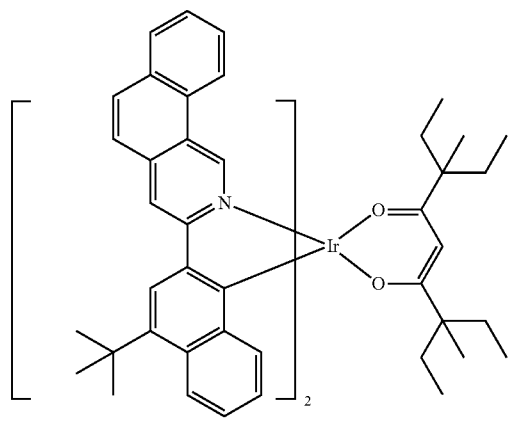

7

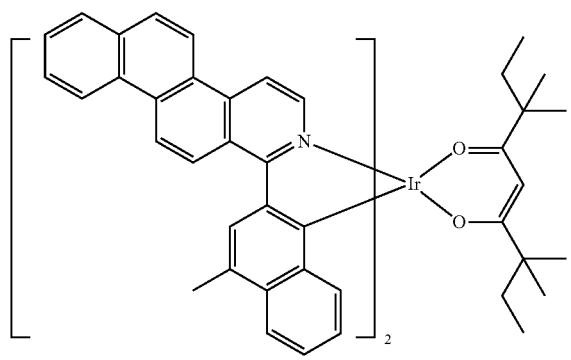
8
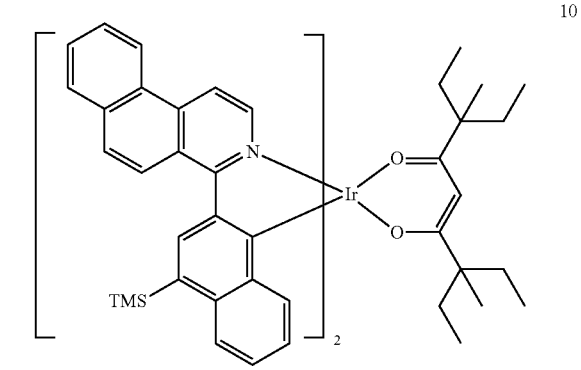
10
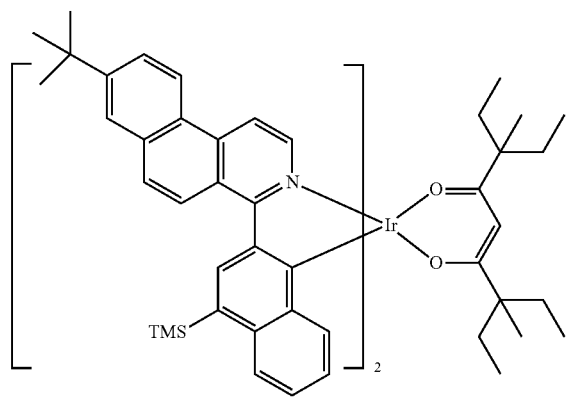
11
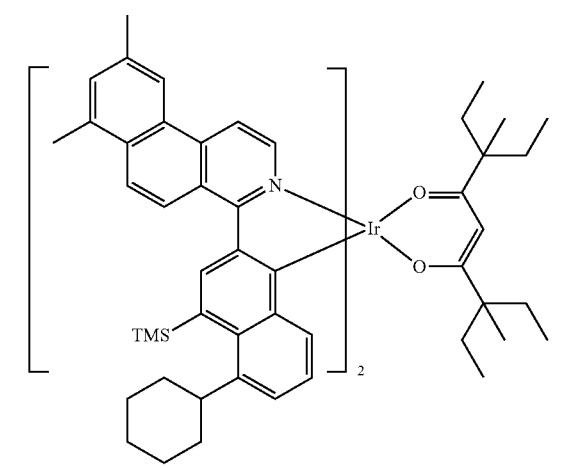
12
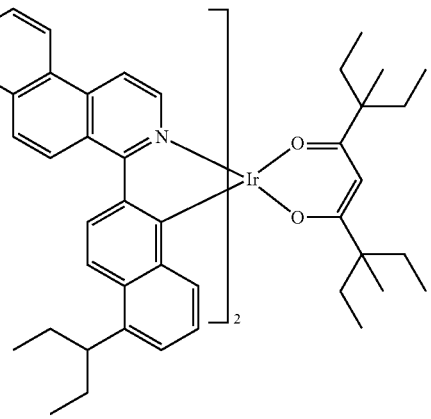
13
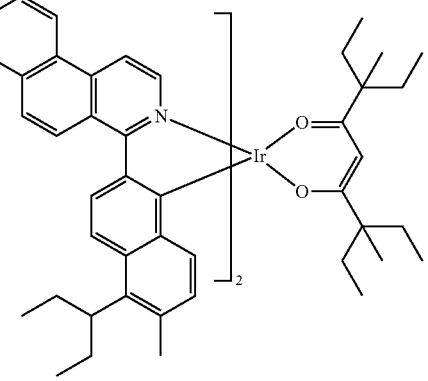
14
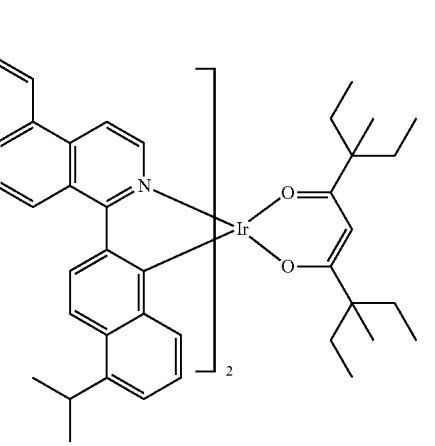
15

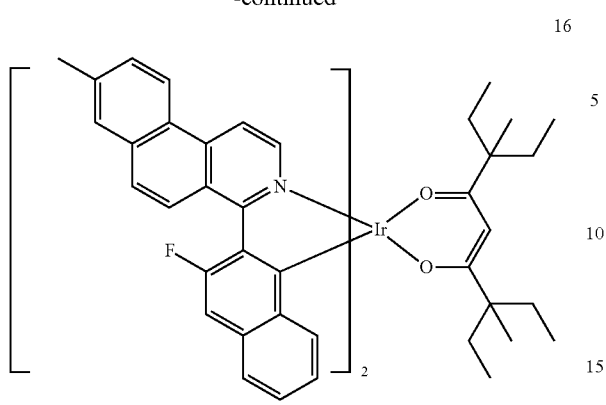
16
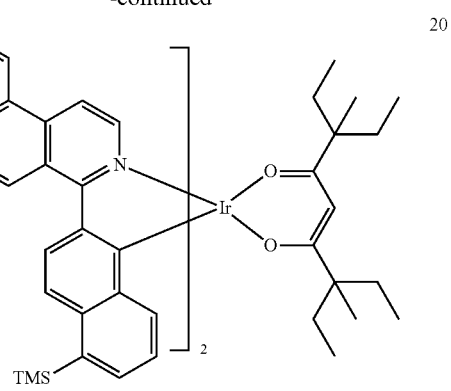
20
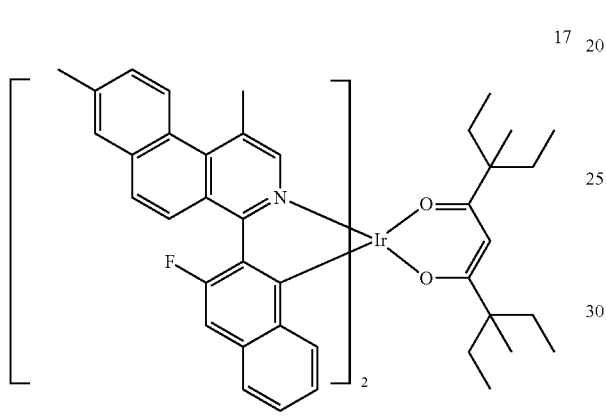
17
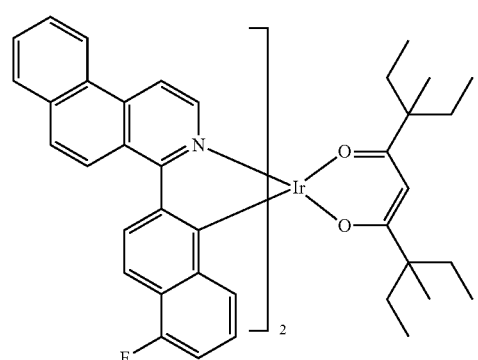
21
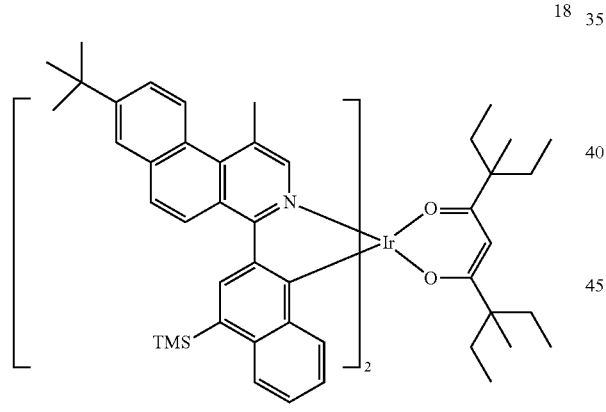
18
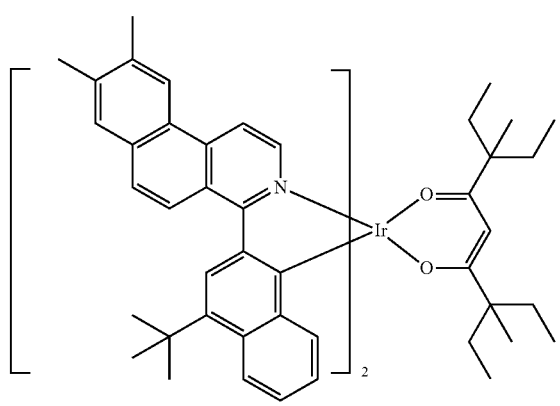
22
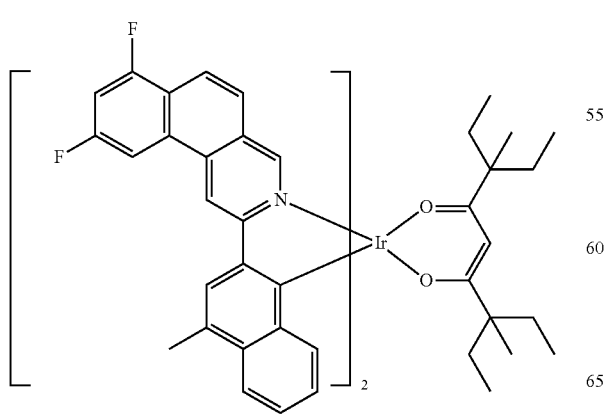
19
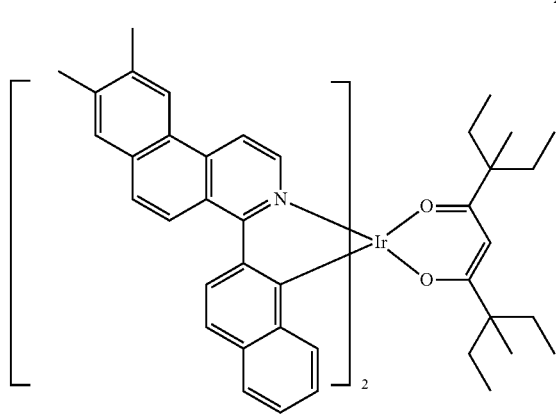
23

271
-continued

24

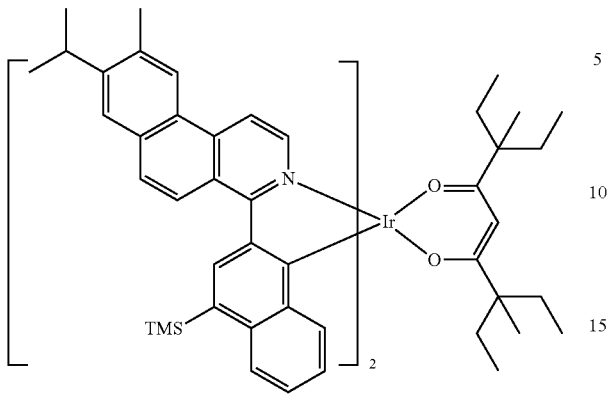

25

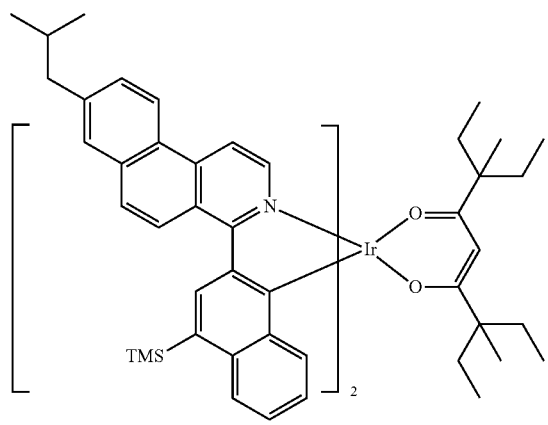

26

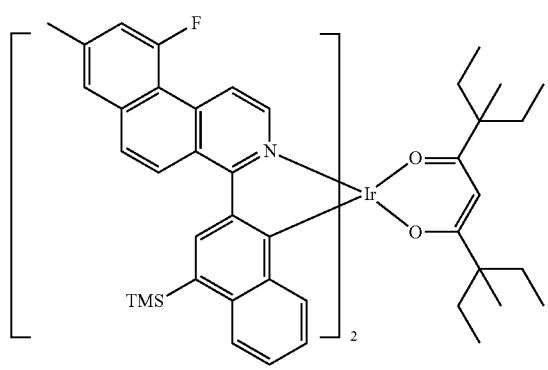

272
-continued

27

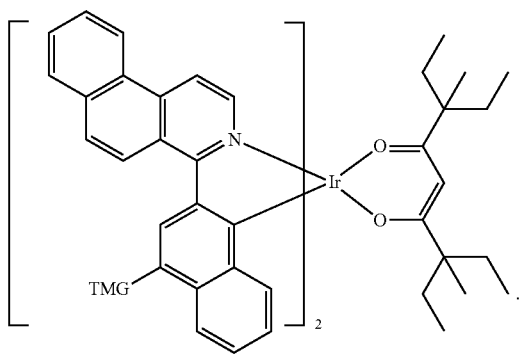

15. An organic light-emitting device comprising:
a first electrode,
a second electrode; and
an organic layer located between the first electrode and the second electrode,
wherein the organic layer comprises an emission layer, and
wherein the organic layer further comprises at least one of the organometallic compound of claim 1.
16. The organic light-emitting device of claim 15, wherein the first electrode is an anode,
the second electrode is a cathode,
the organic layer further comprises a hole transport region located between the first electrode and the emission layer and an electron transport region located between the emission layer and the second electrode,
the hole transport region comprises a hole injection layer, a hole transport layer, an electron blocking layer, a buffer layer, or a combination thereof, and
the electron transport region comprises a hole blocking layer, an electron transport layer, an electron injection layer, or a combination thereof.
17. The organic light-emitting device of claim 15, wherein the emission layer comprises the at least one organometallic compound.
18. The organic light-emitting device of claim 17, wherein the emission layer further comprises a host, and
an amount of the host in the emission layer is greater than an amount of the organometallic compound in the emission layer.
19. An electronic apparatus comprising the organic light-emitting device of claim 15.

* * * * *